(12) United States Patent
Shigihara et al.

(10) Patent No.: US 6,970,633 B2
(45) Date of Patent: Nov. 29, 2005

(54) SEMICONDUCTOR OPTICAL DEVICE

(75) Inventors: Kimio Shigihara, Tokyo (JP);
Kazushige Kawasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 222 days.

(21) Appl. No.: 10/668,185

(22) Filed: Sep. 24, 2003

(65) Prior Publication Data

US 2004/0062507 A1 Apr. 1, 2004

(30) Foreign Application Priority Data

Sep. 27, 2002 (JP) ........................ 2002-283438
Mar. 4, 2003 (JP) ........................ 2003-057238
Jul. 16, 2003 (JP) ........................ 2003-275554

(51) Int. Cl.[7] ............... G02B 6/10; H01S 5/00; H01L 29/205; H01L 29/04; B22B 7/02
(52) U.S. Cl. .................. 385/131; 372/45; 257/49; 257/91; 428/213
(58) Field of Search .................. 385/131; 372/45; 257/49, 91; 428/213

(56) References Cited

U.S. PATENT DOCUMENTS

| | | | | | |
|---|---|---|---|---|---|
| 3,799,653 | A | * | 3/1974 | Ikeda ..................... | 359/588 |
| 4,821,277 | A | * | 4/1989 | Alphonse et al. ......... | 372/45 |
| 5,360,659 | A | * | 11/1994 | Arends et al. ........... | 428/216 |
| 5,438,583 | A | * | 8/1995 | Narui et al. ............ | 372/45 |
| 6,436,541 | B1 | * | 8/2002 | Sopko et al. ............ | 428/432 |
| 6,628,692 | B2 | * | 9/2003 | Kasamatsu .............. | 372/70 |
| 6,671,438 | B2 | * | 12/2003 | Ido et al. .............. | 385/49 |

FOREIGN PATENT DOCUMENTS

JP 2001-196685 7/2001

OTHER PUBLICATIONS

Ladany, I. et al.; "Scandium oxide antireflection coatings for superluminescent LEDs", *Applied Optics*, vol. 25, No. 4, pp. 472–473, (Feb. 15, 1986).

* cited by examiner

*Primary Examiner*—Brian Healy
(74) *Attorney, Agent, or Firm*—Leydig, Voit & Mayer, Ltd.

(57) ABSTRACT

A semiconductor optical device includes a waveguide layer and a reflecting multi-layer film. The waveguide layer includes two cladding layers and an active layer sandwiched between the two cladding layers. The reflecting multi-layer film including multiple layers is on at least one of a pair of opposing end faces of the waveguide layer. A summation $\Sigma n_i d_i$ of products $n_i d_i$ of refractive indexes $n_i$ and thicknesses $d_i$ of the layers denoted i in the reflecting multi-layer film, and a wavelength $\lambda_0$ of light guided through the waveguide layer satisfies a relationship, $\Sigma n_i d_i > \lambda_0/4$. A first wavelength bandwidth $\Delta\lambda$ is wider than a second wavelength bandwidth $\Delta\Lambda$. $\Delta\lambda$ is a wavelength range including the wavelength $\lambda_0$ in which a reflectance R of the reflecting multi-layer film is not higher than +2.0% from reflectance R at the wavelength $\lambda_0$. $\Delta\Lambda$ is a wavelength range including the wavelength $\lambda_0$ in which a reflectance R' of a hypothetical layer is not higher than +2.0% from a hypothetical reflectance R' at the wavelength $\lambda_0$ of a hypothetical layer having a thickness of $5\lambda_0/(4n_f)$, a refractive index $n_f$, on the at least one of opposing end faces, and satisfying a relationship, $R'=((n_c-n_f^2)/(n_c+n_f^2))^2$, where $n_c$ denotes an effective refractive index of the waveguide layer.

15 Claims, 87 Drawing Sheets

SEMICONDUCTOR OPTICAL DEVICE

BACKGROUND OF THE INVENTION

1. Field of the Invention

The present invention relates to a semiconductor optical device such as a semiconductor laser device used as a light source for optical information processing, a signal for optical communication, an excitation light source of a fiber amplifier, or the like, a semiconductor amplifier for amplifying an optical signal, or an optical modulator for modulating an optical signal.

2. Description of the Background Art

An end face, including a waveguide layer, of a semiconductor laser device or a semiconductor optical device, such as an optical modulator, is generally coated with a reflecting film. When a reflecting film having a refractive index $n_1$ on the end face portion of the semiconductor element has a film thickness d equal to an odd integer multiple of $\lambda/(4n_1)$, the reflectance of the reflecting film becomes a minimum value. In addition, when a coating having a refractive index which is a square root of a refractive index $n_c$ of a laminated element is on a waveguide layer at the end face portion is, an antireflecting film is obtained. For example, the reference of I. Ladany, et al., "Scandium oxide antireflection coatings for superluminescent LEDs", Appl. Opt. Vol. 25, No. 4, pp. 472–473, (1986), describes a semiconductor laser with an antireflection film on the end face.

Wavelength dependence of reflectance of a reflecting film (refractive index $n_1$=1.449) including films of various thicknesses in a laminated element (effective refractive index $n_c$=3.37), including a waveguide layer of an end face portion of a semiconductor optical device, will be considered. In this case, the reflectance is set to be the minimum value at a setting wavelength $\lambda$=980 nm. When the reflectance is the minimum value, the thickness is an odd integer multiple of $\lambda/(4n_1)$. If the single-layer reflecting film has a thickness of $\lambda/(4n_i)$ and if the single-layer reflecting film has a thickness of $5\lambda/(4n_1)$, it is understood that a flat portion near a minimal value of the reflectance in the single-layer reflecting film having the thickness of $\lambda/(4n_1)$ is larger than that in the single-layer reflecting film having the thickness of $5\lambda/(4n_1)$.

When a thickness d of the reflecting film on the end face portion of the semiconductor optical device is increased an odd-number of times $\lambda/(4n_1)$, a wavelength band of a low-reflectance area near the minimal value of the reflectance becomes narrow, and a semiconductor laser characteristic disadvantageously varies singificantly due to the wavelength dependence of the reflectance of the reflecting film.

Typically, the single-layer reflecting film having a thickness of $d_1=\lambda/(4n_1)$ has a minimal reflectance of 4% at a wavelength $\lambda$ of 980 nm. In this case, the reflectance in the range of a wavelength of 848 nm to a wavelength of 1161 nm ranges from a minimal value of 4.0% to 6.0%. The continuous wavelength band in the range of 4.0% to 6.0% is 313 nm. Meanwhile, the single-layer reflecting film having a thickness of $d_1=5\lambda/(4n_1)$ has a minimal reflectance of 4% at a wavelength $\lambda$ of 980 nm. In this case, the reflectance in the range of a wavelength of 951 nm to a wavelength of 1011 nm ranges from a minimal value of 4.0% to 6.0%. The first continuous wavelength band in the range of 4.0% to 6.0% is 60 nm narrower than that of the single-layer reflecting film having a thickness of $d_1=\lambda/(4n_1)$. Then, a first reference value is obtained by dividing the wavelength band by the predetermined wavelength of 980 nm is about 0.061. Also, the reflectance in the range of a wavelength of 949 nm to a wavelength of 1013 nm ranges from a minimal value of 4.0% to 6.5%. The first continuous wavelength band in the range of 4.0% to 6.5% is 64 nm. Then, a second reference value is obtained by dividing the wavelength band by the predetermined wavelength of 980 nm is about 0.065.

SUMMARY OF THE INVENTION

Therefore, it is an object of the present invention to provide a semiconductor optical device including a reflecting film having a low reflectance over a wide wavelength band.

A semiconductor optical device includes a waveguide layer and a reflecting multi-layer film. The waveguide layer includes two cladding layers and an active layer sandwiched between the two cladding layers. The reflecting multi-layer film is formed on at least one of a pair of opposing end faces of the waveguide layer. A summation $\Sigma n_i d_i$ of products $n_i d_i$ of refractive index $n_i$ and film thickness $d_i$ of a layer denoted with i in the reflecting multi-layer film, and a wavelength $\lambda_0$ of light guided through the waveguide layer satisfies a relationship, $\Sigma n_i d_i > \lambda_0/4$. A first wavelength bandwidth $\Delta\lambda$ is wider than a second wavelength bandwidth $\Delta\Lambda$. The $\Delta\lambda$ is a wavelength range including the wavelength $\lambda_0$ in which a hypothetical reflectance $R(\lambda)$ at a wavelength $\lambda$ is not higher than +2.0% from reflectance $R(\lambda_0)$ at the wavelength $\lambda_0$. The $\Delta\Lambda$ is a wavelength range including the wavelength $\lambda_0$ in which a hypothetical reflectance $R'(\lambda)$ at a wavelength $\lambda$ is not higher than +2.0% from a hypothetical reflectance $R'(\lambda_0)$ at the wavelength $\lambda_0$ of a hypothetical layer having a thickness of $5\lambda_0/(4n_f)$ of a refractive index $n_f$ formed on the at least one of opposing end faces satisfies a relationship, $R(\lambda_0)=((n_c-n_f^2)/(n_c+n_f^2))^2$. The $n_c$ denotes an effective refractive index of the waveguide layer.

The $\Sigma n_i d_i$ preferably satisfies the relationship $\Sigma n_i d_i > 5\lambda_0/4$. In this manner, the thickness of the reflecting film can be made more large. A value $\Delta\lambda/\lambda_0$ obtained by dividing the wavelength bandwidth $\Delta\lambda$ by the wavelength $\lambda_0$ is preferably 0.070 or more, more preferably 0.090 or more, and still more preferably 0.10 or more. When the wavelength bandwidth $\Delta\lambda$ of a low reflectance is large, the wavelength dependence of the reflectance is small. For this reason, a change in characteristic can be suppressed even though the wavelength of waveguide light changes.

BRIEF DESCRIPTION OF THE DRAWINGS

The present invention will become readily understood from the following description of preferred embodiments thereof made with reference to the accompanying drawings, in which like parts are designated by like reference numeral and in which:

FIG. 119 is a graph of a wavelength dependence of a reflectance on a reflecting multi-layer film formed on an end face portion of a semiconductor optical device according to the 107th embodiment of the present invention;

FIG. 120 is a graph of a wavelength dependence of a reflectance on a reflecting multi-layer film formed on an end face portion of a semiconductor optical device according to the 108th embodiment of the present invention;

Figure 121:
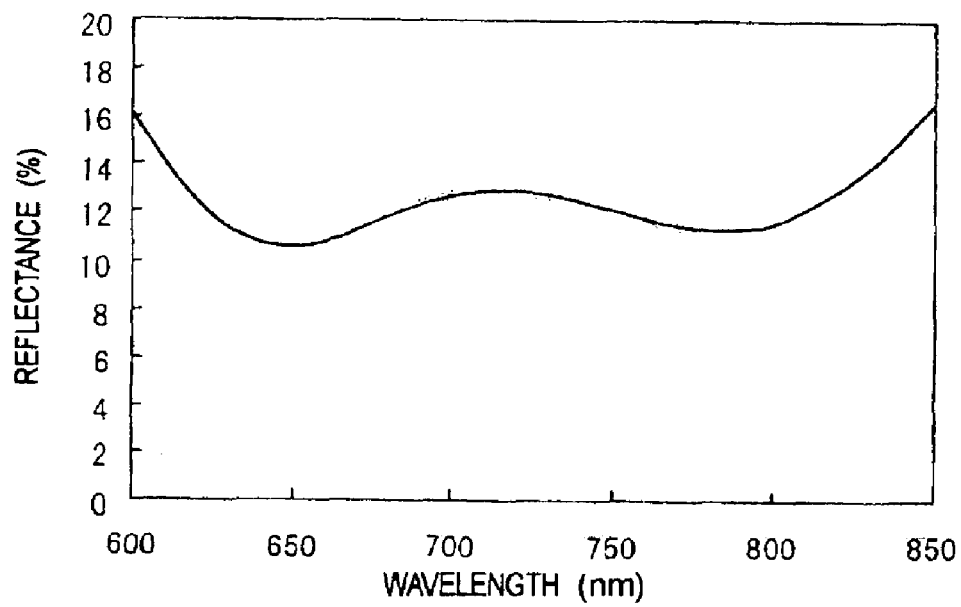
Figure 122:
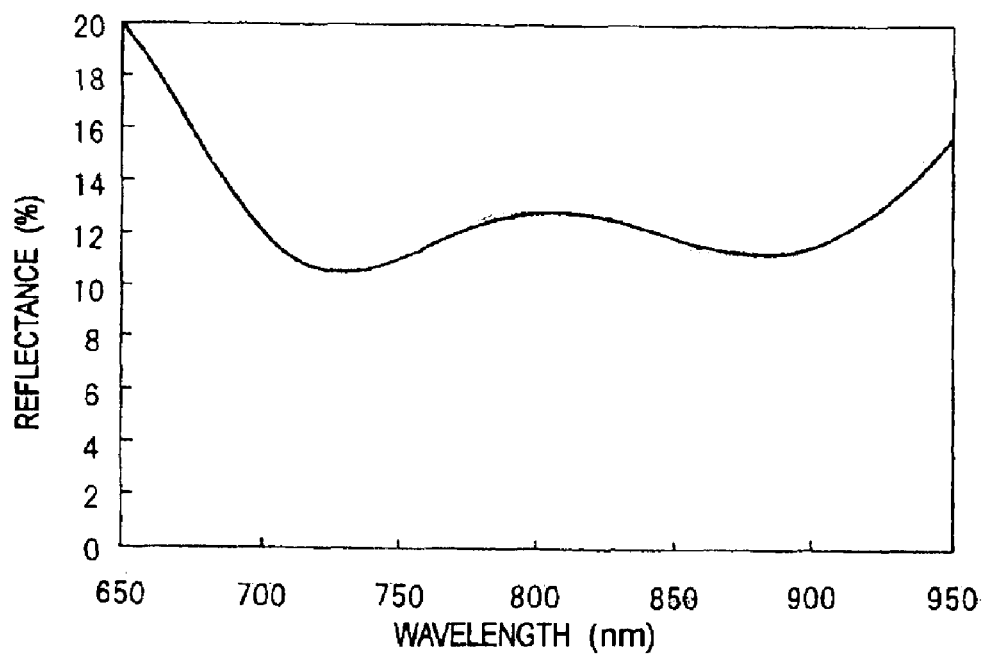

FIG. 121 is a graph of a wavelength dependence of a reflectance on a reflecting multi-layer film formed on an end face portion of a semiconductor optical device according to the 109th embodiment of the present invention; and FIG. 122 is a graph of a wavelength dependence of a reflectance on a reflecting multi-layer film formed on an end face portion of a semiconductor optical device according to the 110th embodiment of the present invention.

DETAILED DESCRIPTION OF THE PREFERRED EMBODIMENTS

Semiconductor optical devices according to embodiments of the present invention will be described below with reference to the accompanying drawings. The same reference numerals as in the drawings denote the same parts in the drawings.

Figure 1:
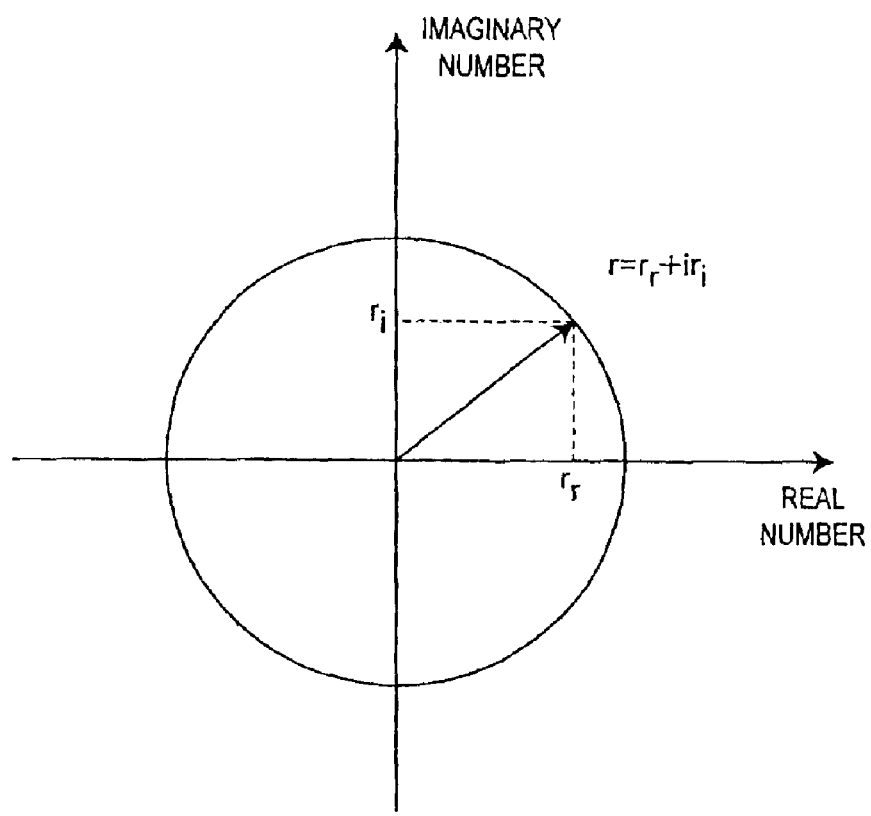
FIG. 1 is a graph of a complex plane of an amplitude reflectance by complex number expression.
Figure 2:
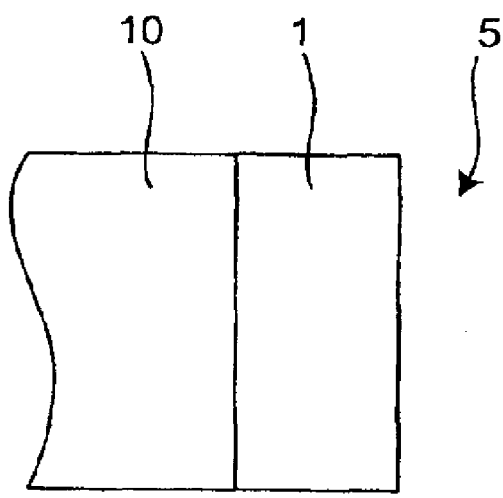
FIG. 2 is a schematic sectional view of the structure of a semiconductor optical device having an hypothetical reflecting film on an end face.
Figure 3:
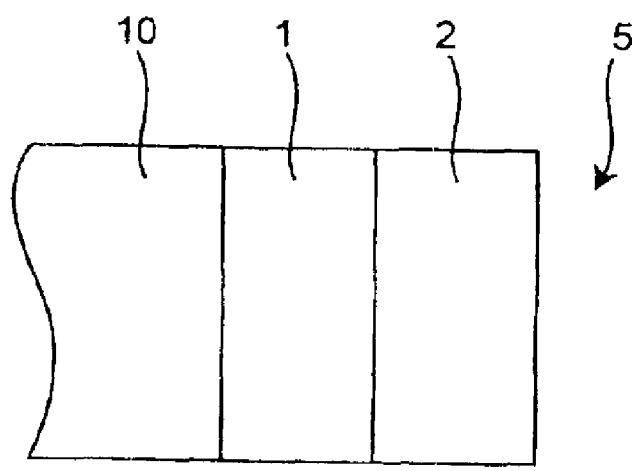
FIG. 3 is a schematic sectional view of the structure of a semiconductor optical device according to the present invention when the hypothetical reflecting film in FIG. 2 is replaced with a two-layer film.
Figure 4:
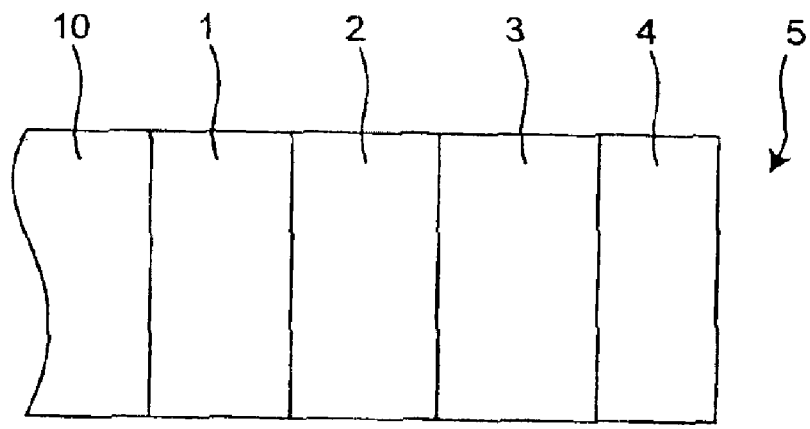
FIG. 4 is a schematic sectional view of the structure of a semiconductor optical device according to the present invention when the hypothetical reflecting film in FIG. 2 is replaced with a four-layer film.
Figure 5:
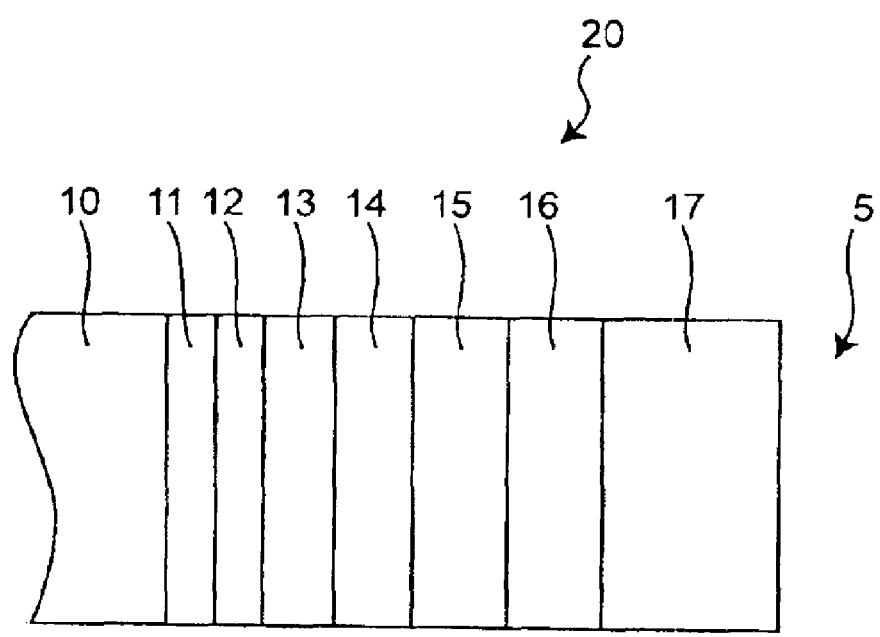
FIG. 5 is a schematic sectional view of the structure of the end face portion of a semiconductor optical device according to the first embodiment of the present invention.

Calculation of a reflectance of a reflecting multi-layer film formed on an end face portion of a semiconductor optical device according to an embodiment of the present invention will be described below with reference to FIGS. 1 to 5. FIG. 1 is a graph of a complex plane of an amplitude reflectance r which is expressed by a complex number. FIG. 2 is a schematic sectional view of a single-layer reflecting film on an end face portion of a semiconductor optical device. FIG. 3 is a schematic sectional view obtained when a two-layer reflecting film is formed in place of the single-layer reflecting film in FIG. 2. FIG. 4 is a schematic sectional view obtained when a four-layer reflecting film is formed in place of the single-layer reflecting film in FIG. 2. FIG. 5 is a schematic sectional view obtained when a seven-layer reflecting film is formed in place of the single-layer reflecting film. The amplitude reflectance r which is expressed as a complex number and which is related to light having a wavelength λ is expressed by the following equation (1), and can be indicated on the graph of the complex plane in FIG. 1.

$$r = r_r(\lambda) + i r_i(\lambda) \tag{1}$$

Reference symbol i denotes an imaginary unit ($i=(-1)^{1/2}$), reference symbol $r_r(\lambda)$ denotes a real part, and reference symbol $r_i(\lambda)$ denotes an imaginary part. A general reflectance is the square of the amplitude reflectance. The case in which the reflectance is zero corresponds to the case in which the real part and the imaginary part of the amplitude reflectance are zero as expressed in the following equations (2a) and (2b). These relational expressions are solved to make it possible to obtain a condition for making the reflectance zero.

$$r_r(\lambda) = 0 \tag{2a}$$

$$r_i(\lambda) = 0 \tag{2b}$$

On the other hand, in order to calculate a reflectance which is not zero, amplitude reflectance at respective points on a circumference on the complex plane in FIG. 1. For this reason, the conditional expressions described above are not uniquely determined. Therefore, an hypothetical reflecting film from which a desired reflectance with reference to a wavelength λ of guided light will be considered. FIG. 2 is a schematic sectional view of an hypothetical reflecting film obtained by forming a single-layer reflecting film 1 on an end face of a waveguide layer 10 of the semiconductor optical device. The single-layer reflecting film 1 faces a free space 5 such as the atmosphere. A condition for minimizing the amplitude reflectance r of the single-layer reflecting film 1 is expressed by the following equation (3) by using the wavelength λ of light guided through the waveguide layer 10 of the semiconductor optical device, a refractive index $n_f$ of the single-layer reflecting film 1, and a film thickness $d_f$.

$$d_f = \frac{\lambda}{4n_f}(2m+1) \quad (3)$$

where m=0, 1, 2, 3, or the like which is 0 or a positive integer.

The minimum value of the amplitude reflectance r of the hypothetical film is expressed by the following equation (4).

$$r = \frac{n_c - n_f^2}{n_c + n_f^2} \quad (4)$$

A reflectance R is expressed by $|r|^2$ with reference to the amplitude reflectance r. More specifically, $R=((n_c-n_f^2)/(n_c+n_f^2))^2$ is satisfied. Therefore, in order to satisfy reflectance R=4%, when an effective refractive index $n_c$ of the waveguide layer of the semiconductor optical device satisfies $n_c$=3.37, the above equation is solved, 2.248 or 1.499 is obtained as the refractive index $n_f$ of the single-layer reflecting film 1. However, in general, a single-layer film having such a refractive index is hardly obtained. Therefore, it will be considered that the hypothetical reflecting film is replaced with a reflecting multi-layer film.

A reflectance obtained when a two-layer reflecting film is arranged in place of the single-layer reflecting film will be considered. FIG. 3 is a schematic sectional view obtained when the two-layer reflecting film is used on the end face portion in place of the hypothetical reflecting film. A consideration result by the present inventors will be described below with reference to a condition for setting a minimal value of the reflectance of the two-layer reflecting film. It is assumed that phase shifts of the first-layer film 1 and the second-layer film 2 constituting the two-layer reflecting film are represented by $\phi_1$ and $\phi_2$, respectively. In this case, the phase shifts are defined by the following equations (5) and (6):

$$\phi_1 = \frac{2\pi}{\lambda} n_1 d_1 \quad (5)$$

$$\phi_2 = \frac{2\pi}{\lambda} n_2 d_2 \quad (6)$$

In this case, an amplitude reflectance r expressed by a complex number is given by the following equation (7):

$$r = \frac{\text{Re}1 + i\text{Im}1}{\text{Re}2 + i\text{Im}2} \quad (7)$$

where i is an imaginary unit, Re1 and Re2 are real parts of the numerator and the denominator, and Im1 and Im2 are imaginary parts of the numerator and the denominator.

In the equation (7), the real parts Re1 and Re2 and the imaginary parts Im1 and Im2 of the numerator and the denominator are expressed as described in the following equations (8a) to (8d):

$$\text{Re}1 = (n_c - 1)\cos\phi_1 \cos\phi_2 + \left(\frac{n_1}{n_2} - \frac{n_2 n_c}{n_1}\right)\sin\phi_1 \sin\phi_2 \quad (8a)$$

$$\text{Im}1 = -\left\{\left(\frac{n_c}{n_2} - n_2\right)\cos\phi_1 \sin\phi_2 + \left(\frac{n_c}{n_1} - n_1\right)\sin\phi_1 \cos\phi_2\right\} \quad (8b)$$

$$\text{Re}2 = (n_c + 1)\cos\phi_1 \cos\phi_2 - \left(\frac{n_2 n_c}{n_1} + \frac{n_1}{n_2}\right)\sin\phi_1 \sin\phi_2 \quad (8c)$$

$$\text{Im}2 = -\left\{\left(\frac{n_c}{n_2} + n_2\right)\cos\phi_1 \sin\phi_2 + \left(\frac{n_c}{n_1} + n_1\right)\sin\phi_1 \cos\phi_2\right\} \quad (8d)$$

The reflectance R is expressed as $|r|^2$ by using the amplitude reflectance r. Thickness $d_1$ and $d_2$ may be determined such that the amplitude reflectance expressed by the equation (7) is equal to the amplitude reflectance of the hypothetical reflecting film expressed by the equation (4).

FIG. 4 is a schematic sectional view obtained when a four-layer reflecting film is formed on the end face portion in place of the single-layer reflecting film. A condition for making the reflectance of the four-layer reflecting film equal to the reflectance of the hypothetical single-layer film at a setting wavelength will be considered. In the four-layer reflecting film, the amplitude reflectance is expressed by the following equation (9).

$$r = \frac{(m_{11} + m_{12})n_c - (m_{21} + m_{22})}{(m_{11} + m_{12})n_c + (m_{21} + m_{22})} \quad (9)$$

where $m_{ij}$ (i, j=1 or 2) is expressed by the following equation (10):

$$\begin{pmatrix} m_{11} & m_{12} \\ m_{21} & m_{22} \end{pmatrix} = \begin{pmatrix} \cos A\phi_1 & -\frac{i}{n_1}\sin A\phi_1 \\ -in_1 \sin A\phi_1 & \cos A\phi_1 \end{pmatrix} \begin{pmatrix} \cos A\phi_2 & -\frac{i}{n_2}\sin A\phi_2 \\ -in_2 \sin A\phi_2 & \cos A\phi_2 \end{pmatrix} \times \begin{pmatrix} \cos B\phi_1 & -\frac{i}{n_1}\sin B\phi_1 \\ -in_1 \sin B\phi_1 & \cos B\phi_1 \end{pmatrix} \begin{pmatrix} \cos B\phi_2 & -\frac{i}{n_2}\sin B\phi_2 \\ -in_2 \sin B\phi_2 & \cos B\phi_2 \end{pmatrix} \quad (10)$$

where A and B are parameters representing contributing rates of respective two-layer films (pair) when a film thickness $Ad_1$ of a first-layer reflecting film 1, a film thickness $Ad_2$ of a second-layer film 2, a film thickness $Bd_1$ of a third-layer film 3, and a film thickness $Bd_2$ of a fourth-layer film 4 are given.

FIG. 5 is a schematic sectional view obtained when a seven-layer reflecting film 20 is formed on an end face portion of a waveguide layer 10. A condition for setting the reflectance of the seven-layer reflecting film 20 to be equal to the reflectance of the hypothetical film will be considered. In the seven-layer reflecting film 20, an amplitude reflectance is expressed by the following equation (11) as in the four-layer reflecting film.

$$r = \frac{(m_{11} + m_{12})n_c - (m_{21} + m_{22})}{(m_{11} + m_{12})n_c + (m_{21} + m_{22})} \quad (11)$$

where $m_{ij}$ (i, j=1 or 2) is expressed by the following equation (12):

$$\begin{pmatrix} m_{11} & m_{12} \\ m_{21} & m_{22} \end{pmatrix} = \begin{pmatrix} \cos O\phi_2 & -\frac{i}{n_2}\sin O\phi_2 \\ -in_2\sin O\phi_2 & \cos O\phi_2 \end{pmatrix} \times \quad (12)$$

$$\begin{pmatrix} \cos A\phi_1 & -\frac{i}{n_1}\sin A\phi_1 \\ -in_1\sin A\phi_1 & \cos A\phi_1 \end{pmatrix}$$

$$\begin{pmatrix} \cos A\phi_2 & -\frac{i}{n_2}\sin A\phi_2 \\ -in_2\sin A\phi_2 & \cos A\phi_2 \end{pmatrix} \times$$

$$\begin{pmatrix} \cos B\phi_1 & -\frac{i}{n_1}\sin B\phi_1 \\ -in_1\sin B\phi_1 & \cos B\phi_1 \end{pmatrix}$$

$$\begin{pmatrix} \cos B\phi_2 & -\frac{i}{n_2}\sin B\phi_2 \\ -in_2\sin B\phi_2 & \cos B\phi_2 \end{pmatrix} \times$$

$$\begin{pmatrix} \cos C\phi_1 & -\frac{i}{n_1}\sin C\phi_1 \\ -in_1\sin C\phi_1 & \cos C\phi_1 \end{pmatrix}$$

$$\begin{pmatrix} \cos C\phi_2 & -\frac{i}{n_2}\sin C\phi_2 \\ -in_2\sin C\phi_2 & \cos C\phi_2 \end{pmatrix}$$

where O, A, B, and C are parameters representing contributing rates of respective two-layer films (pair) when a film thickness $Od_2$ of a first-layer film 11, a film thickness $Ad_1$ of a second-layer film 12, a film thickness $Ad_2$ of a third-layer film 13, a film thickness $Bd_1$ of a fourth-layer film 14, a film thickness $Bd_2$ of a fifth-layer film 15, a film thickness $Cd_1$ of a sixth-layer film 16, and a film thickness $Cd_2$ of a seventh-layer film 17 are given.

First Embodiment

A semiconductor optical device according to the first embodiment of the present invention will be described below with reference to FIGS. 5 and 6. FIG. 5 is a schematic sectional view obtained when a seven-layer reflective film is formed in place of a single-layer reflecting film. This semiconductor optical device is, for example, a semiconductor laser device, an optical modulator, an optical switch, or the like. In this semiconductor optical device, a reflecting multi-layer film having a low reflectance over a wide wavelength band centering around a predetermined wavelength is formed on an end face portion of a waveguide layer through which light is guided. In this manner, when the reflecting multi-layer film having the low reflectance is formed, noise or the like generated by the so-called reflected can be reduced in, e.g., a semiconductor laser device. In an optical modulator and an optical switch, a signal can be transmitted with a low loss. Since this reflecting multi-layer film has a low reflectance over the wide wavelength band, A wavelength dependence of a reflection characteristic can be suppressed even though an oscillation wavelength or a center wavelength of a signal changes.

The seven-layer reflecting film 20 formed on the end face portion of the semiconductor optical device will be described below with reference to FIG. 5. FIG. 5 is a schematic sectional view of the configuration of the seven-layer reflecting film 20 formed on the end face portion of the semiconductor optical device. In this semiconductor optical device, on an end face portion of a waveguide layer 10 (equivalent refractive index $n_c$=3.37), a first-layer film 11 (refractive index $n_2$=1.62 and a film thickness $Od_2$) made of aluminum oxide, a second-layer film 12 (refractive index $n_1$=2.057 and a film thickness $Ad_1$) made of tantalum oxide, a third-layer film 13 (refractive index $n_2$=1.62 and a film thickness $Ad_2$) made of aluminum oxide, a fourth-layer film 14 (refractive index $n_1$=2.057 and a film thickness $Bd_1$) made of tantalum oxide, a fifth-layer film 15 (refractive index $n_1$=1.62 and a film thickness $Bd_2$) made of aluminum oxide, a sixth-layer film 16 (refractive index $n_1$=2.057 and a film thickness $Cd_1$) made of tantalum oxide, and a seventh-layer film 17 (refractive index $n_2$=1.62 and a film thickness $Cd_2$) made of aluminum oxide are sequentially stacked. The seventh-layer film 17 is in contact with a free space 5 such as the atmosphere.

The reflection characteristic of the seven-layer reflecting film 20 formed on the end face portion of the semiconductor optical device will be described below. A setting reflectance $R(\lambda_0)$ is set at 2% when a setting wavelength $\lambda_0$=980 nm. When the parameters are given by O=0.2, A=2.2, B=2.0, and C=2.0, and when phase shifts $\phi_1$ and $\phi_2$ of tantalum oxide and aluminum oxide are given by $\phi_1$=0.45844 and $\phi_2$=1.14932, a reflectance of 2% is obtained at a wavelength of 980 nm. In this case, the film thickness of the layers of the seven-layer reflecting film are given by $Od_2/Ad_1/Ad_2/Bd_1/Bd_2/Cd_1/Cd_2$=22.13 nm/76.47 nm/234.44 nm/69.52 nm/221.31 nm/69.52 nm/221.31 nm. The total thickness $(d_{total}=\Sigma d_i)$ of the film is 923.7 nm. A sum $\Sigma n_i d_i$ of products $n_i d_i$ of refractive index $n_i$ and film thickness $d_i$ of a layer denoted with i in the seven films is 1590.57 nm which is very large, i.e., about 6.49 times a ¼ wavelength (=245 nm) of the predetermined wavelength of 980 nm. More specifically, the film thickness is larger than the 5/4 wavelength of the predetermined wavelength 980 nm of guided light. For this reason, a heat-radiation characteristic on the end face is improved, and the temperature of the end face can be suppressed from increasing.

Figure 6:
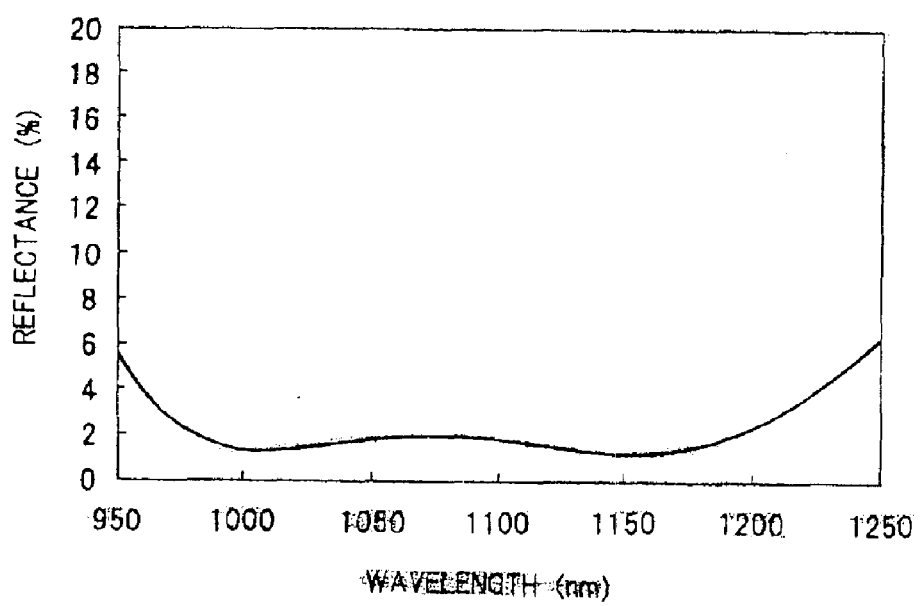
FIG. 6 is a graph of a waveguide dependence of a reflectance on a reflecting multi-layer film formed on the end face portion of the semiconductor optical device according to the first embodiment of the present invention.

FIG. 6 is a graph of a wavelength dependence of the reflectance of the seven-layer reflecting film 20. The abscissa of the graph indicates a wavelength, and the ordinate denotes a reflectance. In this case, about +1% of the set reference is a target reflectance. In this seven-layer reflecting film, a flat portion having about 3% of the target reflectance over a wide wavelength band can be obtained. More specifically, the reflectance in the range of a wavelength of 968 nm to a wavelength of 1210 nm ranges from a minimal value of 1.3% to 4.0%. With reference to the reflectance of 2.0% at the setting wavelength 980 nm, a continuous wavelength band in the range of −1.0% to +2.0%, i.e., 1.0% to 4.0% is 242 nm. A value obtained by dividing the wavelength band by the predetermined wavelength $\lambda_0$ (=980 nm) is about 0.246.

Meanwhile, it is assumed that a hypothetical single reflecting film having a thickness of $5\lambda/(4n_1)$ has a minimal reflectance of 4% at a wavelength $\lambda$ of 980 nm. It should be noted that the effective refractive index $n_c$=3.37, and the refractive index $n_1$=1.449. In this case, the reflectance in the range of a wavelength of 951 nm to a wavelength of 1011 nm ranges from a minimal value of 4.0% to 6.0%. The continuous wavelength band in the range of 4.0% to 6.0% is 60 nm. An reference index of continuous wavelength band is obtained by dividing the wavelength band by the predetermined wavelength of 980 nm is about 0.061.

Then, as compared to the reference index, the value of 0.246 is larger than the reference index of 0.061 in the hypothetical single reflecting film. Therefore, as described above, it is understood that, although the seven-layer reflecting film has a film thickness which is larger than the 5/4 wavelength of the predetermined wavelength of 980 nm of the guided light, the seven-layer reflecting film has a flat portion having a low reflectance over a wide wavelength band.

Second Embodiment

Figure 7:
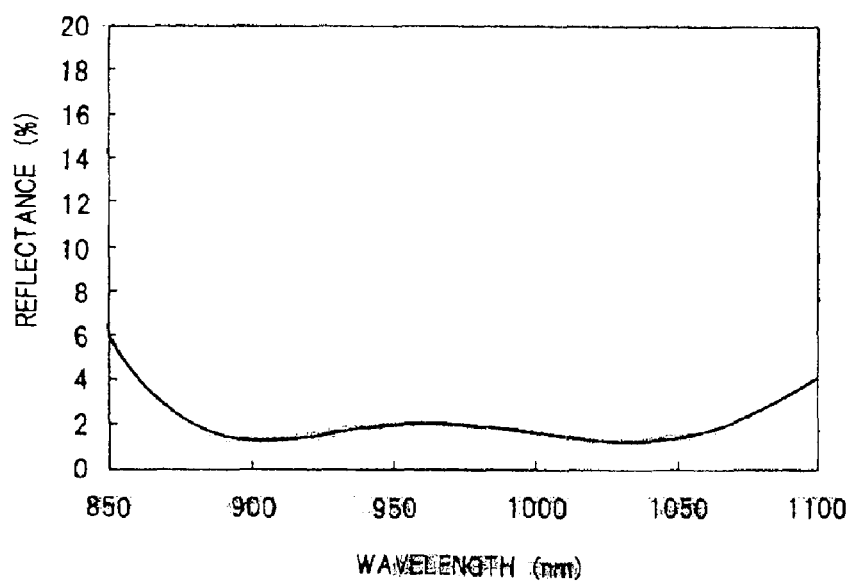
FIG. 7 is a graph of a wavelength dependence of a reflectance on a reflecting multi-layer film formed on the end face portion of a semiconductor optical device according to the second embodiment of the present invention.

A semiconductor optical device having a seven-layer reflecting film according to the second embodiment of the present invention will be described below with reference to FIG. 7. FIG. 7 is a graph of a wavelength dependence of the reflectance of the seven-layer reflecting film. The semiconductor optical device has the same multi-layer film configuration as that of the semiconductor optical device according to the first embodiment. However, the semiconductor optical device is different from the semiconductor optical device according to the first embodiment in that a setting reflectance $R(\lambda_0)$ is 2.0% when the setting wavelength $\lambda_0$ is 879 nm. When the parameters are given by O=0.2, A=2.2, B=2.0, and C=2.0, when the phase shifts $\phi_1$ and $\phi_2$ of tantalum oxide and aluminum oxidea are given by $\phi_1$=0.45844 and $\phi_2$=1.14932, a reflectance of 2% is obtained at a wavelength of 879 nm. In this case, the film thickness of the layers of the seven-layer reflecting film are given by $Od_2/Ad_1/Ad_2/Bd_1/Bd_2/Cd_1/Cd_2$=19.85 nm/68.59 nm/218.35 nm/62.36 nm/198.50 nm/62.36 nm/198.50 nm. The total thickness $(d_{total}=\Sigma d_i)$ of the film is 828.51 nm. A sum $\Sigma n_i d_i$ of products $n_i d_i$ of refractive index $n_i$ and film thickness $d_i$ of a layer denoted with i in the seven films is 1426.66 nm which is very large, i.e., about 5.82 times a 1/4 wavelength (=245 nm) of the predetermined wavelength of 980 nm. For this reason, a heat-radiation characteristic on the end face is improved, and the temperature of the end face can be suppressed from increasing.

FIG. 7 is a graph of a wavelength dependence of the reflectance of the seven-layer reflecting film. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 861 nm to a wavelength of 1098 nm ranges from a minimal value of 1.3% to 4.0%. In this case, the flat portion centering around a predetermined wavelength of 980 nm of guided light can be obtained. With reference to the reflectance of 2.0% at the setting wavelength 879 nm, a continuous wavelength bandwidth $\Delta\lambda$ in the range of −1.0% to +2.0%, i.e., 1.0% to 4.0% is 237 nm. A value obtained by dividing the wavelength band by the setting wavelength of 879 nm is about 0.270, and is larger than 0.061 in the hypothetical reflecting film. Therefore, as described above, it is understood that, although the seven-layer reflecting film has a film thickness which is larger than the 5/4 wavelength of the predetermined wavelength of 980 nm of the guided light, the seven-layer reflecting film has a flat portion having a low reflectance over a wide wavelength band. Here, the "predetermined wavelength" means the wavelength of light guided through a waveguide layer. In this case, light having a wavelength of 980 nm is used. On the other hand, the "setting wavelength" means a wavelength which is set such that the predetermined wavelength is almost set at the center of the flat portion having the low reflection.

Figure 8:
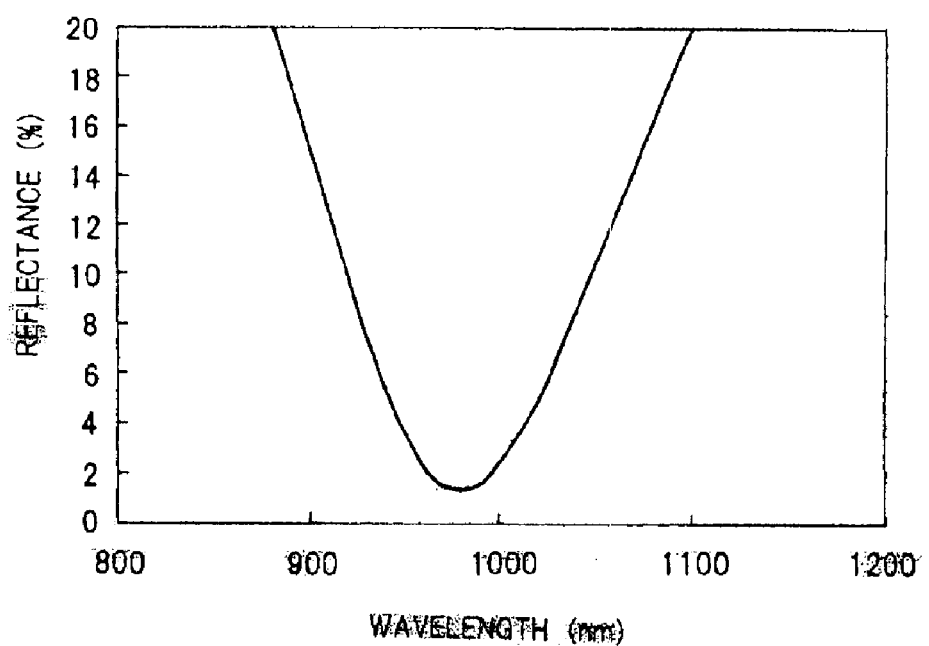
FIG. 8 is a graph of a wavelength dependence of a reflectance in an hypothetical reflecting film formed on an end face portion.

The widths of the wavelength bands each having a reflectance of +2.0% with reference to a minimal reflectance in the seven-layer reflecting film and the hypothetical reflecting film will be compared and considered. The minimal reflectance of the seven-layer reflecting film is 1.3%. For this reason, a wavelength range in which a reflectance of +2.0% is obtained with reference to the minimal reflectance, i.e., a range in which a reflectance of 3.3% or less is obtained is from a wavelength 866 nm to 1089 nm. More specifically, the wavelength band is 223 nm. On the other hand, in order to realize the equal minimal reflectance by an hypothetical reflecting film, since an effective refractive index $n_c$=3.37 is satisfied, a refractive index $n_f$ of the single-layer film may be set at 1.637 or 2.058. For example, FIG. 8 shows a wavelength dependence of an hypothetical reflecting film having a refractive index $n_f$=1.637 and a film thickness d=5λ/(4$n_f$). A range in which a reflectance is lower than the minimal reflectance +2.0% with reference to the minimal reflectance of 1.3% of the hypothetical reflecting film is from a wavelength of 952 nm to a wavelength of 1009 nm. More specifically, the wavelength band is 57 nm. Therefore, a wavelength band of a low reflectance in the seven-layer reflecting film is considerably wider than that in the hypothetical reflecting film having a thickness of d=5λ/(4$n_f$).

Third Embodiment

A semiconductor optical device having a seven-layer reflecting film according to the third embodiment of the present invention will be described below with reference to FIG. 9. This semiconductor optical device is different from the semiconductor optical device according to the first embodiment in that a setting reflectance $R(\lambda_0)$ is 3.0% at a setting wavelength $\lambda_0$=980 nm. Parameters are given by O=0.2, A=2.4, B=2.0, and C=2.0. In addition, when phase shifts $\phi_1$ and $\phi_2$ of tantalum oxide and aluminum oxide are given by $\phi_1$=0.518834 and $\phi_2$=0.789695, a reflectance of 3.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=15.21 nm/94.42 nm/182.47 nm/78.68 nm/152.06 nm/78.68 nm/152.06 nm. The total thickness $(d_{total}=\Sigma d_i)$ of the film is 753.58 nm. A sum $\Sigma n_i d_i$ of products $n_i d_i$ of refractive index $n_i$ and film thickness $d_i$ of a layer denoted with i in the seven films is 1330.83 nm which is very large, i.e., about 5.43 times a 1/4 wavelength (=245 nm) of the predetermined wavelength of 980 nm. For this reason, a heat-radiation characteristic on the end face is improved, and the temperature of the end face can be suppressed from increasing.

Figure 9:
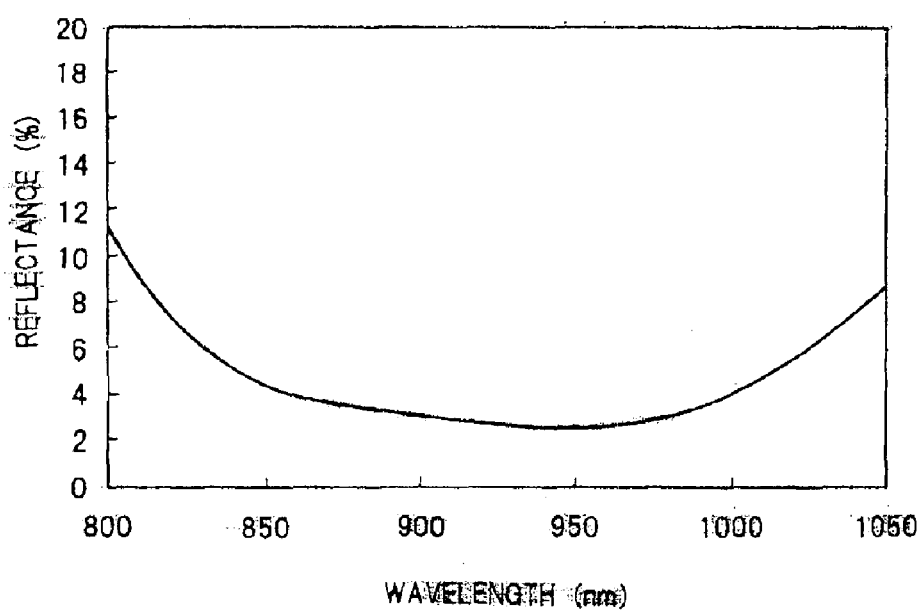
FIG. 9 is a graph of a wavelength dependence of a reflectance on a reflecting multi-layer film formed on an end face portion of a semiconductor optical device according to the third embodiment of the present invention.

FIG. 9 is a graph of a wavelength dependence of the reflectance of the seven-layer reflecting film. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 841 nm to a wavelength of 1014 nm ranges from 2.5% to 5.0%. With reference to the reflectance of 3.0% at the setting wavelength 980 nm, a continuous wavelength band in the range of −1.0% to +2.0%, i.e., 2.0% to 5.0% is 173 nm. A value obtained by dividing the wavelength band by the setting wavelength of 980 nm is about 0.177, and is larger than 0.061 in the hypothetical reflecting film. Therefore, it is understood that the seven-layer reflecting film has a flat portion having a low reflectance over a wide wavelength band.

Fourth Embodiment

A semiconductor optical device having a seven-layer reflecting film according to the fourth embodiment will be described below with reference to FIG. 9. This semiconductor optical device is different from the semiconductor optical device according to the third embodiment in that a setting reflectance $R(\lambda_0)$ is 3.0% at a setting wavelength $\lambda_0$=1035 nm. Parameters are given by O=0.2, A=2.4, B=2.0, and C=2.0. In addition, when phase shifts φ1 and φ2 of tantalum oxide and aluminum oxide are given by φ1=0.518834 and φ2=0.789695, a reflectance of 3% is obtained at a wavelength of 1035 nm. In this case, the film thickness of the layers of the seven-layer reflecting film are given by $Od_2/Ad_1/Ad_2/Bd_1/Bd_2/Cd_1/Cd_2$=16.06 nm/99.72 nm/192.72 nm/83.10 nm/160.60 nm/83.10 nm/160.60 nm. The total thickness ($d_{total}=\Sigma d_i$) of the film is 795.9 nm. A sum $\Sigma n_i d_i$ of products $n_i d_i$ of refractive index $n_i$ and film thickness $d_i$ of a layer denoted with i in the seven films is 1405.57 nm which is very large, i.e., about 5.43 times a ¼ wavelength (=258.75 nm) of the predetermined wavelength of 980 nm. For this reason, a heat-radiation characteristic on the end face is improved, and the temperature of the end face can be suppressed from increasing.

Figure 10:
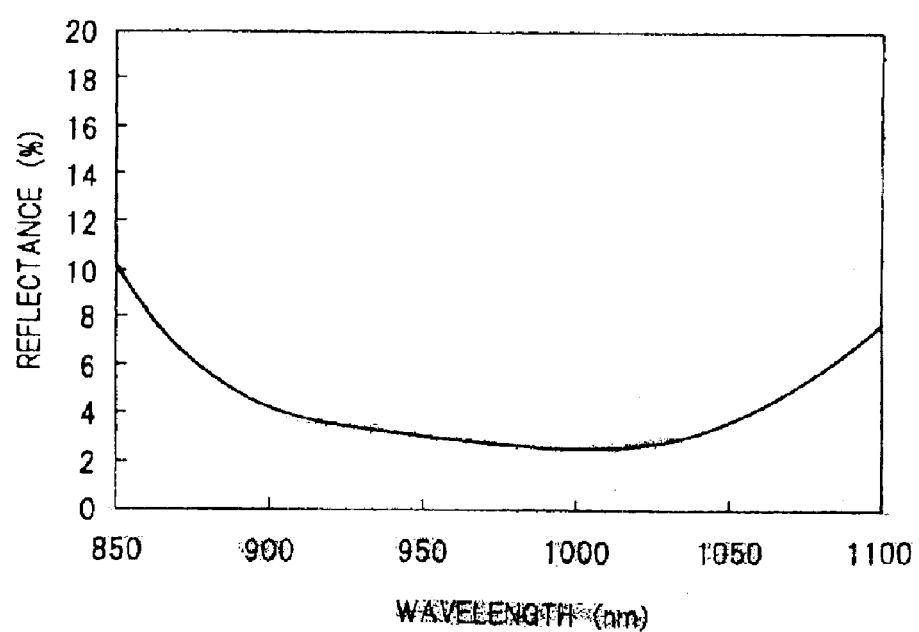
FIG. 10 is a graph of a wavelength dependence of a reflectance on a reflecting multi-layer film formed on an end face portion of a semiconductor optical device according to the fourth embodiment of the present invention.

FIG. 10 is a graph of a wavelength dependence of the reflectance of the seven-layer reflecting film. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 888 nm to a wavelength of 1071 nm ranges from 2.5% to 5.0%. With reference to the reflectance of 3.0% at the setting wavelength 1035 nm, a continuous wavelength band in the range of −1.0% to +2.0%, i.e., 2.0% to 5.0% is 183 nm. A value obtained by dividing the wavelength band by the setting wavelength of 1035 nm is about 0.177, and is larger than 0.061 in the hypothetical reflecting film. Therefore, it is understood that the seven-layer reflecting film has a flat portion having a low reflectance over a wide wavelength band.

Fifth Embodiment

A semiconductor optical device having a seven-layer reflecting film according to the fifth embodiment of the present invention will be described below with reference to FIG. 11. This semiconductor optical device is different from the semiconductor optical device according to the first embodiment in that a setting reflectance $R(\lambda_0)$ is 4.0% at a setting wavelength $\lambda_0$=980 nm. Parameters are given by O=0.15, A=2.5, B=2.0, and C=2.0. In addition, when phase shifts φ1 and φ2 of tantalum oxide and aluminum oxide are given by φ1=0.52082 and φ2=0.767337, a reflectance of 4.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=11.08 nm/98.73 nm/184.70 nm/78.98 nm/147.76 nm/78.98 nm/147.76 nm. The total thickness ($d_{total}=\Sigma d_i$) of the film is 747.99 nm. A sum $\Sigma n_i d_i$ of products $n_i d_i$ of refractive index $n_i$ and film thickness $d_i$ of a layer denoted with i in the seven films is 1323.92 nm which is very large, i.e., about 5.40 times a ¼ wavelength (=245 nm) of the predetermined wavelength of 980 nm. For this reason, a heat-radiation characteristic on the end face is improved, and the temperature of the end face can be suppressed from increasing.

Figure 11:
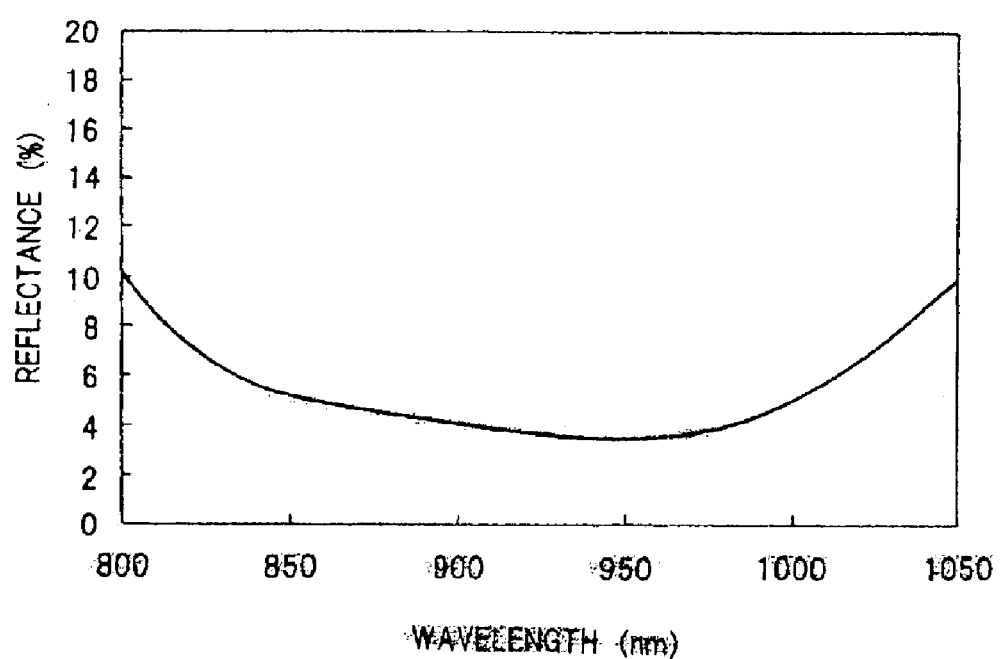
FIG. 11 is a graph of a wavelength dependence of a reflectance on a reflecting multi-layer film formed on an end face portion of a semiconductor optical device according to the fifth embodiment of the present invention.

FIG. 11 is a graph of a wavelength dependence of the reflectance of the seven-layer reflecting film. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 834 nm to a wavelength of 1012 nm ranges from 3.5% to 6.0%. With reference to the reflectance of 4.0% at the setting wavelength 980 nm, a continuous wavelength band in the range of −1.0% to +2.0%, i.e., 3.0% to 6.0% is 178 nm. A value obtained by dividing the wavelength band by the setting wavelength of 980 nm is about 0.182, and is larger than 0.061 in the hypothetical reflecting film. Therefore, it is understood that the seven-layer reflecting film has a flat portion having a low reflectance over a wide wavelength band.

Sixth Embodiment

A semiconductor optical device having a seven-layer reflecting film according to the sixth embodiment will be described below with reference to FIG. 12. This semiconductor optical device is different from the semiconductor optical device according to the fifth embodiment in that a setting reflectance $R(\lambda_0)$ is 4.0% at a setting wavelengths =1040 nm. Parameters are given by O=0.15, A=2.5, B=2.0, and C=2.0. In addition, when phase shifts φ1 and φ2 of tantalum oxide and aluminum oxide are given by φ1=0.52082 and φ2=0.767337, a reflectance of 4% is obtained at a wavelength of 1040 nm. In this case, the film thickness of the layers of the seven-layer reflecting film are given by $Od_2/Ad_1/Ad_2/Bd_1/Bd_2/Cd_1/Cd_2$=11.76 nm/104.77 nm/196.00 nm/83.82 nm/156.80 nm/83.82 nm/156.80 nm. The total thickness ($d_{total}=\Sigma d_i$) of the film is 793.77 nm. A sum $\Sigma n_i d_i$ of products $n_i d_i$ of refractive index $n_i$ and film thickness $d_i$ of a layer denoted with i in the seven films is 1404.95 nm which is very large, i.e., about 5.73 times a ¼ wavelength (=245 nm) of the predetermined wavelength of 980 nm. For this reason, a heat-radiation characteristic on the end face is improved, and the temperature of the end face can be suppressed from increasing.

Figure 12:
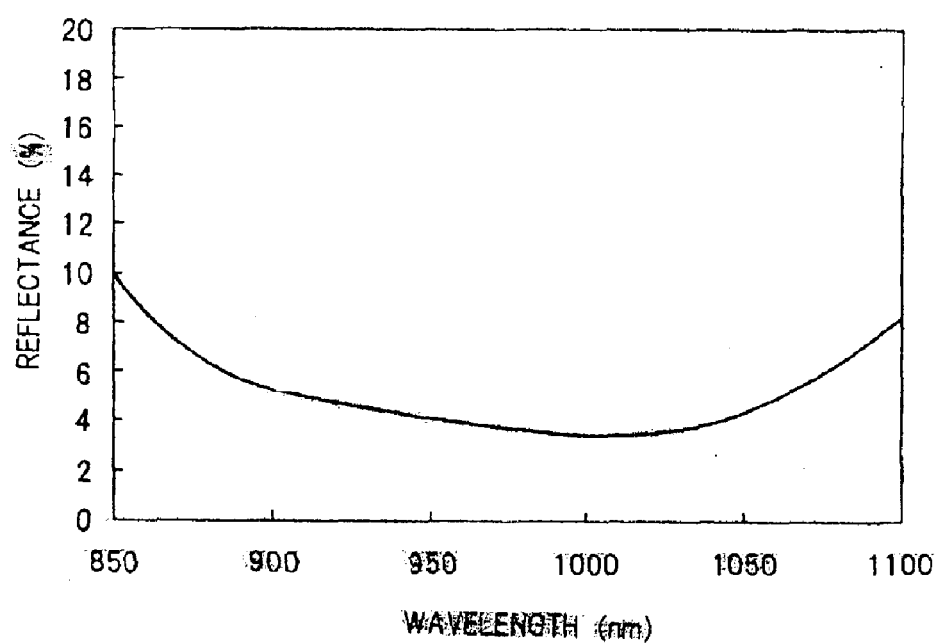
FIG. 12 is a graph of a wavelength dependence of a reflectance on a reflecting multi-layer film formed on an end face portion of a semiconductor optical device according to the sixth embodiment of the present invention.

FIG. 12 is a graph of a wavelength dependence of the reflectance of the seven-layer reflecting film. The abscissa of the graph indicates a wavelength, and the ordinate denotes a reflectance. In the seven-layer reflecting film, a flat portion having about 5% of a target reflectance over a wide wavelength band can be obtained. More specifically, the reflectance in the range of a wavelength of 885 nm to a wavelength of 1074 nm ranges from 3.5% to 6.0%. With reference to the reflectance of 4.0% at the setting wavelength 1040 nm, a continuous wavelength band in the range of −1.0% to +2.0%, i.e., 3.0% to 6.0% is 189 nm. A value obtained by dividing the wavelength band by the setting wavelength of 1040 nm is about 0.1827, and is larger than 0.061 in the hypothetical reflecting film. Therefore, it is understood that the seven-layer reflecting film has a flat portion having a low reflectance over a wide wavelength band.

Seventh Embodiment

A semiconductor optical device having a seven-layer reflecting film according to the seventh embodiment of the present invention will be described below with reference to FIG. 13. This semiconductor optical device is different from the semiconductor optical device according to the first embodiment in that a setting reflectance $R(\lambda_0)$ is 5.0% at a setting wavelength $\lambda_0$=980 nm. Parameters are given by O=0.15, A=2.5, B=2.0, and C=2.0. In addition, when phase shifts φ1 and φ2 of tantalum oxide and aluminum oxide are given by φ1=0.541022 and φ2=0.741397, a reflectance of 5.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=10.71 nm/102.56 nm/178.45 nm/82.05 nm/142.76 nm/82.05 nm/142.76 nm. The total thickness ($d_{total}=\Sigma d_i$) of the film is 741.34 nm. A sum $\Sigma n_i d_i$ of products $n_i d_i$ of refractive index $n_i$ and film thickness $d_i$ of a layer denoted with i in the seven films is 1391.41 nm which is very large, i.e., about 5.38 times a ¼ wavelength (=245 nm) of the predetermined wavelength of 980 nm. For this reason, a heat-radiation characteristic on the end face is improved, and the temperature of the end face can be suppressed from increasing.

Figure 13:
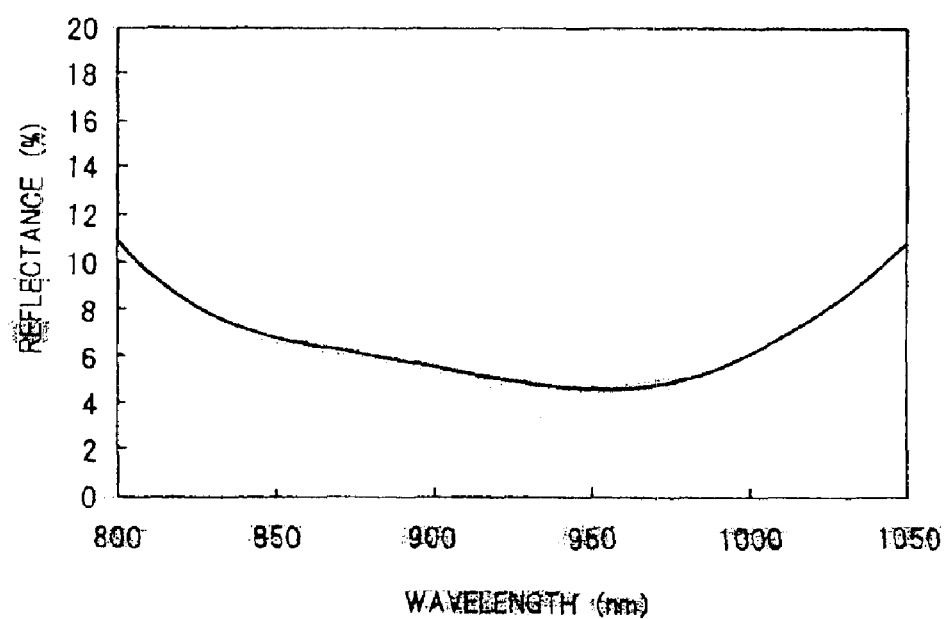
FIG. 13 is a graph of a wavelength dependence of a reflectance on a reflecting multi-layer film formed on an end face portion of a semiconductor optical device according to the seventh embodiment of the present invention.

FIG. 13 is a graph of a wavelength dependence of the reflectance of the seven-layer reflecting film. The abscissa of the graph indicates a wavelength, and the ordinate denotes a reflectance. In the seven-layer reflecting film, a flat portion having about 6% of a target reflectance over a wide wavelength band can be obtained. More specifically, the reflectance in the range of a wavelength of 843 nm to a wavelength of 1013 nm ranges from 4.6% to 7.0%. With reference to the reflectance of 5.0% at the setting wavelength 980 nm, a continuous wavelength band in the range of −1.0% to +2.0%, i.e., 4.0% to 7.0% is 170 nm. A value obtained by dividing the wavelength band by the setting wavelength of 980 nm is about 0.173, and is larger than 0.061 in the hypothetical reflecting film. Therefore, it is understood that the seven-layer reflecting film has a flat portion having a low reflectance over a wide wavelength band.

Eighth Embodiment

A semiconductor optical device having a seven-layer reflecting film according to the eighth embodiment will be described below with reference to FIG. 14. This semiconductor optical device is different from the semiconductor optical device according to the third embodiment in that a setting reflectance $R(\lambda_0)$ is 5.0% at a setting wavelength $\lambda_0$=1035 nm. Parameters are given by O=0.15, A=2.5, B=2.0, and C=2.0. In addition, when phase shifts $\phi 1$ and $\phi 2$ of tantalum oxide and aluminum oxide are given by $\phi 1$=0.541022 and $\phi 2$=0.741397, a reflectance of 5% is obtained at a wavelength of 1035 nm. In this case, the film thickness of the layers of the seven-layer reflecting film are given by $Od_2/Ad_1/Ad_2/Bd_1/Bd_2/Cd_1/Cd_2$=11.31 nm/108.31 nm/188.47 nm/86.65 nm/150.77 nm/86.65 nm/150.77 nm. The total thickness ($d_{total}=\Sigma d_i$) of the film is 782.93 nm. A sum $\Sigma n_i d_i$ of products $n_i d_i$ of refractive index $n_i$ and film thickness $d_i$ of a layer denoted with i in the seven films is 1391.41 nm which is very large, i.e., about 5.68 times a ¼ wavelength (=245 nm) of the predetermined wavelength of 980 nm. For this reason, a heat-radiation characteristic on the end face is improved, and the temperature of the end face can be suppressed from increasing.

Figure 14:
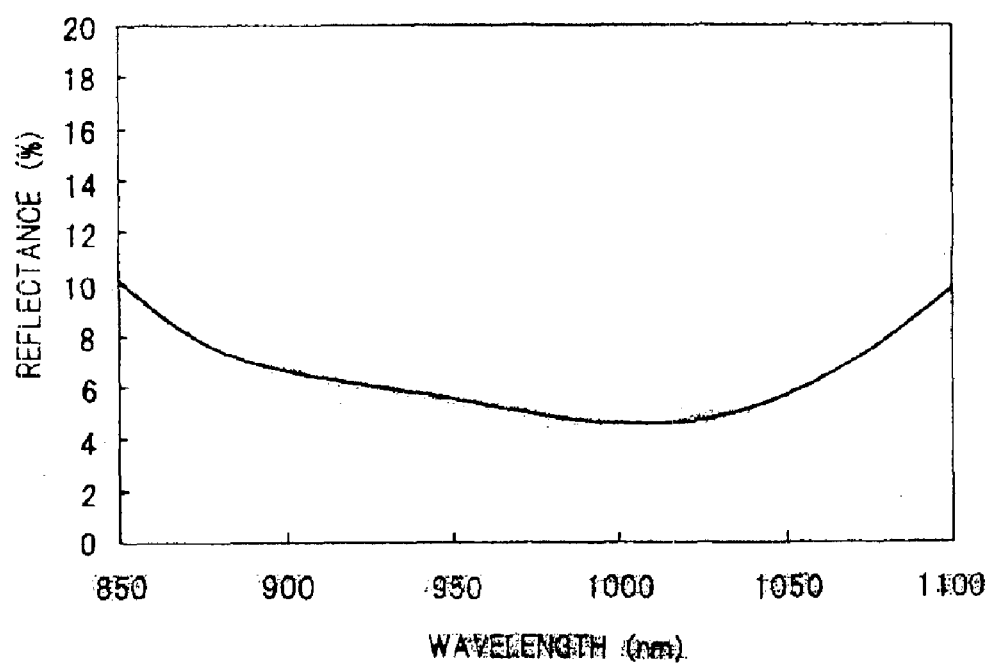
FIG. 14 is a graph of a wavelength dependence of a reflectance on a reflecting multi-layer film formed on an end face portion of a semiconductor optical device according to the eighth embodiment of the present invention.

FIG. 14 is a graph of a wavelength dependence of the reflectance of the seven-layer reflecting film. The abscissa of the graph indicates a wavelength, and the ordinate denotes a reflectance. In the seven-layer reflecting film, a flat portion having about 6% of a target reflectance over a wide wavelength band can be obtained. More specifically, the reflectance in the range of a wavelength of 890 nm to a wavelength of 1070 nm ranges from 4.6% to 7.0%. With reference to the reflectance of 5.0% at the setting wavelength 1035 nm, a continuous wavelength band in the range of −1.0% to +2.0%, i.e., 4.0% to 7.0% is 170 nm. A value obtained by dividing the wavelength band by the setting wavelength of 1035 nm is about 0.164, and is larger than 0.061 in the hypothetical reflecting film. Therefore, it is understood that the seven-layer reflecting film has a flat portion having a low reflectance over a wide wavelength band.

Ninth Embodiment

Figure 15:
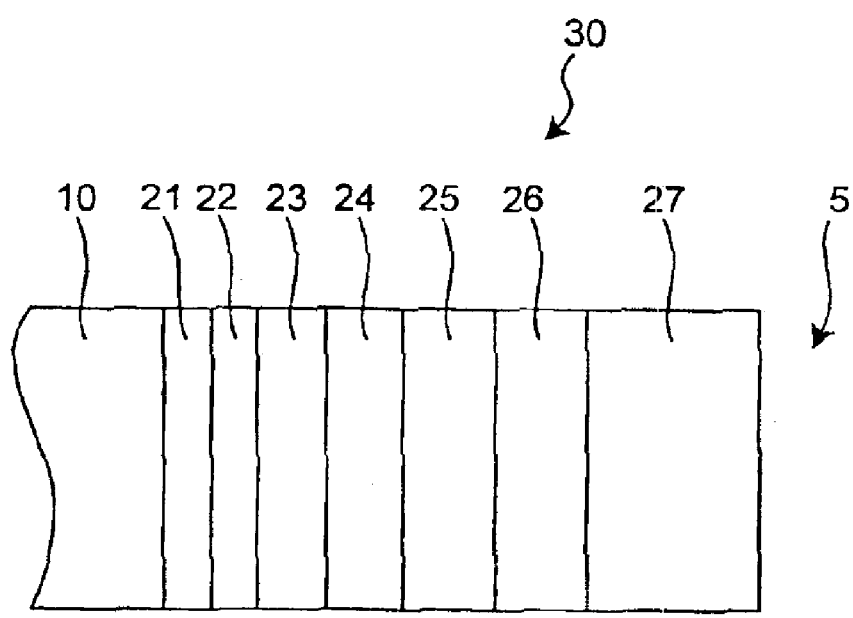
FIG. 15 is a schematic sectional view of the structure of an end face portion of a semiconductor optical device according to the ninth embodiment of the present invention.

A semiconductor optical device having a seven-layer reflecting film according to the ninth embodiment will be described below with reference to FIGS. 15 and 16. FIG. 15 is a schematic sectional view of a configuration in which a seven-layer reflecting film 30 using a tantalum oxide film as a first-layer film is formed as a reflecting film on an end face portion of the semiconductor optical device. This semiconductor optical device is different from the semiconductor optical device according to the first embodiment in that tantalum oxide 21/aluminum oxide 22/tantalum oxide 23/aluminum oxide 24/tantalum oxide 25/aluminum oxide 26/tantalum oxide 27 are sequentially stacked from the waveguide layer 10 side and the first-layer film 21 on the waveguide layer 10 side made of tantalum oxide. More specifically, in the seven-layer reflecting film 30, from the waveguide layer 10 side, a first-layer film 21 (refractive index $n_2$=2.037 and film thickness Od2) made of tantalum oxide, a second-layer film 22 (refractive index $n_1$=1.62 and film thickness Ad1) made of aluminum oxide, a third-layer film 23 (refractive index $n_2$=2.037 and film thickness Ad2) made of tantalum oxide, a fourth-layer film 24 (refractive index $n_1$=1.62 and film thickness Bd1) made of aluminum oxide, a fifth-layer film 25 (refractive index $n_2$=2.037 and film thickness Bd2) made of tantalum oxide, a sixth-layer film 26 (refractive index $n_1$=1.62 and film thickness Cd1) made of aluminum oxide, and a seventh-layer film 27 (refractive index $n_2$=2.037 and film thickness Cd2) made of tantalum oxide. The semiconductor optical device is equal to the semiconductor optical device according to the first embodiment in that films made of aluminum oxide and tantalum oxide are alternately stacked.

In the seven-layer reflecting film 30 on the end face portion of the semiconductor optical device, a setting reflectance $R(\lambda_0)$ is set to be 2.0% at a setting wavelength $\lambda_0$=980 nm. In this case, when parameters are given by O=1.15, A=1.82, B=1.97, and C=2.06, and when phase shifts $\phi 1$ and $\phi 2$ of aluminum oxide and tantalum oxide are given by $\phi 1$=0.645821 and $\phi 2$=1.452041, a reflectance of 2% can be obtained at a wavelength of 980 nm. In this case, the film thickness of the layers of the seven-layer reflecting film are given by $Od_2/Ad_1/Ad_2/Bd_1/Bd_2/Cd_1/Cd_2$=126.62 nm/113.17 nm/200.38 nm/122.49 nm/216.90 nm/128.09 nm/226.81 nm. The total thickness ($d_{total}=\Sigma d_i$) of the film is 1134.46 nm. A sum $\Sigma n_i d_i$ of products $n_i d_i$ of refractive index $n_i$ and film thickness $d_i$ of a layer denoted with i in the seven films is 2174.63 nm which is very large, i.e., about 8.88 times a ¼ wavelength (=245 nm) of the predetermined wavelength of 980 nm. For this reason, a heat-radiation characteristic on the end face is improved, and the temperature of the end face can be suppressed from increasing.

Figure 16:
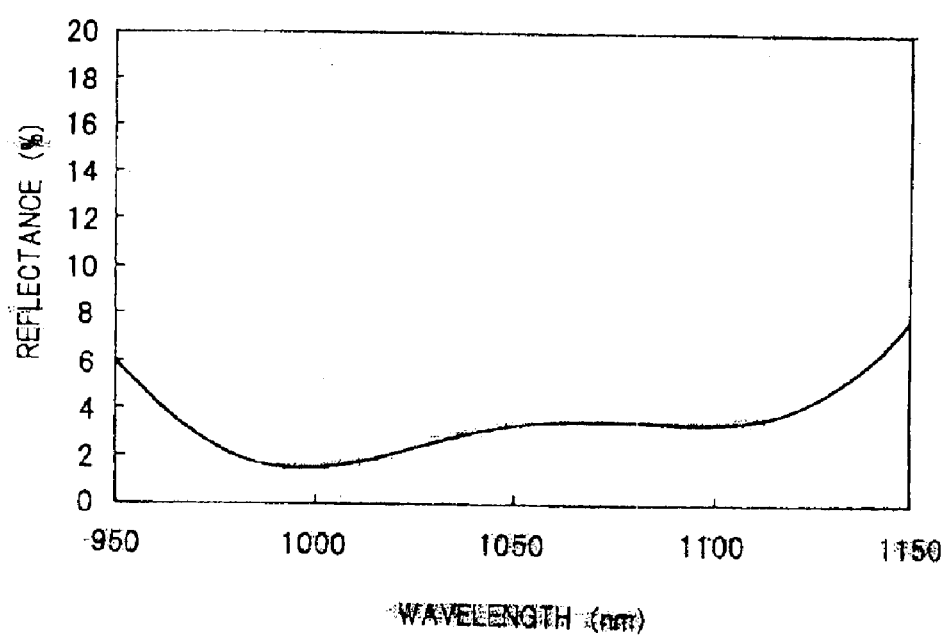
FIG. 16 is a graph of a wavelength dependence of a reflectance on a reflecting multi-layer film formed on the end face portion of the semiconductor optical device according to the ninth embodiment of the present invention.

FIG. 16 is a graph of a wavelength dependence of the reflectance of the seven-layer reflecting film 30. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 996 nm to a wavelength of 1119 nm ranges from 1.5% to 4.0%. With reference to the reflectance of 2.0% at the setting wavelength 980 nm, a continuous wavelength band in the range of −1.0% to +2.0%, i.e., 1.0% to 4.0% is 157 nm. A value obtained by dividing the wavelength band by the setting wavelength of 980 nm is about 0.160, and is larger than 0.061 in the hypothetical reflecting film. Therefore, it is understood that the seven-layer reflecting film has a flat portion having a low reflectance over a wide wavelength band.

Tenth Embodiment

A semiconductor optical device having a seven-layer reflecting film according to the tenth embodiment will be described below with reference to FIG. 17. This semiconductor optical device is different from the semiconductor optical device according to the ninth embodiment in that a setting reflectance $R(\lambda_0)$ is 2.0% at a setting wavelength $\lambda_0$=908 nm. Parameters are given by O=1.15, A=1.82, B=1.97, and C=2.06 In addition, when phase shifts $\phi1$ and $\phi2$ of aluminum oxide and tantalum oxide are given by $\phi1$=0.645821 and $\phi2$=1.452041, a reflectance of 2.0% is obtained at a wavelength of 908 nm. In this case, the film thickness of the layers of the seven-layer reflecting film are given by $Od_2/Ad_1/Ad_2/Bd_1/Bd_2/Cd_1/Cd_2$=117.31 nm/104.85 nm/185.66 nm/113.49 nm/200.96 nm/118.68 nm/210.14 nm. The total thickness ($d_{total}=\Sigma d_i$) of the film is 1051.09 nm. A sum $\Sigma n_i d_i$ of products $n_i d_i$ of refractive index n and film thickness $d_i$ of a layer denoted with i in the seven films is 2014.81 nm which is very large, i.e., about 8.22 times a ¼ wavelength (=245 nm) of the predetermined wavelength of 980 nm. For this reason, a heat-radiation characteristic on the end face is improved, and the temperature of the end face can be suppressed from increasing.

Figure 17:
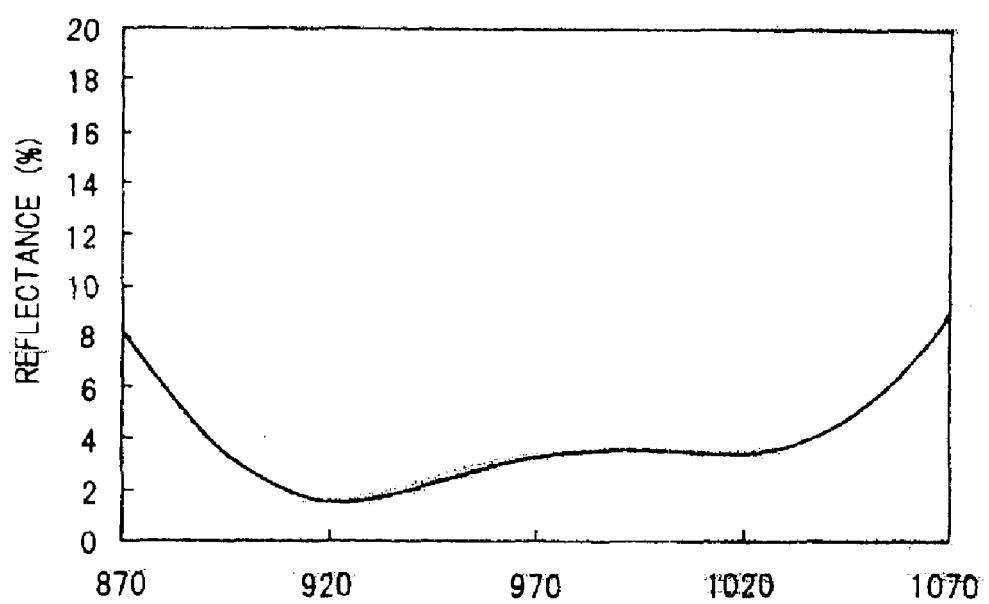
FIG. 17 is a graph of a wavelength dependence of a reflectance on a reflecting multi-layer film formed on an end face portion of a semiconductor optical device according to the tenth embodiment of the present invention.

FIG. 17 is a graph of a wavelength dependence of the reflectance of the seven-layer reflecting film. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 924 nm to a wavelength of 1037 nm ranges from 1.5% to 4.0%. With reference to the reflectance of 2.0% at the setting wavelength 908 nm, a continuous wavelength band in the range of −1.0% to +2.0%, i.e., 1.0% to 4.0% is 145 nm. A value obtained by dividing the wavelength band by the setting wavelength of 908 nm is about 0.160, and is larger than 0.061 in the hypothetical reflecting film. Therefore, it is understood that the seven-layer reflecting film has a flat portion having a low reflectance over a wide wavelength band.

Eleventh Embodiment

A semiconductor optical device having a seven-layer reflecting film according to the eleventh embodiment will be described below with reference to FIG. 18. This semiconductor optical device is different from the semiconductor optical device according to the ninth embodiment in that a setting reflectance $R(\lambda_0)$ is 3.0% at a setting wavelength $\lambda_0$=980 nm. Parameters are given by O=1.15, A=1.82, B=1.97, and C=2.06. In addition, when phase shifts $\phi1$ and $\phi2$ of aluminum oxide and tantalum oxide are given by $\phi1$=0.893399 and $\phi2$=1.26984, a reflectance of 3.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=110.73 nm/156.55 nm/175.24 nm/169.45 nm/189.68 nm/177.19 nm/198.35 nm. The total thickness ($d_{total}=\Sigma d_i$) of the film is 1177.19 nm. A sum $\Sigma n_i d_i$ of products $n_i d_i$ of refractive index $n_i$ and film thickness $d_i$ of a layer denoted with i in the seven films is 2201.59 nm which is very large, i.e., about 8.99 times a ¼ wavelength (=245 nm) of the predetermined wavelength of 980 nm. For this reason, a heat-radiation characteristic on the end face is improved, and the temperature of the end face can be suppressed from increasing.

Figure 18:
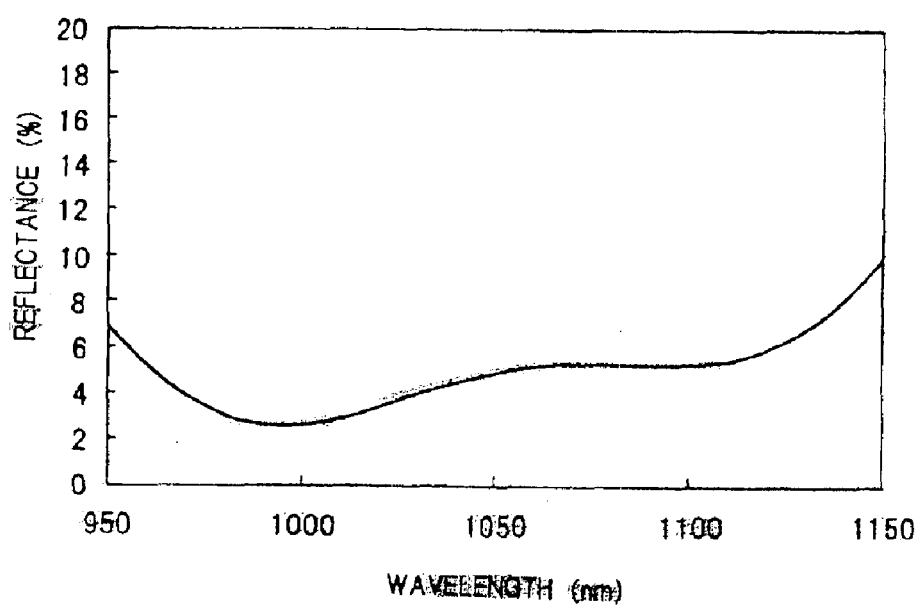
FIG. 18 is a graph of a wavelength dependence of a reflectance on a reflecting multi-layer film formed on an end face portion of a semiconductor optical device according to the eleventh embodiment of the present invention.

FIG. 18 is a graph of a wavelength dependence of the reflectance of the seven-layer reflecting film. The abscissa of the graph indicates a wavelength, and the ordinate denotes a reflectance. In the seven-layer reflecting film, a flat portion having about 4% of a target reflectance over a wide wavelength band can be obtained. More specifically, the reflectance in the range of a wavelength of 962 nm to a wavelength of 1053 nm ranges from 2.6% to 5.0%. With reference to the reflectance of 3.0% at the setting wavelength 980 nm, a continuous wavelength band in the range of −1.0% to +2.0%, i.e., 2.0% to 5.0% is 91 nm. A value obtained by dividing the wavelength band by the setting wavelength of 980 nm is about 0.093, and is larger than 0.061 in the hypothetical reflecting film. Therefore, it is understood that the seven-layer reflecting film has a flat portion having a low reflectance over a wide wavelength band.

Twelfth Embodiment

A semiconductor optical device having a seven-layer reflecting film according to the twelfth embodiment will be described below with reference to FIG. 19. This semiconductor optical device is different from the semiconductor optical device according to the eleventh embodiment in that a setting reflectance $R(\lambda_0)$ is 3.0% at a setting wavelength $\lambda_0$=913 nm. Parameters are given by O=1.15, A=1.82, B=1.97, and C=2.06. In addition, when phase shifts $\phi1$ and $\phi2$ of aluminum oxide and tantalum oxide are given by $\phi1$=0.893399 and $\phi2$=1.26984, a reflectance of 3.0% is obtained at a wavelength of 953 nm. In this case, the film thickness of the layers of the seven-layer reflecting film are given by $Od_2/Ad_1/Ad_2/Bd_1/Bd_2/Cd_1/Cd_2$=103.16 nm/145.85 nm/163.26 nm/157.87 nm/176.72 nm/165.08 nm/184.79 nm. The total thickness ($d_{total}=\Sigma d_i$) of the film is 1096.73 nm. A sum $\Sigma n_i d_i$ of products $n_i d_i$ of refractive index $n_i$ and film thickness $d_i$ of a layer denoted with i in the seven films is 2140.93 nm which is very large, i.e., about 8.74 times a ¼ wavelength (=245 nm) of the predetermined wavelength of 980 nm. For this reason, a heat-radiation characteristic on the end face is improved, and the temperature of the end face can be suppressed from increasing.

Figure 19:
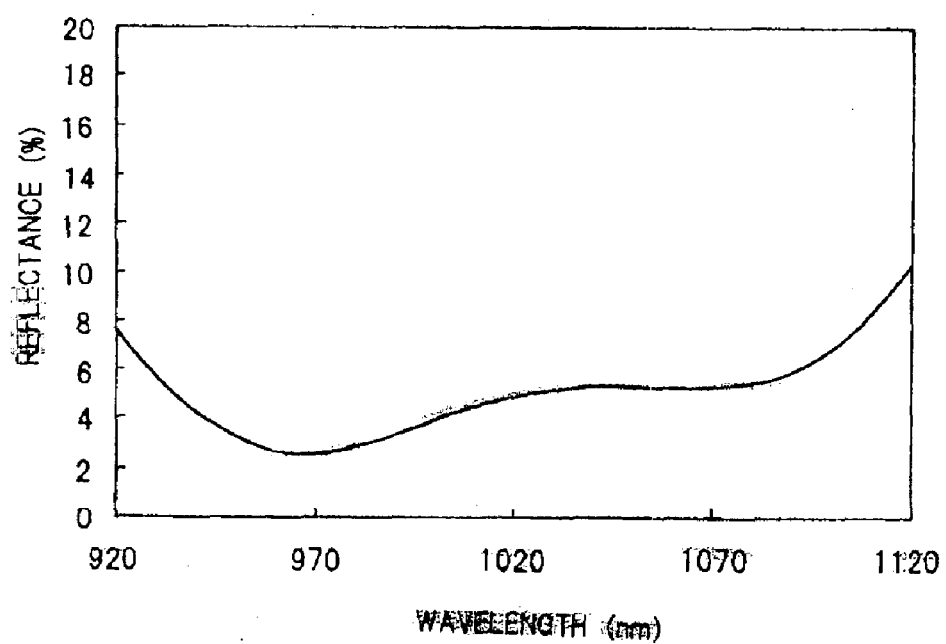
FIG. 19 is a graph of a wavelength dependence of a reflectance on a reflecting multi-layer film formed on an end face portion of a semiconductor optical device according to the twelfth embodiment of the present invention.

FIG. 19 is a graph of a wavelength dependence of the reflectance of the seven-layer reflecting film. The abscissa of the graph indicates a wavelength, and the ordinate denotes a reflectance. In the seven-layer reflecting film, a flat portion having about 4% of a target reflectance over a wide wavelength band can be obtained. More specifically, the reflectance in the range of a wavelength of 962 nm to a wavelength of 1053 nm ranges from 2.6% to 5.0%. With reference to the reflectance of 3.0% at the setting wavelength 953 nm, a continuous wavelength band in the range of −1.0% to +2.0%, i.e., 2.0% to 5.0% is 89 nm. A value obtained by dividing the wavelength band by the setting wavelength of 953 nm is about 0.093, and is larger than 0.061 in the hypothetical reflecting film. Therefore, it is understood that the seven-layer reflecting film has a flat portion having a low reflectance over a wide wavelength band.

Thirteenth Embodiment

A semiconductor optical device having a seven-layer reflecting film according to the thirteenth embodiment will be described below with reference to FIG. 20. This semiconductor optical device is different from the semiconductor optical device according to the ninth embodiment in that a setting reflectance $R(\lambda_0)$ is 4.0% at a setting wavelength $\lambda_0$=980 nm. Parameters are given by O=1.09, A=1.80, B=1.98, and C=2.05. In addition, when phase shifts $\phi1$ and $\phi2$ of aluminum oxide and tantalum oxide are given by $\phi1$=0.922613 and $\phi2$=1.26872, a reflectance of 4.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=104.86 nm/159.89 nm/173.16 nm/175.88 nm/190.48 nm/182.99 nm/198.17 nm. The total thickness ($d_{total}=\Sigma d_i$) of the film is 1185.43 nm. A sum $\Sigma n_i d_i$ of products $n_i d_i$ of refractive index $n_i$ and film thickness $d_i$ of a layer denoted with i in the seven films is 2211.73 nm which is very large, i.e., about 9.03 times a ¼ wavelength (=245 nm) of the predetermined wavelength of 980 nm. For this reason, a heat-radiation characteristic on the end face is improved, and the temperature of the end face can be suppressed from increasing.

Figure 20:
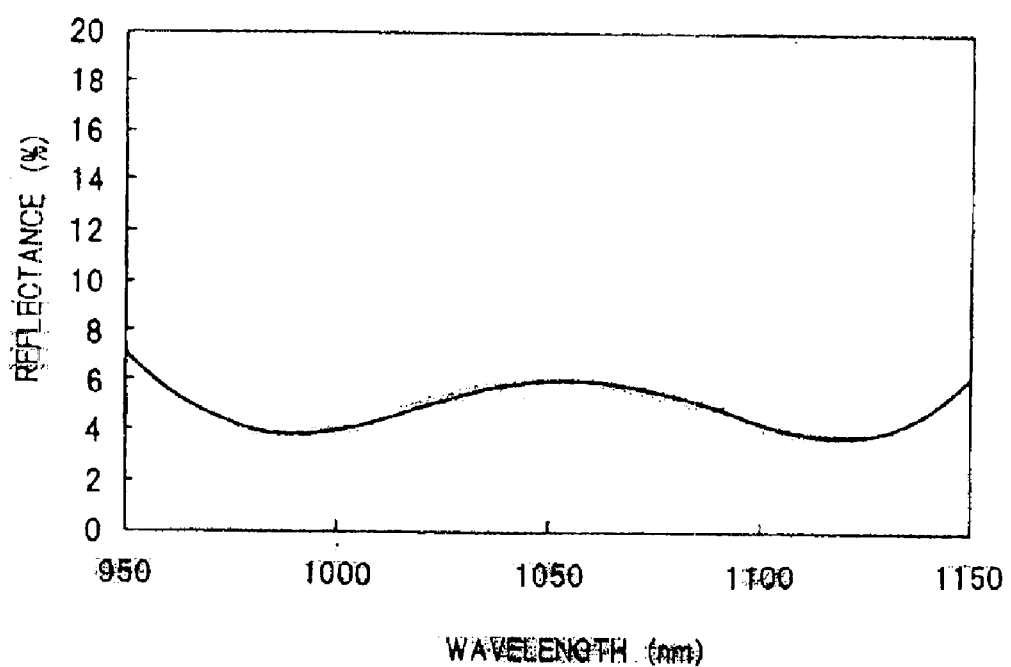
FIG. 20 is a graph of a wavelength dependence of a reflectance on a reflecting multi-layer film formed on an end face portion of a semiconductor optical device according to the thirteenth embodiment of the present invention.

FIG. 20 is a graph of a wavelength dependence of the reflectance of the seven-layer reflecting film. The abscissa of the graph indicates a wavelength, and the ordinate denotes a reflectance. In the seven-layer reflecting film, a flat portion having about 5% of a target reflectance over a wide wavelength band can be obtained. More specifically, the reflectance in the range of a wavelength of 890 nm to a wavelength of 980 nm ranges from 3.7% to 6.0%. With reference to the reflectance of 4.0% at the setting wavelength 980 nm, a continuous wavelength band in the range of −1.0% to +2.0%, i.e., 3.0% to 6.0% is 190 nm. A value obtained by dividing the wavelength band by the setting wavelength of 980 nm is about 0.093, and is larger than 0.061 in the hypothetical reflecting film. Therefore, it is understood that the seven-layer reflecting film has a flat portion having a low reflectance over a wide wavelength band.

Fourteenth Embodiment

A semiconductor optical device having a seven-layer reflecting film according to the fourteenth embodiment will be described below with reference to FIG. 21. This semiconductor optical device is different from the semiconductor optical device according to the thirteenth embodiment in that a setting reflectance $R(\lambda_0)$ is 4.0% at a setting wavelength $\lambda_0=912$ nm. Parameters are given by O=1.09, A=1.80, B=1.98, and C=2.05. In addition, when phase shifts $\phi 1$ and $\phi 2$ of aluminum oxide and tantalum oxide are given by $\phi 1=0.922613$ and $\phi 2=1.26872$, a reflectance of 4.0% is obtained at a wavelength of 912 nm. In this case, the film thickness of the layers of the seven-layer reflecting film are given by $Od_2/Ad_1/Ad_2/Bd_1/Bd_2/Cd_1/Cd_2=97.58$ nm/148.80 nm/161.15 nm/163.68 nm/177.26 nm/170.29 nm/184.42 nm. The total thickness $(d_{total}=\Sigma d_i)$ of the film is 1103.18 nm. A sum $\Sigma n_i d_i$ of products $n_i d_i$ of refractive index $n_i$ and film thickness $d_i$ of a layer denoted with i in the seven films is 2059.26 nm which is very large, i.e., about 8.41 times a ¼ wavelength (=245 nm) of the predetermined wavelength of 980 nm. For this reason, a heat-radiation characteristic on the end face is improved, and the temperature of the end face can be suppressed from increasing.

Figure 21:
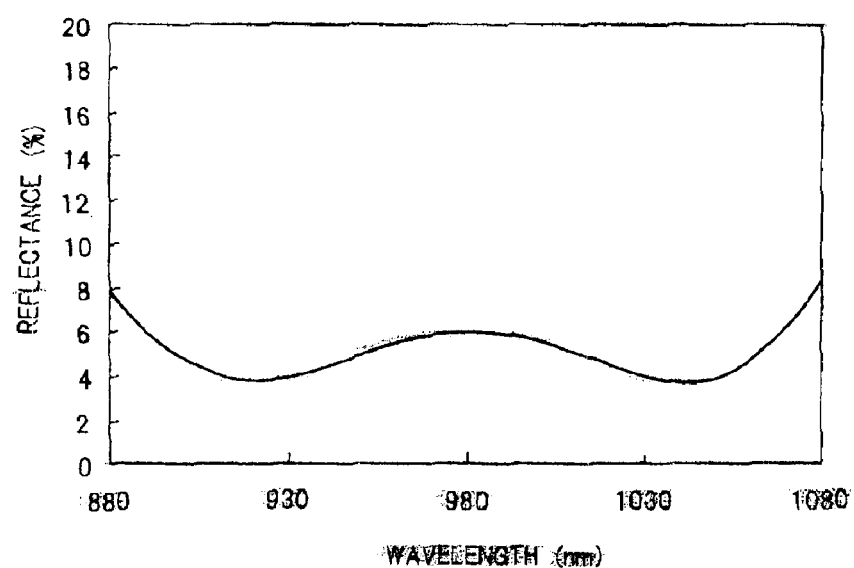
FIG. 21 is a graph of a wavelength dependence of a reflectance on a reflecting multi-layer film formed on an end face portion of a semiconductor optical device according to the fourteenth embodiment of the present invention.

FIG. 21 is a graph of a wavelength dependence of the reflectance of the seven-layer reflecting film. The abscissa of the graph indicates a wavelength, and the ordinate denotes a reflectance. In the seven-layer reflecting film, a flat portion having about 5% of a target reflectance over a wide wavelength band can be obtained. More specifically, the reflectance in the range of a wavelength of 891 nm to a wavelength of 1069 nm ranges from 3.7% to 6.0%. With reference to the reflectance of 4.0% at the setting wavelength 912 nm, a continuous wavelength band in the range of −1.0% to +2.0%, i.e., 3.0% to 6.0% is 178 nm. A value obtained by dividing the wavelength band by the setting wavelength of 1035 nm is about 0.195, and is larger than 0.061 in the hypothetical reflecting film. Therefore, it is understood that the seven-layer reflecting film has a flat portion having a low reflectance over a wide wavelength band.

Fifteenth Embodiment

A semiconductor optical device having a seven-layer reflecting film according to the fifteenth embodiment will be described below with reference to FIG. 22. This semiconductor optical device is different from the semiconductor optical device according to the ninth embodiment in that a setting reflectance $R(\lambda_0)$ is 4.0% at a setting wavelength $\lambda_0=912$ nm. Parameters are given by O=1.13, A=1.76, B=1.98, and C=2.06. In addition, when phase shifts $\phi 1$ and $\phi 2$ of aluminum oxide and tantalum oxide are given by $\phi 1=1.0252$ and $\phi 2=1.18958$, a reflectance of 5.0% is obtained at a wavelength of 912 nm. In this case, the film thickness of the layers of the seven-layer reflecting film are given by $Od_2/Ad_1/Ad_2/Bd_1/Bd_2/Cd_1/Cd_2=101.93$ nm/173.72 nm/158.75 nm/195.44 nm/178.60 nm/203.33 nm/185.81 nm. The total thickness $(d_{total}=\Sigma d_i)$ of the film is 1103.18 nm. A sum $\Sigma n_i d_i$ of products $n_i d_i$ of refractive index $n_i$ and film thickness $d_i$ of a layer denoted with i in the seven films is 2213.24 nm which is very large, i.e., about 9.03 times a 114 wavelength (=245 nm) of the predetermined wavelength of 980 nm. For this reason, a heat-radiation characteristic on the end face is improved, and the temperature of the end face can be suppressed from increasing.

Figure 22:
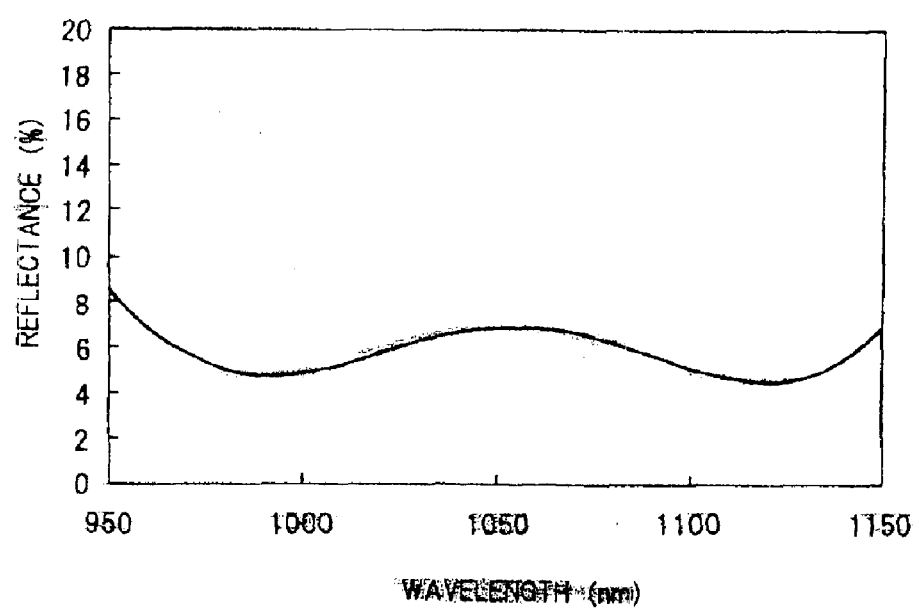
FIG. 22 is a graph of a wavelength dependence of a reflectance on a reflecting multi-layer film formed on an end face portion of a semiconductor optical device according to the fifteenth embodiment of the present invention.

FIG. 22 is a graph of a wavelength dependence of the reflectance of the seven-layer reflecting film. The abscissa of the graph indicates a wavelength, and the ordinate denotes a reflectance. In the seven-layer reflecting film, a flat portion having about 6% of a target reflectance over a wide wavelength band can be obtained. With reference to the reflectance of 5.0% at the setting wavelength 980 nm, a continuous wavelength band in the range of −1.0% to +2.0%, i.e., 4.0% to 7.0% is 190 nm. A value obtained by dividing the wavelength band by the setting wavelength of 980 nm is about 0.194, and is larger than 0.061 in the hypothetical reflecting film. Therefore, it is understood that the seven-layer reflecting film has a flat portion having a low reflectance over a wide wavelength band.

Sixteenth Embodiment

A semiconductor optical device having a seven-layer reflecting film according to the sixteenth embodiment will be described below with reference to FIG. 23. This semiconductor optical device is different from the semiconductor optical device according to the fifteenth embodiment in that a setting reflectance $R(\lambda_0)$ is 5.0% at a setting wavelength $\lambda_0=910$ nm. Parameters are given by O=1.13, A=1.76, B=1.98, and C=2.06. In addition, when phase shifts $\phi 1$ and $\phi 2$ of aluminum oxide and tantalum oxide are given by $\phi 1=1.0252$ and $\phi 2=1.18958$, a reflectance of 5.0% is obtained at a wavelength of 910 nm. In this case, the film thickness of the layers of the seven-layer reflecting film are given by $Od_2/Ad_1/Ad_2/Bd_1/Bd_2/Cd_1/Cd_2=94.65$ nm/161.31 nm/147.41 nm/181.48 nm/165.84 nm/188.81 nm/172.54 nm. The total thickness $(d_{total}=\Sigma d_i)$ of the film is 1112.04 nm. A sum $\Sigma n_i d_i$ of products $n_i d_i$ of refractive index n and film thickness $d_i$ of a layer denoted with i in the seven films is 2055.16 nm which is very large, i.e., about 8.39 times a ¼ wavelength (=245 nm) of the predetermined wavelength of 980 nm. For this reason, a heat-radiation characteristic on the end face is improved, and the temperature of the end face can be suppressed from increasing.

Figure 23:
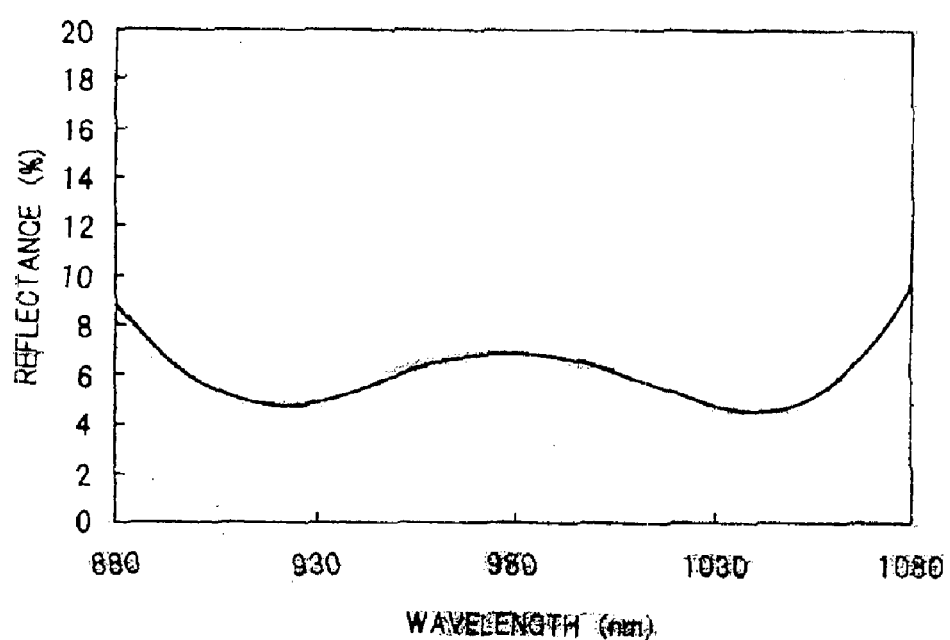
FIG. 23 is a graph of a wavelength dependence of a reflectance on a reflecting multi-layer film formed on an end face portion of a semiconductor optical device according to the sixteenth embodiment of the present invention.

FIG. 23 is a graph of a wavelength dependence of the reflectance of the seven-layer reflecting film. The abscissa of the graph indicates a wavelength, and the ordinate denotes a reflectance. In the seven-layer reflecting film, a flat portion having about 6% of a target reflectance over a wide wavelength band can be obtained. More specifically, the reflectance in the range of a wavelength of 891 nm to a wavelength of 1068 nm ranges from 4.7% to 7.0%. With reference to the reflectance of 5.0% at the setting wavelength 910 nm, a continuous wavelength band in the range of −1.0% to +2.0%, i.e., 4.0% to 7.0% is 177 nm. A value obtained by dividing the wavelength band by the setting wavelength of 910 nm is about 0.195, and is larger than 0.061 in the hypothetical reflecting film. Therefore, it is understood that the seven-layer reflecting film has a flat portion having a low reflectance over a wide wavelength band.

The characteristics of the reflecting multi-layer films of the semiconductor optical elements according to the first embodiment to the sixteenth embodiment are shown in Table 1. In Table 1, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.0 to +2.0% of $R(\lambda_0)$, and ratio of $\Delta\lambda/\lambda_0$ are shown.

seven-layer reflecting film, an amplitude reflectance is expressed by the following equation (13):

$$r = \frac{(m_{11} + m_{12})n_c - (m_{21} + m_{22})}{(m_{11} + m_{12})n_c + (m_{21} + m_{22})} \quad (13)$$

where $m_{ij}$ (i and j are 1 or 2) is expressed by the following equation (14):

$$\begin{pmatrix} m_{11} & m_{12} \\ m_{21} & m_{22} \end{pmatrix} = \quad (14)$$

TABLE 1

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.0 to 2.0 of $R(\lambda_0)$ | Ratio of $\Delta\lambda/\lambda_0$ |
|---|---|---|---|---|---|---|
| 1 | Seven films | 980 nm 2.0% | 1.3% | 1590.57 nm 6.49 times | 242 nm | 242/980 = 0.246 |
| 2 | Seven films | 879 nm 2.0% | 1.3% | 1426.66 nm 5.82 times | 237 nm | 237/879 = 0.270 |
| 3 | Seven films | 980 nm 3.0% | 2.5% | 1330.83 nm 5.43 times | 173 nm | 173/980 = 0.177 |
| 4 | Seven films | 1035 nm 3.0% | 2.5% | 1405.57 nm 5.74 times | 183 nm | 183/1035 = 0.177 |
| 5 | Seven films | 980 nm 4.0% | 3.5% | 1323.92 nm 5.40 times | 178 nm | 178/980 = 0.182 |
| 6 | Seven films | 1040 nm 4.0% | 3.5% | 1405.95 nm 5.73 times | 189 nm | 189/1040 = 0.182 |
| 7 | Seven films | 980 nm 5.0% | 4.6% | 1391.41 nm 5.38 times | 170 nm | 170/980 = 0.173 |
| 8 | Seven films | 1035 nm 5.0% | 4.6% | 1391.41 nm 5.68 times | 170 nm | 170/1035 = 0.164 |
| 9 | Seven films | 980 nm 2.0% | 1.5% | 2174.63 nm 8.88 times | 157 nm | 157/980 = 0.160 |
| 10 | Seven films | 908 nm 2.0% | 1.5% | 2014.81 nm 8.22 times | 145 nm | 145/908 = 0.160 |
| 11 | Seven films | 980 nm 3.0% | 2.6% | 2201.59 nm 8.99 times | 91 nm | 91/980 = 0.093 |
| 12 | Seven films | 953 nm 3.0% | 2.6% | 2140.93 nm 8.74 times | 89 nm | 89/953 = 0.093 |
| 13 | Seven films | 980 nm 4.0% | 3.7% | 2211.73 nm 9.03 times | 190 nm | 190/980 = 0.194 |
| 14 | Seven films | 912 nm 4.0% | 3.7% | 2059.26 nm 8.41 times | 178 nm | 178/912 = 0.195 |
| 15 | Seven films | 980 nm 5.0% | 4.7% | 2213.24 nm 9.03 times | 190 nm | 190/980 = 0.194 |
| 16 | Seven films | 910 nm 5.0% | 4.7% | 2055.16 nm 8.39 times | 177 nm | 177/910 = 0.195 |

Seventeenth Embodiment

Figure 24:
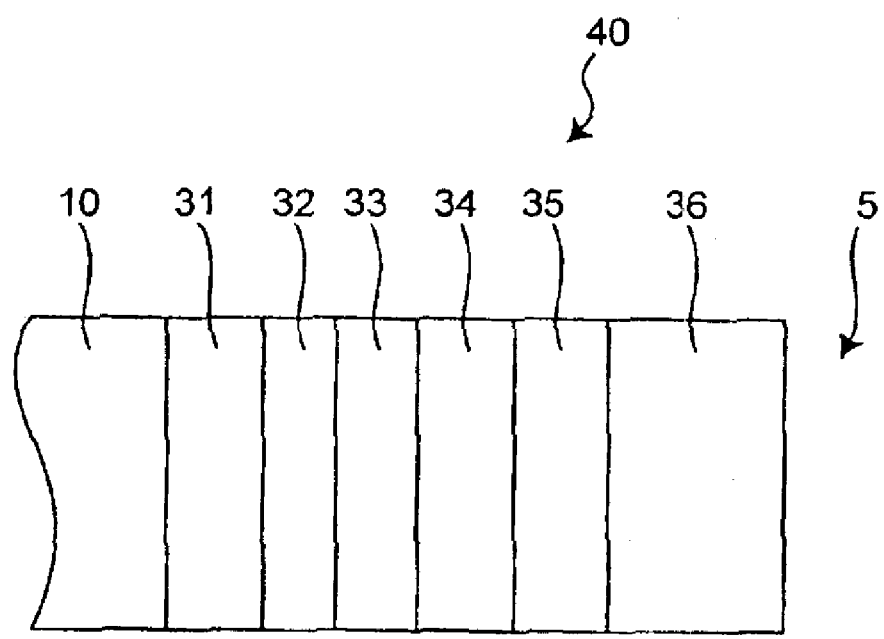
FIG. 24 is a schematic sectional view of the structure of an end face portion of a semiconductor optical device according to the seventeenth embodiment of the present invention.

A semiconductor optical device having a six-layer reflecting film according to the seventeenth embodiment of the present invention will be described below with reference to FIGS. 24 and 25. FIG. 24 is a schematic sectional view of a configuration obtained when a six-layer reflecting film 40 is formed in place of a single-layer reflecting film as a reflecting film on an end face portion of the semiconductor optical element. The semiconductor optical device is different from the semiconductor optical device according to the first embodiment in that the reflecting multi-layer film includes the six-layer reflecting film 40. A condition for setting the reflectance of the six-layer reflecting film 40 to be equal to the reflectance of the hypothetical film will be considered. Also in the six-layer reflecting film 40, as in the -continued $$\begin{pmatrix} \cos A\phi_1 & -\frac{i}{n_1}\sin A\phi_1 \\ -in_1\sin A\phi_1 & \cos A\phi_1 \end{pmatrix} \begin{pmatrix} \cos A\phi_2 & -\frac{i}{n_2}\sin A\phi_2 \\ -in_2\sin A\phi_2 & \cos A\phi_2 \end{pmatrix} \times$$

$$\begin{pmatrix} \cos B\phi_1 & -\frac{i}{n_1}\sin B\phi_1 \\ -in_1\sin B\phi_1 & \cos B\phi_1 \end{pmatrix} \begin{pmatrix} \cos B\phi_2 & -\frac{i}{n_2}\sin B\phi_2 \\ -in_2\sin B\phi_2 & \cos B\phi_2 \end{pmatrix} \times$$

$$\begin{pmatrix} \cos C\phi_1 & -\frac{i}{n_1}\sin C\phi_1 \\ -in_1\sin C\phi_1 & \cos C\phi_1 \end{pmatrix} \begin{pmatrix} \cos C\phi_2 & -\frac{i}{n_2}\sin C\phi_2 \\ -in_2\sin C\phi_2 & \cos C\phi_2 \end{pmatrix}$$

where A, B, and C are parameters representing contributing rates of respective two-layer films (pair) when a film thickness Ad1 of a first-layer film 31, a film thickness Ad2 of a second-layer film 32, a film thickness Bd1 of a third-layer film 33, a film thickness Bd2 of a fourth-layer film 34, a film thickness Cd1 of a fifth-layer film 35, and a film thickness Cd2 of a sixth-layer film 36 are given.

A case in which the six-layer reflecting film 40 is formed on an end face portion of the semiconductor optical device will be described below. FIG. 24 is a schematic sectional view of the configuration of the six-layer reflecting film 40 formed on the end face portion. In this semiconductor optical device, on an end face portion of a waveguide layer 10 (equivalent refractive index $n_c$=3.37), the first-layer film 31 (refractive index $n_1$=2.057 and a film thickness Ad1) made of tantalum oxide, the second-layer film 32 (refractive index $n_2$=1.62 and a film thickness Ad2) made of aluminum oxide, the third-layer film 33 (refractive index $n_1$=2.057 and a film thickness Bd1) made of tantalum oxide, the fourth-layer film 34 (refractive index $n_2$=1.62 and a film thickness Bd2) made of aluminum oxide, the fifth-layer film 35 (refractive index $n_1$=2.057 and a film thickness Cd1) made of tantalum oxide, and the sixth-layer film 36 (refractive index $n_2$=1.62 and a film thickness Cd2) made of aluminum oxide are sequentially stacked. In addition, the six-layer reflecting film 40 is in contact with a free space 5 such as the air.

The reflection characteristic of the six-layer reflecting film 40 formed on the end face portion of the semiconductor optical device will be described below. A setting reflectance $R(\lambda_0)$ is set at 2% when a setting wavelength $\lambda_0$=980 nm. When the parameters are given by A=2.0, B=2.0, and C=2.0, and when phase shifts $\phi 1$ and $\phi 2$ of tantalum oxide and aluminum oxide are given by $\phi 1$=0.792828 and $\phi 2$=0.715471, a reflectance of 2% is obtained. In this case, the film thickness of the layers of the six-layer reflecting film are given by $Ad_1/Ad_2/Bd_1/Bd_2/Cd_1/Cd_2$=120.23 nm/137.77 nm/120.23 nm/137.77 nm/120.23 nm/137.77 nm. The total thickness ($d_{total}=\Sigma d_i$) of the film is 774.0 nm. A sum $\Sigma n_i d_i$ of products $n_i d_i$ of refractive index $n_i$ and film thickness $d_i$ of a layer denoted with i in the six films is 1411.50 nm which is very large, i.e., about 5.76 times a ¼ wavelength (=245 nm) of the predetermined wavelength of 980 nm. For this reason, a heat-radiation characteristic on the end face is improved, and the temperature of the end face can be suppressed from increasing.

Figure 25:
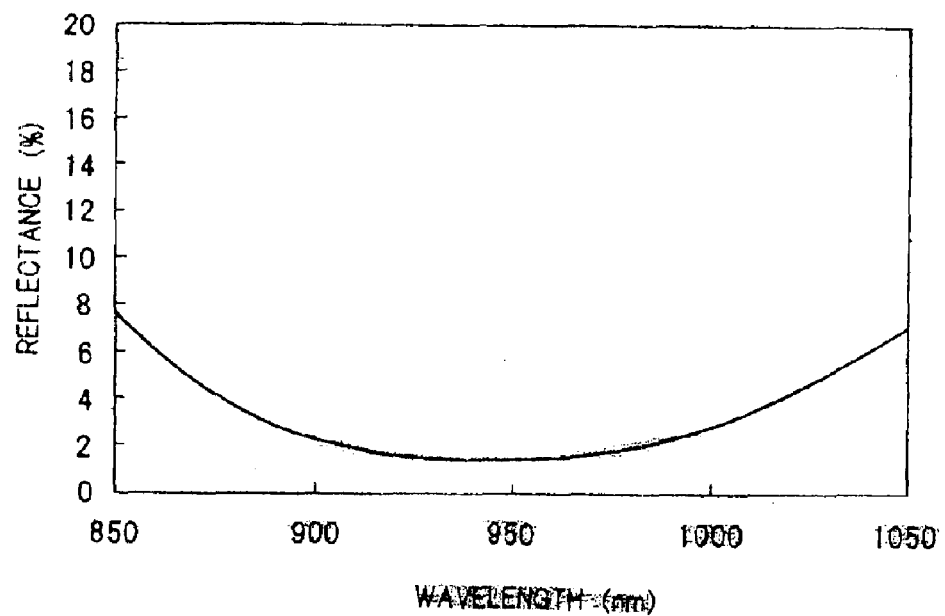
FIG. 25 is a graph of a wavelength dependence of a reflectance on a reflecting multi-layer film formed on the end face portion of the semiconductor optical device according to the seventeenth embodiment of the present invention.

FIG. 25 is a graph of a wavelength dependence of the reflectance of the six-layer reflecting film 40. The abscissa of the graph indicates a wavelength, and the ordinate denotes a reflectance. In this six-layer reflecting film, a flat portion having about 3% of the target reflectance over a wide wavelength band can be obtained. More specifically, the reflectance in the range of a wavelength of 877 nm to a wavelength of 1017 nm ranges from a minimal value of 1.4% to 4.0%. With reference to the reflectance of 2.0% at the setting wavelength 980 nm, a continuous wavelength band in the range of −1.0% to +2.0%, i.e., 1.0% to 4.0% is 140 nm. A value obtained by dividing the wavelength band by the setting wavelength of 980 nm is about 0.143, and is larger than 0.061 in the hypothetical reflecting film. Therefore, it is understood that, the six-layer reflecting film has a flat portion having a low reflectance over a wide wavelength band.

Eighteenth Embodiment

A semiconductor optical device having a six-layer reflecting film according to the eighteenth embodiment of the present invention will be described below with reference to FIG. 26. This semiconductor optical device is different from the semiconductor optical device according to the seventeenth embodiment in that a setting reflectance $R(\lambda_0)$ is 2.0% at a setting wavelength $\lambda_0$=1014 nm. Parameters are given by A=2.0, B=2.0, and C=2.0. In addition, when phase shifts $\phi_1$ and $\phi_2$ of tantalum oxide and aluminum oxide are given by $\phi_1$=0.792828 and $\phi_2$=0.715471, a reflectance of 2.0% is obtained at a wavelength of 1014 nm. In this case, the film thickness of the layers of the six-layer reflecting film are given by $Ad_1/Ad_2/Bd_1/Bd_2/Cd_1/Cd_2$=124.40 nm/142.55 nm/124.40 nm/142.55 nm/124.40 nm/142.55 nm. The total thickness ($d_{total}=\Sigma d_i$) of the film is 800.85 nm. A sum $\Sigma n_i d_i$ of products $n_i d_i$ of refractive index $n_i$ and film thickness $d_i$ of a layer denoted with i in the six films is 1460.47 nm which is very large, i.e., about 5.96 times a ¼ wavelength (=245 nm) of the predetermined wavelength of 980 nm. For this reason, a heat-radiation characteristic on the end face is improved, and the temperature of the end face can be suppressed from increasing.

Figure 26:
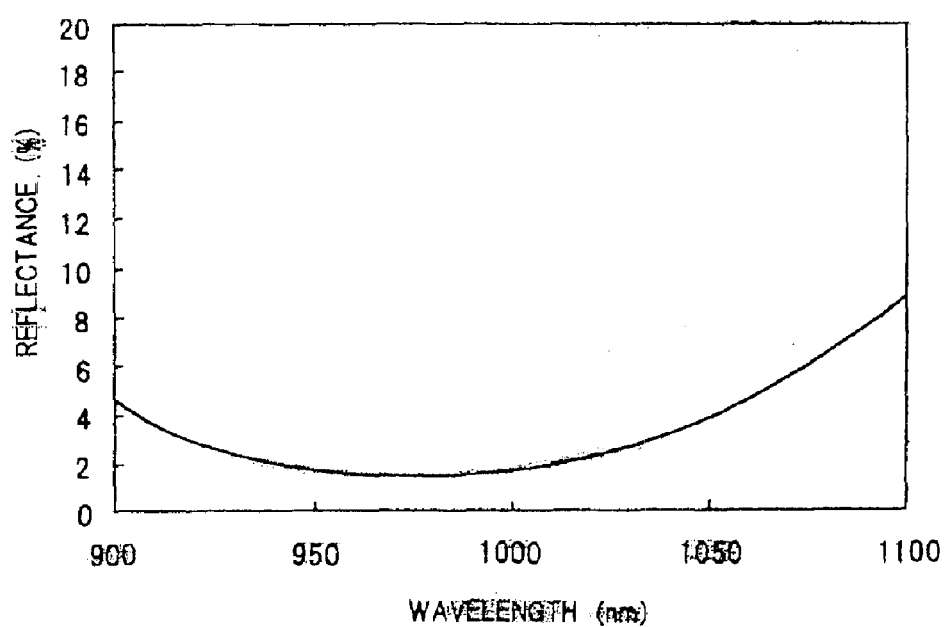
FIG. 26 is a graph of a wavelength dependence of a reflectance on a reflecting multi-layer film formed on the end face portion of the semiconductor optical device according to the eighteenth embodiment of the present invention.

FIG. 26 is a graph of a wavelength dependence of the reflectance of the six-layer reflecting film 40. The abscissa of the graph indicates a wavelength, and the ordinate denotes a reflectance. In the six-layer reflecting film, a flat portion having about 3% of a target reflectance over a wide wavelength band can be obtained. More specifically, the reflectance in the range of a wavelength of 907 nm to a wavelength of 1053 nm ranges from 1.4% to 4.0%. With reference to the reflectance of 2.0% at the setting wavelength 1014 nm, a continuous wavelength band in the range of −1.0% to +2.0%, i.e., 1.0% to 4.0% is 146 nm. A value obtained by dividing the wavelength band by the setting wavelength of 1014 nm is about 0.144, and is larger than 0.061 in the hypothetical reflecting film. Therefore, it is understood that the six-layer reflecting film 40 has a flat portion having a low reflectance over a wide wavelength band.

Nineteenth Embodiment

A semiconductor optical device having a six-layer reflecting film according to the nineteenth embodiment of the present invention will be described below with reference to FIG. 27. This semiconductor optical device is different from the semiconductor optical device according to the seventeenth embodiment in that a setting reflectance $R(\lambda_0)$ is 3.0% at a setting wavelength $\lambda_0$=980 nm. Parameters are given by A=1.94, B=1.90, and C=2.2. In addition, when phase shifts $\phi_1$ and $\phi_2$ of tantalum oxide and aluminum oxide are given by $\phi_1$=0.948585 and $\phi_2$=0.476939, a reflectance of 3.0% is obtained at a wavelength of 980 nm. In this case, the film thickness of the layers of the six-layer reflecting film are given by $Ad_1/Ad_2/Bd_1/Bd_2/Cd_1/Cd_2$=139.54 nm/89.08 nm/136.66 nm/87.25 nm/158.24 nm/101.02 nm. The total thickness ($d_{total}=\Sigma d_i$) of the film is 711.79 nm. A sum $\Sigma n_i d_i$ of products $n_i d_i$ of refractive index $n_i$ and film thickness $d_i$ of a layer denoted with i in the six films is 1342.95 nm which is very large, i.e., about 5.48 times a ¼ wavelength (=245 nm) of the predetermined wavelength of 980 nm. For this reason, a heat-radiation characteristic on the end face is improved, and the temperature of the end face can be suppressed from increasing.

Figure 27:
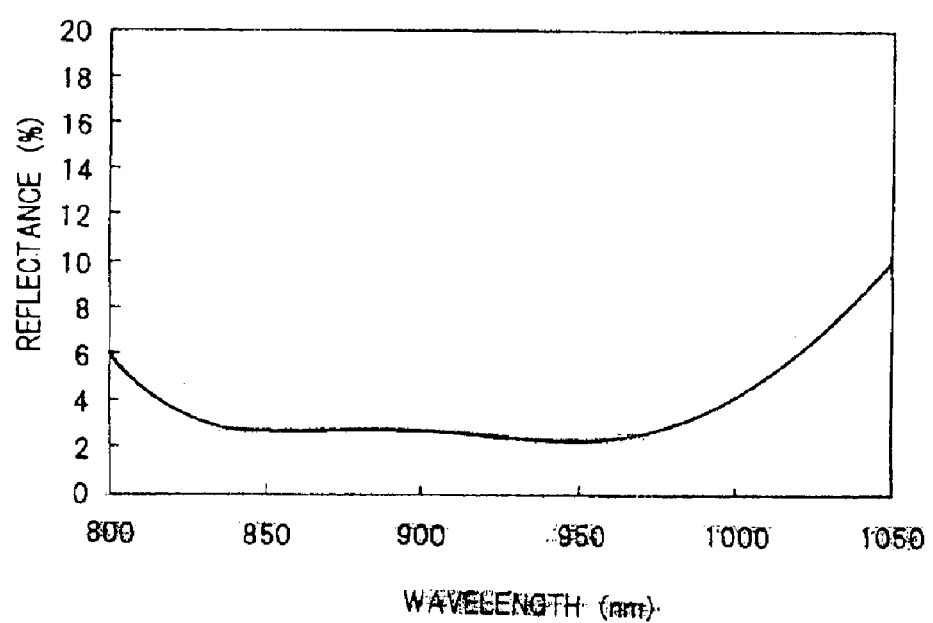
FIG. 27 is a graph of a wavelength dependence of a reflectance on a reflecting multi-layer film formed on an end face portion of a semiconductor optical device according to the nineteenth embodiment of the present invention.

FIG. 27 is a graph of a wavelength dependence of the reflectance of the six-layer reflecting film 40. The abscissa of the graph indicates a wavelength, and the ordinate denotes a reflectance. In the six-layer reflecting film, a flat portion having about 4% of a target reflectance over a wide wavelength band can be obtained. More specifically, the reflectance in the range of a wavelength of 806 nm to a wavelength of 1009 nm ranges from 2.3% to 5.0%. With reference to the reflectance of 3.0% at the setting wavelength 980 nm, a continuous wavelength band in the range of −1.0% to +2.0%, i.e., 2.0% to 5.0% is 203 nm. A value obtained by dividing the wavelength band by the setting wavelength of 980 nm is about 0.207, and is larger than 0.061 in the hypothetical reflecting film. Therefore, it is understood that the six-layer reflecting film 40 has a flat portion having a low reflectance over a wide wavelength band.

Twentieth Embodiment

A semiconductor optical device having a six-layer reflecting film according to the twentieth embodiment of the present invention will be described below with reference to FIG. 28. This semiconductor optical device is different from the semiconductor optical device according to the nineteenth embodiment in that a setting reflectance $R(\lambda_0)$ is 3.0% at a setting wavelength $\lambda_0 = 1052$ nm. Parameters are given by A=1.94, B=1.90, and C=2.2. In addition, when phase shifts $\phi1$ and $\phi2$ of tantalum oxide and aluminum oxide are given by $\phi1$=0.948585 and $\phi2$=0.476939, a reflectance of 3.0% is obtained at a wavelength of 1052 nm. In this case, the film thickness of the layers of the six-layer reflecting film are given by $Ad_1/Ad_2/Bd_1/Bd_2/Cd_1/Cd_2$=150.64 nm/96.17 nm/147.54 nm/94.19 nm/170.83 nm/109.06 nm. The total thickness ($d_{total}=\Sigma d_i$) of the film is 768.43 nm. A sum $\Sigma n_i d_i$ of products $n_i d_i$ of refractive index $n_i$ and film thickness $d_i$ of a layer denoted with i in the six films is 1449.81 nm which is very large, i.e., about 5.92 times a ¼ wavelength (=245 nm) of the predetermined wavelength of 980 nm. For this reason, a heat-radiation characteristic on the end face is improved, and the temperature of the end face can be suppressed from increasing.

Figure 28:
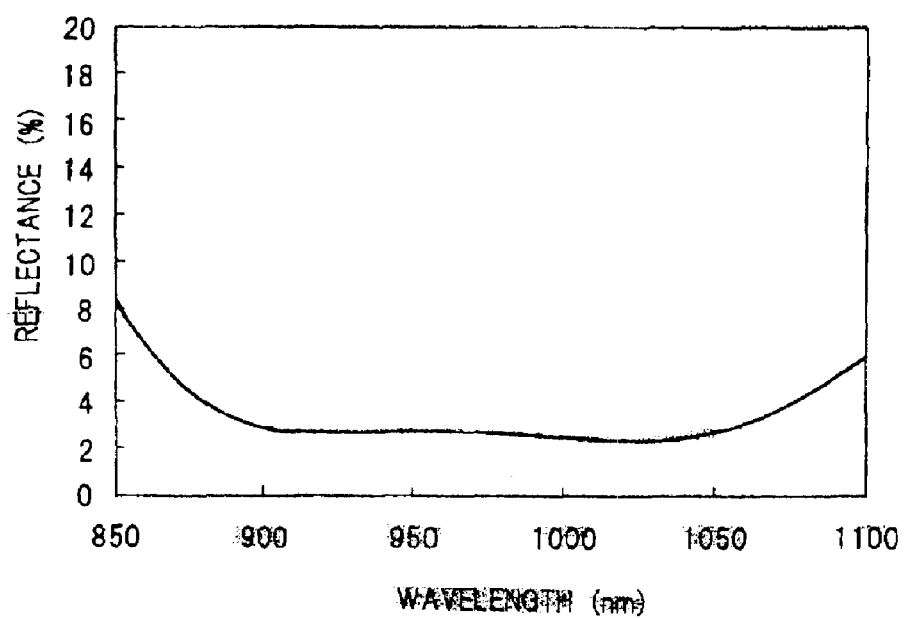
FIG. 28 is a graph of a wavelength dependence of a reflectance on a reflecting multi-layer film formed on an end face portion of a semiconductor optical device according to the twentieth embodiment of the present invention.

FIG. 28 is a graph of a wavelength dependence of the reflectance of the six-layer reflecting film 40. The abscissa of the graph indicates a wavelength, and the ordinate denotes a reflectance. In the six-layer reflecting film, a flat portion having about 4% of a target reflectance over a wide wavelength band can be obtained. More specifically, the minimal reflectance is 2.3%. With reference to the reflectance of 3.0% at the setting wavelength 1052 nm, a continuous wavelength band in the range of −1.0% to +2.0%, i.e., 2.0% to 5.0% is 218 nm. A value obtained by dividing the wavelength band by the setting wavelength of 1052 nm is about 0.207, and is larger than 0.061 in the hypothetical reflecting film. Therefore, it is understood that the six-layer reflecting film 40 has a flat portion having a low reflectance over a wide wavelength band.

Twenty-first Embodiment

A semiconductor optical device having a six-layer reflecting film according to the twenty-first embodiment of the present invention will be described below with reference to FIG. 29. This semiconductor optical device is different from the semiconductor optical device according to the seventeenth embodiment in that a setting reflectance $R(\lambda_0)$ is 4.0% at a setting wavelength $\lambda_0$=980 nm. Parameters are given by A=1.94, B=1.90, and C=2.2. In addition, when phase shifts $\phi1$ and $\phi2$ of tantalum oxide and aluminum oxide are given by $\phi1$=0.98561 and $\phi2$=0.417545, a reflectance of 4.0% is obtained at a wavelength of 980 nm. In this case, the film thickness of the layers of the six-layer reflecting film are given by $Ad_1/Ad_2/Bd_1/Bd_2/Cd_1/Cd_2$=144.98 nm/77.99 nm/141.99 nm/76.38 nm/164.41 nm/188.44 nm. The total thickness ($d_{total}=\Sigma d_i$) of the film is 794.19 nm. A sum $\Sigma n_i d_i$ of products $n_i d_i$ of refractive index $n_i$ and film thickness $d_i$ of a layer denoted with i in the six films is 1483.84 nm which is very large, i.e., about 6.06 times a ¼ wavelength (=245 nm) of the predetermined wavelength of 980 nm. For this reason, a heat-radiation characteristic on the end face is improved, and the temperature of the end face can be suppressed from increasing.

Figure 29:
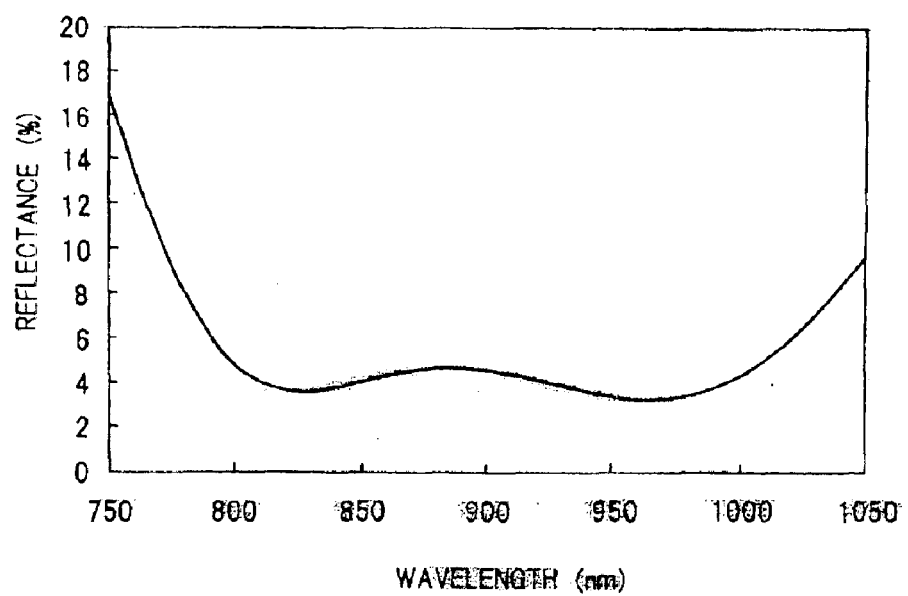
FIG. 29 is a graph of a wavelength dependence of a reflectance on a reflecting multi-layer film formed on an end face portion of a semiconductor optical device according to the twenty-first embodiment of the present invention.

FIG. 29 is a graph of a wavelength dependence of the reflectance of the six-layer reflecting film 40. The abscissa of the graph indicates a wavelength, and the ordinate denotes a reflectance. In the six-layer reflecting film, a flat portion having about 5% of a target reflectance over a wide wavelength band can be obtained. More specifically, the reflectance in the range of a wavelength of 791 nm to a wavelength of 1020 nm ranges from 3.3% to 6.0%. With reference to the reflectance of 4.0% at the setting wavelength 980 nm, a continuous wavelength band in the range of −1.0% to +2.0%, i.e., 3.0% to 6.0% is 229 nm. A value obtained by dividing the wavelength band by the setting wavelength of 980 nm is about 0.234, and is larger than 0.061 in the hypothetical reflecting film. Therefore, it is understood that the six-layer reflecting film 40 has a flat portion having a low reflectance over a wide wavelength band.

Twenty-second Embodiment

A semiconductor optical device having a six-layer reflecting film according to the twenty-second embodiment of the present invention will be described below with reference to FIG. 30. This semiconductor optical device is different from the semiconductor optical device according to the twenty-first embodiment in that a setting reflectance $R(\lambda_0)$ is 4.0% at a setting wavelength $\lambda_0$=1075 nm. Parameters are given by A=1.94, B=1.90, and C=2.2. In addition, when phase shifts $\phi1$ and $\phi2$ of tantalum oxide and aluminum oxide are given by $\phi1$=0.98561 and $\phi2$=0.417545, a reflectance of 4.0% is obtained at a wavelength of 1075 nm. In this case, the film thickness of the layers of the six-layer reflecting film are given by $Ad_1/Ad_2/Bd_1/Bd_2/Cd_1/Cd_2$=159.04 nm/85.55 nm/155.76 nm/83.79 nm/180.35 nm/97.02 nm. The total thickness ($d_{total}=\Sigma d_i$) of the film is 761.51 nm. A sum $\Sigma n_i d_i$ of products $n_i d_i$ of refractive index $n_i$ and film thickness $d_i$ of a layer denoted with i in the six films is 1450.03 nm which is very large, i.e., about 5.92 times a ¼ wavelength (=245 nm) of the predetermined wavelength of 980 nm. For this reason, a heat-radiation characteristic on the end face is improved, and the temperature of the end face can be suppressed from increasing.

Figure 30:
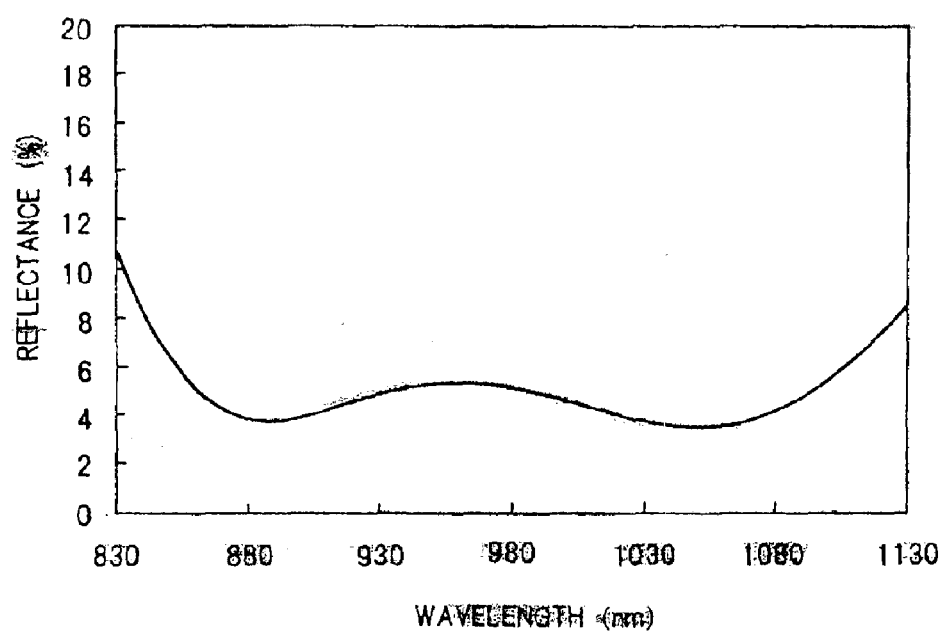
FIG. 30 is a graph of a wavelength dependence of a reflectance on a reflecting multi-layer film formed on an end face portion of a semiconductor optical device according to the twenty-second embodiment of the present invention.

FIG. 30 is a graph of a wavelength dependence of the reflectance of the six-layer reflecting film 40. The abscissa of the graph indicates a wavelength, and the ordinate denotes a reflectance. In the six-layer reflecting film, a flat portion having about 5% of a target reflectance over a wide wavelength band can be obtained. More specifically, the reflectance in the range of a wavelength of 854 nm to a wavelength of 1105 nm ranges from 3.3% to 6.0%. With reference to the reflectance of 4.0% at the setting wavelength 1075 nm, a continuous wavelength band in the range of −1.0% to +2.0%, i.e., 3.0% to 6.0% is 251 nm. A value obtained by dividing the wavelength band by the setting wavelength of 1075 nm is about 0.233, and is larger than 0.061 in the hypothetical reflecting film. Therefore, it is understood that the six-layer reflecting film 40 has a flat portion having a low reflectance over a wide wavelength band.

Twenty-third Embodiment

A semiconductor optical device having a six-layer reflecting film according to the twenty-third embodiment of the present invention will be described below with reference to FIG. 31. This semiconductor optical device is different from the semiconductor optical device according to the seventeenth embodiment in that a setting reflectance $R(\lambda_0)$ is 5.0% at a setting wavelength $\lambda_0$=980 nm. Parameters are given by A=2.04, B=1.92, and C=2.2. In addition, when phase shifts $\phi 1$ and $\phi 2$ of tantalum oxide and aluminum oxide are given by $\phi 1=0.93793$ and $\phi 2=0.433879$, a reflectance of 5.0% is obtained at a wavelength of 980 nm. In this case, the film thickness of the layers of the six-layer reflecting film are given by $Ad_1/Ad_2/Bd_1/Bd_2/Cd_1/Cd_2$=145.08 nm/85.22 nm/136.55 nm/80.21 nm/156.46 nm/91.90 nm. The total thickness ($d_{total}=\Sigma d_i$) of the film is 695.42 nm. A sum $\Sigma n_i d_i$ of products $n_i d_i$ of refractive index $n_i$ and film thickness $d_i$ of a layer denoted with i in the six films is 1318.03 nm which is very large, i.e., about 5.38 times a ¼ wavelength (=245 nm) of the predetermined wavelength of 980 nm. For this reason, a heat-radiation characteristic on the end face is improved, and the temperature of the end face can be suppressed from increasing.

Figure 31:
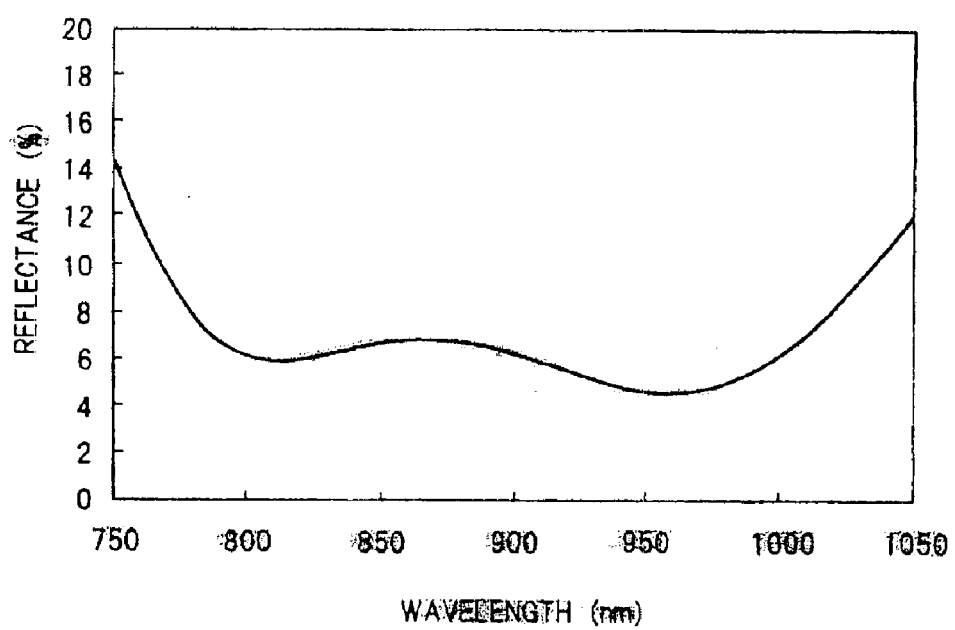
FIG. 31 is a graph of a wavelength dependence of a reflectance on a reflecting multi-layer film formed on an end face portion of a semiconductor optical device according to the twenty-third embodiment of the present invention.

FIG. 31 is a graph of a wavelength dependence of the reflectance of the six-layer reflecting film 40. The abscissa of the graph indicates a wavelength, and the ordinate denotes a reflectance. In the six-layer reflecting film, a flat portion having about 6% of a target reflectance over a wide wavelength band can be obtained. More specifically, the reflectance in the range of a wavelength of 787 nm to a wavelength of 1009 nm ranges from 4.6% to 7.0%. With reference to the reflectance of 5.0% at the setting wavelength 980 nm, a continuous wavelength band in the range of −1.0% to +2.0%, i.e., 4.0% to 7.0% is 222 nm. A value obtained by dividing the wavelength band by the setting wavelength of 980 nm is about 0.227, and is larger than 0.061 in the hypothetical reflecting film. Therefore, it is understood that the six-layer reflecting film 40 has a flat portion having a low reflectance over a wide wavelength band.

Twenty-fourth Embodiment

A semiconductor optical device having a six-layer reflecting film according to the twenty-fourth embodiment of the present invention will be described below with reference to FIG. 32. This semiconductor optical device is different from the semiconductor optical device according to the seventeenth embodiment in that a setting reflectance $R(\lambda_0)$ is 5.0% at a setting wavelength $\lambda_0$=1069 nm. Parameters are given by A=2.04, B=1.92, and C=2.2. In addition, when phase shifts $\phi 1$ and $\phi 2$ of tantalum oxide and aluminum oxide are given by $\phi 1=0.93793$ and $\phi 2=0.433879$, a reflectance of 5.0% is obtained at a wavelength of 1069 nm. In this case, the film thickness of the layers of the six-layer reflecting film are given by $Ad_1/Ad_2/Bd_1/Bd_2/Cd_1/Cd_2$=158.26 nm/92.96 nm/148.95 nm/87.49 nm/170.67 nm/100.25 nm. The total thickness ($d_{total}=\Sigma d_i$) of the film is 758.58 nm. A sum $\Sigma n_i d_i$ of products $n_i d_i$ of refractive index $n_i$ and film thickness $d_i$ of a layer denoted with i in the six films is 1437.73 nm which is very large, i.e., about 5.87 times a ¼ wavelength (=245 nm) of the predetermined wavelength of 980 nm. For this reason, a heat-radiation characteristic on the end face is improved, and the temperature of the end face can be suppressed from increasing.

Figure 32:
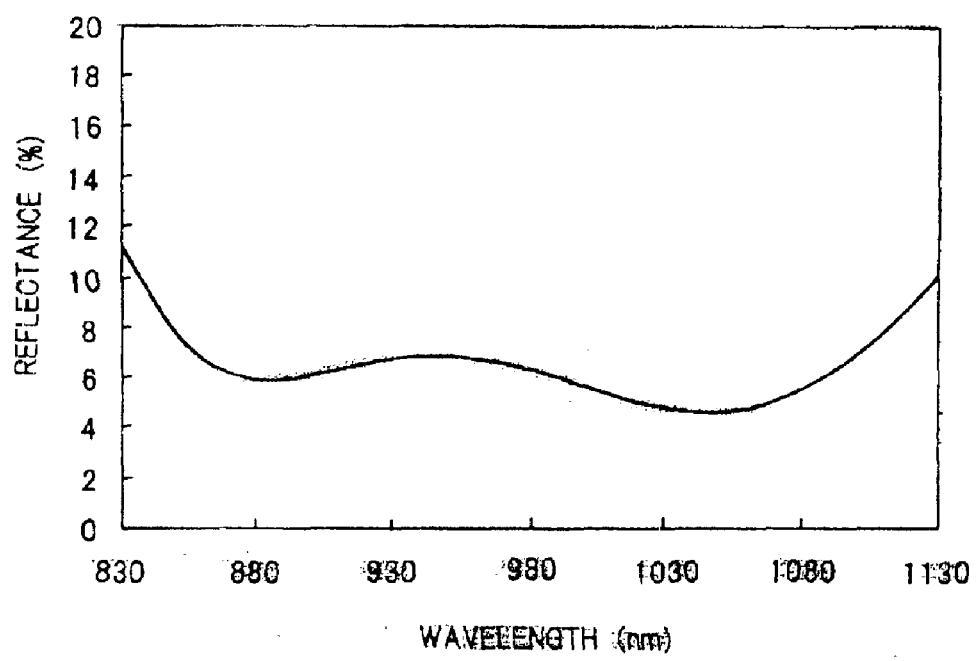
FIG. 32 is a graph of a wavelength dependence of a reflectance on a reflecting multi-layer film formed on an end face portion of a semiconductor optical device according to the twenty-fourth embodiment of the present invention.

FIG. 32 is a graph of a wavelength dependence of the reflectance of the six-layer reflecting film 40. The abscissa of the graph indicates a wavelength, and the ordinate denotes a reflectance. In the six-layer reflecting film, a flat portion having about 6% of a target reflectance over a wide wavelength band can be obtained. More specifically, the reflectance in the range of a wavelength of 858 nm to a wavelength of 1101 nm ranges from 4.6% to 7.0%. With reference to the reflectance of 5.0% at the setting wavelength 1069 nm, a continuous wavelength band in the range of −1.0% to +2.0%, i.e., 4.0% to 7.0% is 243 nm. A value obtained by dividing the wavelength band by the setting wavelength of 1069 nm is about 0.227, and is larger than 0.061 in the hypothetical reflecting film. Therefore, it is understood that the six-layer reflecting film 40 has a flat portion having a low reflectance over a wide wavelength band.

The characteristics of the reflecting multi-layer films of the semiconductor optical elements according to the seventeenth embodiment to the twenty-fourth embodiment are shown in Table 2. In Table 2, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands AA in which the reflectance falls within the range from −1.0 to +2.0% of $R(\lambda_0)$, and ratio of $\Delta\lambda/\lambda_0$ are shown.

TABLE 2

Characteristic of Multi-layer Reflecting Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.0 to 2.0 of $R(\lambda_0)$ | Ratio of $\Delta\lambda/\lambda_0$ |
|---|---|---|---|---|---|---|
| 17 | Six films | 980 nm<br>2.0% | 1.4% | 1411.50 nm<br>5.76 times | 140 nm | 140/980 = 0.143 |
| 18 | Six films | 1014 nm<br>2.0% | 1.4% | 1460.47 nm<br>5.96 times | 146 nm | 146/1014 = 0.144 |
| 19 | Six films | 980 nm<br>3.0% | 2.3% | 1342.95 nm<br>5.48 times | 203 nm | 203/980 = 0.207 |
| 20 | Six films | 1014 nm<br>3.0% | 2.3% | 1449.81 nm<br>5.92 times | 218 nm | 218/1014 = 0.207 |
| 21 | Six films | 980 nm<br>4.0% | 3.3% | 1483.84 nm<br>6.06 times | 229 nm | 229/980 = 0.234 |
| 22 | Six films | 1075 nm<br>4.0% | 3.3% | 1450.03 nm<br>5.92 times | 251 nm | 251/1075 = 0.233 |
| 23 | Six films | 980 nm<br>5.0% | 4.6% | 1318.03 nm<br>5.38 times | 222 nm | 222/980 = 0.227 |
| 24 | Six films | 1069 nm<br>5.0% | 4.6% | 1437.73 nm<br>5.87 times | 243 nm | 243/1069 = 0.164 |

Twenty-fifth Embodiment

Figure 33:
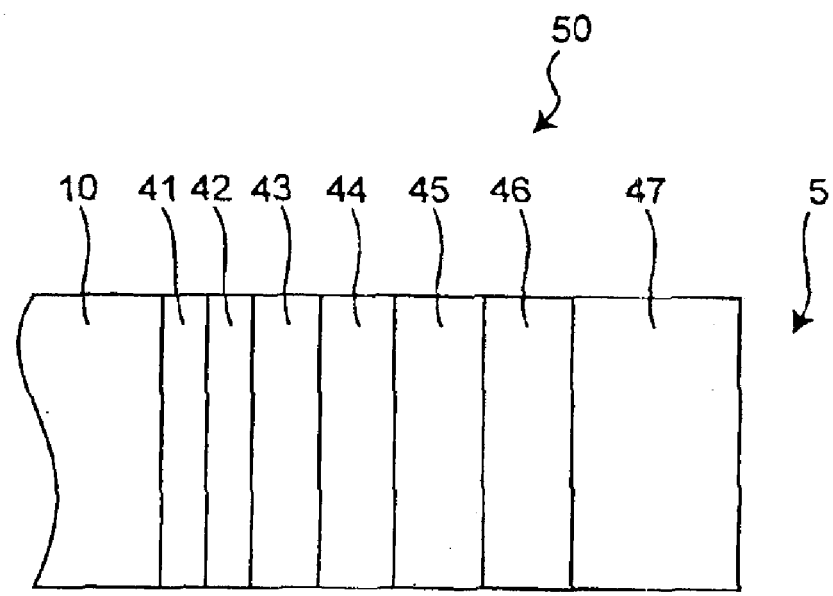
FIG. 33 is a schematic sectional view of the structure of an end face portion of a semiconductor optical device according to the twenty-fifth embodiment of the present invention.

A semiconductor optical device having a seven-layer reflecting film including films of three types according to the twenty-fifth embodiment of the present invention will be described below with reference to FIGS. 33 and 34. FIG. 33 is a schematic sectional view of a configuration obtained when a seven-layer reflecting film 50 including three types films is formed in place of a single-layer reflecting film as a reflecting film on an end face portion of the semiconductor optical device. This semiconductor optical device is different from the semiconductor optical device according to the first embodiment in that the reflecting multi-layer film is the seven-layer reflecting film 50 including the three types films. More specifically, the semiconductor optical device is different from the semiconductor optical device according to the first embodiment in that a first-layer film being in contact with a waveguide layer 10 is an aluminum nitride film 41. These semiconductor optical devices are equal to each other in that tantalum oxide films and aluminum oxide films are alternately stacked from the second-layer films to the seventh-layer films.

A condition for setting the reflectance of the seven-layer reflecting film 50 including the films of three types to be equal to the reflectance of the hypothetical film will be considered. A case in which the film of the third type is used as the first-layer film being in contact with the waveguide layer 10 is considered here. A phase shift $\phi3$ of the third film is expressed by the following equation (15).

$$\phi_3 = \frac{2\pi}{\lambda} n_3 d_3 \tag{15}$$

Therefore, the amplitude reflectance of the seven-layer reflecting film 50 including the three types films is expressed by the following equation (16) like the amplitude reflectance of the seven-layer reflecting film and the six-layer reflecting film.

$$r = \frac{(m_{11} + m_{12})n_c - (m_{21} + m_{22})}{(m_{11} + m_{12})n_c + (m_{21} + m_{22})} \tag{16}$$

where $m_{ij}$ (i and j are 1 or 2) is expressed by the following equation (17):

$$\begin{pmatrix} m_{11} & m_{12} \\ m_{21} & m_{22} \end{pmatrix} = \begin{pmatrix} \cos\phi_3 & -\frac{i}{n_3}\sin\phi_3 \\ -in_3\sin\phi_3 & \cos\phi_3 \end{pmatrix} \times \tag{17}$$

$$\begin{pmatrix} \cos A\phi_1 & -\frac{i}{n_1}\sin A\phi_1 \\ -in_1\sin A\phi_1 & \cos A\phi_1 \end{pmatrix} \begin{pmatrix} \cos A\phi_2 & -\frac{i}{n_2}\sin A\phi_2 \\ -in_2\sin A\phi_2 & \cos A\phi_2 \end{pmatrix} \times$$

$$\begin{pmatrix} \cos B\phi_1 & -\frac{i}{n_1}\sin B\phi_1 \\ -in_1\sin B\phi_1 & \cos B\phi_1 \end{pmatrix} \begin{pmatrix} \cos B\phi_2 & -\frac{i}{n_2}\sin B\phi_2 \\ -in_2\sin B\phi_2 & \cos B\phi_2 \end{pmatrix} \times$$

$$\begin{pmatrix} \cos C\phi_1 & -\frac{i}{n_1}\sin C\phi_1 \\ -in_1\sin C\phi_1 & \cos C\phi_1 \end{pmatrix} \begin{pmatrix} \cos C\phi_2 & -\frac{i}{n_2}\sin C\phi_2 \\ -in_2\sin C\phi_2 & \cos C\phi_2 \end{pmatrix}$$

where A, B, and C represent contributing rates of respective two-layer films (pair) when a film thickness Ad1 of a second-layer film 42, a film thickness Ad2 of a third-layer film 43, a film thickness Bd1 of a fourth-layer film 44, a film thickness Bd2 of a fifth-layer film 45, a film thickness Cd1 of a sixth-layer film 46, and a film thickness Cd2 of a seven-layer film 47 are given.

A case in which the seven-layer reflecting film 50 including the films of three types is formed on an end face portion of the semiconductor optical device will be described below. FIG. 33 is a schematic sectional view of the configuration of the seven-layer reflecting film including the films of three types formed on the end face portion. In this semiconductor optical device, on an end face portion of the waveguide layer 10 (equivalent refractive index $n_c$=3.37), a first-layer film 41 (refractive index $n_3$=2.072 and a film thickness d3=50 nm) made of aluminum nitride (AlN), a second-layer film 42 (refractive index $n_1$=2.057 and a film thickness $Ad_1$) made of tantalum oxide, a third-layer film 43 (refractive index $n_2$=1.62 and a film thickness $Ad_2$) made of aluminum oxide, a fourth-layer film 44 (refractive index $n_1$=2.057 and a film thickness $Bd_1$) made of tantalum oxide, a fifth-layer film 45 (refractive index $n_2$=1.62 and a film thickness $Bd_2$) made of aluminum oxide, a sixth-layer film 46 (refractive index $n_1$=2.057 and a film thickness Cd1) made of tantalum oxide, and a seventh-layer film 47 (refractive index $n_2$=1.62 and a film thickness $Cd_2$) made of aluminum oxide are stacked. In addition, the seven-layer reflecting film 50 is in contact with a free space 5 such as the air.

The thermal characteristic of the seven-layer reflecting film including the films of three types, i.e., the films made of aluminum nitride, tantalum oxide film, and aluminum oxide will be described below. The heat conductivity of the films of three types are about 1.8 W/(cm·K), about 0.1 W/(cm·K), and about 0.2 W/(cm·K), respectively. The aluminum nitride has the highest heat conductivity. For this reason, heat of the waveguide layer 10 can be rapidly radiated outside.

The reflecting characteristic of the seven-layer reflecting film 50 including the films of three types on the end face portion of the semiconductor optical device will be described below. A setting reflectance $R(\lambda_0)$ is set to be 2.0% at a setting wavelength $\lambda_0$=980 nm. When parameters are given by A=1.0, B=2.0, and C=2.0, and when phase shifts $\phi1$ and $\phi2$ of tantalum oxide and aluminum oxide are given by $\phi1$=1.23574 and $\phi2$=0.727856, a reflectance of 2% is obtained at a wavelength of 980 nm. In this case, the film thickness of the layers of the seven-layer reflecting film are given by $d_3/Ad_1/Ad_2/Bd_1/Bd_2/Cd_1/Cd_2$=50 nm/93.7 nm/70.08 nm/187.40 nm/140.15 nm/187.40 nm/140.15 nm. The total thickness ($d_{total}=\Sigma d_i$) of the film is 868.88 nm. A sum $\Sigma n_i d_i$ of products $n_i d_i$ of refractive index $n_i$ and film thickness $d_i$ of a layer denoted with i in the seven films is 1634.92 nm which is very large, i.e., about 6.67 times a ¼ wavelength (=245 nm). For this reason, a heat-radiation characteristic on the end face is improved, and the temperature of the end face can be suppressed from increasing.

Figure 34:
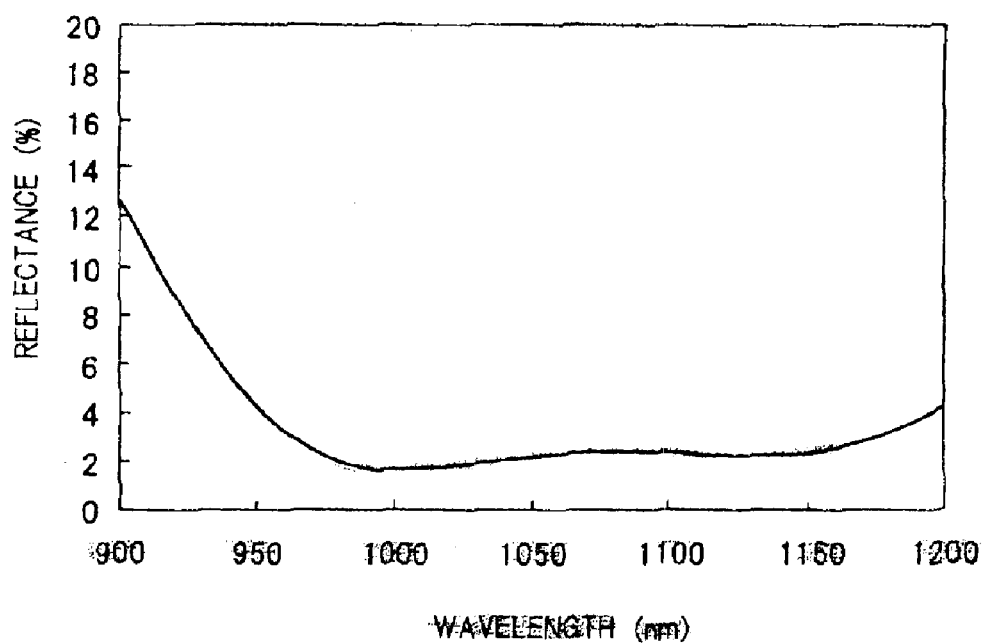
FIG. 34 is a graph of a wavelength dependence of a reflectance on a reflecting multi-layer film formed on the end face portion of the semiconductor optical device according to the twenty-fifth embodiment of the present invention.

FIG. 34 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 952 nm to a wavelength of 1194 nm ranges from 1.6% to 4.0%. With reference to the reflectance of 2.0% at the setting wavelength 980 nm, a continuous wavelength band in the range of −1.0% to +2.0%, i.e., 1.0% to 4.0% is 242 nm. A value obtained by dividing the wavelength band by the setting wavelength of 980 nm is about 0.247, and is larger than 0.061 in the hypothetical reflecting film. Therefore, it is understood that the seven-layer reflecting film has a flat portion having a low reflectance over a wide wavelength band.

Twenty-sixth Embodiment

A semiconductor optical device having a seven-layer reflecting film including films of three types according to the twenty-sixth embodiment of the present invention will be described below with reference to FIG. 35. This semiconductor optical device has the same configuration as that of the semiconductor optical device according to the twenty-fifth embodiment. However, the semiconductor optical device is different from the semiconductor optical device according to the twenty-fifth embodiment in that a setting reflectance $R(\lambda_0)$ is 2.0% at a setting wavelength $\lambda_0=897$ nm. Parameters are given by A=1.0, B=2.0, and C=2.0. In addition, when phase shifts $\phi 1$ and $\phi 2$ of tantalum oxide and aluminum oxide are given by $\phi 1=1.23574$ and $\phi 2=0.727856$, a reflectance of 2.0% is obtained at a wavelength of 897 nm. In this case, the film thickness of the layers of the six-layer reflecting film are given by $d_3/Ad_1/Ad_2/Bd_1/Bd_2/Cd_1/Cd_2$= 50/83.26 nm/65.10 nm/166.52 nm/130.20 nm/166.52 nm/130.20 nm. The total thickness ($d_{total}=\Sigma d_i$) of the film is 791.8 nm. A sum $\Sigma n_i d_i$ of products $n_i d_i$ of refractive index $n_i$ and film thickness $d_i$ of a layer denoted with i in the seven films is 1487.24 nm which is very large, i.e., about 6.07 times a ¼ wavelength (=245 nm) of the predetermined wavelength of 980 nm. For this reason, a heat-radiation characteristic on the end face is improved, and the temperature of the end face can be suppressed from increasing.

Figure 35:
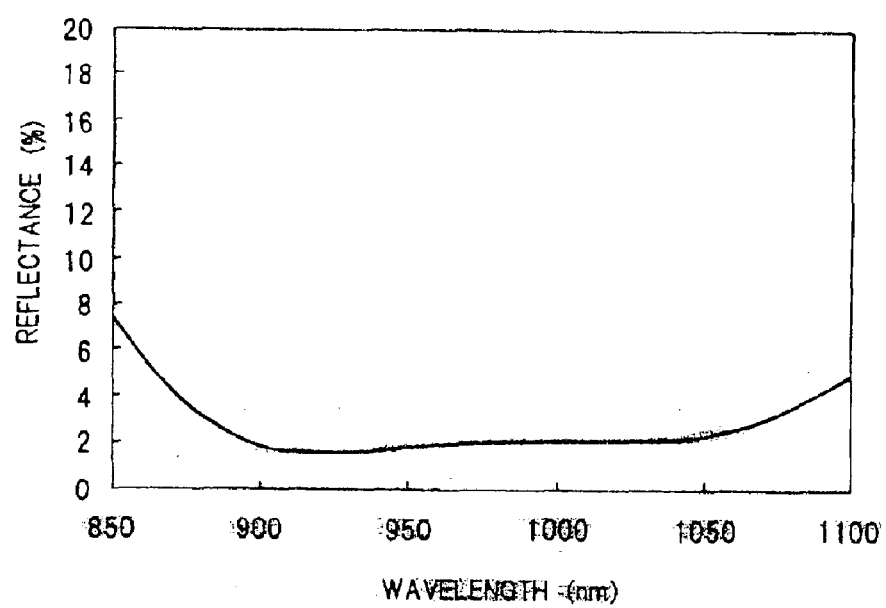
FIG. 35 is a graph of a wavelength dependence of a reflectance on a reflecting multi-layer film formed on the end face portion of the semiconductor optical device according to the twenty-sixth embodiment of the present invention.

FIG. 35 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 3% of a target reflectance over a wide wavelength band can be obtained. More specifically, the reflectance in the range of a wavelength of 872 nm to a wavelength of 1086 nm ranges from 1.5% to 4.0%. With reference to the reflectance of 2.0% at the setting wavelength 897 nm, a continuous wavelength band in the range of −1.0% to +2.0%, i.e., 1.0% to 4.0% is 214 nm. A value obtained by dividing the wavelength band by the setting wavelength of 897 nm is about 0.239, and is larger than 0.061 in the hypothetical reflecting film. Therefore, it is understood that the seven-layer reflecting film 50 has a flat portion having a low reflectance over a wide wavelength band.

Twenty-seventh Embodiment

A semiconductor optical device having a seven-layer reflecting film including films of three types according to the twenty-seventh embodiment of the present invention will be described below with reference to FIG. 36. This semiconductor optical device has the same configuration as that of the semiconductor optical device according to the twenty-fifth embodiment. However, the semiconductor optical device is different from the semiconductor optical device according to the twenty-fifth embodiment in that a setting reflectance $R(\lambda_0)$ is 3.0% at a setting wavelength $\lambda_0=980$ nm. Parameters are given by A=1.0, B=2.0, and C=2.0. In addition, when phase shifts $\phi 1$ and $\phi 2$ of tantalum oxide and aluminum oxide are given by $\phi 1=1.20275$ and $\phi 2=0.765599$, a reflectance of 3.0% is obtained at a wavelength of 980 nm. In this case, the film thickness of the layers of the six-layer reflecting film are given by $d_3/Ad_1/Ad_2/Bd_1/Bd_2/Cd_1/Cd_2$= 50 nm/91.20 nm/73.71 nm/182.40 nm/147.42 nm/182.40 nm/147.42 nm. The total thickness ($d_{total}=\Sigma d_i$) of the film is 874.55 nm. A sum $\Sigma n_i d_i$ of products $n_i d_i$ of refractive index $n_i$ and film thickness $d_i$ of a layer denoted with i in the seven films is 1638.64 nm which is very large, i.e., about 6.69 times a ¼ wavelength (=245 nm) of the predetermined wavelength of 980 nm. For this reason, a heat-radiation characteristic on the end face is improved, and the temperature of the end face can be suppressed from increasing.

Figure 36:
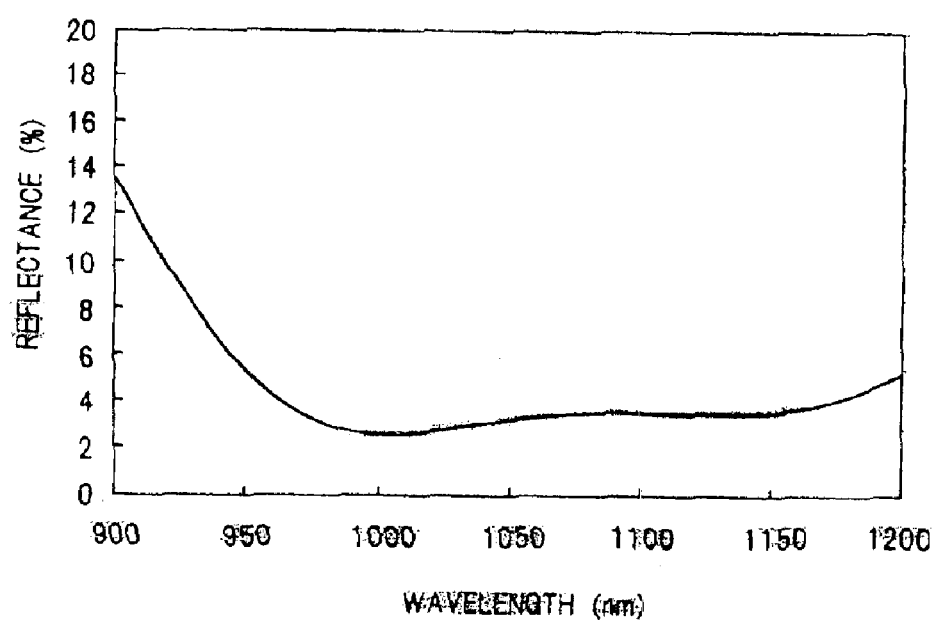
FIG. 36 is a graph of a wavelength dependence of a reflectance on a reflecting multi-layer film formed on an end face portion of a semiconductor optical device according to the twenty-seventh embodiment of the present invention.

FIG. 36 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 4% of a target reflectance over a wide wavelength band can be obtained. More specifically, the reflectance in the range of a wavelength of 953 nm to a wavelength of 1195 nm ranges from 2.6% to 5.0%. With reference to the reflectance of 3.0% at the setting wavelength 980 nm, a continuous wavelength band in the range of −1.0% to +2.0%, i.e., 2.0% to 5.0% is 242 nm. A value obtained by dividing the wavelength band by the setting wavelength of 980 nm is about 0.247, and is larger than 0.061 in the hypothetical reflecting film. Therefore, it is understood that the seven-layer reflecting film 50 has a flat portion having a low reflectance over a wide wavelength band.

Twenty-eighth Embodiment

A semiconductor optical device having a seven-layer reflecting film including films of three types according to the twenty-eighth embodiment of the present invention will be described below with reference to FIG. 37. This semiconductor optical device has the same configuration as that of the semiconductor optical device according to the twenty-seventh embodiment. However, the semiconductor optical device is different from the semiconductor optical device according to the twenty-seventh embodiment in that a setting reflectance $R(\lambda_0)$ is 3.0% at a setting wavelength $\lambda_0=896$ nm. Parameters are given by A=1.0, B=2.0, and C=2.0. In addition, when phase shifts $\phi 1$ and $\phi 2$ of tantalum oxide and aluminum oxide are given by $\phi 1=1.23574$ and $\phi 2=0.727856$, a reflectance of 3.0% is obtained at a wavelength of 896 nm. In this case, the film thickness of the layers of the six-layer reflecting film are given by $d_3/Ad_1/Ad_2/Bd_1/Bd_2/Cd_1/Cd_2$=50 nm/81.08 nm/68.15 nm/162.16 nm/136.31 nm/162.16 nm/136.31 nm. The total thickness ($d_{total}=\Sigma d_i$) of the film is 796.17 nm. A sum $\Sigma n_i d_i$ of products $n_i d_i$ of refractive index $n_i$ and film thickness $d_i$ of a layer denoted with i in the seven films is 1489.56 nm which is very large, i.e., about 6.08 times a ¼ wavelength (=245 nm) of the predetermined wavelength of 980 nm. For this reason, a heat-radiation characteristic on the end face is improved, and the temperature of the end face can be suppressed from increasing.

Figure 37:
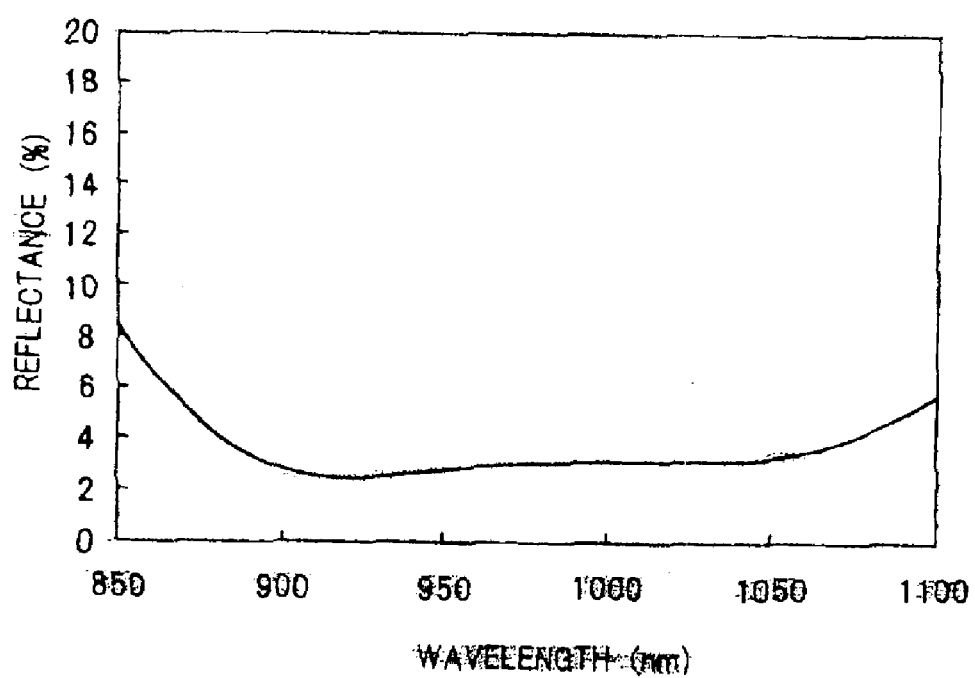
FIG. 37 is a graph of a wavelength dependence of a reflectance on a reflecting multi-layer film formed on an end face portion of a semiconductor optical device according to the twenty-eighth embodiment of the present invention.

FIG. 37 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 4% of a target reflectance over a wide wavelength band can be obtained. More specifically, the reflectance in the range of a wavelength of 872 nm to a wavelength of 1089 nm ranges from 2.5% to 5.0%. With reference to the reflectance of 3.0% at the setting wavelength 896 nm, a continuous wavelength band in the range of −1.0% to +2.0%, i.e., 2.0% to 5.0% is 217 nm. A value obtained by dividing the wavelength band by the setting wavelength of 896 nm is about 0.242, and is larger than 0.061 in the hypothetical reflecting film. Therefore, it is understood that the seven-layer reflecting film 50 has a flat portion having a low reflectance over a wide wavelength band.

Twenty-ninth Embodiment

A semiconductor optical device having a seven-layer reflecting film including films of three types according to the twenty-ninth embodiment of the present invention will be described below with reference to FIG. 38. This semiconductor optical device has the same configuration as that of the semiconductor optical device according to the twenty-fifth embodiment. However, the semiconductor optical device is different from the semiconductor optical device according to the twenty-fifth embodiment in that a setting reflectance $R(\lambda_0)$ is 4.0% at a setting wavelength $\lambda_0=980$ nm. Parameters are given by A=1.0, B=2.0, and C=2.0. In addition, when phase shifts $\phi1$ and $\phi2$ of tantalum oxide and aluminum oxide are given by $\phi1=1.17459$ and $\phi2=0.798874$, a reflectance of 4.0% is obtained at a wavelength of 980 nm. In this case, the film thickness of the layers of the six-layer reflecting film are given by $d_3/Ad_1/Ad_2/Bd_1/Bd_2/Cd_1/Cd_2=$ 50 nm/89.06 nm/76.91 nm/178.13 nm/153.83 nm/178.13 nm/153.83 nm. The total thickness ($d_{total}=\Sigma d_i$) of the film is 879.89 nm. A sum $\Sigma n_i d_i$ of products $n_i d_i$ of refractive index $n_i$ and film thickness $d_i$ of a layer denoted with i in the seven films is 1642.63 nm which is very large, i.e., about 6.70 times a ¼ wavelength (=245 nm) of the predetermined wavelength of 980 nm. For this reason, a heat-radiation characteristic on the end face is improved, and the temperature of the end face can be suppressed from increasing.

Figure 38:
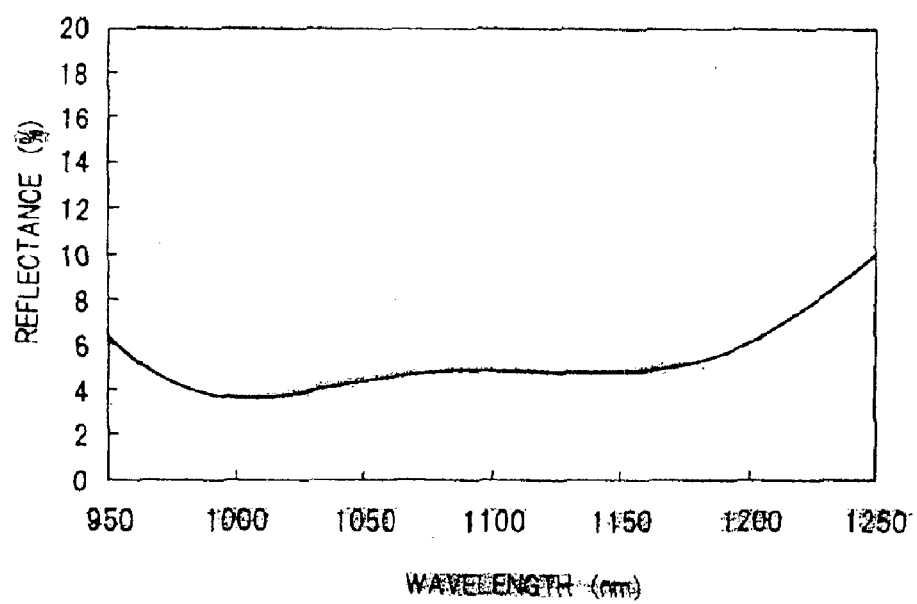
FIG. 38 is a graph of a wavelength dependence of a reflectance on a reflecting multi-layer film formed on an end face portion of a semiconductor optical device according to the twenty-ninth embodiment of the present invention.

FIG. 38 is a graph of a wavelength dependence of the reflectance of the seven-layer reflecting film 50 including films of three types. The abscissa of the graph indicates a wavelength, and the ordinate denotes a reflectance. In the seven-layer reflecting film, a flat portion having about 5% of a target reflectance over a wide wavelength band can be obtained. More specifically, the reflectance in the range of a wavelength of 953 nm to a wavelength of 1198 nm ranges from 3.6% to 6.0%. With reference to the reflectance of 4.0% at the setting wavelength 980 nm, a continuous wavelength band in the range of −1.0% to +2.0%, i.e., 3.0% to 6.0% is 245 nm. A value obtained by dividing the wavelength band by the setting wavelength of 980 nm is about 0.250, and is larger than 0.061 in the hypothetical reflecting film. Therefore, it is understood that the seven-layer reflecting film 50 has a flat portion having a low reflectance over a wide wavelength band.

Thirtieth Embodiment

A semiconductor optical device having a seven-layer reflecting film including films of three types according to the thirtieth embodiment of the present invention will be described below with reference to FIG. 39. This semiconductor optical device has the same configuration as that of the semiconductor optical device according to the twenty-ninth embodiment. However, the semiconductor optical device is different from the semiconductor optical device according to the twenty-ninth embodiment in that a setting reflectance $R(\lambda_0)$ is 4.0% at a setting wavelength $\lambda_0=893$ nm. Parameters are given by A=1.0, B=2.0, and C=2.0°. In addition, when phase shifts $\phi_1$ and $\phi_2$ of tantalum oxide and aluminum oxide are given by $\phi_1=1.14262$ and $\phi_2=0.805876$, a reflectance of 4.0% is obtained at a wavelength of 893 nm. In this case, the film thickness of the layers of the six-layer reflecting film are given by $d_3/Ad_1/Ad_2/Bd_1/Bd_2/Cd_1/Cd_2=$ 50 nm/78.95 nm/70.70 nm/157.90 nm/141.40 nm/157.90 nm/141.40 nm. The total thickness ($d_{total}=\Sigma d_i$) of the film is 798.25 nm. A sum $\Sigma n_i d_i$ of products $n_i d_i$ of refractive index $n_i$ and film thickness $d_i$ of a layer denoted with i in the seven films is 1488.27 nm which is very large, i.e., about 6.07 times a ¼ wavelength (=245 nm) of the predetermined wavelength of 980 nm. For this reason, a heat-radiation characteristic on the end face is improved, and the temperature of the end face can be suppressed from increasing.

Figure 39:
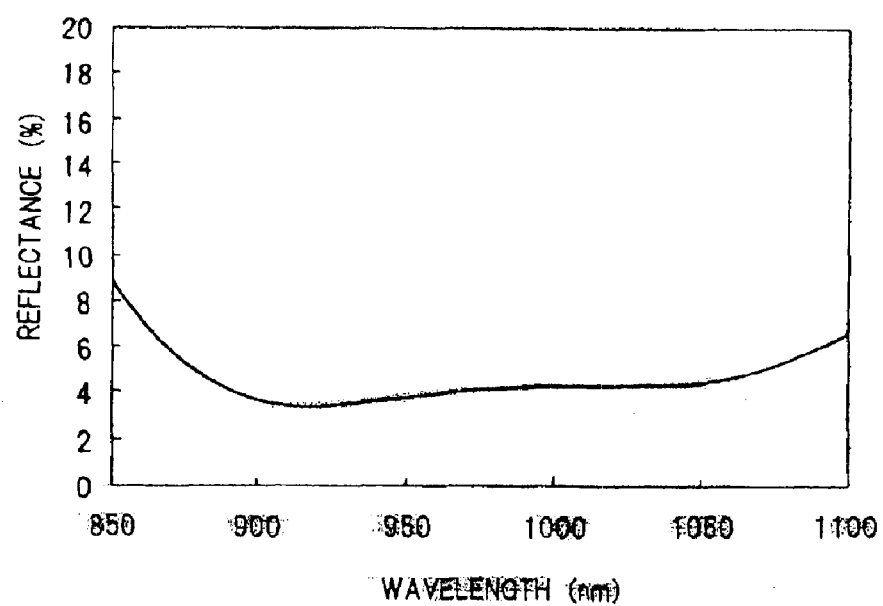
FIG. 39 is a graph of a wavelength dependence of a reflectance on a reflecting multi-layer film formed on an end face portion of a semiconductor optical device according to the thirtieth embodiment of the present invention.

FIG. 39 is a graph of a wavelength dependence of the reflectance of the seven-layer reflecting film 50 including three films made of materials different from each other. The abscissa of the graph indicates a wavelength, and the ordinate denotes a reflectance. In the seven-layer reflecting film, a flat portion having about 5% of a target reflectance over a wide wavelength band can be obtained. More specifically, the reflectance in the range of a wavelength of 870 nm to a wavelength of 1090 nm ranges from 3.4% to 6.0%. With reference to the reflectance of 4.0% at the setting wavelength 893 nm, a continuous wavelength band in the range of −1.0% to +2.0%, i.e., 3.0% to 6.0% is 220 nm. A value obtained by dividing the wavelength band by the setting wavelength of 893 nm is about 0.246, and is larger than 0.061 in the hypothetical reflecting film. Therefore, it is understood that the seven-layer reflecting film 50 has a flat portion having a low reflectance over a wide wavelength band.

Thirty-first Embodiment

A semiconductor optical device having a seven-layer reflecting film including three films made of materials different from each other according to the thirty-first embodiment of the present invention will be described below with reference to FIG. 40. This semiconductor optical device has the same configuration as that of the semiconductor optical device according to the twenty-fifth embodiment. However, the semiconductor optical device is different from the semiconductor optical device according to the twenty-fifth embodiment in that a setting reflectance $R(\lambda_0)$ is 5.0% at a setting wavelength $\lambda_0=980$ nm. Parameters are given by A=1.0, B=2.0, and C=2.0. In addition, when phase shifts $\phi1$ and $\phi2$ of tantalum oxide and aluminum oxide are given by $\phi1=1.14888$ and $\phi2=0.829916$, a reflectance of 5.0% is obtained at a wavelength of 980 nm. In this case, the film thickness of the layers of the six-layer reflecting film are given by $d_3/Ad_1/Ad_2/Bd_1/Bd_2/Cd_1/Cd_2=50$ nm/87.11 nm/79.90 nm/174.23 nm/159.81 nm/174.23 nm/159.81 nm. The total thickness ($d_{total}=\Sigma d_i$) of the film is 885.09 nm. A sum $\Sigma n_i d_i$ of products $n_i d_i$ of refractive index $n_i$ and film thickness $d_i$ of a layer denoted with i in the seven films is 1646.79 nm which is very large, i.e., about 6.72 times a ¼ wavelength (=245 nm) of the predetermined wavelength of 980 nm. For this reason, a heat-radiation characteristic on the end face is improved, and the temperature of the end face can be suppressed from increasing.

Figure 40:
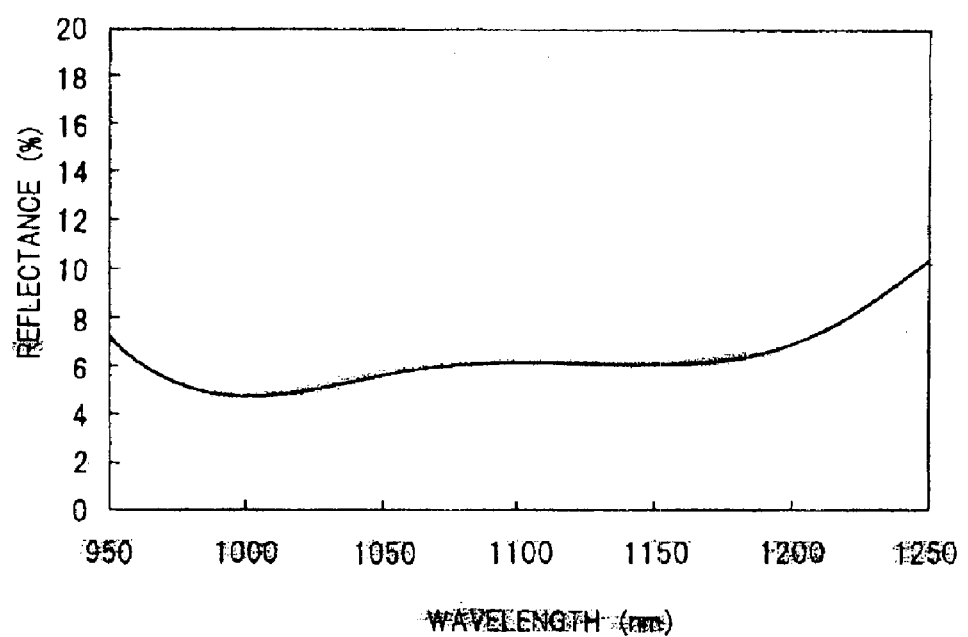
FIG. 40 is a graph of a wavelength dependence of a reflectance on a reflecting multi-layer film formed on an end face portion of a semiconductor optical device according to the thirty-first embodiment of the present invention.

FIG. 40 is a graph of a wavelength dependence of the reflectance of the seven-layer reflecting film 50 including three films made of materials different from each other. The abscissa of the graph indicates a wavelength, and the ordinate denotes a reflectance. In the seven-layer reflecting film, a flat portion having about 6% of a target reflectance over a wide wavelength band can be obtained. More specifically, the reflectance in the range of a wavelength of 952 nm to a wavelength of 1201 nm ranges from 4.6% to 7.0%. With reference to the reflectance of 5.0% at the setting wavelength 980 nm, a continuous wavelength band in the range of −1.0% to +2.0%, i.e., 4.0% to 7.0% is 249 nm. A value obtained by dividing the wavelength band by the setting wavelength of 897 nm is about 0.254, and is larger than 0.061 in the hypothetical reflecting film. Therefore, it is understood that the seven-layer reflecting film 50 has a flat portion having a low reflectance over a wide wavelength band.

Thirty-second Embodiment

A semiconductor optical device having a seven-layer reflecting film including three films according to the thirty-second embodiment of the present invention will be described below with reference to FIG. 41. This semiconductor optical device has the same configuration as that of the semiconductor optical device according to the thirty-first embodiment. However, the semiconductor optical device is different from the semiconductor optical device according to the thirty-first embodiment in that a setting reflectance $R(\lambda_0)$ is 5.0% at a setting wavelength $\lambda_0$=890 nm. Parameters are given by A=1.0, B=2.0, and C=2.0. In addition, when phase shifts $\phi1$ and $\phi2$ of tantalum oxide and aluminum oxide are given by $\phi1$=1.11792 and $\phi2$=0.835299, a reflectance of 5.0% is obtained at a wavelength of 890 nm. In this case, the film thickness of the layers of the six-layer reflecting film are given by $d_3/Ad_1/Ad_2/Bd_1/Bd_2/Cd_1/Cd_2$=50 nm/76.98 nm/73.04 nm/153.96 nm/146.07 nm/153.96 nm/146.07 nm. The total thickness ($d_{total}=\Sigma d_i$) of the film is 800.08 nm. A sum $\Sigma n_i d_i$ of products $n_i d_i$ of refractive index $n_i$ and film thickness $d_i$ of a layer denoted with i in the seven films is 1486.93 nm which is very large, i.e., about 6.07 times a ¼ wavelength (=245 nm) of the predetermined wavelength of 980 nm. For this reason, a heat-radiation characteristic on the end face is improved, and the temperature of the end face can be suppressed from increasing.

Figure 41:
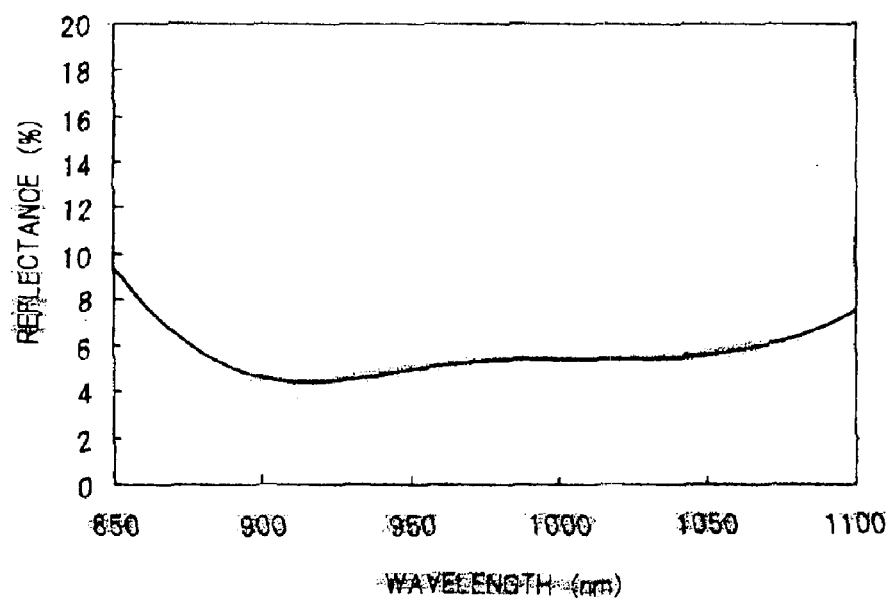
FIG. 41 is a graph of a wavelength dependence of a reflectance on a reflecting multi-layer film formed on an end face portion of a semiconductor optical device according to the thirty-second embodiment of the present invention.

FIG. 41 is a graph of a wavelength dependence of the reflectance of the seven-layer reflecting film 50 including three films made of materials different from each other. The abscissa of the graph indicates a wavelength, and the ordinate denotes a reflectance. In the seven-layer reflecting film, a flat portion having about 6% of a target reflectance over a wide wavelength band can be obtained. More specifically, the reflectance in the range of a wavelength of 867 nm to a wavelength of 1093 nm ranges from 4.4% to 7.0%. With reference to the reflectance of 5.0% at the setting wavelength 890 nm, a continuous wavelength band in the range of −1.0% to +2.0%, i.e., 4.0% to 7.0% is 226 nm. A value obtained by dividing the wavelength band by the setting wavelength of 890 nm is about 0.254, and is larger than 0.061 in the hypothetical reflecting film. Therefore, it is understood that the seven-layer reflecting film 50 has a flat portion having a low reflectance over a wide wavelength band.

The characteristics of the reflecting multi-layer films of the semiconductor optical elements according to the twenty-fifth embodiment to the thirty-second embodiment are shown in Table 3. In Table 3, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.0 to +2.0% of $R(\lambda_0)$, and ratio of $\Delta\lambda/\lambda_0$ are shown.

TABLE 3

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.0 to 2.0 of $R(\lambda_0)$ | Ratio of $\Delta\lambda/\lambda_0$ |
|---|---|---|---|---|---|---|
| 25 | Seven films (three types) | 980 nm 2.0% | 1.6% | 1634.92 nm 6.67 times | 242 nm | 242/980 = 0.247 |
| 26 | Seven films (three types) | 897 nm 2.0% | 1.5% | 1487.24 nm 6.07 times | 214 nm | 214/897 = 0.239 |
| 27 | Seven films (three types) | 980 nm 3.0% | 2.6% | 1638.64 nm 6.69 times | 242 nm | 242/980 = 0.247 |
| 28 | Seven films (three types) | 896 nm 3.0% | 2.5% | 1489.56 nm 6.08 times | 217 nm | 217/896 = 0.242 |
| 29 | Seven films (three types) | 980 nm 4.0% | 3.6% | 1642.63 nm 6.70 times | 245 nm | 245/980 = 0.250 |
| 30 | Seven films (three types) | 893 nm 4.0% | 3.4% | 1488.27 nm 6.07 times | 220 nm | 220/893 = 0.246 |
| 31 | Seven films (three types) | 980 nm 5.0% | 4.6% | 1646.79 nm 5.38 times | 249 nm | 249/980 = 0.254 |
| 32 | Seven films (three types) | 890 nm 5.0% | 4.4% | 1486.93 nm 6.07 times | 226 nm | 226/890 = 0.254 |

Thirty-third Embodiment

Figure 42:
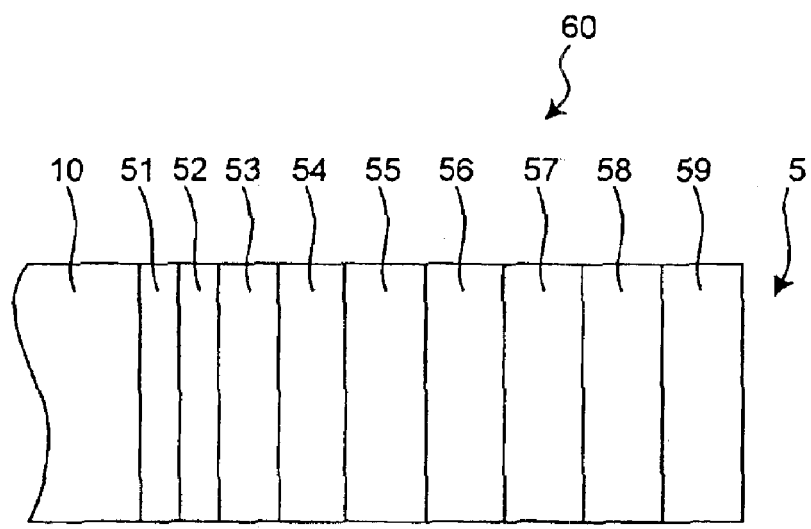
FIG. 42 is a schematic sectional view of the structure of an end face portion of a semiconductor optical device according to the thirty-third embodiment of the present invention.

A semiconductor optical device having a nine-layer reflecting film according to the thirty-third embodiment of the present invention will be described below with reference to FIGS. 42 and 43. FIG. 42 is a schematic sectional view of a configuration obtained when a nine-layer reflecting film 60 is formed in place of a single-layer reflecting film as a reflecting film on an end face portion of the semiconductor optical device. This semiconductor optical device is different from the semiconductor optical device according to the first embodiment in that the reflecting multi-layer film is the nine-layer reflecting film 60. A condition for setting the reflectance of the nine-layer reflecting film 60 to be equal to the reflectance of the hypothetical film at a predetermined wavelength will be considered. The amplitude reflectance of the nine-layer reflecting film 60 is expressed by the following equation (18) like the amplitude reflectance of the four-layer reflecting film and the seven-layer reflecting film.

$$r = \frac{(m_{11} + m_{12})n_c - (m_{21} + m_{22})}{(m_{11} + m_{12})n_c + (m_{21} + m_{22})} \quad (18)$$

where $m_{ij}$ (i and j are 1 or 2) is expressed by the following equation (19):

$$\begin{pmatrix} m_{11} & m_{12} \\ m_{21} & m_{22} \end{pmatrix} = \begin{pmatrix} \cos O\phi_2 & -\frac{i}{n_2}\sin O\phi_2 \\ -in_2\sin O\phi_2 & \cos O\phi_2 \end{pmatrix} \times \quad (19)$$

$$\begin{pmatrix} \cos A\phi_1 & -\frac{i}{n_1}\sin A\phi_1 \\ -in_1\sin A\phi_1 & \cos A\phi_1 \end{pmatrix} \begin{pmatrix} \cos A\phi_2 & -\frac{i}{n_2}\sin A\phi_2 \\ -in_2\sin A\phi_2 & \cos A\phi_2 \end{pmatrix} \times$$

-continued $$\begin{pmatrix} \cos B\phi_1 & -\dfrac{i}{n_1}\sin B\phi_1 \\ -in_1\sin B\phi_1 & \cos B\phi_1 \end{pmatrix} \begin{pmatrix} \cos B\phi_2 & -\dfrac{i}{n_2}\sin B\phi_2 \\ -in_2\sin B\phi_2 & \cos B\phi_2 \end{pmatrix} \times$$

$$\begin{pmatrix} \cos C\phi_1 & -\dfrac{i}{n_1}\sin C\phi_1 \\ -in_1\sin C\phi_1 & \cos C\phi_1 \end{pmatrix} \begin{pmatrix} \cos C\phi_2 & -\dfrac{i}{n_2}\sin C\phi_2 \\ -in_2\sin C\phi_2 & \cos C\phi_2 \end{pmatrix} \times$$

$$\begin{pmatrix} \cos D\phi_1 & -\dfrac{i}{n_1}\sin D\phi_1 \\ -in_1\sin D\phi_1 & \cos D\phi_1 \end{pmatrix} \begin{pmatrix} \cos D\phi_2 & -\dfrac{i}{n_2}\sin D\phi_2 \\ -in_2\sin D\phi_2 & \cos D\phi_2 \end{pmatrix}$$

where O, A, B, C and D are parameters representing contributing rates of respective two-layer films (pair) in a film thickness Od2 of a first-layer film 51, a film thickness Ad1 of a second-layer film 52, a film thickness Ad2 of a third-layer film 63, a film thickness Bd1 of a fourth-layer film 54, a film thickness Bd2 of a fifth-layer film 55, a film thickness Cd1 of a sixth-layer film 56, a film thickness Cd2 of a seventh-layer film 57, a film thickness Dd1 of an eighth-layer film 58, and a film thickness Dd2 of a ninth-layer film 59 except for the first-layer film 51.

A case in which the nine-layer reflecting film 60 is formed on an end face portion of the semiconductor optical device will be described below. FIG. 42 is a schematic sectional view of the configuration of the nine-layer reflecting film formed on the end face portion. In this semiconductor optical device, on an end face portion of the waveguide layer 10 (equivalent refractive index $n_c$=3.37), the first-layer film 51 (refractive index $n_2$=1.62 and a film thickness $Od_2$) made of aluminum oxide, the second-layer film 52 (refractive index $n_1$=2.057 and a film thickness $Ad_1$) made of tantalum oxide, the third-layer film 53 (refractive index $n_2$=1.62 and a film thickness $Ad_2$) made of aluminum oxide, the fourth-layer film 54 (refractive index $n_1$=2.057 and a film thickness $Bd_1$) made of tantalum oxide, the fifth-layer film 55 (refractive index $n_2$=1.62 and a film thickness $Bd_2$) made of aluminum oxide, the sixth-layer film 56 (refractive index $n_1$=2.057 and a film thickness $Cd_1$) made of tantalum oxide, the seventh-layer film 57 (refractive index $n_2$=1.62 and a film thickness $Cd_2$) made of aluminum oxide, the eighth-layer film 58 (refractive index $n_1$=2.057 and a film thickness $Dd_1$) made of tantalum oxide, the ninth-layer film 59 (refractive index $n_2$=1.62 and a film thickness $Dd_2$) made of aluminum oxide are stacked. In addition, the nine-layer reflecting film 60 is in contact with a free space 5 such as the air.

The reflecting characteristic of the nine-layer reflecting film 60 on the end face portion of the semiconductor optical device will be described below. A setting reflectance $R(\lambda_0)$ is set to be 2.0% at a setting wavelength $\lambda_0$=980 nm. When parameters are given by O=0.2, A=2.7, B=2.0, C=2.0, and D=2.0, and when phase shifts $\phi_1$ and $\phi_2$ of tantalum oxide and aluminum oxide are given by $\phi_1$=0.35769 and $\phi_2$=0.958077, a reflectance of 2% is obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2$=18.45 nm/73.23 nm/249.06 nm/54.24 nm/184.49 nm/54.24 nm/184.49 nm/54.24 nm/184.49 nm. The total thickness ($d_{total}=\Sigma d_i$) of the film is 1056.93 nm. A sum $\Sigma n_i d_i$ of products $n_i d_i$ of refractive index $n_i$ and film thickness $d_i$ of a layer denoted with i in the nine films is 1815.34 nm which is very large, i.e., about 7.41 times a ¼ wavelength (=245 nm) at a predetermined wavelength of 980 nm. For this reason, a heat-radiation characteristic on the end face is improved, and the temperature of the end face can be suppressed from increasing.

Figure 43:
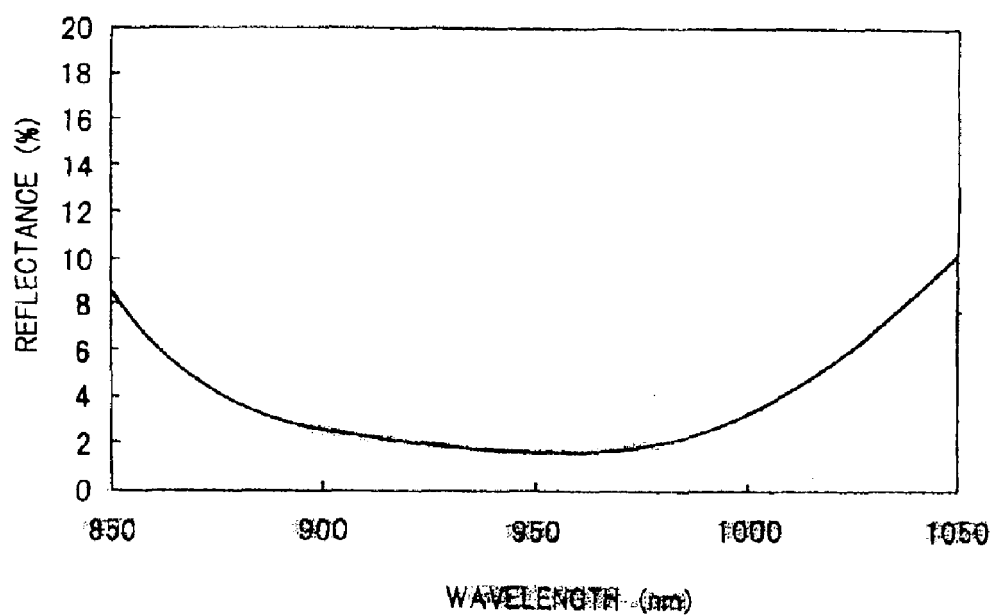
FIG. 43 is a graph of a wavelength dependence of a reflectance on a reflecting multi-layer film formed on the end face portion of the semiconductor optical device according to the thirty-third embodiment of the present invention.

FIG. 43 is a graph of a wavelength dependence of the reflectance of the nine-layer reflecting film 60. The abscissa of the graph indicates a wavelength, and the ordinate denotes a reflectance. In the nine-layer reflecting film, a flat portion having about 3% of a target reflectance over a wide wavelength band can be obtained. More specifically, the reflectance in the range of a wavelength of 877 nm to a wavelength of 1007 nm ranges from 1.6% to 4.0%. With reference to the reflectance of 2.0% at the predetermined wavelength 980 nm, a continuous wavelength band in the range of −1.0% to +2.0%, i.e., 1.0% to 4.0% is 130 nm. A value obtained by dividing the wavelength band by the setting wavelength of 980 nm is about 0.133, and is larger than 0.061 in the hypothetical reflecting film. Therefore, it is understood that the nine-layer reflecting film 60 has a flat portion having a low reflectance over a wide wavelength band.

Thirty-fourth Embodiment

A semiconductor optical device having a nine-layer reflecting film according to the thirty-fourth embodiment of the present invention will be described below with reference to FIG. 44. This semiconductor optical device has the same configuration as that of the semiconductor optical device according to the thirty-third embodiment. However, the semiconductor optical device is different from the semiconductor optical device according to the thirty-third embodiment in that a setting reflectance $R(\lambda_0)$ is 2.0% at a setting wavelength $\lambda_0$=1020 nm. Parameters are given by O=0.2, A=2.7, B=2.0, C=2.0 and D=2.0. In addition, when phase shifts $\phi_1$ and $\phi_2$ of tantalum oxide and aluminum oxide are given by $\phi_1$=0.35769 and $\phi_2$=0.958077, a reflectance of 2.0% can be obtained at a wavelength of 1020 nm. In this case, the film thickness of the layers of the nine-layer reflecting film are given by $Od_2/Ad_1/Ad_2/Bd_1/Bd_2/Cd_1/Cd_2/Dd_1/Dd_2$=19.20 nm/76.22 nm/259.22 nm/56.46 nm/192.02 nm/56.46 nm/192.02 nm/56.46 nm/192.02 nm. The total thickness ($d_{total}=\Sigma d_i$) of the film is 1100.08 nm. A sum $\Sigma n_i d_i$ of products $n_i d_i$ of refractive index $n_i$ and film thickness $d_i$ of a layer denoted with i in the nine films is 1889.46 nm which is very large, i.e., about 7.71 times a ¼ wavelength (=245 nm) of the predetermined wavelength of 980 nm. For this reason, a heat-radiation characteristic on the end face is improved, and the temperature of the end face can be suppressed from increasing.

Figure 44:
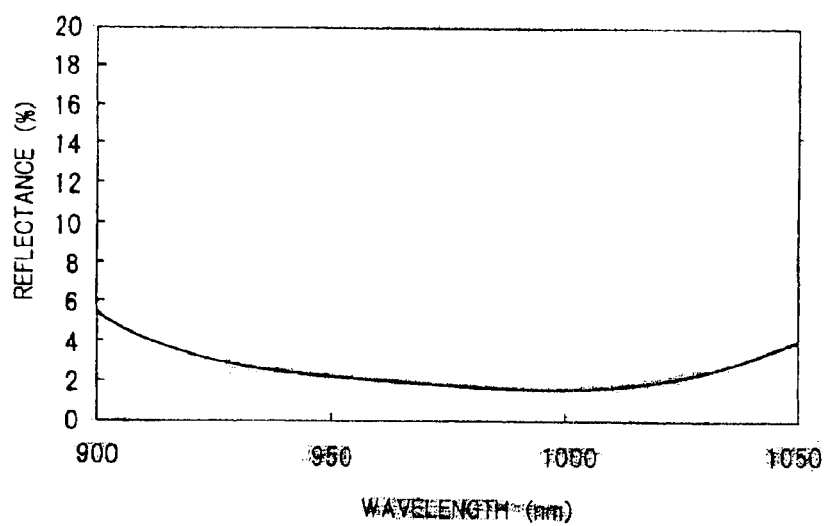
FIG. 44 is a graph of a wavelength dependence of a reflectance on a reflecting multi-layer film formed on the end face portion of the semiconductor optical device according to the thirty-fourth embodiment of the present invention.

FIG. 44 is a graph of a wavelength dependence of the reflectance of the nine-layer reflecting film 60. The abscissa of the graph indicates a wavelength, and the ordinate denotes a reflectance. In the nine-layer reflecting film, a flat portion having about 3% of a target reflectance over a wide wavelength band can be obtained. More specifically, the reflectance in the range of a wavelength of 912 nm to a wavelength of 1048 nm ranges from 1.6% to 4.0%. With reference to the reflectance of 2.0% at the setting wavelength 1020 nm, a continuous wavelength band in the range of −1.0% to +2.0%, i.e., 1.0% to 4.0% is 136 nm. A value obtained by dividing the wavelength band by the setting wavelength of 1020 nm is about 0.133, and is larger than 0.061 in the hypothetical reflecting film. Therefore, it is understood that the nine-layer reflecting film 60 has a flat portion having a low reflectance over a wide wavelength band.

Thirty-fifth Embodiment

A semiconductor optical device having a nine-layer reflecting film according to the thirty-fifth embodiment of the present invention will be described below with reference to FIG. 45. This semiconductor optical device has the same configuration as that of the semiconductor optical device according to the thirty-third embodiment. However, the semiconductor optical device is different from the semiconductor optical device according to the thirty-third embodiment in that a setting reflectance $R(\lambda_0)$ is 3.0% at a setting wavelength $\lambda_0$=980 nm. Parameters are given by O=0.2, A=2.7, B=2.0, C=2.0 and D=2.0. In addition, when phase shifts $\phi 1$ and $\phi 2$ of tantalum oxide and aluminum oxide are given by $\phi 1$=0.377348 and $\phi 2$=0.935416, a reflectance of 3.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2$=18.01 nm/77.25 nm/243.16 nm/57.22 nm/180.12 nm/57.22 nm/180.12 nm/57.22 nm/180.12 nm. The total thickness ($d_{total}=\Sigma d_i$) of the film is 1050.44 nm. A sum $\Sigma n_i d_i$ of products $n_i d_i$ of refractive index $n_i$ and film thickness $d_i$ of a layer denoted with i in the nine films is 1810.49 nm which is very large, i.e., about 7.49 times a ¼ wavelength (=245 nm) of the predetermined wavelength of 980 nm. For this reason, a heat-radiation characteristic on the end face is improved, and the temperature of the end face can be suppressed from increasing.

Figure 45:
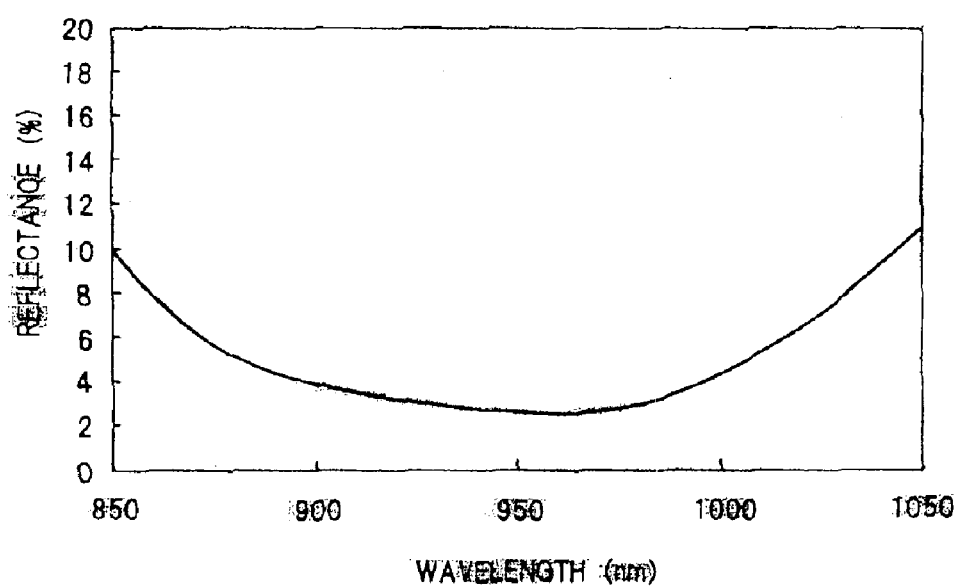
FIG. 45 is a graph of a wavelength dependence of a reflectance on a reflecting multi-layer film formed on an end face portion of a semiconductor optical device according to the thirty-fifth embodiment of the present invention.

FIG. 45 is a graph of a wavelength dependence of the reflectance of the nine-layer reflecting film 60. The abscissa of the graph indicates a wavelength, and the ordinate denotes a reflectance. In the nine-layer reflecting film, a flat portion having about 4% of a target reflectance over a wide wavelength band can be obtained. More specifically, the reflectance in the range of a wavelength of 882 nm to a wavelength of 1007 nm ranges from 2.6% to 5.0%. With reference to the reflectance of 3.0% at the setting wavelength 980 nm, a continuous wavelength band in the range of −1.0% to +2.0%, i.e., 2.0% to 5.0% is 125 nm. A value obtained by dividing the wavelength band by the setting wavelength of 980 nm is about 0.128, and is larger than 0.061 in the hypothetical reflecting film. Therefore, it is understood that the nine-layer reflecting film 60 has a flat portion having a low reflectance over a wide wavelength band.

Thirty-sixth Embodiment

A semiconductor optical device having a nine-layer reflecting film according to the thirty-sixth embodiment of the present invention will be described below with reference to FIG. 46. This semiconductor optical device has the same configuration as that of the semiconductor optical device according to the thirty-fifth embodiment. However, the semiconductor optical device is different from the semiconductor optical device according to the thirty-fifth embodiment in that a setting reflectance $R(\lambda_0)$ is 3.0% at a setting wavelength $\lambda_0$=1017 nm. Parameters are given by O=0.2, A=2.7, B=2.0, C=2.0 and D=2.0. In addition, when phase shifts $\phi 1$ and $\phi 2$ of tantalum oxide and aluminum oxide are given by $\phi 1$=0.377348 and $\phi 2$=0.935416, a reflectance of 3.0% can be obtained at a wavelength of 1017 nm. In this case, the film thickness of the layers of the nine-layer reflecting film are given by $Od_2/Ad_1/Ad_2/Bd_1/Bd_2/Cd_1/Cd_2/Dd_1/Dd_2$=18.69 nm/80.17 nm/252.35 nm/59.39 nm/186.92 nm/59.39 nm/186.92 nm/59.39 nm/186.92 nm. The total thickness ($d_{total}=\Sigma d_i$) of the film is 1090.14 nm. A sum $\Sigma n_i d_i$ of products $n_i d_i$ of refractive index $n_i$ and film thickness $d_i$ of a layer denoted with i in the nine films is 1878.92 nm which is very large, i.e., about 7.67 times a ¼ wavelength (=245 nm) of the predetermined wavelength of 980 nm. For this reason, a heat-radiation characteristic on the end face is improved, and the temperature of the end face can be suppressed from increasing.

Figure 46:
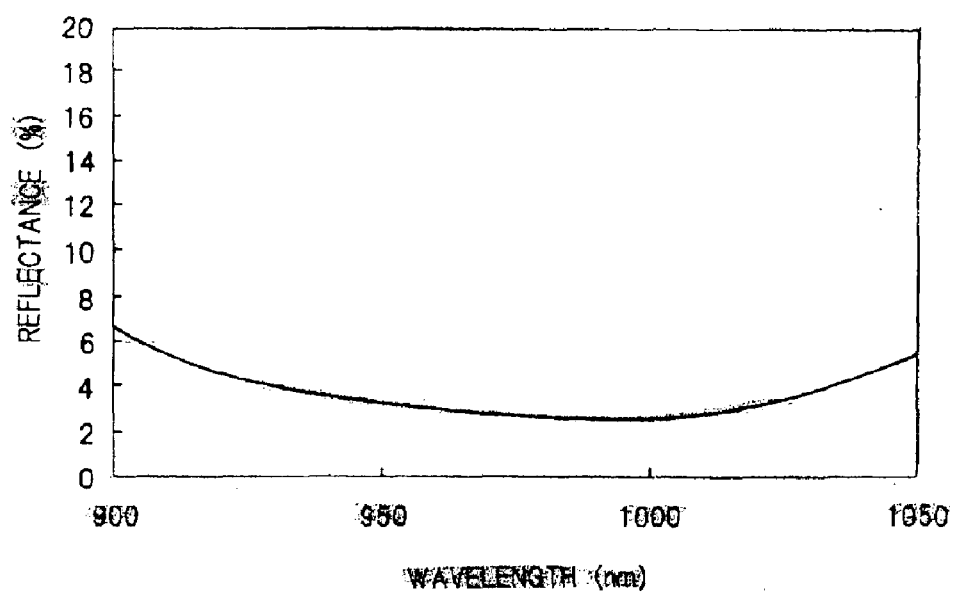
FIG. 46 is a graph of a wavelength dependence of a reflectance on a reflecting multi-layer film formed on an end face portion of a semiconductor optical device according to the thirty-sixth embodiment of the present invention.

FIG. 46 is a graph of a wavelength dependence of the reflectance of the nine-layer reflecting film 60. The abscissa of the graph indicates a wavelength, and the ordinate denotes a reflectance. In the nine-layer reflecting film, a flat portion having about 4% of a target reflectance over a wide wavelength band can be obtained. More specifically, the reflectance in the range of a wavelength of 915 nm to a wavelength of 1045 nm ranges from 2.6% to 5.0%. With reference to the reflectance of 3.0% at the setting wavelength 1017 nm, a continuous wavelength band in the range of −1.0% to +2.0%, i.e., 2.0% to 5.0% is 130 nm. A value obtained by dividing the wavelength band by the setting wavelength of 1017 nm is about 0.128, and is larger than 0.061 in the hypothetical reflecting film. Therefore, it is understood that the nine-layer reflecting film 60 has a flat portion having a low reflectance over a wide wavelength band.

Thirty-seventh Embodiment

A semiconductor optical device having a nine-layer reflecting film according to the thirty-seventh embodiment of the present invention will be described below with reference to FIG. 47. This semiconductor optical device has the same configuration as that of the semiconductor optical device according to the thirty-third embodiment. However, the semiconductor optical device is different from the semiconductor optical device according to the thirty-third embodiment in that a setting reflectance $R(\lambda_0)$ is 4.0% at a setting wavelength $\lambda_0$=980 nm. Parameters are given by O=0.15, A=2.8, B=2.0, C=2.0 and D=2.0. In addition, when phase shifts $\phi 1$ and $\phi 2$ of tantalum oxide and aluminum oxide are given by $\phi 1$=0.38725 and $\phi 2$=0.911369, a reflectance of 4.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2$=13.16 nm/82.22 nm/245.69 nm/58.73 nm/175.49 nm/58.73 nm/175.49 nm/58.73 nm/175.49 nm. The total thickness ($d_{total}=\Sigma d_i$) of the film is 1043.73 nm. A sum $\Sigma n_i d_i$ of products $n_i d_i$ of refractive index $n_i$ and film thickness $d_i$ of a layer denoted with i in the nine films is 1803.77 nm which is very large, i.e., about 7.36 times a ¼ wavelength (=245 nm) of the predetermined wavelength of 980 nm. For this reason, a heat-radiation characteristic on the end face is improved, and the temperature of the end face can be suppressed from increasing.

Figure 47:
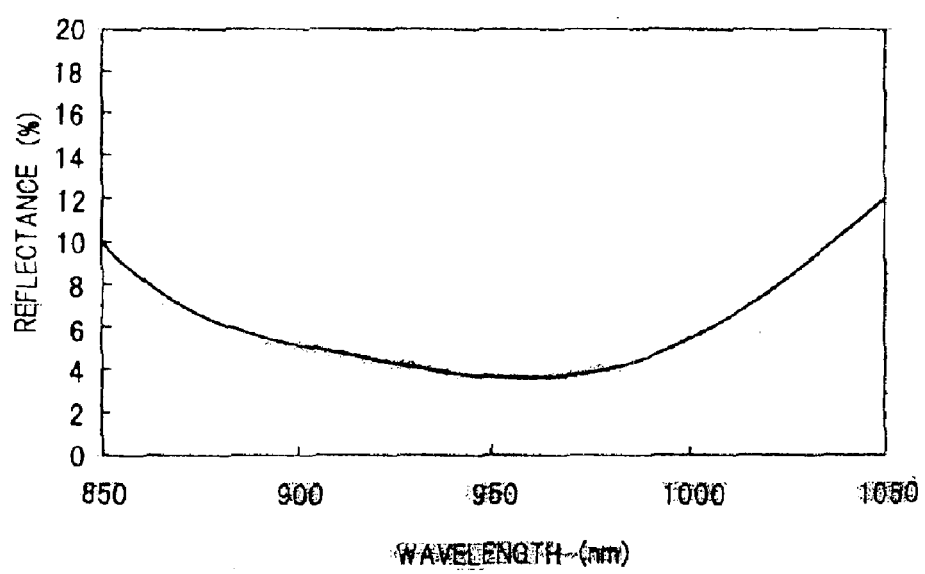
FIG. 47 is a graph of a wavelength dependence of a reflectance on a reflecting multi-layer film formed on an end face portion of a semiconductor optical device according to the thirty-seventh embodiment of the present invention.

FIG. 47 is a graph of a wavelength dependence of the reflectance of the nine-layer reflecting film 60. The abscissa of the graph indicates a wavelength, and the ordinate denotes a reflectance. In the nine-layer reflecting film, a flat portion having about 5% of a target reflectance over a wide wavelength band can be obtained. More specifically, the reflectance in the range of a wavelength of 883 nm to a wavelength of 1006 nm ranges from 3.6% to 6.0%. With reference to the reflectance of 4.0% at the setting wavelength 980 nm, a continuous wavelength band in the range of −1.0% to +2.0%, i.e., 3.0% to 6.0% is 123 nm. A value obtained by dividing the wavelength band by the setting wavelength of 980 nm is about 0.126, and is larger than 0.061 in the hypothetical reflecting film. Therefore, it is understood that the nine-layer reflecting film 60 has a flat portion having a low reflectance over a wide wavelength band.

Thirty-eighth Embodiment

A semiconductor optical device having a nine-layer reflecting film according to the thirty-eighth embodiment of the present invention will be described below with reference to FIG. 48. This semiconductor optical device has the same configuration as that of the semiconductor optical device according to the thirty-seventh embodiment. However, the semiconductor optical device is different from the semiconductor optical device according to the thirty-seventh embodiment in that a setting reflectance $R(\lambda_0)$ is 4.0% at a setting wavelength $\lambda_0=1017$ nm. Parameters are given by O=0.15, A=2.8, B=2.0, C=2.0 and D=2.0. In addition, when phase shifts $\phi1$ and $\phi2$ of tantalum oxide and aluminum oxide are given by $\phi1=0.38725$ and $\phi2=0.911369$, a reflectance of 4.0% can be obtained at a wavelength of 1017 nm. In this case, the film thickness of the layers of the nine-layer reflecting film are given by $Od_2/Ad_1/Ad_2/Bd_1/Bd_2/Cd_1/Cd_2/Dd_1/Dd_2$=13.66 nm/85.32 nm/245.96 nm/60.94 nm/182.12 nm/60.94 nm/182.12 nm/60.94 nm/182.12 nm. The total thickness ($d_{total}=\Sigma d_i$) of the film is 1083.12 nm. A sum $\Sigma n_i d_i$ of products $n_i d_i$ of refractive index $n_i$ and film thickness $d_i$ of a layer denoted with i in the nine films is 1871.83 nm which is very large, i.e., about 7.64 times a ¼ wavelength (=245 nm) of the predetermined wavelength of 980 nm. For this reason, a heat-radiation characteristic on the end face is improved, and the temperature of the end face can be suppressed from increasing.

Figure 48:
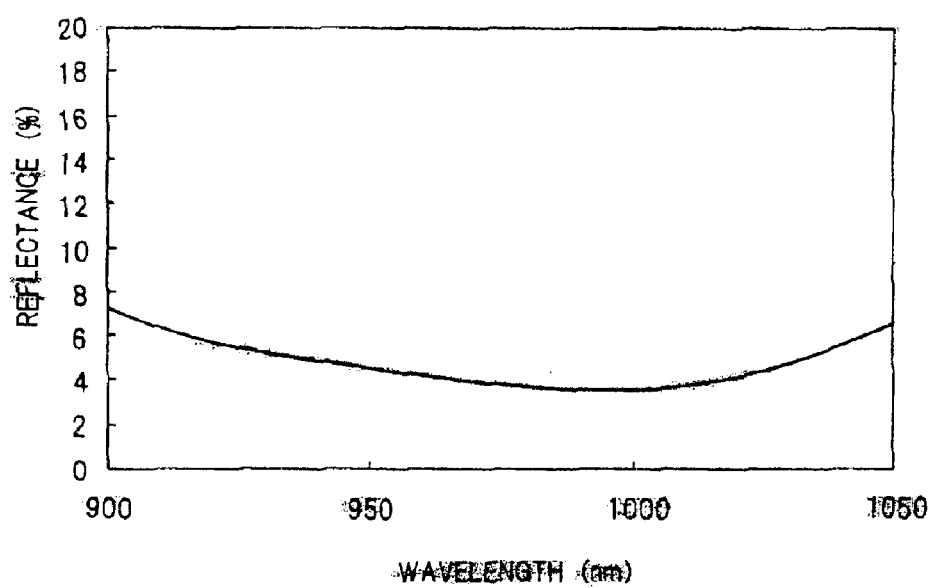
FIG. 48 is a graph of a wavelength dependence of a reflectance on a reflecting multi-layer film formed on an end face portion of a semiconductor optical device according to the thirty-eighth embodiment of the present invention.

FIG. 48 is a graph of a wavelength dependence of the reflectance of the nine-layer reflecting film 60. The abscissa of the graph indicates a wavelength, and the ordinate denotes a reflectance. In the nine-layer reflecting film, a flat portion having about 5% of a target reflectance over a wide wavelength band can be obtained. More specifically, the reflectance in the range of a wavelength of 916 nm to a wavelength of 1044 nm ranges from 3.6% to 6.0%. With reference to the reflectance of 4.0% at the setting wavelength 1017 nm, a continuous wavelength band in the range of −1.0% to +2.0%, i.e., 3.0% to 6.0% is 128 nm. A value obtained by dividing the wavelength band by the setting wavelength of 1017 nm is about 0.126, and is larger than 0.061 in the hypothetical reflecting film. Therefore, it is understood that the nine-layer reflecting film 60 has a flat portion having a low reflectance over a wide wavelength band.

Thirty-ninth Embodiment

A semiconductor optical device having a nine-layer reflecting film according to the thirty-ninth embodiment of the present invention will be described below with reference to FIG. 49. This semiconductor optical device has the same configuration as that of the semiconductor optical device according to the thirty-third embodiment. However, the semiconductor optical device is different from the semiconductor optical device according to the thirty-third embodiment in that a setting reflectance $R(\lambda_0)$ is 5.0% at a setting wavelength $\lambda_0=980$ nm. Parameters are given by O=0.10, A=2.9, B=2.0, C=2.0 and D=2.0. In addition, when phase shifts $\phi1$ and $\phi2$ of tantalum oxide and aluminum oxide are given by $\phi1=0.397519$ and $\phi2=0.886992$, a reflectance of 5.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2$=8.54 nm/87.41 nm/247.66 nm/60.28 nm/170.80 nm/60.28 nm/170.80 nm/60.28 nm/170.80 nm. The total thickness ($d_{total}=\Sigma d_i$) of the film is 1036.85 nm. A sum $\Sigma n_i d_i$ of products $n_i d_i$ of refractive index $n_i$ and film thickness $d_i$ of a layer denoted with i in the nine films is 1801.04 nm which is very large, i.e., about 7.35 times a ¼ wavelength (=245 nm) of the predetermined wavelength of 980 nm. For this reason, a heat-radiation characteristic on the end face is improved, and the temperature of the end face can be suppressed from increasing.

Figure 49:
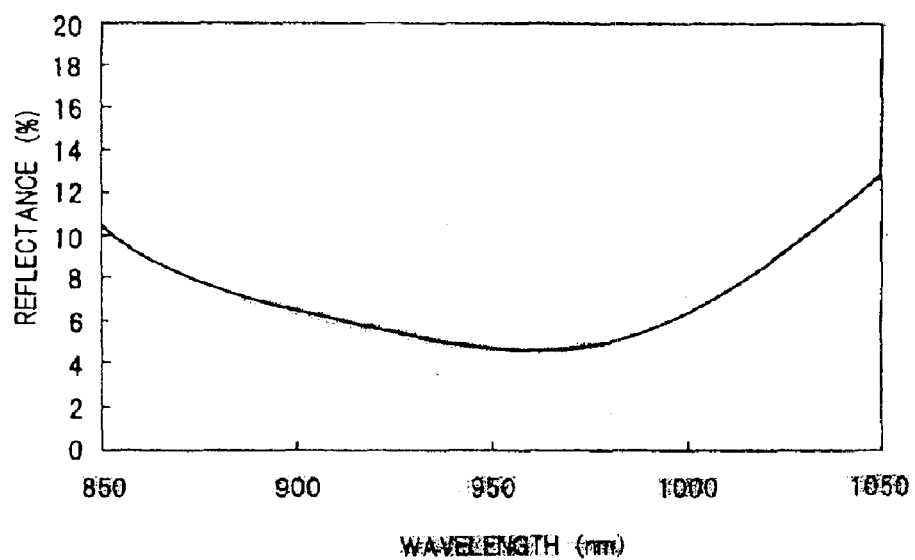
FIG. 49 is a graph of a wavelength dependence of a reflectance on a reflecting multi-layer film formed on an end face portion of a semiconductor optical device according to the thirty-ninth embodiment of the present invention.

FIG. 49 is a graph of a wavelength dependence of the reflectance of the nine-layer reflecting film 60. The abscissa of the graph indicates a wavelength, and the ordinate denotes a reflectance. In the nine-layer reflecting film, a flat portion having about 6% of a target reflectance over a wide wavelength band can be obtained. More specifically, the reflectance in the range of a wavelength of 890 nm to a wavelength of 1006 nm ranges from 4.6% to 7.0%. With reference to the reflectance of 5.0% at the setting wavelength 980 nm, a continuous wavelength band in the range of −1.0% to +2.0%, i.e., 4.0% to 7.0% is 116 nm. A value obtained by dividing the wavelength band by the setting wavelength of 980 nm is about 0.118, and is larger than 0.061 in the hypothetical reflecting film. Therefore, it is understood that the nine-layer reflecting film 60 has a flat portion having a low reflectance over a wide wavelength band.

Fortieth Embodiment

A semiconductor optical device having a nine-layer reflecting film according to the fortieth embodiment of the present invention will be described below with reference to FIG. 50. This semiconductor optical device has the same configuration as that of the semiconductor optical device according to the thirty-ninth embodiment. However, the semiconductor optical device is different from the semiconductor optical device according to the thirty-ninth embodiment in that a setting reflectance $R(\lambda_0)$ is 5.0% at a setting wavelength $\lambda_0=1013$ nm. Parameters are given by O=0.10, A=2.9, B=2.0, C=2.0 and D=2.0. In addition, when phase shifts $\phi1$ and $\phi2$ of tantalum oxide and aluminum oxide are given by $\phi1=0.397519$ and $\phi2=0.886992$, a reflectance of 5.0% can be obtained at a wavelength of 1013 nm. In this case, the film thickness of the layers of the nine-layer reflecting film are given by $Od_2/Ad_1/Ad_2/Bd_1/Bd_2/Cd_1/Cd_2/Dd_1/Dd_2$=8.83 nm/90.35 nm/256.00 nm/62.31 nm/176.55 nm/62.31 nm/176.55 nm/62.31 nm/176.55 nm. The total thickness ($d_{total}=\Sigma d_i$) of the film is 1071.76 nm. A sum $\Sigma n_i d_i$ of products $n_i d_i$ of refractive index $n_i$ and film thickness $d_i$ of a layer denoted with i in the nine films is 1857.42 nm which is very large, i.e., about 7.58 times a ¼ wavelength (=245 nm) of the predetermined wavelength of 980 nm. For this reason, a heat-radiation characteristic on the end face is improved, and the temperature of the end face can be suppressed from increasing.

Figure 50:
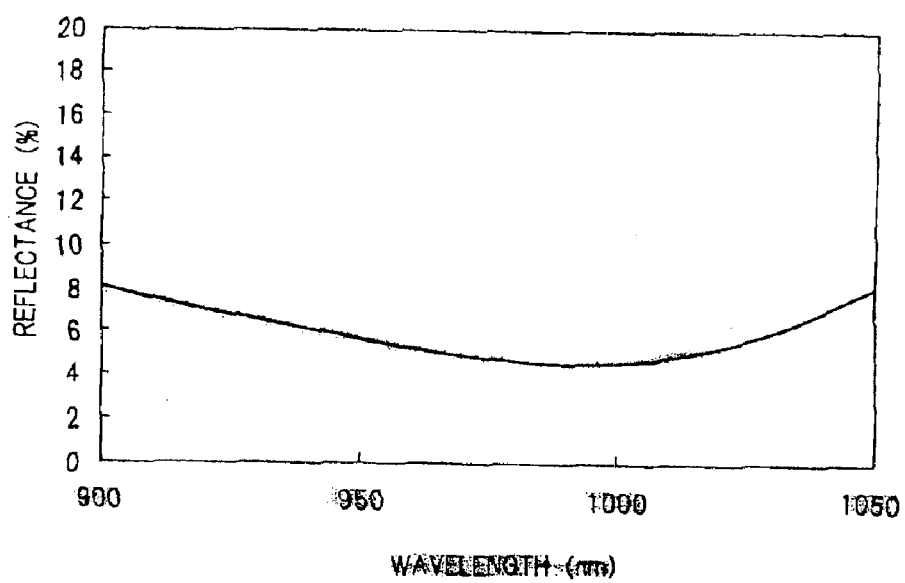
FIG. 50 is a graph of a wavelength dependence of a reflectance on a reflecting multi-layer film formed on an end face portion of a semiconductor optical device according to the fortieth embodiment of the present invention.

FIG. 50 is a graph of a wavelength dependence of the reflectance of the nine-layer reflecting film 60. The abscissa of the graph indicates a wavelength, and the ordinate denotes a reflectance. In the nine-layer reflecting film, a flat portion having about 6% of a target reflectance over a wide wavelength band can be obtained. More specifically, the reflectance in the range of a wavelength of 920 nm to a wavelength of 1040 nm ranges from 4.6% to 7.0%. With reference to the reflectance of 5.0% at the setting wavelength 1013 nm, a continuous wavelength band in the range of −1.0% to +2.0%, i.e., 4.0% to 7.0% is 120 nm. A value obtained by dividing the wavelength band by the setting wavelength of 1013 nm is about 0.118, and is larger than 0.061 in the hypothetical reflecting film. Therefore, it is understood that the nine-layer reflecting film 60 has a flat portion having a low reflectance over a wide wavelength band.

The characteristics of the reflecting multi-layer films of the semiconductor optical device according to the thirty-third embodiment to the fortieth embodiment are shown in Table 4. In Table 4, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.0 to +2.0% of $R(\lambda_0)$, and ratio of $\Delta\lambda/\lambda_0$ are shown.

TABLE 4

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation of $\Sigma n_i d_i$; Ratio of $\Sigma n_i d_i$ to 1/4 wave-length (245 nm) of 980 nm | Band width $\Delta\lambda$ in which the reflectance falls within the range from −1.0 to 2.0 of $R(\lambda_0)$ | Ratio of $\Delta\lambda/\lambda_0$ |
|---|---|---|---|---|---|---|
| 33 | nine films | 980 nm 2.0% | 1.4% | 1815.34 nm 7.41 times | 130 nm | 130/980 = 0.133 |
| 34 | nine films | 1020 nm 2.0% | 1.4% | 1889.46 nm 7.71 times | 136 nm | 136/1020 = 0.133 |
| 35 | nine films | 980 nm 3.0% | 2.6% | 1810.49 nm 7.49 times | 125 nm | 125/980 = 0.128 |
| 36 | nine films | 1017 nm 3.0% | 2.6% | 1878.92 nm 7.67 times | 130 nm | 130/1017 = 0.128 |
| 37 | nine films | 980 nm 4.0% | 3.6% | 1803.77 nm 7.36 times | 123 nm | 123/980 = 0.126 |
| 38 | nine films | 1017 nm 4.0% | 3.6% | 1871.83 nm 7.64 times | 128 nm | 128/1017 = 0.126 |
| 39 | nine films | 980 nm 5.0% | 4.6% | 1801.04 nm 7.35 times | 116 nm | 116/980 = 0.118 |
| 40 | nine films | 1013 nm 5.0% | 4.6% | 1857.42 nm 7.58 times | 120 nm | 120/1013 = 0.118 |

Forty-first Embodiment

A semiconductor optical device having a seven-layer reflecting film according to the forty-first embodiment of the present invention will be described below with reference to FIG. 51. This semiconductor optical device is different from the semiconductor optical device according to the first embodiment in that a setting reflectance $R(\lambda_0)$ is 6.0% at a setting wavelength $\lambda_0$=980 nm. Parameters are given by O=0.15, A=1.95, B=2.0, and C=2.0. In addition, when phase shifts $\phi 1$ and $\phi 2$ of tantalum oxide and aluminum oxide are given by $\phi 1$=0.845348 and $\phi 2$=0.578286, a reflectance of 6.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=8.35 nm/124.99 nm/108.57 nm/128.20 nm/111.35 nm/128.20 nm/111.35 nm. The total thickness ($d_{total}=\Sigma d_i$) of the film is 721.01 nm. A sum $\Sigma n_i d_i$ of products $n_i d_i$ of refractive index $n_i$ and film thickness $d_i$ of a layer denoted with i in the seven films is 1334.70 nm which is very large, i.e., about 5.45 times a ¼ wavelength (=245 nm) of the predetermined wavelength of 980 nm. For this reason, a heat-radiation characteristic on the end face is improved, and the temperature of the end face can be suppressed from increasing.

Figure 51:
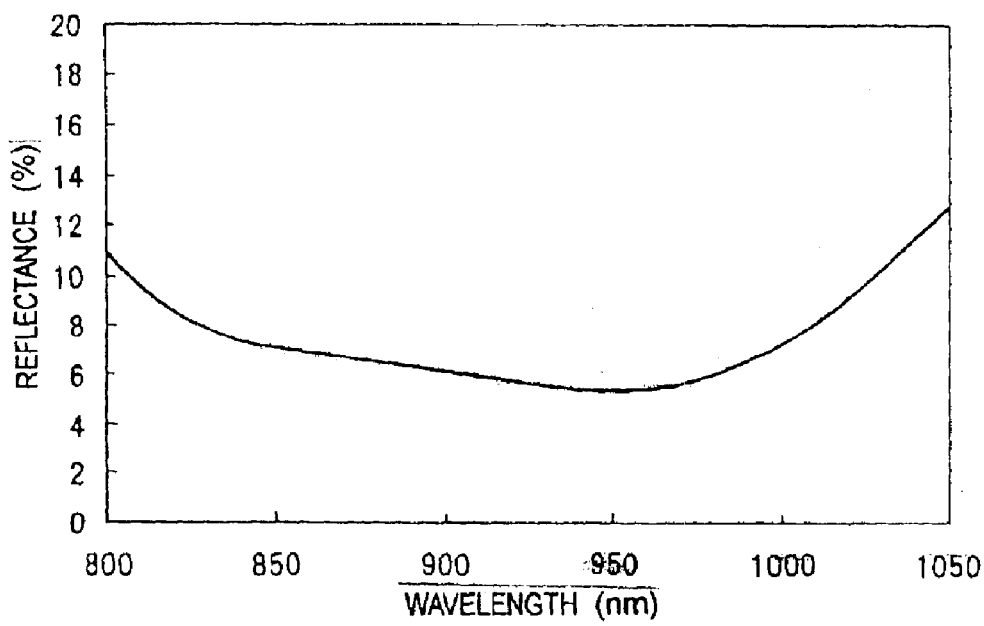
FIG. 51 is a graph of a wavelength dependence of a reflectance on a reflecting multi-layer film formed on an end face portion of a semiconductor optical device according to the forty-first embodiment of the present invention.

FIG. 51 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a target reflectance over a wide wavelength band can be obtained. More specifically, the reflectance in the range of a wavelength of 828 nm to a wavelength of 1009 nm ranges from 5.4% to 8.0%. With reference to the reflectance of 6.0% at the setting wavelength 980 nm, a continuous wavelength band in the range of −1.0% to +2.0%, i.e., 5.0% to 8.0% is 181 nm. A value obtained by dividing the wavelength band by the setting wavelength of 980 nm is about 0.185, and is larger than 0.062 in the hypothetical reflecting film. Therefore, it is understood that the seven-layer reflecting film has a flat portion having a low reflectance over a wide wavelength band.

Forty-second Embodiment

A semiconductor optical device having a seven-layer reflecting film according to the forty-second embodiment will be described below with reference to FIG. 52. This semiconductor optical device is different from the semiconductor optical device according to the forty-first embodiment in that a setting reflectance $R(\lambda_0)$ is 6.0% at a setting wavelength $\lambda_0$=1045 nm. Parameters are given by O=0.15, A=1.95, B=2.0, and C=2.0. In addition, when phase shifts $\phi 1$ and $\phi 2$ of tantalum oxide and aluminum oxide are given by $\phi 1$=0.541022 and $\phi 2$=0.741397, a reflectance of 6% is obtained at a wavelength of 1045 nm. In this case, the film thickness of the layers of the seven-layer reflecting film are given by $Od_2/Ad_1/Ad_2/Bd_1/Bd_2/Cd_1/Cd_2$=8.91 nm/133.28 nm/115.77 nm/136.70 nm/118.74 nm/136.70 nm/118.74 nm. The total thickness ($d_{total}=\Sigma d_i$) of the film is 768.84 nm. A sum $\Sigma n_i d_i$ of products $n_i d_i$ of refractive index $n_i$ and film thickness $d_i$ of a layer denoted with i in the seven films is 1423.24 nm which is very large, i.e., about 5.81 times a ¼ wavelength (=245 nm) of the predetermined wavelength of 980 nm. For this reason, a heat-radiation characteristic on the end face is improved, and the temperature of the end face can be suppressed from increasing.

Figure 52:
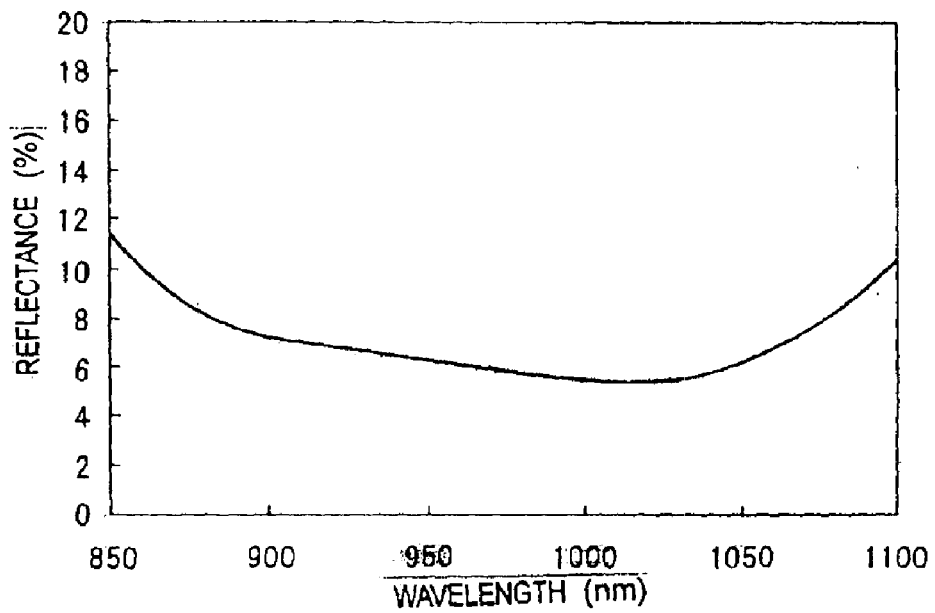
FIG. 52 is a graph of a wavelength dependence of a reflectance on a reflecting multi-layer film formed on an end face portion of a semiconductor optical device according to the forty-second embodiment of the present invention.

FIG. 52 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a target reflectance over a wide wavelength band can be obtained. More specifically, the reflectance in the range of a wavelength of 883 nm to a wavelength of 1076 nm ranges from 5.4% to 8.0%. With reference to the reflectance of 6.0% at the setting wavelength 1045 nm, a continuous wavelength band in the range of −1.0% to +2.0%, i.e., 5.0% to 8.0% is 193 nm. A value obtained by dividing the wavelength band by the setting wavelength of 1045 nm is about 0.185, and is larger than 0.062 in the hypothetical reflecting film. Therefore, it is understood that the seven-layer reflecting film has a flat portion having a low reflectance over a wide wavelength band.

The characteristics of the reflecting multi-layer films of the semiconductor optical device according to the forty-first embodiment to the forty-second embodiment are shown in Table 5. In Table 5, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.0 to +2.0% of $R(\lambda_0)$, and ratio of $\Delta\lambda/\lambda_0$ are shown.

hypothetical single reflecting film. Therefore, it is understood that the seven-layer reflecting film has a flat portion having a low reflectance over a wide wavelength band.

TABLE 5

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.0 to 2.0 of $R(\lambda_0)$ | Ratio of $\Delta\lambda/\lambda_0$ |
|---|---|---|---|---|---|---|
| 41 | Seven films | 980 nm 6.0% | 5.4% | 1334.70 nm 5.45 times | 181 nm | 181/980 = 0.185 |
| 42 | Seven films | 1045 nm 6.0% | 5.4% | 1423.24 nm 5.81 times | 193 nm | 193/1045 = 0.185 |

Forty-third Embodiment

A semiconductor optical device having a seven-layer reflecting film according to the forty-third embodiment of the present invention will be described below with reference to FIG. 53. This semiconductor optical device is different from the semiconductor optical device according to the first embodiment in that a setting reflectance $R(\lambda_0)$ is 6.0% at a setting wavelength $\lambda_0$=980 nm. Parameters are given by O=0.20, A=1.97, B=2.35, and C=2.10. In addition, when phase shifts $\phi 1$ and $\phi 2$ of tantalum oxide and aluminum oxide are given by $\phi 1$=0.79703 and $\phi 2$=0.528684, a reflectance of 6.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=10.18 nm/119.06 nm/100.28 nm/145.02 nm/119.62 nm/126.91 nm/106.89 nm. The total thickness ($d_{total}=\Sigma d_i$) of the film is 727.96 nm. A sum $\Sigma n_i d_i$ of products $n_i d_i$ of refractive index $n_i$ and film thickness $d_i$ of a layer denoted with i in the seven films is 1350.16 nm which is very large, i.e., about 5.51 times a ¼ wavelength (=245 nm) of the predetermined wavelength of 980 nm. For this reason, a heat-radiation characteristic on the end face is improved, and the temperature of the end face can be suppressed from increasing.

Figure 53:
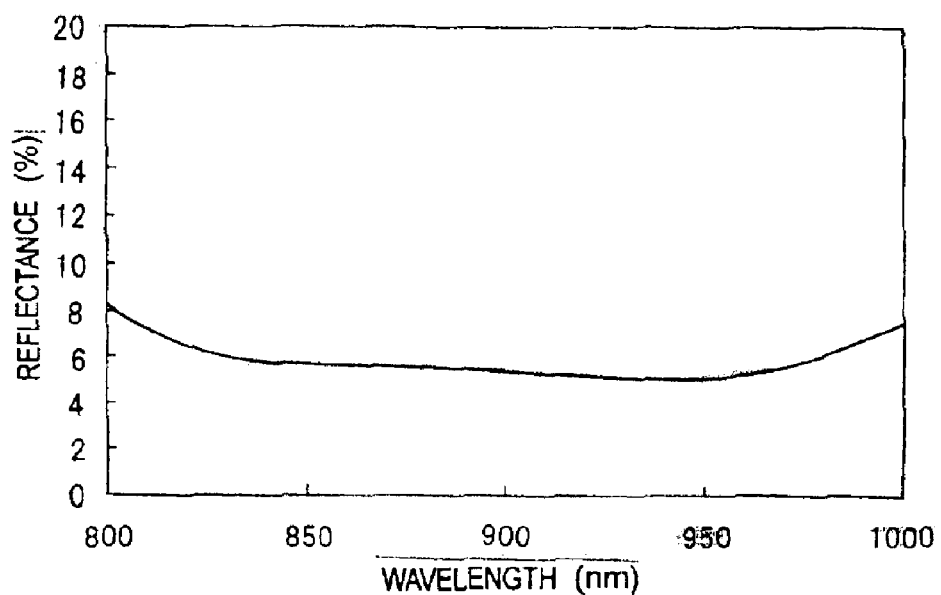
FIG. 53 is a graph of a wavelength dependence of a reflectance on a reflecting multi-layer film formed on an end face portion of a semiconductor optical device according to the forty-third embodiment of the present invention.

FIG. 53 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a target reflectance over a wide wavelength band can be obtained. More specifically, the reflectance in the range of a wavelength of 813 nm to a wavelength of 994 nm ranges from 5.0% to 7.0%. With reference to the reflectance of 6.0% at the setting wavelength 980 nm, a continuous wavelength band in the range of −1.5% to +1.0%, i.e., 4.5% to 7.0% is 181 nm. A value obtained by dividing the wavelength band by the setting wavelength of 980 nm is about 0.185.

Meanwhile, it is assumed that a hypothetical single reflecting film having a thickness of $5\lambda/(4n_1)$ has a minimal reflectance of 4% at a wavelength $\lambda$ of 980 nm. It should be noted that the effective refractive index $n_e$=3.37, and the refractive index $n_1$=1.449. In this case, the reflectance in the range of a wavelength of 949 nm to a wavelength of 1013 nm ranges from a minimal value of 4.0% to 6.5%. The continuous wavelength band in the range of 4.0% to 6.5% is 64 nm. An reference index of continuous wavelength band is obtained by dividing the wavelength band by the predetermined wavelength of 980 nm is about 0.065.

Then, as compared to the reference index, the value of 0.185 is larger than the reference index of 0.065 in the Forty-fourth Embodiment A semiconductor optical device having a seven-layer reflecting film according to the forty-fourth embodiment will be described below with reference to FIG. 54. This semiconductor optical device is different from the semiconductor optical device according to the forty-third embodiment in that a setting reflectance $R(\lambda_0)$ is 6.0% at a setting wavelength $\lambda_0$=1063 nm. Parameters are given by O=0.20, A=1.97, B=2.35, and C=2.10. In addition, when phase shifts $\phi 1$ and $\phi 2$ of tantalum oxide and aluminum oxide are given by $\phi 1$=0.79703 and $\phi 2$=0.528684, a reflectance of 6% is obtained at a wavelength of 1063 nm. In this case, the film thickness of the layers of the seven-layer reflecting film are given by $Od_2/Ad_1/Ad_2/Bd_1/Bd_2/Cd_1/Cd_2$=11.04 nm/129.14 nm/108.77 nm/154.05 nm/129.75 nm/137.66 nm/115.95 nm. The total thickness ($d_{total}=\Sigma d_i$) of the film is 786.36 nm. A sum $\Sigma n_i d_i$ of products $n_i d_i$ of refractive index $n_i$ and film thickness $d_i$ of a layer denoted with i in the seven films is 1457.82 nm which is very large, i.e., about 5.95 times a ¼ wavelength (=245 nm) of the predetermined wavelength of 980 nm. For this reason, a heat-radiation characteristic on the end face is improved, and the temperature of the end face can be suppressed from increasing.

Figure 54:
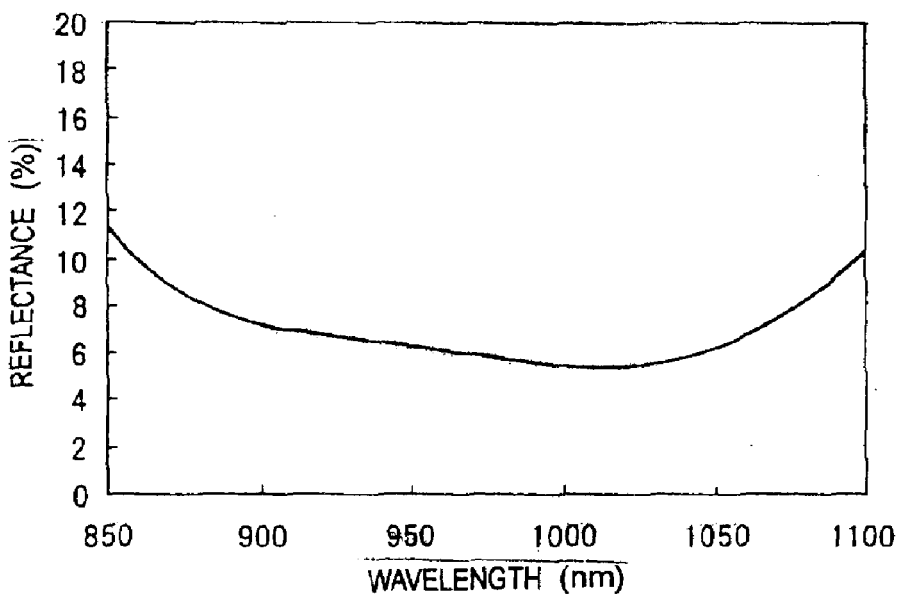
FIG. 54 is a graph of a wavelength dependence of a reflectance on a reflecting multi-layer film formed on an end face portion of a semiconductor optical device according to the forty-fourth embodiment of the present invention.

FIG. 54 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a target reflectance over a wide wavelength band can be obtained. More specifically, the reflectance in the range of a wavelength of 882 nm to a wavelength of 1078 nm ranges from 5.0% to 7.0%. With reference to the reflectance of 6.0% at the setting wavelength 1063 nm, a continuous wavelength band in the range of −1.5% to +1.0%, i.e., 4.5% to 7.0% is 196 nm. A value obtained by dividing the wavelength band by the setting wavelength of 1063 nm is about 0.184, and is larger than 0.065 in the hypothetical reflecting film. Therefore, it is understood that the seven-layer reflecting film has a flat portion having a low reflectance over a wide wavelength band.

Forty-fifth Embodiment

A semiconductor optical device having a seven-layer reflecting film according to the forty-fifth embodiment of the present invention will be described below with reference to FIG. 55. This semiconductor optical device is different from the semiconductor optical device according to the first embodiment in that a setting reflectance $R(\lambda_0)$ is 7.0% at a setting wavelength $\lambda_0$=980 nm. Parameters are given by O=0.17, A=1.97, B=2.35, and C 2.05. In addition, when phase shifts $\phi 1$ and $c\phi 2$ of tantalum oxide and aluminum oxide are given by φ1=0.80763 and φ2=0.525803, a reflectance of 6.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=8.61 nm/120.64 nm/99.73 nm/143.91 nm/118.97 nm/125.54 nm/103.78 nm. The total thickness ($d_{total}=\Sigma d_i$) of the film is 721.18 nm. A sum $\Sigma n_i d_i$ of products $n_i d_i$ of refractive index $n_i$ and film thickness $d_i$ of a layer denoted with i in the seven films is 1338.78 nm which is very large, i.e., about 5.46 times a ¼ wavelength (=245 nm) of the predetermined wavelength of 980 nm. For this reason, a heat-radiation characteristic on the end face is improved, and the temperature of the end face can be suppressed from increasing.

Figure 55:
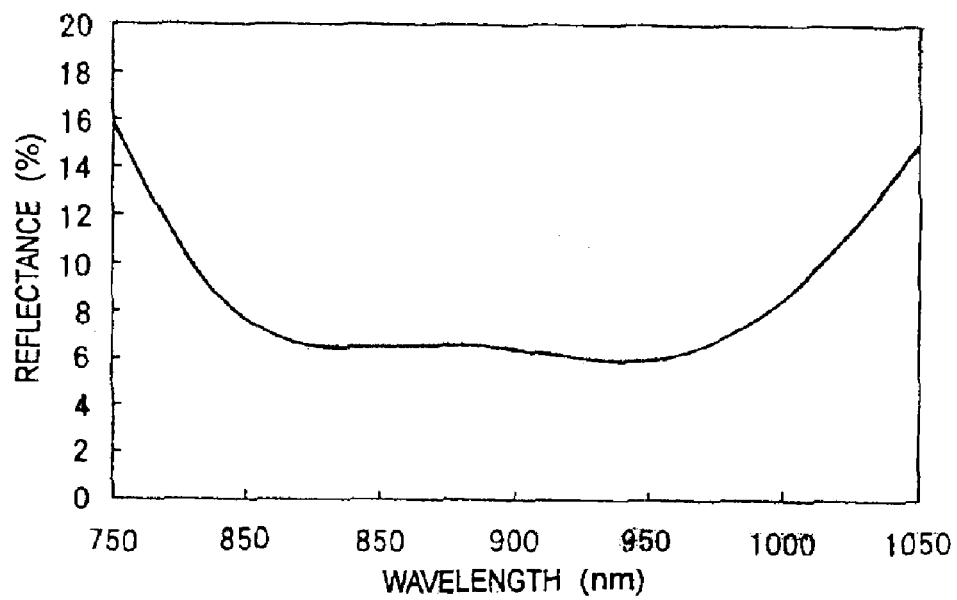
FIG. 55 is a graph of a wavelength dependence of a reflectance on a reflecting multi-layer film formed on an end face portion of a semiconductor optical device according to the forty-fifth embodiment of the present invention.

FIG. 55 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a setting reflectance over a wide wavelength band can be obtained. More specifically, the reflectance in the range of a wavelength of 797 nm to a wavelength of 993 nm ranges from 5.9% to 8.0%. With reference to the reflectance of 7.0% at the setting wavelength 980 nm, a continuous wavelength band in the range of −1.5% to +1.0%, i.e., 5.5% to 8.0% is 196 nm. A value obtained by dividing the wavelength band by the setting wavelength of 980 nm is about 0.200, and is larger than 0.065 in the hypothetical reflecting film. Therefore, it is understood that the seven-layer reflecting film has a flat portion having a low reflectance over a wide wavelength band.

Forty-sixth Embodiment

A semiconductor optical device having a seven-layer reflecting film according to the forty-sixth embodiment will be described below with reference to FIG. 56. This semiconductor optical device is different from the semiconductor optical device according to the forty-first embodiment in that a setting reflectance $R(\lambda_0)$ is 7.0% at a setting wavelength $\lambda_0$=1073 nm. In addition, when phase shifts φ1 and φ2 of tantalum oxide and aluminum oxide are given by φ1=0.80763 and φ2=0.525803, a reflectance of 7% is obtained at a wavelength of 1073 nm. In this case, the film thickness of the layers of the seven-layer reflecting film are given by $Od_2/Ad_1/Ad_2/Bd_1/Bd_2/Cd_1/Cd_2$=9.42 nm/132.09 nm/109.19 nm/157.57 nm/130.26 nm/137.45 nm/113.63 nm. The total thickness ($d_{total}=\Sigma d_i$) of the film is 789.61 nm. A sum $\Sigma n_i d_i$ of products $n_i d_i$ of refractive index $n_i$ and film thickness $d_i$ of a layer denoted with i in the seven films is 1465.82 nm which is very large, i.e., about 5.98 times a ¼ wavelength (=245 nm) of the predetermined wavelength of 980 nm. For this reason, a heat-radiation characteristic on the end face is improved, and the temperature of the end face can be suppressed from increasing.

Figure 56:
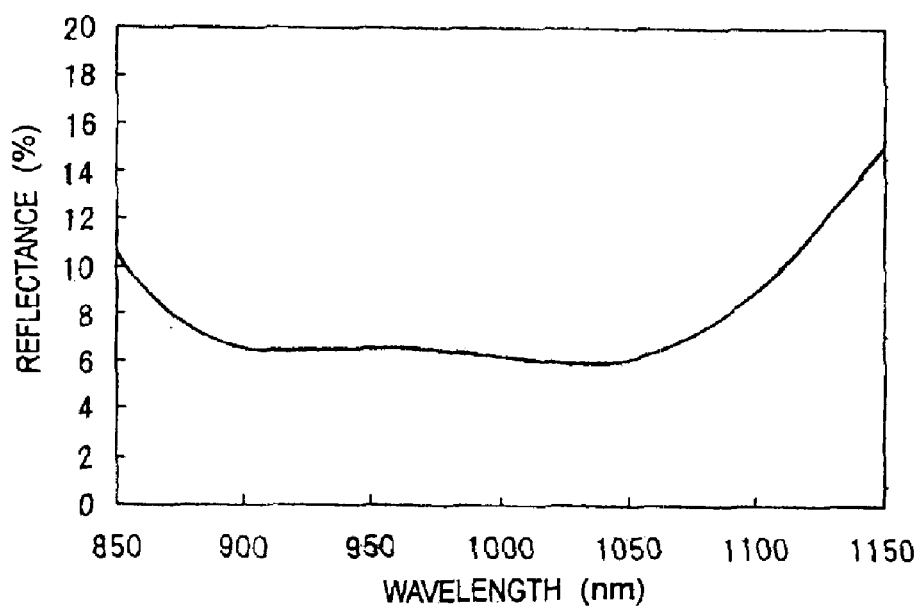
FIG. 56 is a graph of a wavelength dependence of a reflectance on a reflecting multi-layer film formed on an end face portion of a semiconductor optical device according to the forty-sixth embodiment of the present invention.

FIG. 56 is a graph of a wavelength dependence of the reflectance of the seven-layer reflecting film. The abscissa of the graph indicates a wavelength, and the ordinate denotes a reflectance. In the seven-layer reflecting film, a flat portion having about 7% of a setting reflectance over a wide wavelength band can be obtained. More specifically, the reflectance in the range of a wavelength of 872 nm to a wavelength of 1088 nm ranges from 5.9% to 8.0%. With reference to the reflectance of 7.0% at the setting wavelength 1073 nm, a continuous wavelength band in the range of −1.5% to +1.0%, i.e., 5.5% to 8.0% is 196 nm. A value obtained by dividing the wavelength band by the setting wavelength of 1073 nm is about 0.183, and is larger than 0.065 in the hypothetical reflecting film. Therefore, it is understood that the seven-layer reflecting film has a flat portion having a low reflectance over a wide wavelength band.

Forty-seventh Embodiment

A semiconductor optical device having a seven-layer reflecting film according to the forty-seventh embodiment of the present invention will be described below with reference to FIG. 57. This semiconductor optical device is different from the semiconductor optical device according to the first embodiment in that a setting reflectance $R(\lambda_0)$ is 8.0% at a setting wavelength $\lambda_0$=980 nm. Parameters are given by O=0.17, A=1.97, B=2.35, and C=2.0. In addition, when phase shifts φ1 and φ2 of tantalum oxide and aluminum oxide are given by φ1=0.806965 and φ2=0.531203, a reflectance of 8.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=8.69 nm/120.54 nm/100.75 nm/143.79 nm/120.19 nm/122.38 nm/102.29 nm. The total thickness ($d_{total}=\Sigma d_i$) of the film is 718.63 nm. A sum $\Sigma n_i d_i$ of products $n_i d_i$ of refractive index $n_i$ and film thickness $d_i$ of a layer denoted with i in the seven films is 1333.17 nm which is very large, i.e., about 5.44 times a ¼ wavelength (=245 nm) of the predetermined wavelength of 980 nm. For this reason, a heat-radiation characteristic on the end face is improved, and the temperature of the end face can be suppressed from increasing.

Figure 57:
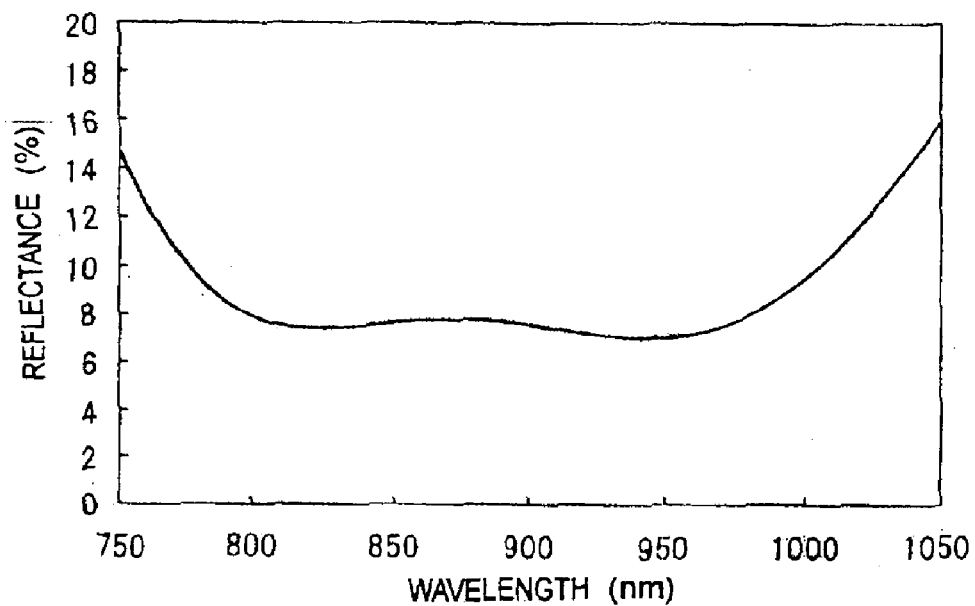
FIG. 57 is a graph of a wavelength dependence of a reflectance on a reflecting multi-layer film formed on an end face portion of a semiconductor optical device according to the forty-seventh embodiment of the present invention.

FIG. 57 is a graph of a wavelength dependence of the reflectance of the seven-layer reflecting film. The abscissa of the graph indicates a wavelength, and the ordinate denotes a reflectance. In the seven-layer reflecting film, a flat portion having about 8% of a setting reflectance over a wide wavelength band can be obtained. More specifically, the reflectance in the range of a wavelength of 786 nm to a wavelength of 994 nm ranges from 7.0% to 9.0%. With reference to the reflectance of 8.0% at the setting wavelength 980 nm, a continuous wavelength band in the range of −1.5% to +1.0%, i.e., 6.5% to 9.0% is 208 nm. A value obtained by dividing the wavelength band by the setting wavelength of 980 nm is about 0.212, and is larger than 0.065 in the hypothetical reflecting film. Therefore, it is understood that the seven-layer reflecting film has a flat portion having a low reflectance over a wide wavelength band.

Forty-eighth Embodiment

A semiconductor optical device having a seven-layer reflecting film according to the forty-eighth embodiment will be described below with reference to FIG. 58. This semiconductor optical device is different from the semiconductor optical device according to the forty-seventh embodiment in that a setting reflectance $R(\lambda_0)$ is 8.0% at a setting wavelength $\lambda_0$=1079 nm. In addition, when phase shifts φ1 and φ2 of tantalum oxide and aluminum oxide are given by φ1=0.806965 and φ2=0.531203, a reflectance of 8% is obtained at a wavelength of 1079 nm. In this case, the film thickness of the layers of the seven-layer reflecting film are given by $Od_2/Ad_1/Ad_2/Bd_1/Bd_2/Cd_1/Cd_2$=9.57 nm/132.72 nm/110.93 nm/158.32 nm/132.33 nm/134.74 nm/112.62 nm. The total thickness ($d_{total}=\Sigma d_i$) of the film is 791.23 nm. A sum $\Sigma n_i d_i$ of products $n_i d_i$ of refractive index $n_i$ and film thickness $d_i$ of a layer denoted with i in the seven films is 1467.86 nm which is very large, i.e., about 5.99 times a ¼ wavelength (=245 nm) of the predetermined wavelength of 980 nm. For this reason, a heat-radiation characteristic on the end face is improved, and the temperature of the end face can be suppressed from increasing.

Figure 58:
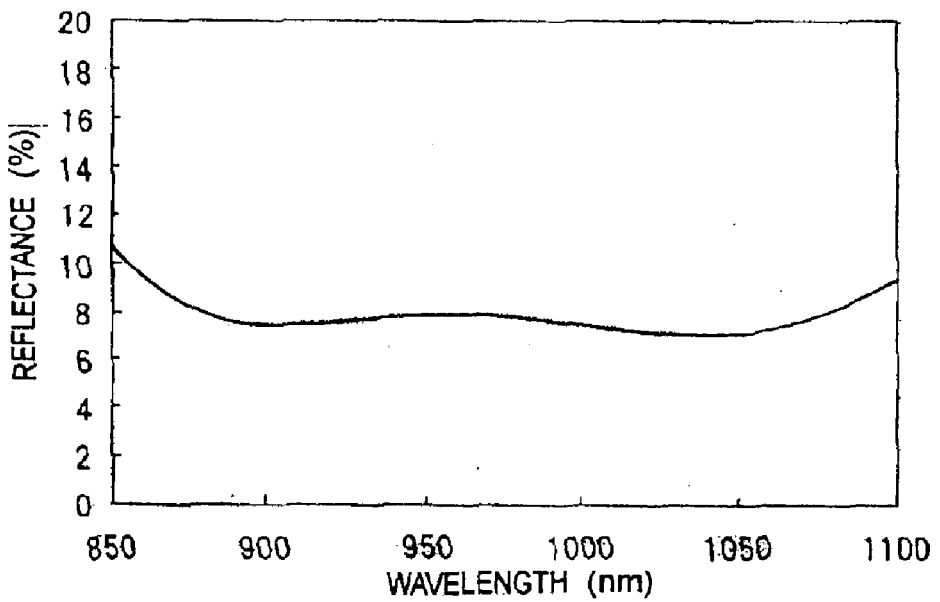
FIG. 58 is a graph of a wavelength dependence of a reflectance on a reflecting multi-layer film formed on an end face portion of a semiconductor optical device according to the forty-eighth embodiment of the present invention.

FIG. 58 is a graph of a wavelength dependence of the reflectance of the seven-layer reflecting film. The abscissa of the graph indicates a wavelength, and the ordinate denotes a reflectance. In the seven-layer reflecting film, a flat portion having about 8% of a setting reflectance over a wide wavelength band can be obtained. More specifically, the reflectance in the range of a wavelength of 866 nm to a wavelength of 1094 nm ranges from 7.0% to 9.0%. With reference to the reflectance of 8.0% at the setting wavelength 1079 nm, a continuous wavelength band in the range of −1.5% to +1.0%, i.e., 5.5% to 8.0% is 228 nm. A value obtained by dividing the wavelength band by the setting wavelength of 1079 nm is about 0.211, and is larger than 0.065 in the hypothetical reflecting film. Therefore, it is understood that the seven-layer reflecting film has a flat portion having a low reflectance over a wide wavelength band.

Forty-ninth Embodiment

A semiconductor optical device having a seven-layer reflecting film according to the forty-ninth embodiment of the present invention will be described below with reference to FIG. 59. This semiconductor optical device is different from the semiconductor optical device according to the first embodiment in that a setting reflectance $R(\lambda_0)$ is 9.0% at a setting wavelength $\lambda_0$=980 nm. Parameters are given by O=0.20, A=2.05, B=2.40, and C=1.95. In addition, when phase shifts $\phi1$ and $\phi2$ of tantalum oxide and aluminum oxide are given by $\phi1$=0.734549 and $\phi2$=0.580342, a reflectance of 9.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=11.17 nm/114.18 nm/114.54 nm/133.67 nm/134.10 nm/108.61 nm/108.96 nm. The total thickness ($d_{total}=\phi d_i$) of the film is 725.23 nm. A sum $\Sigma n_i d_i$ of products $n_i d_i$ of refractive index $n_i$ and film thickness $d_i$ of a layer denoted with i in the seven films is 1330.65 nm which is very large, i.e., about 5.43 times a ¼ wavelength (=245 nm) of the predetermined wavelength of 980 nm. For this reason, a heat-radiation characteristic on the end face is improved, and the temperature of the end face can be suppressed from increasing.

Figure 59:
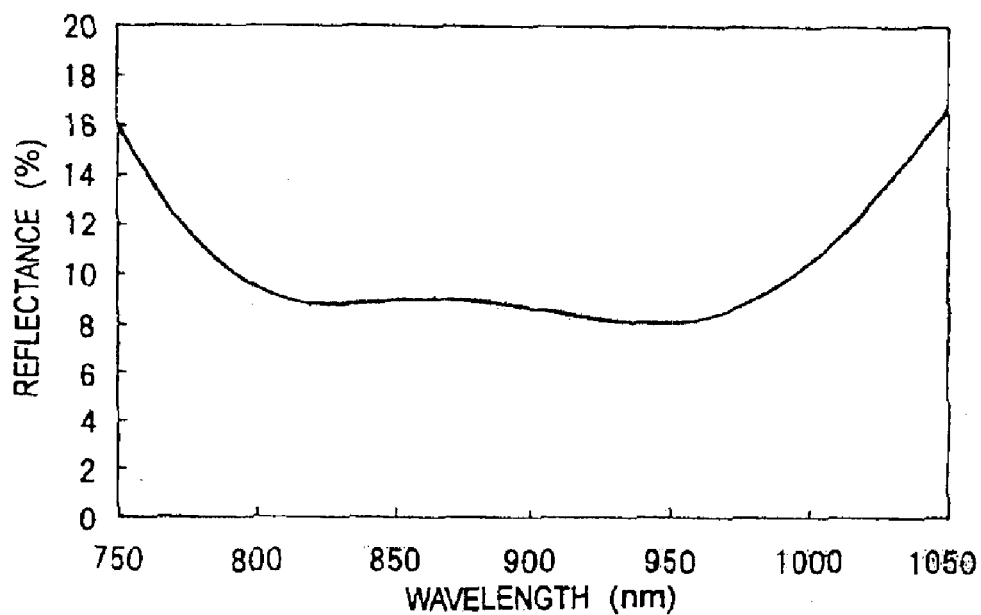
FIG. 59 is a graph of a wavelength dependence of a reflectance on a reflecting multi-layer film formed on an end face portion of a semiconductor optical device according to the forty-ninth embodiment of the present invention.

FIG. 59 is a graph of a wavelength dependence of the reflectance of the seven-layer reflecting film. The abscissa of the graph indicates a wavelength, and the ordinate denotes a reflectance. In the seven-layer reflecting film, a flat portion having about 9% of a setting reflectance over a wide wavelength band can be obtained. More specifically, the reflectance in the range of a wavelength of 793 nm to a wavelength of 994 nm ranges from 8.1% to 10.0%. With reference to the reflectance of 9.0% at the setting wavelength 980 nm, a continuous wavelength band in the range of −1.5% to +1.0%, i.e., 7.5% to 10.0% is 202 nm. A value obtained by dividing the wavelength band by the setting wavelength of 980 nm is about 0.206, and is larger than 0.065 in the hypothetical reflecting film. Therefore, it is understood that the seven-layer reflecting film has a flat portion having a low reflectance over a wide wavelength band.

Fiftieth Embodiment

A semiconductor optical device having a seven-layer reflecting film according to the fiftieth embodiment will be described below with reference to FIG. 60. This semiconductor optical device is different from the semiconductor optical device according to the forty-ninth embodiment in that a setting reflectance $R(\lambda_0)$ is 9.0% at a setting wavelength $\lambda_0$=1075 nm. In addition, when phase shifts $\phi1$ and $\phi2$ of tantalum oxide and aluminum oxide are given by $\phi1$=0.734549 and $\phi2$=0.580342, a reflectance of 9% is obtained at a wavelength of 1075 nm. In this case, the film thickness of the layers of the seven-layer reflecting film are given by $Od_1/Ad_1/Ad_2/Bd_1/Bd_2/Cd_1/Cd_2$=12.26 nm/125.25 nm/125.65 nm/146.63 nm/147.10 nm/119.14 nm/119.52 nm. The total thickness ($d_{total}=\Sigma d_i$) of the film is 795.55 nm. A sum $\Sigma n_i d_i$ of products $n_i d_i$ of refractive index $n_i$ and film thickness $d_i$ of a layer denoted with i in the seven films is 1459.67 nm which is very large, i.e., about 5.96 times a ¼ wavelength (=245 nm) of the predetermined wavelength of 980 nm. For this reason, a heat-radiation characteristic on the end face is improved, and the temperature of the end face can be suppressed from increasing.

Figure 60:
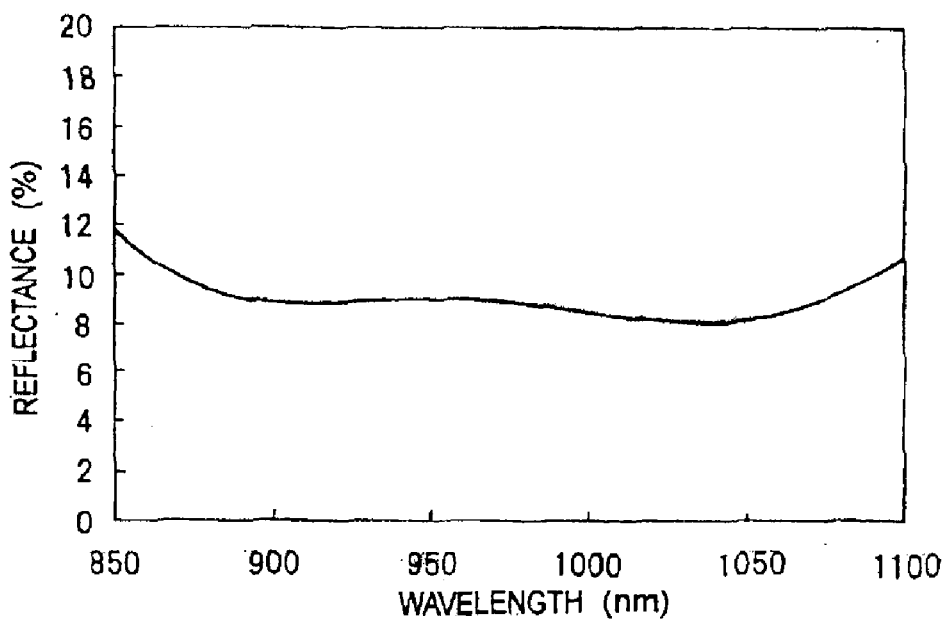
FIG. 60 is a graph of a wavelength dependence of a reflectance on a reflecting multi-layer film formed on an end face portion of a semiconductor optical device according to the fiftieth embodiment of the present invention.

FIG. 60 is a graph of a wavelength dependence of the reflectance of the seven-layer reflecting film. The abscissa of the graph indicates a wavelength, and the ordinate denotes a reflectance. In the seven-layer reflecting film, a flat portion having about 9% of a setting reflectance over a wide wavelength band can be obtained. More specifically, the reflectance in the range of a wavelength of 870 nm to a wavelength of 1090 nm ranges from 8.1% to 10.0%. With reference to the reflectance of 9.0% at the setting wavelength 1075 nm, a continuous wavelength band in the range of −1.5% to +1.0%, i.e., 7.5% to 10.0% is 220 nm. A value obtained by dividing the wavelength band by the setting wavelength of 1075 nm is about 0.205, and is larger than 0.065 in the hypothetical reflecting film. Therefore, it is understood that the seven-layer reflecting film has a flat portion having a low reflectance over a wide wavelength band.

Fifty-first Embodiment

A semiconductor optical device having a seven-layer reflecting film according to the fifty-first embodiment of the present invention will be described below with reference to FIG. 61. This semiconductor optical device is different from the semiconductor optical device according to the first embodiment in that a setting reflectance $R(\lambda_0)$ is 10.0% at a setting wavelength $\lambda_0$=980 nm. Parameters are given by O=0.17, A=2.10, B=2.45, and C=1.95. In addition, when phase shifts $\phi1$ and $\phi2$ of tantalum oxide and aluminum oxide are given by $\phi1$=0.729549 and $\phi2$=0.56426, a reflectance of 10.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=9.24 nm/116.17 nm/114.09 nm/135.53 nm/133.10 nm/107.87 nm/105.94 nm. The total thickness ($d_{total}=\Sigma d_i$) of the film is 721.94 nm. A sum $\Sigma n_i d_i$ of products $n_i d_i$ of refractive index $n_i$ and film thickness $d_i$ of a layer denoted with i in the seven films is 1326.67 nm which is very large, i.e., about 5.41 times a ¼ wavelength (=245 nm) of the predetermined wavelength of 980 nm. For this reason, a heat-radiation characteristic on the end face is improved, and the temperature of the end face can be suppressed from increasing.

Figure 61:
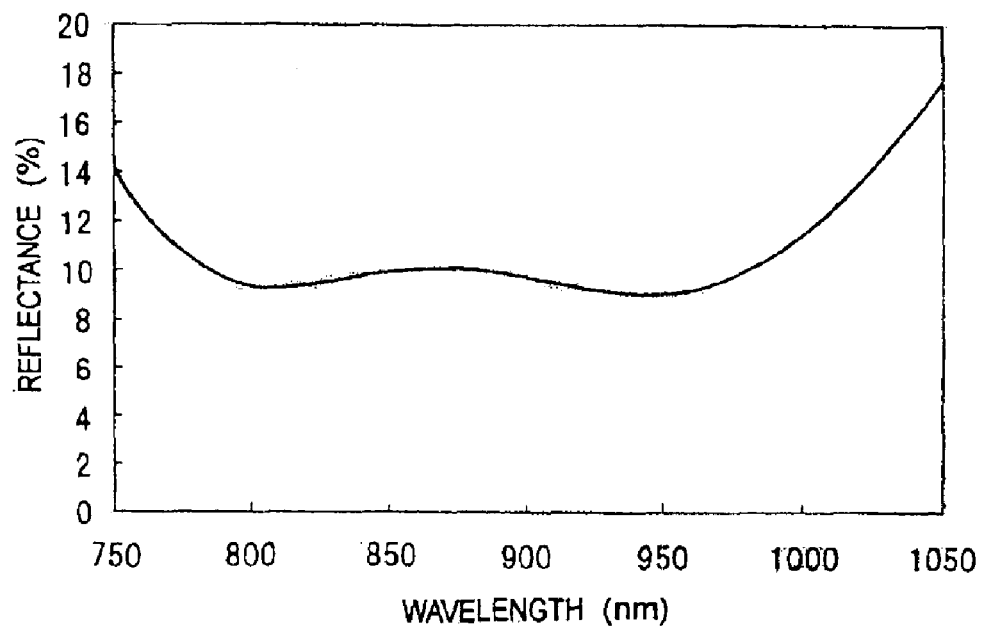
FIG. 61 is a graph of a wavelength dependence of a reflectance on a reflecting multi-layer film formed on an end face portion of a semiconductor optical device according to the fifty-first embodiment of the present invention.

FIG. 61 is a graph of a wavelength dependence of the reflectance of the seven-layer reflecting film. The abscissa of the graph indicates a wavelength, and the ordinate denotes a reflectance. In the seven-layer reflecting film, a flat portion having about 10% of the setting reflectance over a wide wavelength band can be obtained. More specifically, the reflectance in the range of a wavelength of 773 nm to wavelength of 994 nm ranges from 9.0% to 11.0%. With reference to the reflectance of 10.0% at the setting wavelength 980 nm, a continuous wavelength band in the range of −1.5% to +1.0%, i.e., 8.5% to 11.0% is 221 nm. A value obtained by dividing the wavelength band by the setting wavelength of 980 nm is about 0.226, and is larger than 0.065 in the hypothetical reflecting film. Therefore, it is understood that the seven-layer reflecting film has a flat portion having a low reflectance over a wide wavelength band.

Fifty-second Embodiment

A semiconductor optical device having a seven-layer reflecting film according to the fifty-second embodiment will be described below with reference to FIG. 62. This semiconductor optical device is different from the semiconductor optical device according to the fifty-first embodiment in that a setting reflectance $R(\lambda_0)$ is 10.0% at a setting wavelength $\lambda_0$=1087 nm. In addition, when phase shifts $\phi 1$ and $\phi 2$ of tantalum oxide and aluminum oxide are given by $\phi 1$=0.729549 and $\phi 2$=0.564265, a reflectance of 10% is obtained at a wavelength of 1087 nm. In this case, the film thickness of the layers of the seven-layer reflecting film are given by $Od_2/Ad_1/Ad_2/Bd_1/Bd_2/Cd_1/Cd_2$=10.24 nm/128.85 nm/126.54 nm/150.33 nm/147.63 nm/1 19.65 nm/1 17.50 nm. The total thickness ($d_{total}=\Sigma d_i$) of the film is 800.74 nm. A sum $\Sigma n_i d_i$ of products $n_i d_i$ of refractive index $n_i$ and film thickness $d_i$ of a layer denoted with i in the seven films is 1471.49 nm which is very large, i.e., about 6.01 times a ¼ wavelength (=245 nm) of the predetermined wavelength of 980 nm. For this reason, a heat-radiation characteristic on the end face is improved, and the temperature of the end face can be suppressed from increasing.

Figure 62:
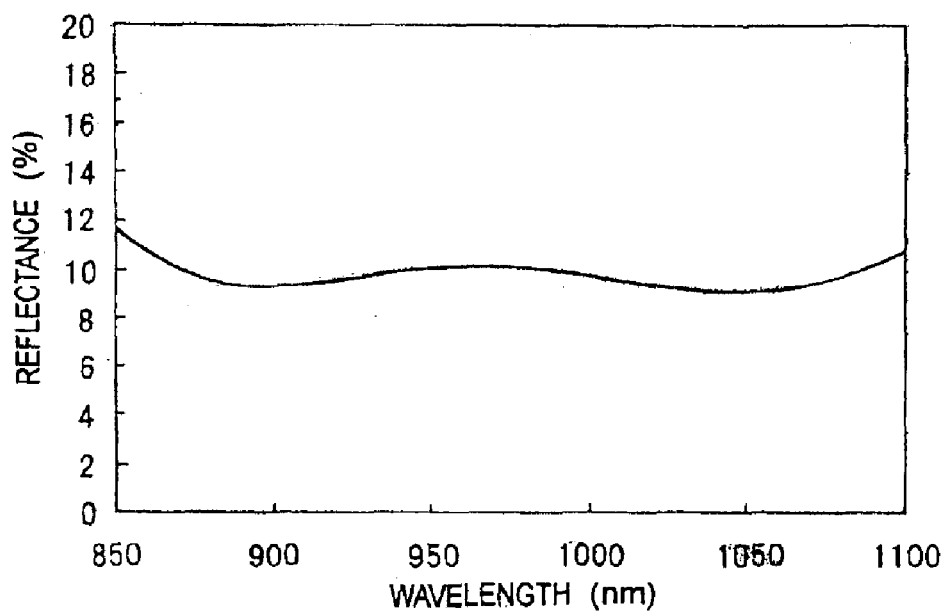
FIG. 62 is a graph of a wavelength dependence of a reflectance on a reflecting multi-layer film formed on an end face portion of a semiconductor optical device according to the fifty-second embodiment of the present invention.

FIG. 62 is a graph of a wavelength dependence of the reflectance of the seven-layer reflecting film. The abscissa of the graph indicates a wavelength, and the ordinate denotes a reflectance. In the seven-layer reflecting film, a flat portion having about 10% of a setting reflectance over a wide wavelength band can be obtained. More specifically, the reflectance in the range of a wavelength of 857 nm to a wavelength of 1102 nm ranges from 9.0% to 11.0%. With reference to the reflectance of 10.0% at the setting wavelength 1087 nm, a continuous wavelength band in the range of −1.5% to +1.0%, i.e., 8.5% to 11.0% is 245 nm. A value obtained by dividing the wavelength band by the setting wavelength of 1087 nm is about 0.225, and is larger than 0.065 in the hypothetical reflecting film. Therefore, it is understood that the seven-layer reflecting film has a flat portion having a low reflectance over a wide wavelength band.

Fifty-third Embodiment

A semiconductor optical device having a seven-layer reflecting film according to the fifty-third embodiment of the present invention will be described below with reference to FIG. 63. This semiconductor optical device is different from the semiconductor optical device according to the first embodiment in that a setting reflectance $R(\lambda_0)$ is 11.0% at a setting wavelength $\lambda_0$=980 nm. Parameters are given by O=0.20, A=2.20, B=2.55, and C=1.95. In addition, when phase shifts $\phi 1$ and $\phi 2$ of tantalum oxide and aluminum oxide are given by $\phi 1$=0.674425 and $\phi 2$=0.57230, a reflectance of 11.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=11.02 nm/112.50 nm/121.22 nm/130.40 nm/140.51 nm/99.72 nm/107.45 nm. The total thickness ($d_{total}=\Sigma d_i$) of the film is 722.82 nm. A sum $\Sigma n_i d_i$ of products $n_i d_i$ of refractive index $n_i$ and film thickness $d_i$ of a layer denoted with i in the seven films is 1320.69 nm which is very large, i.e., about 5.39 times a ¼ wavelength (=245 nm) of the predetermined wavelength of 980 nm. For this reason, a heat-radiation characteristic on the end face is improved, and the temperature of the end face can be suppressed from increasing.

Figure 63:
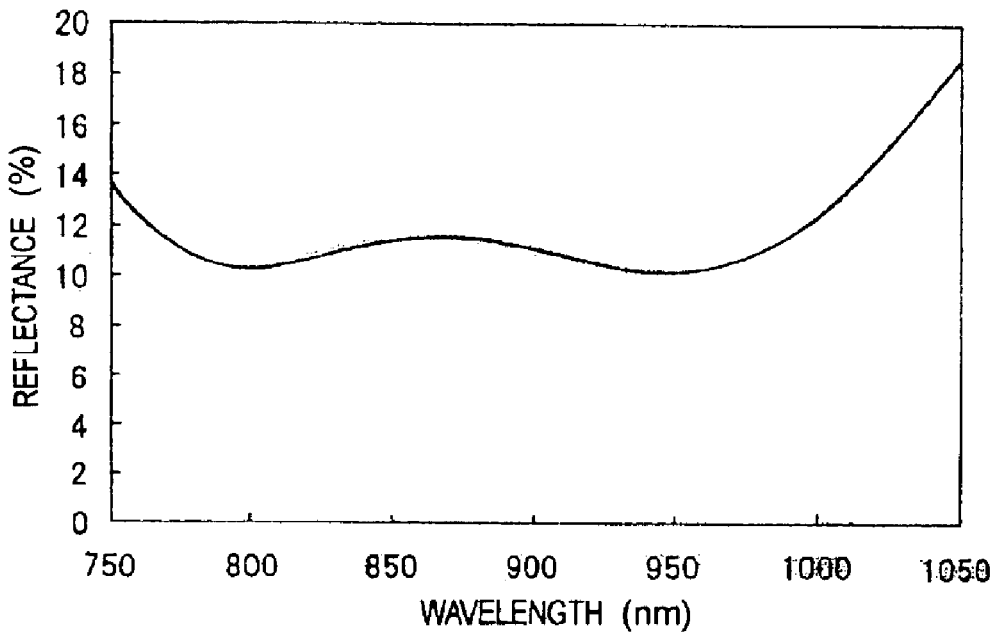
FIG. 63 is a graph of a wavelength dependence of a reflectance on a reflecting multi-layer film formed on an end face portion of a semiconductor optical device according to the fifty-third embodiment of the present invention.

FIG. 63 is a graph of a wavelength dependence of the reflectance of the seven-layer reflecting film. The abscissa of the graph indicates a wavelength, and the ordinate denotes a reflectance. In the seven-layer reflecting film, a flat portion having about 11% of the setting reflectance over a wide wavelength band can be obtained. More specifically, the reflectance in the range of a wavelength of 764 nm to a wavelength of 994 nm ranges from 10.2% to 12.0%. With reference to the reflectance of 11.0% at the setting wavelength 980 nm, a continuous wavelength band in the range of −1.5% to +1.0%, i.e., 9.5% to 12.0% is 230 nm. A value obtained by dividing the wavelength band by the setting wavelength of 980 nm is about 0.235, and is larger than 0.065 in the hypothetical reflecting film. Therefore, it is understood that the seven-layer reflecting film has a flat portion having a low reflectance over a wide wavelength band.

Fifty-fourth Embodiment

A semiconductor optical device having a seven-layer reflecting film according to the fifty-fourth embodiment will be described below with reference to FIG. 64. This semiconductor optical device is different from the semiconductor optical device according to the fifty-third embodiment in that a setting reflectance $R(\lambda_0)$ is 11.0% at a setting wavelength $\lambda_0$=1092 nm. In addition, when phase shifts $\phi 1$ and $\phi 2$ of tantalum oxide and aluminum oxide are given by $\phi 1$=0.674425 and $\phi 2$=0.572301, a reflectance of 11% is obtained at a wavelength of 1092 nm. In this case, the film thickness of the layers of the seven-layer reflecting film are given by $Od_2/Ad_1/Ad_2/Bd_1/Bd_2/Cd_1/Cd_2$=12.28 nm/125.36 nm/135.08 nm/145.31 nm/156.56 nm/111.12 nm/119.73 nm. The total thickness ($d_{total}=\Sigma d_i$) of the film is 805.44 nm. A sum $\Sigma n_i d_i$ of products $n_i d_i$ of refractive index $n_i$ and film thickness $d_i$ of a layer denoted with i in the seven films is 1471.66 nm which is very large, i.e., about 6.01 times a ¼ wavelength (=245 nm) of the predetermined wavelength of 980 nm. For this reason, a heat-radiation characteristic on the end face is improved, and the temperature of the end face can be suppressed from increasing.

Figure 64:
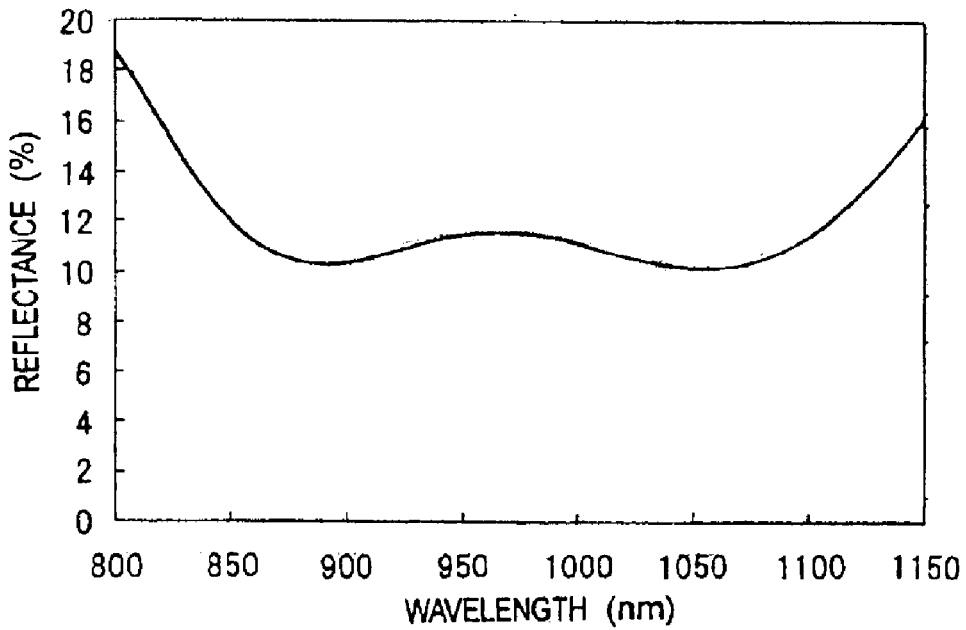
FIG. 64 is a graph of a wavelength dependence of a reflectance on a reflecting multi-layer film formed on an end face portion of a semiconductor optical device according to the fifty-fourth embodiment of the present invention.

FIG. 64 is a graph of a wavelength dependence of the reflectance of the seven-layer reflecting film. The abscissa of the graph indicates a wavelength, and the ordinate denotes a reflectance. In the seven-layer reflecting film, a flat portion having about 11% of the setting reflectance over a wide wavelength band can be obtained. More specifically, the reflectance in the range of a wavelength of 851 nm to a wavelength of 1108 nm ranges from 10.2% to 12.0%. With reference to the reflectance of 11.0% at the setting wavelength 1092 nm, a continuous wavelength band in the range of −1.5% to +1.0%, i.e., 9.5% to 12.0% is 257 nm. A value obtained by dividing the wavelength band by the setting wavelength of 1092 nm is about 0.235, and is larger than 0.065 in the hypothetical reflecting film. Therefore, it is understood that the seven-layer reflecting film has a flat portion having a low reflectance over a wide wavelength band.

Fifty-fifth Embodiment

A semiconductor optical device having a seven-layer reflecting film according to the fifty-fifth embodiment of the present invention will be described below with reference to FIG. 65. This semiconductor optical device is different from the semiconductor optical device according to the first embodiment in that a setting reflectance $R(\lambda_0)$ is 12.0% at a setting wavelength $\lambda_0$=980 nm. Parameters are given by O=0.20, A=2.35, B=2.65, and C=1.95. In addition, when phase shifts $\phi 1$ and $\phi 2$ of tantalum and aluminum oxide are given by $\phi 1$=0.614143 and $\phi 2$=0.58198, a reflectance of 12.0% is obtained at a wavelength of 980 nm. In this case, the film thickness of the layers of the seven-layer reflecting film are given by $Od_2/Ad_1/Ad_2/Bd_1/Bd_2/Cd_1/Cd_2$=11.21 nm/109.43 nm/131.68 nm/123.40 nm/148.49 nm/90.81 nm/109.26 nm. The total thickness ($d_{total}=\Sigma d_i$) of the film is 724.28 nm. A sum $\Sigma n_i d_i$ of products $n_i d_i$ of refractive index $n_i$ and film thickness $d_i$ of a layer denoted with i in the seven films is 1314.76 nm which is very large, i.e., about 5.37 times a ¼ wavelength (=245 nm) of the predetermined wavelength of 980 nm. For this reason, a heat-radiation characteristic on the end face is improved, and the temperature of the end face can be suppressed from increasing.

Figure 65:
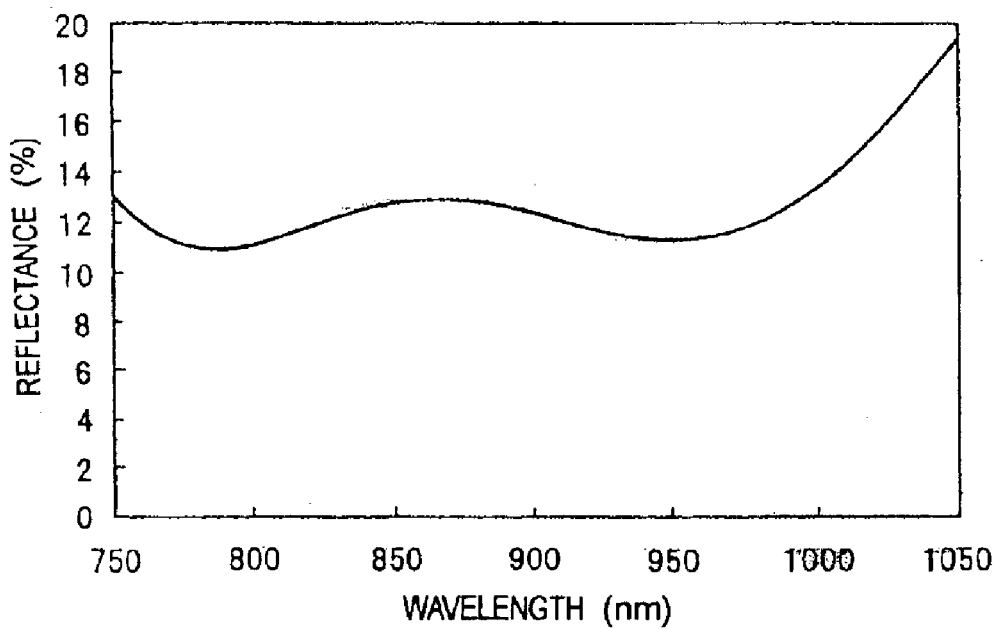
FIG. 65 is a graph of a wavelength dependence of a reflectance on a reflecting multi-layer film formed on an end face portion of a semiconductor optical device according to the fifty-fifth embodiment of the present invention.

FIG. 65 is a graph of a wavelength dependence of the reflectance of the seven-layer reflecting film. The abscissa of the graph indicates a wavelength, and the ordinate denotes a reflectance. In the seven-layer reflecting film, a flat portion having about 12% of the setting reflectance over a wide wavelength band can be obtained. More specifically, the reflectance in the range of a wavelength of 751 nm to a wavelength of 995 nm ranges from 10.9% to 13.0%. With reference to the reflectance of 120% at the setting wavelength 980 nm, a continuous wavelength band in the range of −1.5% to +1.0%, i.e., 10.5% to 13.0% is 244 nm. A value obtained by dividing the wavelength band by the setting wavelength of 980 nm is about 0.249, and is larger than 0.065 in the hypothetical reflecting film. Therefore, it is understood that the seven-layer reflecting film has a flat portion having a low reflectance over a wide wavelength band.

Fifty-sixth Embodiment

A semiconductor optical device having a seven-layer reflecting film according to the fifty-sixth embodiment will be described below with reference to FIG. 66. This semiconductor optical device is different from the semiconductor optical device according to the fifty-fifth embodiment in that a setting reflectance $R(\phi_0)$ is 12.0% at a setting wavelength $\lambda_0$=1100 nm. In addition, when phase shifts $\phi 1$ and $\phi 2$ of tantalum oxide and aluminum oxide are given by $\phi 1$=0.614143 and $\phi 2$=0.581984, a reflectance of 7% is obtained at a wavelength of 1100 nm. In this case, the film thickness of the layers of the seven-layer reflecting film are given by $Od_2/Ad_1/Ad_2/Bd_1/Bd_2/Cd_1/Cd_2$=12.58 nm/122.83 nm/147.80 nm/138.51 nm/166.67 nm/101.93 nm/122.64 nm. The total thickness ($d_{total}=\Sigma d_i$) of the film is 812.96 nm. A sum $\Sigma n_i d_i$ of products $n_i d_i$ of refractive index $n_i$ and film thickness $d_i$ of a layer denoted with i in the seven films is 1475.74 nm which is very large, i.e., about 6.02 times a ¼ wavelength (=245 nm) of the predetermined wavelength of 980 nm. For this reason, a heat-radiation characteristic on the end face is improved, and the temperature of the end face can be suppressed from increasing.

Figure 66:
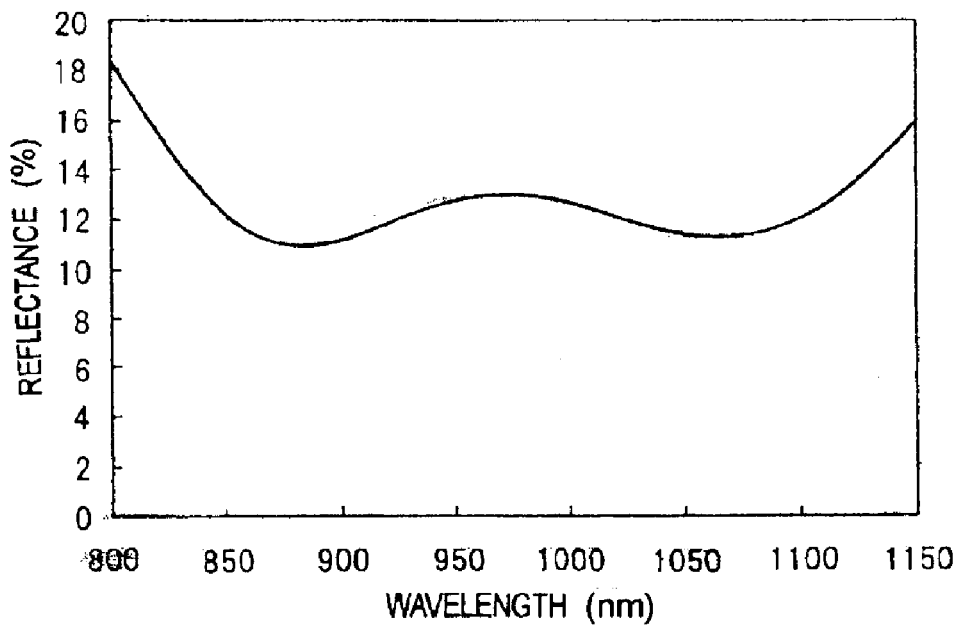
FIG. 66 is a graph of a wavelength dependence of a reflectance on a reflecting multi-layer film formed on an end face portion of a semiconductor optical device according to the fifty-sixth embodiment of the present invention.

FIG. 66 is a graph of a wavelength dependence of the reflectance of the seven-layer reflecting film. The abscissa of the graph indicates a wavelength, and the ordinate denotes a reflectance. In the seven-layer reflecting film, a flat portion having about 12% of the setting reflectance over a wide wavelength band can be obtained. More specifically, the reflectance in the range of a wavelength of 842 nm to a wavelength of 1117 nm ranges from 10.9% to 13.0%. With reference to the reflectance of 7.0% at the setting wavelength 1100 nm, a continuous wavelength band in the range of −1.5% to +1.0%, i.e., 10.5% to 13.0% is 275 nm. A value obtained by dividing the wavelength band by the setting wavelength of 1100 nm is about 0.250, and is larger than 0.065 in the hypothetical reflecting film. Therefore, it is understood that the seven-layer reflecting film has a flat portion having a low reflectance over a wide wavelength band.

The characteristics of the reflecting multi-layer films of the semiconductor optical device according to the forty-third embodiment to the fifty-sixth embodiment are shown in Table 6. In Table 6, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.5 to +1.0% of $R(\lambda_0)$, and ratio of $\Delta\lambda/\lambda_0$ are shown.

TABLE 6

| | | | | | | |
|---|---|---|---|---|---|---|
| | | Characteristic of Reflecting Multi-layer Film | | | | |
| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.5 to 1.0 of $R(\lambda_0)$ | Ratio of $\Delta\lambda/\lambda_0$ |
| 43 | Seven films | 980 nm 6.0% | 5.0% | 1350.16 nm 5.51 times | 181 nm | 181/980 = 0.185 |
| 44 | Seven films | 1063 nm 6.0% | 5.0% | 1457.82 nm 5.95 times | 196 nm | 196/1063 = 0.184 |
| 45 | Seven films | 980 nm 7.0% | 5.9% | 1338.78 nm 5.46 times | 196 nm | 196/980 = 0.200 |
| 46 | Seven films | 1073 nm 7.0% | 5.9% | 1465.82 nm 5.98 times | 196 nm | 196/1073 = 0.183 |
| 47 | Seven films | 980 nm 8.0% | 7.0% | 1333.17 nm 5.44 times | 208 nm | 208/980 = 0.212 |
| 48 | Seven films | 1079 nm 8.0% | 7.0% | 1467.86 nm 5.99 times | 228 nm | 228/1079 = 0.211 |
| 49 | Seven films | 980 nm 9.0% | 8.1% | 1330.65 nm 5.43 times | 202 nm | 202/980 = 0.206 |
| 50 | Seven films | 1075 nm 9.0% | 8.1% | 1459.67 nm 5.96 times | 220 nm | 220/1075 = 0.205 |
| 51 | Seven films | 980 nm 10.0% | 9.0% | 1326.67 nm 5.41 times | 221 nm | 221/980 = 0.226 |
| 52 | Seven films | 1087 nm 10.0% | 9.0% | 1471.49 nm 6.01 times | 245 nm | 245/1087 = 0.225 |
| 53 | Seven films | 980 nm 11.0% | 10.2% | 1320.69 nm 5.39 times | 230 nm | 230/980 = 0.235 |

TABLE 6-continued

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation $\Sigma n_i d_i$; Ratio of $\Sigma n_i d_i$ to 1/4 wave-length (245 nm) of 980 nm | Band width $\Delta\lambda$ in which the reflectance falls within the range from −1.5 to 1.0 of $R(\lambda_0)$ | Ratio of $\Delta\lambda/\lambda_0$ |
|---|---|---|---|---|---|---|
| 54 | Seven films | 1092 nm 11.0% | 10.2% | 1471.66 nm 6.01 times | 257 nm | 257/1092 = 0.235 |
| 55 | Seven films | 980 nm 12.0% | 10.9% | 1314.76 nm 5.37 times | 244 nm | 244/980 = 0.249 |
| 56 | Seven films | 1100 nm 12.0% | 10.9% | 1475.74 nm 6.02 times | 275 nm | 275/1100 = 0.250 |

Fifty-seventh Embodiment

A semiconductor optical device having a six-layer reflecting film according to the fifty-seventh embodiment of the present invention will be described below with reference to FIG. 67. This semiconductor optical device is different from the semiconductor optical device according to the seventeenth embodiment in that a setting reflectance $R(\lambda_0)$ is 6.0% at a setting wavelength $\lambda_0$=980 nm. Parameters are given by A=1.50, B=1.92, and C=2.2. In addition, when phase shifts $\phi 1$ and $\phi 2$ of tantalum oxide and aluminum oxide are given by $\phi 1$=1.16473 and $\phi 2$=0.715823, a reflectance of 6.0% is obtained at a wavelength of 980 nm. In this case, the film thickness of the layers of the six-layer reflecting film are given by $Ad_1/Ad_2/Bd_1/Bd_2/Cd_1/Cd_2$ 132.47 nm/103.38 nm/169.57 nm/132.32 nm/194.30 nm/151.62 nm. The total thickness ($d_{total}=\Sigma d_i$) of the film is 883.66 nm. A sum $\Sigma n_i d_i$ of products $n_i d_i$ of refractive index $n_i$ and film thickness $d_i$ of a layer denoted with i in the six films is 1648.43 nm which is very large, i.e., about 6.73 times a ¼ wavelength (=245 nm) of the predetermined wavelength of 980 nm. For this reason, a heat-radiation characteristic on the end face is improved, and the temperature of the end face can be suppressed from increasing.

Figure 67:
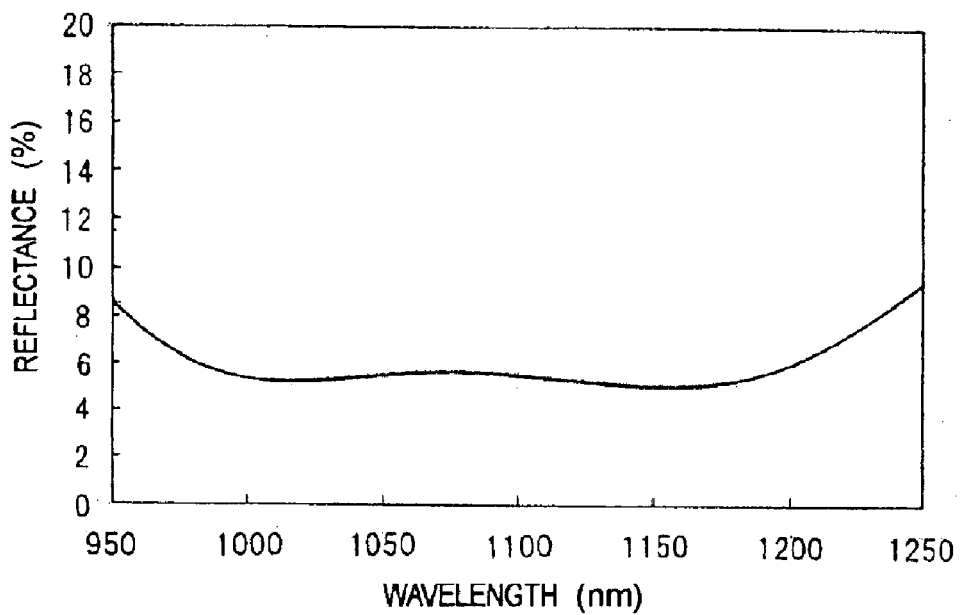
FIG. 67 is a graph of a wavelength dependence of a reflectance on a reflecting multi-layer film formed on an end face portion of a semiconductor optical device according to the fifty-seventh embodiment of the present invention.

FIG. 67 is a graph of a wavelength dependence of the reflectance of the six-layer reflecting film 40. The abscissa of the graph indicates a wavelength, and the ordinate denotes a reflectance. In the six-layer reflecting film, a flat portion having about 6% of the setting reflectance over a wide wavelength band can be obtained. More specifically, the reflectance in the range of a wavelength of 966 nm to a wavelength of 1219 nm ranges from 5.0% to 7.0%. With reference to the reflectance of 6.0% at the setting wavelength 980 nm, a continuous wavelength band in the range of −1.5% to +1.0%, i.e., 4.5% to 7.0% is 253 nm. A value obtained by dividing the wavelength band by the setting wavelength of 980 nm is about 0.258, and is larger than 0.065 in the hypothetical reflecting film. Therefore, it is understood that the six-layer reflecting film 40 has a flat portion having a low reflectance over a wide wavelength band.

Fifty-eighth Embodiment

A semiconductor optical device having a six-layer reflecting film according to the fifty-eighth embodiment of the present invention will be described below with reference to FIG. 68. This semiconductor optical device is different from the semiconductor optical device according to the fifty-seventh embodiment in that a setting reflectance $R(\lambda_0)$ is 6.0% at a setting wavelength $\lambda_0$=879 nm. In addition, when phase shifts $\phi 1$ and $\phi 2$ of tantalum oxide and aluminum oxide are given by $\phi 1$=1.16473 and $\phi 2$=0.715823, a reflectance of 6.0% is obtained at a wavelength of 879 nm. In this case, the film thickness of the layers of the six-layer reflecting film are given by $Ad_1/Ad_2/Bd_1/Bd_2/Cd_1/Cd_2$=118.82 nm/92.72 nm/152.09 nm/118.69 nm/174.27 nm/136.00 nm. The total thickness ($d_{total}=\Sigma d_i$) of the film is 792.59 nm. A sum $\Sigma n_i d_i$ of products $n_i d_i$ of refractive index $n_i$ and film thickness $d_i$ of a layer denoted with i in the six films is 1478.54 nm which is very large, i.e., about 6.03 times a ¼ wavelength (=245 nm) of the predetermined wavelength of 980 nm. For this reason, a heat-radiation characteristic on the end face is improved, and the temperature of the end face can be suppressed from increasing.

Figure 68:
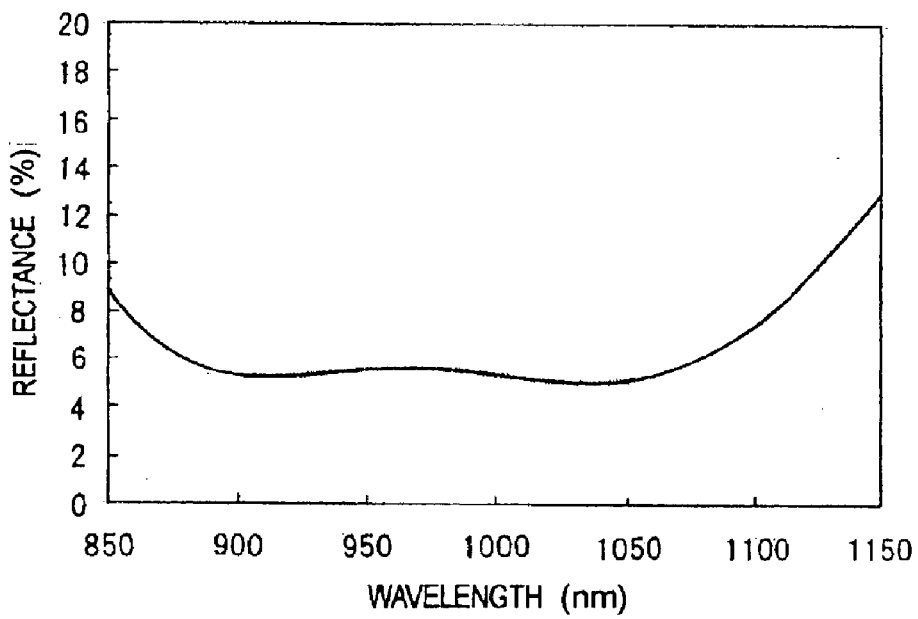
FIG. 68 is a graph of a wavelength dependence of a reflectance on a reflecting multi-layer film formed on an end face portion of a semiconductor optical device according to the fifty-eighth embodiment of the present invention.

FIG. 68 is a graph of a wavelength dependence of the reflectance of the six-layer reflecting film 40. The abscissa of the graph indicates a wavelength, and the ordinate denotes a reflectance. In the six-layer reflecting film, a flat portion having about 6% of the setting reflectance over a wide wavelength band can be obtained. More specifically, the reflectance in the range of a wavelength of 866 nm to a wavelength of 1093 nm ranges from 5.0% to 7.0%. With reference to the reflectance of 6.0% at the setting wavelength 879 nm, a continuous wavelength band in the range of −1.5% to +1.0%, i.e., 4.5% to 7.0% is 227 nm. A value obtained by dividing the wavelength band by the setting wavelength of 879 nm is about 0.258, and is larger than 0.0651 in the hypothetical reflecting film. Therefore, it is understood that the six-layer reflecting film 40 has a flat portion having a low reflectance over a wide wavelength band.

Fifty-ninth Embodiment

A semiconductor optical device having a six-layer reflecting film according to the fifty-ninth embodiment of the present invention will be described below with reference to FIG. 69. This semiconductor optical device is different from the semiconductor optical device according to the seventeenth embodiment in that a setting reflectance $R(\lambda_0)$ is 7.0% at a setting wavelength $\lambda_0$=980 nm. Parameters are given by A=1.50, B=1.95, and C=2.20. In addition, when phase shifts $\phi 1$ and $\phi 2$ of tantalum oxide and aluminum oxide are given by $\phi 1$=1.13181 and $\phi 2$=0.744018, a reflectance of 7.0% is obtained at a wavelength of 980 nm. In this case, the film thickness of the layers of the six-layer reflecting film are given by $Ad_1/Ad_2/Bd_1/Bd_2/Cd_1/Cd_2$=128.73 nm/107.45 nm/167.35 nm/139.69 nm/188.80 nm/157.59 nm. The total thickness ($d_{total}=\Sigma d_i$) of the film is 889.61 nm. A sum $\Sigma n_i d_i$ of products $n_i d_i$ of refractive index $n_i$ and film thickness $d_i$ of a layer denoted with i in the six films is 1653.06 nm which is very large, i.e., about 6.75 times a ¼ wavelength (=245 nm) of the predetermined wavelength of 980 nm. For this reason, a heat-radiation characteristic on the end face is improved, and the temperature of the end face can be suppressed from increasing.

Figure 69:
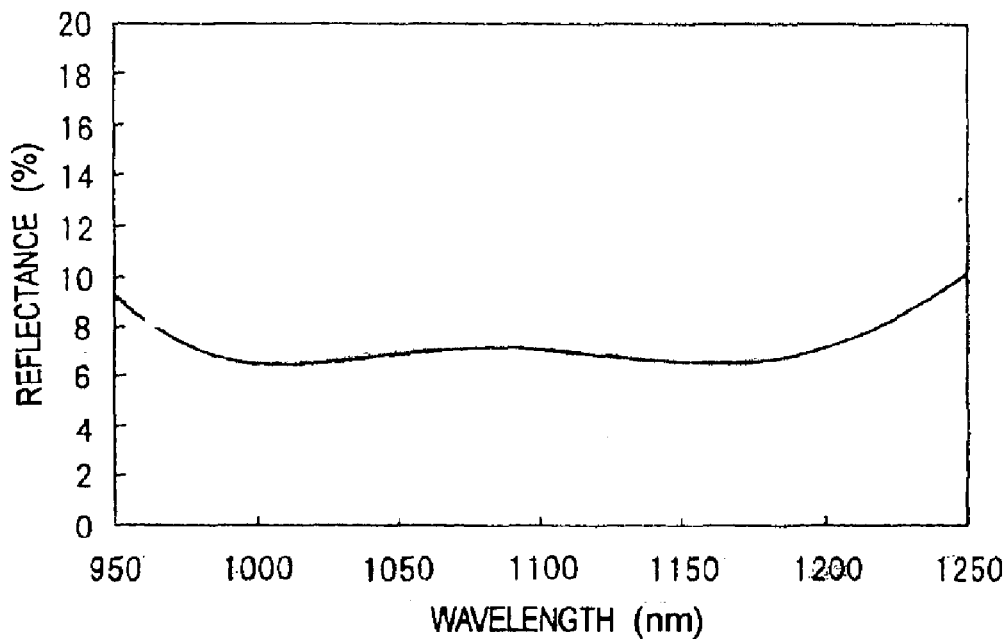
FIG. 69 is a graph of a wavelength dependence of a reflectance on a reflecting multi-layer film formed on an end face portion of a semiconductor optical device according to the fifty-ninth embodiment of the present invention.

FIG. 69 is a graph of a wavelength dependence of the reflectance of the six-layer reflecting film 40. The abscissa of the graph indicates a wavelength, and the ordinate denotes a reflectance. In the six-layer reflecting film, a flat portion having about 7% of the setting reflectance over a wide wavelength band can be obtained. More specifically, the reflectance in the range of a wavelength of 964 nm to a wavelength of 1219 nm ranges from 6.4% to 8.0%. With reference to the reflectance of 7.0% at the setting wavelength 980 nm, a continuous wavelength band in the range of −1.5% to +1.0%, i.e., 5.5% to 8.0% is 255 nm. A value obtained by dividing the wavelength band by the setting wavelength of 980 nm is about 0.260, and is larger than 0.065 in the hypothetical reflecting film. Therefore, it is understood that the six-layer reflecting film 40 has a flat portion having a low reflectance over a wide wavelength band.

Sixtieth Embodiment

A semiconductor optical device having a six-layer reflecting film according to the sixtieth embodiment of the present invention will be described below with reference to FIG. 70. This semiconductor optical device is different from the semiconductor optical device according to the fifty-ninth embodiment in that a setting reflectance $R(\lambda_0)$ is 7.0% at a setting wavelength $\lambda_0$=880 nm. In addition, when phase shifts $\phi1$ and $\phi2$ of tantalum oxide and aluminum oxide are given by $\phi1$=1.13181 and $\phi2$=0.744018, a reflectance of 7.0% is obtained at a wavelength of 880 nm. In this case, the film thickness of the layers of the six-layer reflecting film are given by $Ad_1/Ad_2/Bd_1/Bd_2/Cd_1/Cd_2$=115.59 nm/96.49 nm/150.27 nm/125.43 nm/169.54 nm/141.51 nm. The total thickness ($d_{total}=\Sigma d_i$) of the film is 798.83 nm. A sum $\Sigma n_i d_i$ of products $n_i d_i$ of refractive index $n_i$ and film thickness $d_i$ of a layer denoted with i in the six films is 1484.37 nm which is very large, i.e., about 6.06 times a ¼ wavelength (=245 nm) of the predetermined wavelength of 980 nm. For this reason, a heat-radiation characteristic on the end face is improved, and the temperature of the end face can be suppressed from increasing.

Figure 70:
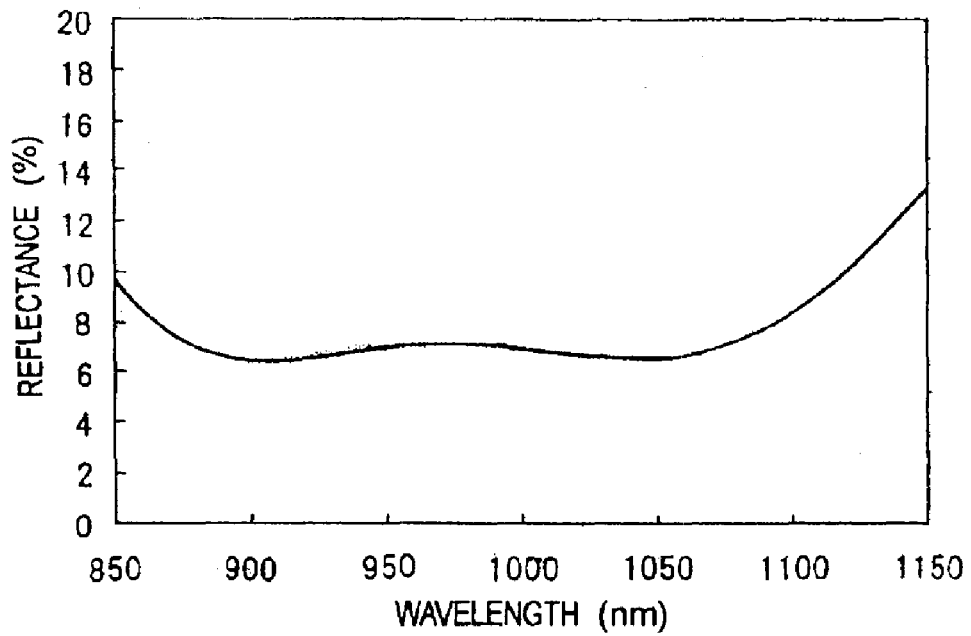
FIG. 70 is a graph of a wavelength dependence of a reflectance on a reflecting multi-layer film formed on an end face portion of a semiconductor optical device according to the sixtieth embodiment of the present invention.

FIG. 70 is a graph of a wavelength dependence of the reflectance of the six-layer reflecting film 40. The abscissa of the graph indicates a wavelength, and the ordinate denotes a reflectance. In the six-layer reflecting film, a flat portion having about 7% of the setting reflectance over a wide wavelength band can be obtained. More specifically, the reflectance in the range of a wavelength of 866 nm to a wavelength of 1094 nm ranges from 6.4% to 8.0%. With reference to the reflectance of 7.0% at the setting wavelength 880 nm, a continuous wavelength band in the range of −1.5% to +1.0%, i.e., 5.5% to 8.0% is 228 nm. A value obtained by dividing the wavelength band by the setting wavelength of 880 nm is about 0.259, and is larger than 0.065 in the hypothetical reflecting film. Therefore, it is understood that the six-layer reflecting film 40 has a flat portion having a low reflectance over a wide wavelength band.

Sixty-first Embodiment

A semiconductor optical device having a six-layer reflecting film according to the sixty-first embodiment of the present invention will be described below with reference to FIG. 71. This semiconductor optical device is different from the semiconductor optical device according to the seventeenth embodiment in that a setting reflectance $R(\lambda_0)$ is 8.0% at a setting wavelength $\lambda_0$=980 nm. Parameters are given by A=1.52, B=1.95, and C=2.20. In addition, when phase shifts $\phi1$ and $\phi2$ of tantalum oxide and aluminum oxide are given by $\phi1$=1.09941 and $\phi2$=0.769346, a reflectance of 8.0% is obtained at a wavelength of 980 nm. In this case, the film thickness of the layers of the six-layer reflecting film are given by $Ad_1/Ad_2/Bd_1/Bd_2/Cd_1/Cd_2$=126.71 nm/112.59 nm/162.56 nm/144.44 nm/183.40 nm/162.96 nm. The total thickness ($d_{total}=\Sigma d_i$) of the film is 892.66 nm. A sum $\Sigma n_i d_i$ of products $n_i d_i$ of refractive index $n_i$ and film thickness $d_i$ of a layer denoted with i in the six films is 1652.67 nm which is very large, i.e., about 6.75 times a ¼ wavelength (=245 nm) of the predetermined wavelength of 980 nm. For this reason, a heat-radiation characteristic on the end face is improved, and the temperature of the end face can be suppressed from increasing.

Figure 71:
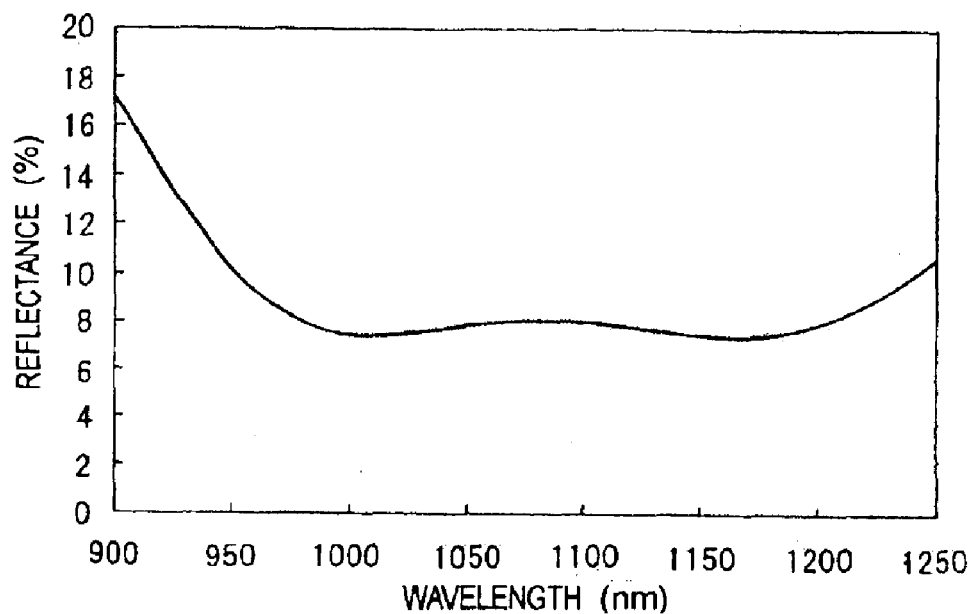
FIG. 71 is a graph of a wavelength dependence of a reflectance on a reflecting multi-layer film formed on an end face portion of a semiconductor optical device according to the sixty-first embodiment of the present invention.

FIG. 71 is a graph of a wavelength dependence of the reflectance of the six-layer reflecting film 40. The abscissa of the graph indicates a wavelength, and the ordinate denotes a reflectance. In the six-layer reflecting film, a flat portion having about 8% of the setting reflectance over a wide wavelength band can be obtained. More specifically, the reflectance in the range of a wavelength of 964 nm to a wavelength of 1223 nm ranges from 7.4% to 9.0%. With reference to the reflectance of 8.0% at the setting wavelength 980 nm, a continuous wavelength band in the range of −1.5% to +1.0%, i.e., 6.5% to 9.0% is 259 nm. A value obtained by dividing the wavelength band by the setting wavelength of 980 nm is about 0.264, and is larger than 0.065 in the hypothetical reflecting film. Therefore, it is understood that the six-layer reflecting film 40 has a flat portion having a low reflectance over a wide wavelength band.

Sixty-second Embodiment

A semiconductor optical device having a six-layer reflecting film according to the sixty-second embodiment of the present invention will be described below with reference to FIG. 72. This semiconductor optical device is different from the semiconductor optical device according to the sixty-first embodiment in that a setting reflectance $R(\lambda_0)$ is 8.0% at a setting wavelength $\lambda_0$=878 nm. In addition, when phase shifts $\phi1$ and $\phi2$ of tantalum oxide and aluminum oxide are given by $\phi1$=1.09941 and $\phi2$=0.769346, a reflectance of 8.0% is obtained at a wavelength of 878 nm. In this case, the film thickness of the layers of the six-layer reflecting film are given by $Ad_1/Ad_2/Bd_1/Bd_2/Cd_1/Cd_2$=113.52 nm/100.87 nm/145.64 nm/129.41 nm/164.31 nm/146.00 nm. The total thickness ($d_{total}=\Sigma d_i$) of the film is 799.75 nm. A sum $\Sigma n_i d_i$ of products $n_i d_i$ of refractive index $n_i$ and film thickness $d_i$ of a layer denoted with i in the six films is 1480.65 nm which is very large, i.e., about 6.04 times a ¼ wavelength (=245 nm) of the predetermined wavelength of 980 nm. For this reason, a heat-radiation characteristic on the end face is improved, and the temperature of the end face can be suppressed from increasing.

Figure 72:
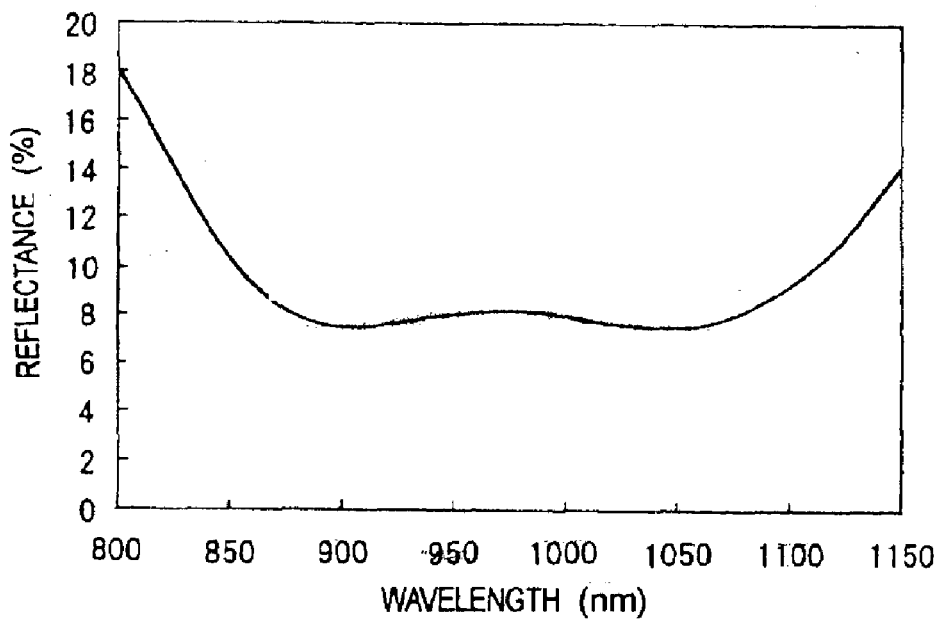
FIG. 72 is a graph of a wavelength dependence of a reflectance on a reflecting multi-layer film formed on an end face portion of a semiconductor optical device according to the sixty-second embodiment of the present invention.

FIG. 72 is a graph of a wavelength dependence of the reflectance of the six-layer reflecting film 40. The abscissa of the graph indicates a wavelength, and the ordinate denotes a reflectance. In the six-layer reflecting film, a flat portion having about 8% of the setting reflectance over a wide wavelength band can be obtained. More specifically, the reflectance in the range of a wavelength of 864 nm to a wavelength of 1096 nm ranges from 7.4% to 9.0%. With reference to the reflectance of 8.0% at the setting wavelength 878 nm, a continuous wavelength band in the range of −1.5% to +1.0%, i.e., 6.5% to 9.0% is 232 nm. A value obtained by dividing the wavelength band by the setting wavelength of 878 nm is about 0.264, and is larger than 0.065 in the hypothetical reflecting film. Therefore, it is understood that the six-layer reflecting film 40 has a flat portion having a low reflectance over a wide wavelength band.

Sixty-third Embodiment

A semiconductor optical device having a six-layer reflecting film according to the sixty-third embodiment of the present invention will be described below with reference to FIG. 73. This semiconductor optical device is different from the semiconductor optical device according to the seventeenth embodiment in that a setting reflectance $R(\lambda_0)$ is 9.0% at a setting wavelength $\lambda_0$=980 nm. Parameters are given by A=1.55, B=1.97, and C=2.25. In addition, when phase shifts $\phi1$ and $\phi2$ of tantalum oxide and aluminum oxide are given by $\phi1$=1.0677 and $\phi2$=0.772496, a reflectance of 6.0% is obtained at a wavelength of 980 nm. In this case, the film thickness of the layers of the six-layer reflecting film are given by $Ad_1/Ad_2/Bd_1/Bd_2/Cd_1/Cd_2$=125.49 nm/115.28 nm/159.49 nm/146.52 nm/182.16 nm/167.34 nm. The total thickness ($d_{total}$=$\Sigma d_i$) of the film is 896.28 nm. A sum $\Sigma n_i d_i$ of products $n_i d_i$ of refractive index $n_i$ and film thickness $d_i$ of a layer denoted with i in the six films is 1656.11 nm which is very large, i.e., about 6.76 times a ¼ wavelength (=245 nm) of the predetermined wavelength of 980 nm. For this reason, a heat-radiation characteristic on the end face is improved, and the temperature of the end face can be suppressed from increasing.

Figure 73:
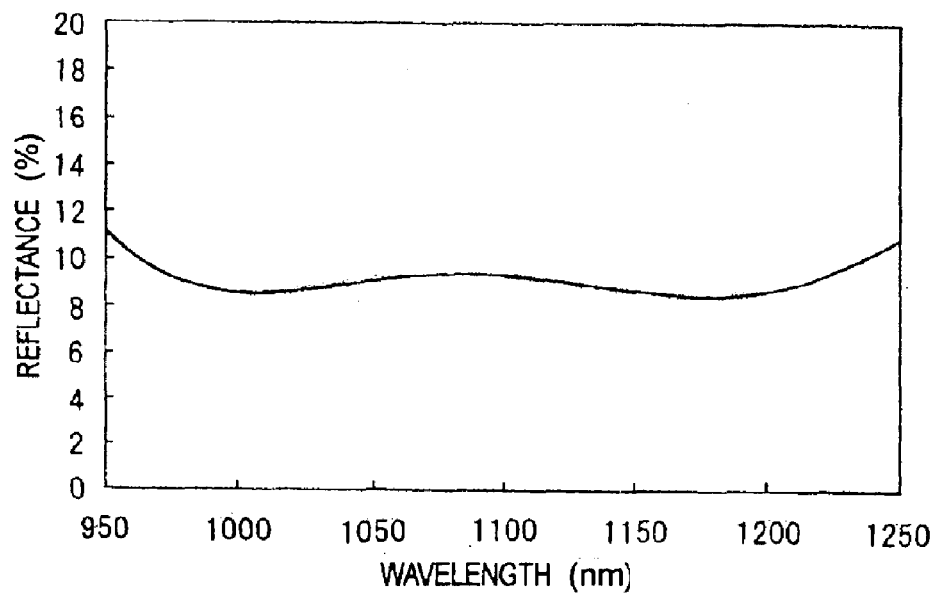
FIG. 73 is a graph of a wavelength dependence of a reflectance on a reflecting multi-layer film formed on an end face portion of a semiconductor optical device according to the sixty-third embodiment of the present invention.

FIG. 73 is a graph of a wavelength dependence of the reflectance of the six-layer reflecting film 40. The abscissa of the graph indicates a wavelength, and the ordinate denotes a reflectance. In the six-layer reflecting film, a flat portion having about 9% of the setting reflectance over a wide wavelength band can be obtained. More specifically, the reflectance in the range of a wavelength of 963 nm to a wavelength of 1235 nm ranges from 8.4% to 10.0%.

With reference to the reflectance of 9.0% at the setting wavelength 980 nm, a continuous wavelength band in the range of −1.5% to +1.0%, i.e., 7.5% to 10.0% is 272 nm. A value obtained by dividing the wavelength band by the setting wavelength of 980 nm is about 0.278, and is larger than 0.065 in the hypothetical reflecting film. Therefore, it is understood that the six-layer reflecting film 40 has a flat portion having a low reflectance over a wide wavelength band.

Sixty-fourth Embodiment

A semiconductor optical device having a six-layer reflecting film according to the sixty-fourth embodiment of the present invention will be described below with reference to FIG. 74. This semiconductor optical device is different from the semiconductor optical device according to the sixty-third embodiment in that a setting reflectance $R(\lambda_0)$ is 9.0% at a setting wavelength $\lambda_0$=874 nm. In addition, when phase shifts $\phi1$ and $\phi2$ of tantalum oxide and aluminum oxide are given by $\phi1$=1.0677 and $\phi2$=0.772496, a reflectance of 9.0% is obtained at a wavelength of 874 nm. In this case, the film thickness of the layers of the six-layer reflecting film are given by $Ad_1/Ad_2/Bd_1/Bd_2/Cd_1/Cd_2$=111.91 nm/102.81 nm/142.24 nm/130.67 nm/162.45 nm/149.24 nm. The total thickness ($d_{total}$=$\Sigma d_i$) of the film is 799.32 nm. A sum $\Sigma n_i d_i$ of products $n_i d_i$ of refractive index $n_i$ and film thickness $d_i$ of a layer denoted with i in the six films is 1476.95 nm which is very large, i.e., about 6.03 times a ¼ wavelength (=245 nm) of the predetermined wavelength of 980 nm. For this reason, a heat-radiation characteristic on the end face is improved, and the temperature of the end face can be suppressed from increasing.

Figure 74:
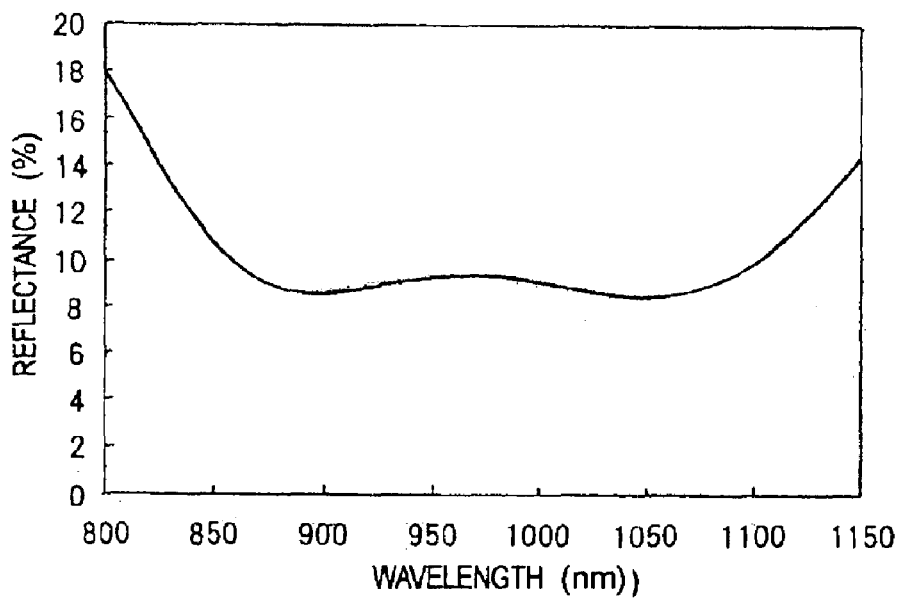
FIG. 74 is a graph of a wavelength dependence of a reflectance on a reflecting multi-layer film formed on an end face portion of a semiconductor optical device according to the sixty-fourth embodiment of the present invention.

FIG. 74 is a graph of a wavelength dependence of the reflectance of the six-layer reflecting film 40. The abscissa of the graph indicates a wavelength, and the ordinate denotes a reflectance. In the six-layer reflecting film, a flat portion having about 9% of the setting reflectance over a wide wavelength band can be obtained. More specifically, the reflectance in the range of a wavelength of 859 nm to a wavelength of 1101 nm ranges from 8.4% to 10.0%. With reference to the reflectance of 9.0% at the setting wavelength 874 nm, a continuous wavelength band in the range of −1.5% to +1.0%, i.e., 7.5% to 10.0% is 242 nm. A value obtained by dividing the wavelength band by the setting wavelength of 874 nm is about 0.244, and is larger than 0.065 in the hypothetical reflecting film. Therefore, it is understood that the six-layer reflecting film 40 has a flat portion having a low reflectance over a wide wavelength band.

Sixty-fifth Embodiment

A semiconductor optical device having a six-layer reflecting film according to the sixty-fifth embodiment of the present invention will be described below with reference to FIG. 75. This semiconductor optical device is different from the semiconductor optical device according to the seventeenth embodiment in that a setting reflectance $R(\lambda_0)$ is 10.0% at a setting wavelength $\lambda_0$=980 nm. Parameters are given by A=1.60, B=2.02, and C=2.25. In addition, when phase shifts $\phi1$ and ($\phi2$ of tantalum oxide and aluminum oxide are given by $\phi1$=1.00317 and $\phi2$=0.803388, a reflectance of 10.0% is obtained at a wavelength of 980 nm. In this case, the film thickness of the layers of the six-layer reflecting film are given by $Ad_1/Ad_2/Bd_1/Bd_2/Cd_1/Cd_2$=121.70 nm/123.76 nm/153.64 nm/156.25 nm/171.14 nm/174.04 nm. The total thickness ($d_{total}$=$\Sigma d_1$) of the film is 900.53 nm. A sum $\Sigma n_i d_i$ of products $n_i d_i$ of refractive index $n_i$ and film thickness $d_i$ of a layer denoted with i in the six films is 1653.97 nm which is very large, i.e., about 6.75 times a ¼ wavelength (=245 nm) of the predetermined wavelength of 980 nm. For this reason, a heat-radiation characteristic on the end face is improved, and the temperature of the end face can be suppressed from increasing.

Figure 75:
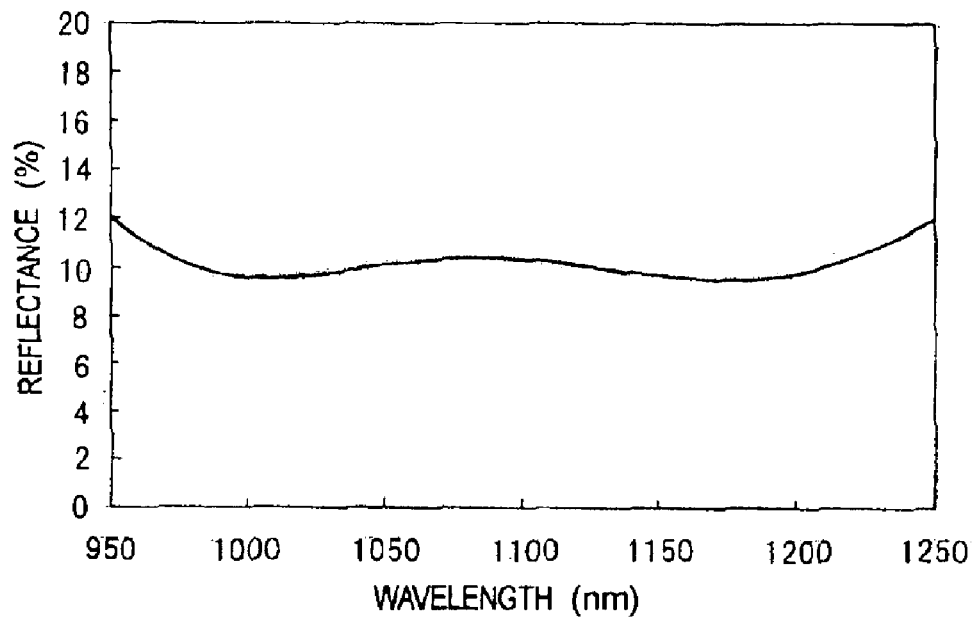
FIG. 75 is a graph of a wavelength dependence of a reflectance on a reflecting multi-layer film formed on an end face portion of a semiconductor optical device according to the sixty-fifth embodiment of the present invention.

FIG. 75 is a graph of a wavelength dependence of the reflectance of the six-layer reflecting film 40. The abscissa of the graph indicates a wavelength, and the ordinate denotes a reflectance. In the six-layer reflecting film, a flat portion having about 10% of the setting reflectance over a wide wavelength band can be obtained. More specifically, the reflectance in the range of a wavelength of 963 nm to a wavelength of 1233 nm ranges from 9.5% to 11.0%. With reference to the reflectance of 10.0% at the setting wavelength 980 nm, a continuous wavelength band in the range of −1.5% to +1.0%, i.e., 8.5% to 12.0% is 270 nm. A value obtained by dividing the wavelength band by the setting wavelength of 980 nm is about 0.276, and is larger than 0.065 in the hypothetical reflecting film. Therefore, it is understood that the six-layer reflecting film 40 has a flat portion having a low reflectance over a wide wavelength band.

Sixty-sixth Embodiment

A semiconductor optical device having a six-layer reflecting film according to the fifty-eighth embodiment of the present invention will be described below with reference to FIG. 76. This semiconductor optical device is different from the semiconductor optical device according to the sixty-fifth embodiment in that a setting reflectance $R(\lambda_0)$ is 10.0% at a setting wavelength $\lambda_0$=874 nm. In addition, when phase shifts $\phi1$ and $\phi2$ of tantalum oxide and aluminum oxide are given by $\phi1$=1.0031 and $\phi2$=0.803388, a reflectance of 10.0% is obtained at a wavelength of 874 nm. In this case, the film thickness of the layers of the six-layer reflecting film are given by $Ad_1/Ad_2/Bd_1/Bd_2/Cd_1/Cd_2$=108.53 nm/110.37 nm/137.02 nm/139.35 nm/152.63 nm/155.21 nm. The total thickness ($d_{total}$=$\Sigma d_i$) of the film is 803.11 nm. A sum $\Sigma n_i d_i$ of products $n_i d_i$ of refractive index $n_i$ and film thickness $d_i$ of a layer denoted with i in the six films is 1475.04 nm which is very large, i.e., about 6.02 times a ¼ wavelength (=245 nm) of the predetermined wavelength of 980 nm. For this reason, a heat-radiation characteristic on the end face is improved, and the temperature of the end face can be suppressed from increasing.

Figure 76:
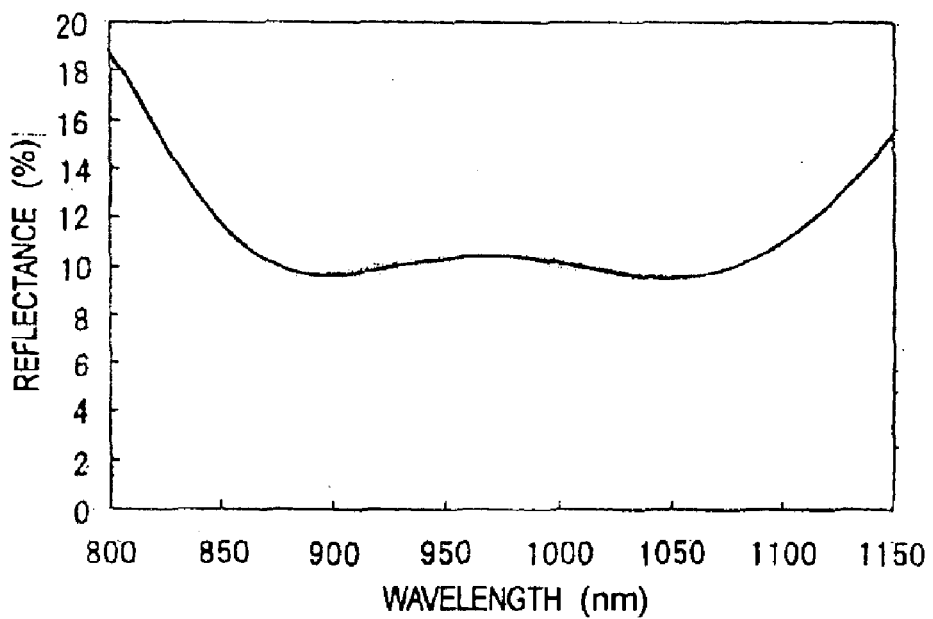
FIG. 76 is a graph of a wavelength dependence of a reflectance on a reflecting multi-layer film formed on an end face portion of a semiconductor optical device according to the sixty-sixth embodiment of the present invention.

FIG. 76 is a graph of a wavelength dependence of the reflectance of the six-layer reflecting film 40. The abscissa of the graph indicates a wavelength, and the ordinate denotes a reflectance. In the six-layer reflecting film, a flat portion having about 10% of the setting reflectance over a wide wavelength band can be obtained. More specifically, the reflectance in the range of a wavelength of 859 nm to a wavelength of 1100 nm ranges from 9.5% to 11.0%. With reference to the reflectance of 10.0% at the setting wavelength 874 nm, a continuous wavelength band in the range of −1.5% to +1.0%, i.e., 8.5% to 11.0% is 241 nm. A value obtained by dividing the wavelength band by the setting wavelength of 874 nm is about 0.276, and is larger than 0.065 in the hypothetical reflecting film. Therefore, it is understood that the six-layer reflecting film 40 has a flat portion having a low reflectance over a wide wavelength band.

Sixty-seventh Embodiment

A semiconductor optical device having a six-layer reflecting film according to the sixty-seventh embodiment of the present invention will be described below with reference to FIG. 77. This semiconductor optical device is different from the semiconductor optical device according to the seventeenth embodiment in that a setting reflectance $R(\lambda_0)$ is 11.0% at a setting wavelength $\lambda_0$=980 nm. Parameters are given by A=1.65, B=2.05, and C=2.20. In addition, when phase shifts φ1 and φ2 of tantalum oxide and aluminum oxide are given by 4P1=0.931121 and φ2=0.862397, a reflectance of 11.0% is obtained at a wavelength of 980 nm. In this case, the film thickness of the layers of the six-layer reflecting film are given by $Ad_1/Ad_2/Bd_1/Bd_2/Cd_1/Cd_2$= 116.49 nm/137.00 nm/144.73 nm/170.21 nm/155.33 nm/182.67 nm. The total thickness ($d_{total}=\Sigma d_i$) of the film is 906.43 nm. A sum $\Sigma n_i d_i$ of products $n_i d_i$ of refractive index $n_i$ and film thickness $d_i$ of a layer denoted with i in the six films is 1650.45 nm which is very large, i.e., about 6.74 times a ¼ wavelength (=245 nm) of the predetermined wavelength of 980 nm. For this reason, a heat-radiation characteristic on the end face is improved, and the temperature of the end face can be suppressed from increasing.

Figure 77:
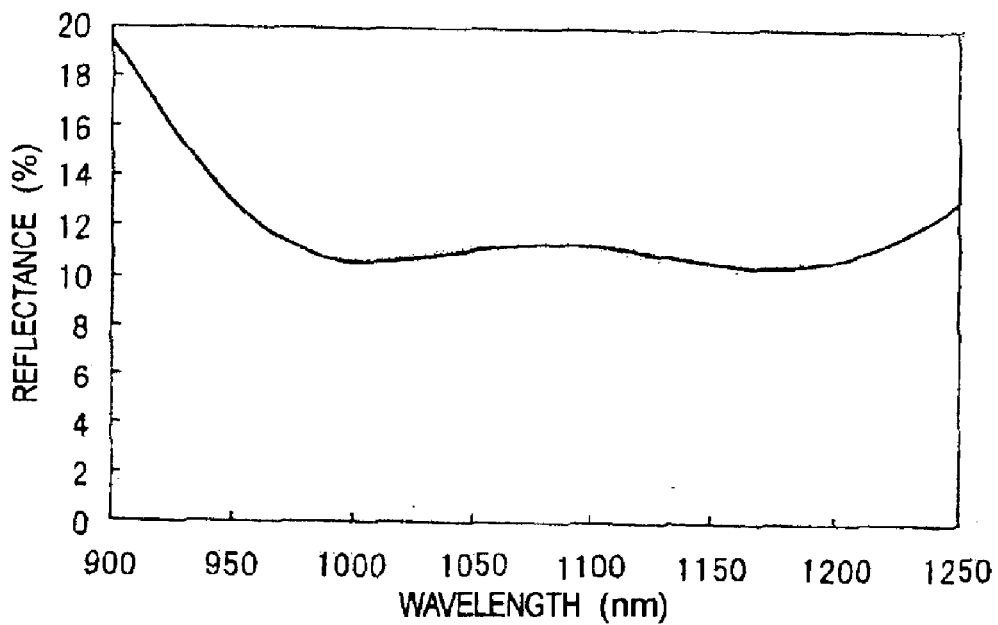
FIG. 77 is a graph of a wavelength dependence of a reflectance on a reflecting multi-layer film formed on an end face portion of a semiconductor optical device according to the sixty-seventh embodiment of the present invention.

FIG. 77 is a graph of a wavelength dependence of the reflectance of the six-layer reflecting film 40. The abscissa of the graph indicates a wavelength, and the ordinate denotes a reflectance. In the six-layer reflecting film, a flat portion having about 11% of the setting reflectance over a wide wavelength band can be obtained. More specifically, the reflectance in the range of a wavelength of 963 nm to a wavelength of 1233 nm ranges from 10.4% to 12.0%. With reference to the reflectance of 11.0% at the setting wavelength 980 nm, a continuous wavelength band in the range of −1.5% to +1.0%, i.e., 9.5% to 12.0% is 270 nm. A value obtained by dividing the wavelength band by the setting wavelength of 980 nm is about 0.276, and is larger than 0.065 in the hypothetical reflecting film. Therefore, it is understood that the six-layer reflecting film 40 has a flat portion having a low reflectance over a wide wavelength band.

Sixty-eighth Embodiment

A semiconductor optical device having a six-layer reflecting film according to the Sixty-eighth embodiment of the present invention will be described below with reference to FIG. 78. This semiconductor optical device is different from the semiconductor optical device according to the Sixty-seventh embodiment in that a setting reflectance $R(\lambda_0)$ is 11.0% at a setting wavelength $\lambda_0$=875 nm. In addition, when phase shifts φ1 and φ2 of tantalum oxide and aluminum oxide are given by φ1=0.931121 and φ2=0.862397, a reflectance of 11.0% is obtained at a wavelength of 875 nm. In this case, the film thickness of the layers of the six-layer reflecting film are given by $Ad_1/Ad_2/Bd_1/Bd_2/Cd_1/Cd_2$=1104.01 nm/122.32 nm/129.23 nm/151.98 nm/138.68 nm/163.10 nm. The total thickness ($d_{total}$=d) of the film is 809.32 nm. A sum $\Sigma n_i d_i$ of products $n_i d_i$ of refractive index $n_i$ and film thickness $d_i$ of a layer denoted with i in the six films is 1473.63 nm which is very large, i.e., about 6.01 times a ¼ wavelength (=245 nm) of the predetermined wavelength of 980 nm. For this reason, a heat-radiation characteristic on the end face is improved, and the temperature of the end face can be suppressed from increasing.

Figure 78:
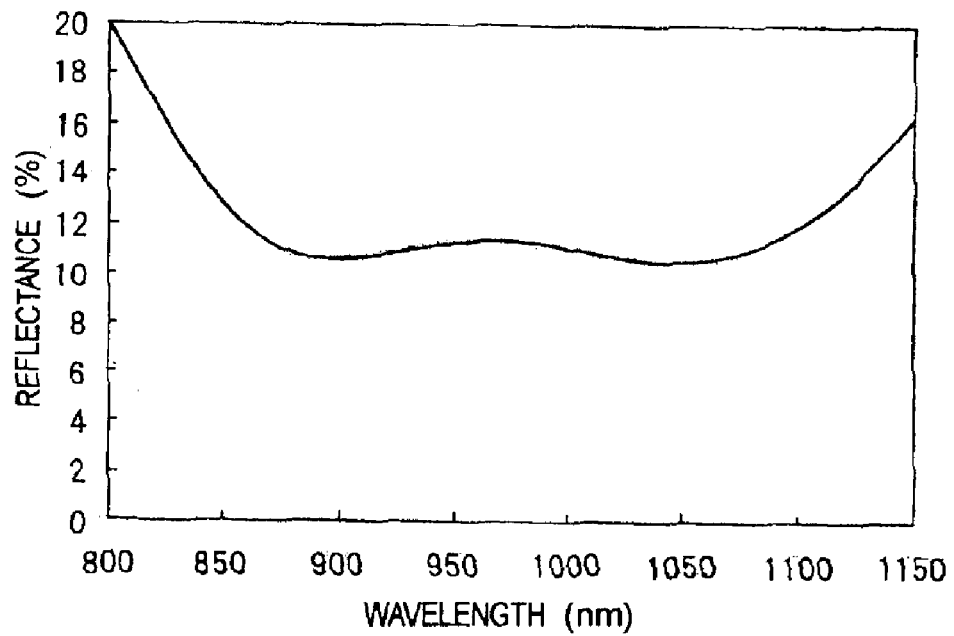
FIG. 78 is a graph of a wavelength dependence of a reflectance on a reflecting multi-layer film formed on an end face portion of a semiconductor optical device according to the sixty-eighth embodiment of the present invention.

FIG. 78 is a graph of a wavelength dependence of the reflectance of the six-layer reflecting film 40. The abscissa of the graph indicates a wavelength, and the ordinate denotes a reflectance. In the six-layer reflecting film, a flat portion having about 11% of the setting reflectance over a wide wavelength band can be obtained. More specifically, the reflectance in the range of a wavelength of 859 nm to a wavelength of 1100 nm ranges from 10.4% to 12.0%. With reference to the reflectance of 11.0% at the setting wavelength 875 nm, a continuous wavelength band in the range of −1.5% to +1.0%, i.e., 9.5% to 12.0% is 241 nm. A value obtained by dividing the wavelength band by the setting wavelength of 875 nm is about 0.275, and is larger than 0.065 in the hypothetical reflecting film. Therefore, it is understood that the six-layer reflecting film 40 has a flat portion having a low reflectance over a wide wavelength band.

Sixty-ninth Embodiment

A semiconductor optical device having a six-layer reflecting film according to the sixty-ninth embodiment of the present invention will be described below with reference to FIG. 79. This semiconductor optical device is different from the semiconductor optical device according to the seventeenth embodiment in that a setting reflectance $R(\lambda_0)$ is 12.0% at a setting wavelength $\lambda_0$=980 nm. Parameters are given by A=1.70, B=2.07, and C=2.15. In addition, when phase shifts φ1 and φ2 of tantalum oxide and aluminum oxide are given by φ1=0.853386 and φ2=0.935812, a reflectance of 12.0% is obtained at a wavelength of 980 nm. In this case, the film thickness of the layers of the six-layer reflecting film are given by $Ad_1/Ad_2/Bd_1/Bd_2/Cd_1/Cd_2$=110.00 nm/153.17 nm/1 33.95 nm/186.51 nm/139.12 nm/193.71 nm. The total thickness ($d_{total}=\Sigma d_i$) of the film is 916.46 nm. A sum $\Sigma n_i d_i$ of products $n_i d_i$ of refractive index $n_i$ and film thickness $d_i$ of a layer denoted with i in the six films is 1652.07 nm which is very large, i.e., about 6.74 times a ¼ wavelength (=245 nm) of the predetermined wavelength of 980 nm. For this reason, a heat-radiation characteristic on the end face is improved, and the temperature of the end face can be suppressed from increasing.

Figure 79:
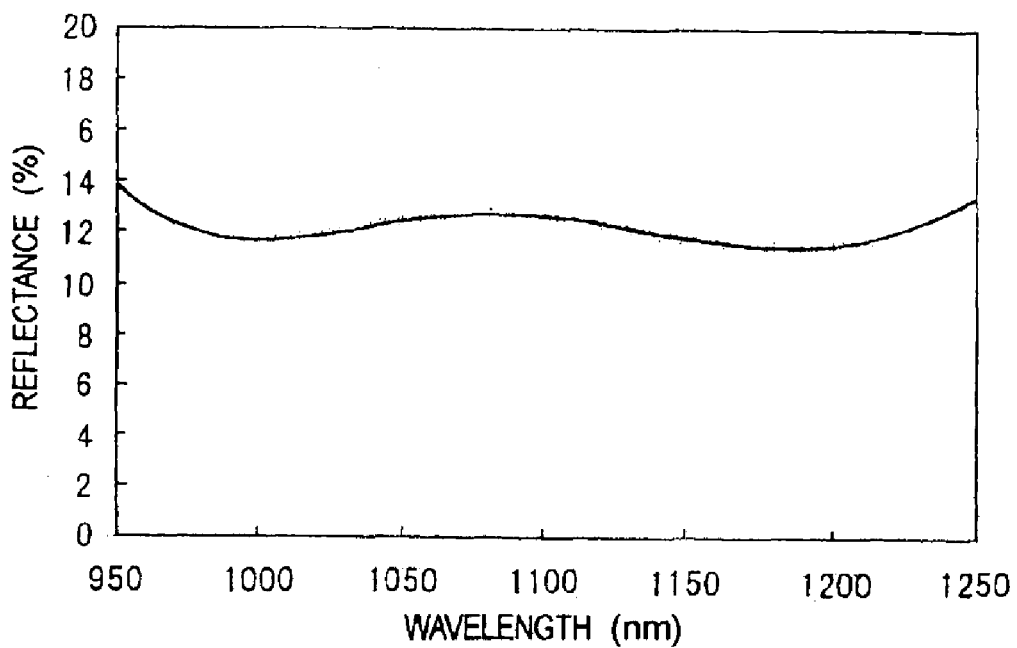
FIG. 79 is a graph of a wavelength dependence of a reflectance on a reflecting multi-layer film formed on an end face portion of a semiconductor optical device according to the sixty-ninth embodiment of the present invention.

FIG. 79 is a graph of a wavelength dependence of the reflectance of the six-layer reflecting film 40. The abscissa of the graph indicates a wavelength, and the ordinate denotes a reflectance. In the six-layer reflecting film, a flat portion having about 12% of the setting reflectance over a wide wavelength band can be obtained. More specifically, the reflectance in the range of a wavelength of 961 nm to a wavelength of 1240 nm ranges from 11.5% to 13.0%. With reference to the reflectance of 12.0% at the setting wavelength 980 nm, a continuous wavelength band in the range of −1.5% to +1.0%, i.e., 10.5% to 13.0% is 279 nm. A value obtained by dividing the wavelength band by the setting wavelength of 980 nm is about 0.285, and is larger than 0.065 in the hypothetical reflecting film. Therefore, it is understood that the six-layer reflecting film 40 has a flat portion having a low reflectance over a wide wavelength band.

Seventieth Embodiment

A semiconductor optical device having a six-layer reflecting film according to the seventieth embodiment of the present invention will be described below with reference to FIG. 80. This semiconductor optical device is different from the semiconductor optical device according to the sixty-ninth embodiment in that a setting reflectance $R(\lambda_0)$ is 12.0% at a setting wavelength $\lambda_0=873$ nm. In addition, when phase shifts 41 and φ2 of tantalum oxide and aluminum oxide are given by φ1=0.853386 and φ2=0.935812, a reflectance of 12.0% is obtained at a wavelength of 873 nm. In this case, the film thickness of the layers of the six-layer reflecting film are given by $Ad_1/Ad_2/Bd_1/Bd_2/Cd_1/Cd_2$=97.99 nm/136.45 nm/119.32 nm/166.14 nm/123.93 nm/172.56 nm. The total thickness ($d_{total}=\Sigma d_i$) of the film is 816.56 nm. A sum $\Sigma n_i d_i$ of products $n_i d_i$ of refractive index $n_i$ and film thickness $d_i$ of a layer denoted with i in the six films is 1471.67 nm which is very large, i.e., about 6.01 times a ¼ wavelength (=245 nm) of the predetermined wavelength of 980 nm. For this reason, a heat-radiation characteristic on the end face is improved, and the temperature of the end face can be suppressed from increasing.

Figure 80:
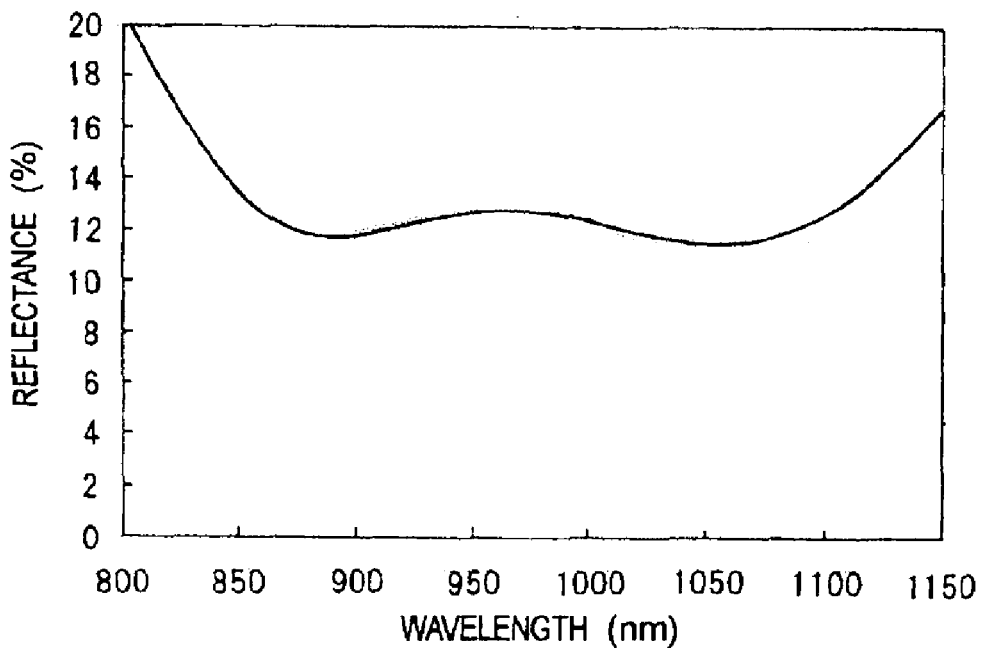
FIG. 80 is a graph of a wavelength dependence of a reflectance on a reflecting multi-layer film formed on an end face portion of a semiconductor optical device according to the seventieth embodiment of the present invention.

FIG. 80 is a graph of a wavelength dependence of the reflectance of the six-layer reflecting film 40. The abscissa of the graph indicates a wavelength, and the ordinate denotes a reflectance. In the six-layer reflecting film, a flat portion having about 12% of the setting reflectance over a wide wavelength band can be obtained. More specifically, the reflectance in the range of a wavelength of 856 nm to a wavelength of 1103 nm ranges from 11.5% to 13.0%. With reference to the reflectance of 12.0% at the setting wavelength 873 nm, a continuous wavelength band in the range of −1.5% to +1.0%, i.e., 10.5% to 13.0% is 247 nm. A value obtained by dividing the wavelength band by the setting wavelength of 873 nm is about 0.283, and is larger than 0.065 in the hypothetical reflecting film. Therefore, it is understood that the six-layer reflecting film 40 has a flat portion having a low reflectance over a wide wavelength band.

The characteristics of the reflecting multi-layer films of the semiconductor optical device according to the fifty-seventh embodiment to the seventieth embodiment are shown in Table 7. In Table 7, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.5 to +1.0% of $R(\lambda_0)$, and ratio of $\Delta\lambda/\lambda_0$ are shown.

TABLE 7

Characteristic of Multi-layer Reflecting Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to ¼ wave-length (245 nm) of 980 nm | Band width $\Delta\lambda$ in which the reflectance falls within the range from −1.5 to 1.0 of $R(\lambda_0)$ | Ratio of $\Delta\lambda/\lambda_0$ |
|---|---|---|---|---|---|---|
| 57 | Six films | 980 nm 6.0% | 5.0% | 1648.43 nm 6.73 times | 253 nm | 253/980 = 0.258 |
| 58 | Six films | 879 nm 6.0% | 5.0% | 1478.54 nm 6.03 times | 227 nm | 227/879 = 0.258 |
| 59 | Six films | 980 nm 7.0% | 6.4% | 1653.06 nm 6.75 times | 255 nm | 255/980 = 0.260 |
| 60 | Six films | 880 nm 7.0% | 6.4% | 1484.37 nm 6.06 times | 228 nm | 228/880 = 0.259 |
| 61 | Six films | 980 nm 8.0% | 7.4% | 1652.67 nm 6.75 times | 259 nm | 259/980 = 0.264 |
| 62 | Six films | 878 nm 8.0% | 7.4% | 1480.65 nm 6.04 times | 232 nm | 232/878 = 0.264 |
| 63 | Six films | 980 nm 9.0% | 8.4% | 1656.11 nm 6.76 times | 272 nm | 272/980 = 0.278 |
| 64 | Six films | 874 nm 9.0% | 8.4% | 1476.95 nm 6.03 times | 242 nm | 242/874 = 0.244 |
| 65 | Six films | 980 nm 10.0% | 9.5% | 1653.97 nm 6.75 times | 270 nm | 270/980 = 0.276 |
| 66 | Six films | 874 nm 10.0% | 9.5% | 1475.04 nm 6.02 times | 241 nm | 241/874 = 0.276 |
| 67 | Six films | 980 nm 11.0% | 10.4% | 1650.45 nm 6.74 times | 270 nm | 270/980 = 0.276 |
| 68 | Six films | 875 nm 11.0% | 10.4% | 1473.63 nm 6.01 times | 241 nm | 241/875 = 0.275 |
| 69 | Six films | 980 nm 12.0% | 11.5% | 1652.07 nm 6.74 times | 279 nm | 279/980 = 0.285 |
| 70 | Six films | 873 nm 12.0% | 11.5% | 1471.67 nm 6.01 times | 247 nm | 247/873 = 0.283 |

Seventy-first Embodiment

A semiconductor optical device having a seven-layer reflecting film including films of three types according to the seventy-first embodiment of the present invention will be described below with reference to FIG. 81. This semiconductor optical device is different from the semiconoptical device according to the twenty-fifth embodiment in that a setting reflectance $R(\lambda_0)$ is 6.0% at a setting wavelength $\lambda_0=980$ nm. Parameters are given by A=1.05, B=2.00, and C=2.00. In addition, when phase shifts $\phi_1$ and $\phi_2$ of tantalum oxide and aluminum oxide are given by $\phi1=1.09082$ and $\phi2=0.85958$, a reflectance of 6.0% is obtained at a wavelength of 980 nm. In this case, the film thickness of the layers of the seven-layer reflecting film are given by $d_3/Ad_1/Ad_2/Bd_1/Bd_2/Cd_1/Cd_2=50$ nm/86.85 nm/86.90 nm/165.42 nm/165.52 nm/165.42 nm/165.52 nm. The total thickness ($d_{total}=d_i$) of the film is 885.63 nm. A sum $\Sigma n_i d_i$ of products $n_i d_i$ of refractive index $n_i$ and film thickness $d_i$ of a layer denoted with i in the seven films is 1639.85 nm which is very large, i.e., about 6.69 times a ¼ wavelength (=245 nm) of the predetermined wavelength of 980 nm. For this reason, a heat-radiation characteristic on the end face is improved, and the temperature of the end face can be suppressed from increasing.

Figure 81:
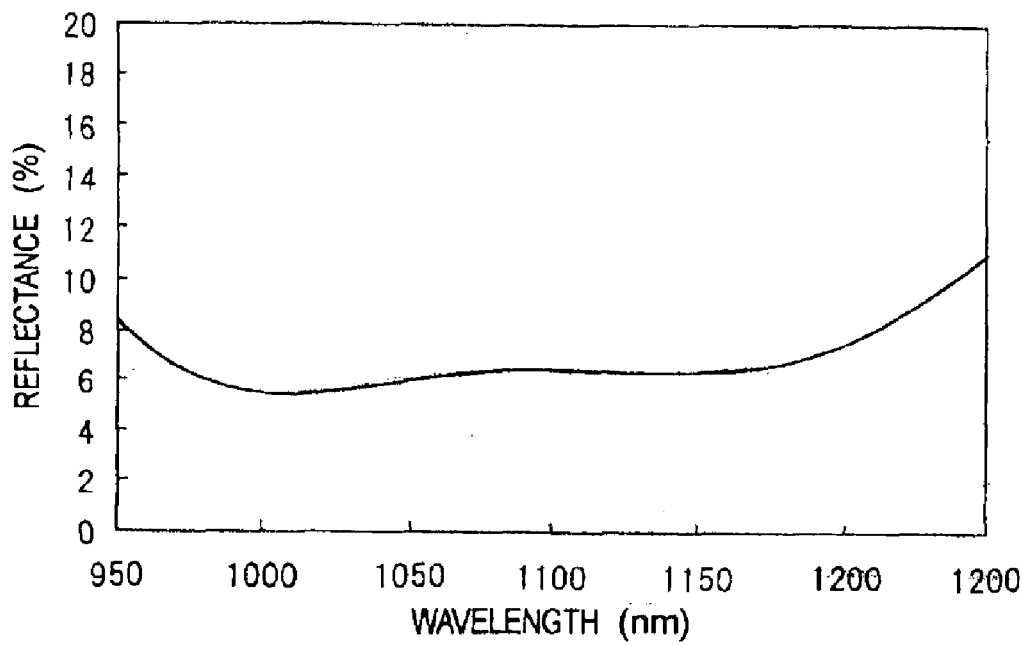
FIG. 81 is a graph of a wavelength dependence of a reflectance on a reflecting multi-layer film formed on an end face portion of a semiconductor optical device according to the seventy-first embodiment of the present invention.

FIG. 81 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 6% of the setting reflectance over a wide wavelength band can be obtained. More specifically, the reflectance in the range of a wavelength of 965 nm to a wavelength of 1186 nm ranges from 5.4% to 7.0%. With reference to the reflectance of 6.0% at the setting wavelength 980 nm, a continuous wavelength band in the range of −1.5% to +1.0%, i.e., 4.5% to 7.0% is 221 nm. A value obtained by dividing the wavelength band by the setting wavelength of 980 nm is about 0.226, and is larger than 0.065 in the hypothetical reflecting film. Therefore, it is understood that the seven-layer reflecting film 50 has a flat portion having a low reflectance over a wide wavelength band.

Seventy-second Embodiment

A semiconductor optical device having a seven-layer reflecting film including films of three types according to the seventy-second embodiment of the present invention will be described below with reference to FIG. 82. This semiconductor optical device is different from the semiconductor optical device according to the seventy-first embodiment in that a setting reflectance $R(\lambda_0)$ is 6.0% at a setting wavelength $\lambda_0=889$ nm. In addition, when phase shifts $\phi1$ and $\phi2$ of tantalum oxide and aluminum oxide are given by $\phi1=1.05881$ and $\phi2=0.86643$, a reflectance of 6.0% is obtained at a wavelength of 889 nm. In this case, the film thickness of the layers of the seven-layer reflecting film are given by d3/Ad1/Ad2/Bd1/Bd2/Cd1/Cd2=50 nm/76.47 nm/79.46 nm/145.66 nm/151.35 nm/145.66 nm/151.35 nm. The total thickness ($d_{total}=\Sigma d_i$) of the film is 799.95 nm. A sum $\Sigma n_i d_i$ of products $n_i d_i$ of refractive index $n_i$ and film thickness $d_i$ of a layer denoted with i in the seven films is 1479.24 nm which is very large, i.e., about 6.04 times a ¼ wavelength (=245 nm) of the predetermined wavelength of 980 nm. For this reason, a heat-radiation characteristic on the end face is improved, and the temperature of the end face can be suppressed from increasing.

Figure 82:
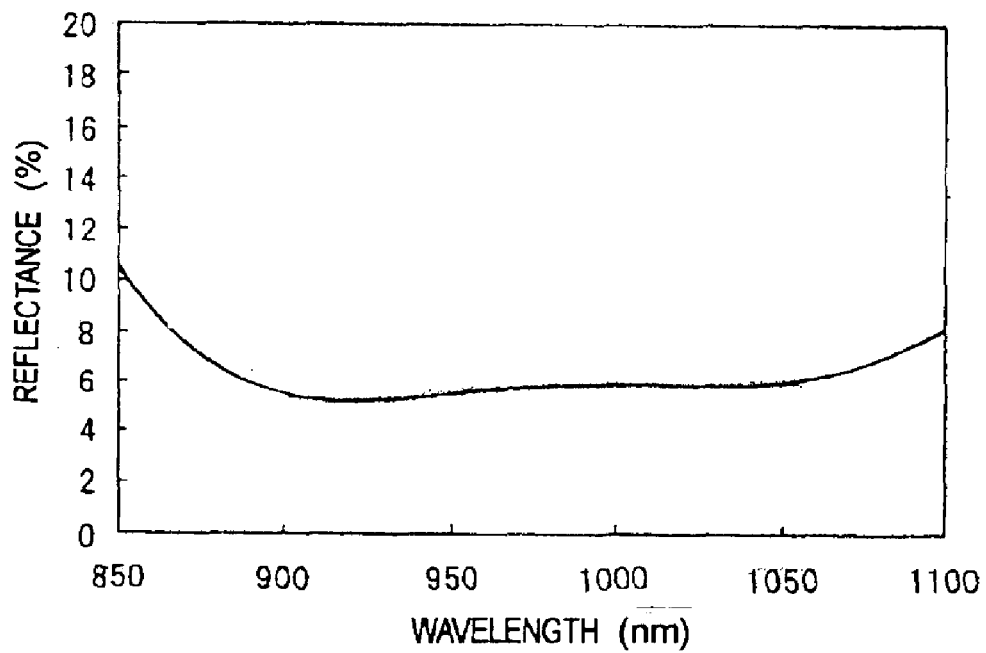
FIG. 82 is a graph of a wavelength dependence of a reflectance on a reflecting multi-layer film formed on an end face portion of a semiconductor optical device according to the seventy-second embodiment of the present invention.

FIG. 82 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 6% of the setting reflectance over a wide wavelength band can be obtained. More specifically, the reflectance in the range of a wavelength of 877 nm to a wavelength of 1081 nm ranges from 5.2% to 7.0%. With reference to the reflectance of 6.0% at the setting wavelength 889 nm, a continuous wavelength band in the range of −1.5% to +1.0%, i.e., 4.5% to 7.0% is 204 nm. A value obtained by dividing the wavelength band by the setting wavelength of 889 nm is about 0.229, and is larger than 0.065 in the hypothetical reflecting film. Therefore, it is understood that the seven-layer reflecting film 50 has a flat portion having a low reflectance over a wide wavelength band.

Seventy-third Embodiment

A semiconductor optical device having a seven-layer reflecting film including films of three types according to the seventy-third embodiment of the present invention will be described below with reference to FIG. 83. This semiconductor optical device is different from the semiconductor optical device according to the twenty-fifth embodiment in that a setting reflectance $R(\lambda_0)$ is 7.0% at a setting wavelength $\lambda_0=980$ nm. Parameters are given by A=1.10, B=2.05, and C=2.00. In addition, when phase shifts $\phi1$ and $\phi2$ of tantalum oxide and aluminum oxide are given by $\phi1=1.01208$ and $\phi2=0.89686$, a reflectance of 7.0% is obtained at a wavelength of 980 nm. In this case, the film thickness of the layers of the seven-layer reflecting film are given by $d_3/Ad_1/Ad_2/Bd_1/Bd_2/Cd_1/Cd_2=50$ nm/84.41 nm/94.98 nm/157.32 nm/177.02 nm/143.48 nm/172.70 nm. The total thickness ($d_{total}=\Sigma d_i$) of the film is 879.91 nm. A sum $\Sigma n_i d_i$ of products $n_i d_i$ of refractive index $n_i$ and film thickness $d_i$ of a layer denoted with i in the seven films is 1636.96 nm which is very large, i.e., about 6.68 times a ¼ wavelength (=245 nm) of the predetermined wavelength of 980 nm. For this reason, a heat-radiation characteristic on the end face is improved, and the temperature of the end face can be suppressed from increasing.

Figure 83:
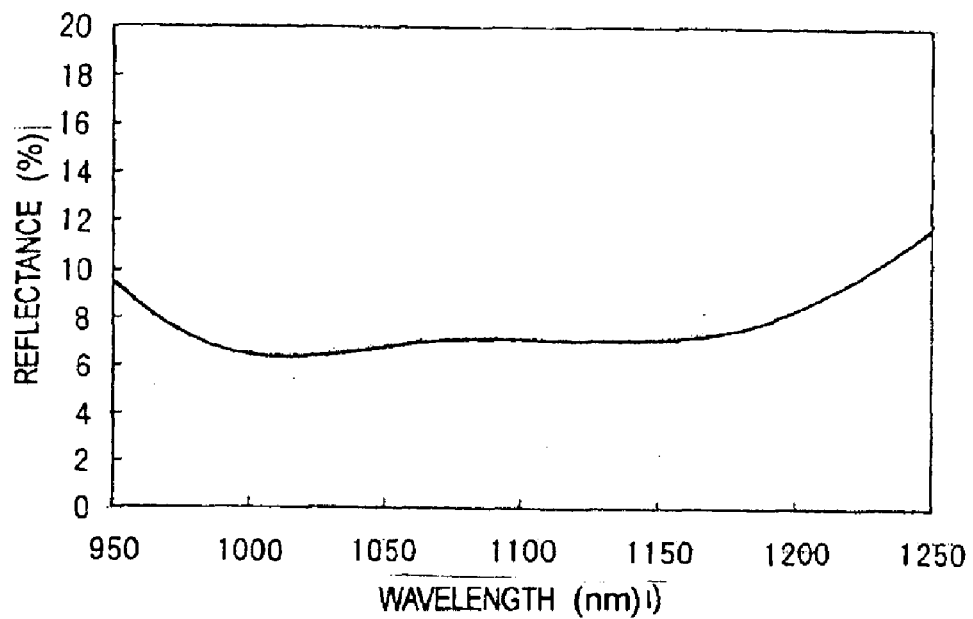
FIG. 83 is a graph of a wavelength dependence of a reflectance on a reflecting multi-layer film formed on an end face portion of a semiconductor optical device according to the seventy-third embodiment of the present invention.

FIG. 83 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 7% of the setting reflectance over a wide wavelength band can be obtained. More specifically, the reflectance in the range of a wavelength of 965 nm to a wavelength of 1194 nm ranges from 6.4% to 8.0%. With reference to the reflectance of 7.0% at the setting wavelength 980 nm, a continuous wavelength band in the range of −1.5% to +1.0%, i.e., 5.5% to 8.0% is 229 nm. A value obtained by dividing the wavelength band by the setting wavelength of 980 nm is about 0.234, and is larger than 0.065 in the hypothetical reflecting film. Therefore, it is understood that the seven-layer reflecting film 50 has a flat portion having a low reflectance over a wide wavelength band.

Seventy-fourth Embodiment

A semiconductor optical device having a seven-layer reflecting film including films of three types according to the seventy-fourth embodiment of the present invention will be described below with reference to FIG. 84. This semiconductor optical device is different from the semiconductor optical device according to the seventy-third embodiment in that a setting reflectance $R(\lambda_0)$ is 7.0% at a setting wavelength $\lambda_0=886$ nm. In addition, when phase shifts $\phi_1$ and $\phi_2$ of tantalum oxide and aluminum oxide are given by $\phi_1=0.97974$ and $\phi_2=0.90431$, a reflectance of 7.0% is obtained at a wavelength of 886 nm. In this case, the film thickness of the layers of the seven-layer reflecting film are given by $d_3/Ad_1/Ad_2/Bd_1/Bd_2/Cd_1/Cd_2=50$ nm/73.88 nm/86.59 nm/137.68 nm/161.37 nm/134.33 nm/157.43 nm. The total thickness ($d_{total}=\Sigma d_i$) of the film is 801.28 nm. A sum $\Sigma n_i d_i$ of products $n_i d_i$ of refractive index $n_i$ and film thickness $d_i$ of a layer denoted with i in the seven films is 1471.83 nm which is very large, i.e., about 6.01 times a ¼ wavelength (=245 nm) of the predetermined wavelength of 980 nm. For this reason, a heat-radiation characteristic on the end face is improved, and the temperature of the end face can be suppressed from increasing.

Figure 84:
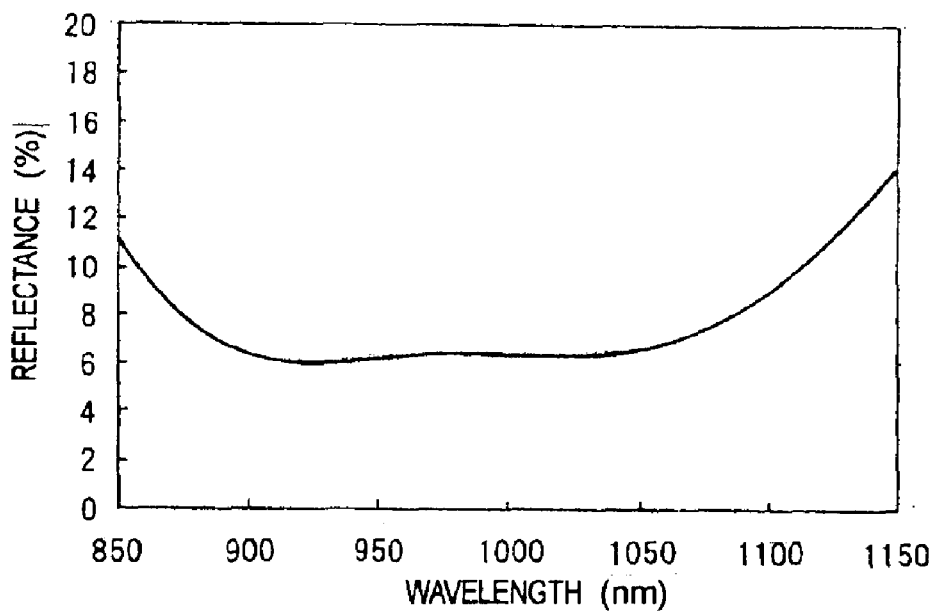
FIG. 84 is a graph of a wavelength dependence of a reflectance on a reflecting multi-layer film formed on an end face portion of a semiconductor optical device according to the seventy-fourth embodiment of the present invention.

FIG. 84 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 7% of the setting reflectance over a wide wavelength band can be obtained. More specifically, the reflectance in the range of a wavelength of 874 nm to a wavelength of 1085 nm ranges from 6.0% to 8.0%. With reference to the reflectance of 7.0% at the setting wavelength 886 nm, a continuous wavelength band in the range of −1.5% to +1.0%, i.e., 5.5% to 8.0% is 211 nm. A value obtained by dividing the wavelength band by the setting wavelength of 886 nm is about 0.238, and is larger than 0.065 in the hypothetical reflecting film. Therefore, it is understood that the seven-layer reflecting film 50 has a flat portion having a low reflectance over a wide wavelength band.

Seventy-fifth Embodiment

A semiconductor optical device having a seven-layer reflecting film including films of three types according to the seventy-fifth embodiment of the present invention will be described below with reference to FIG. 85. This semiconductor optical device is different from the semiconductor optical device according to the twenty-fifth embodiment in that a setting reflectance $R(\lambda_0)$ is 8.0% at a setting wavelength $\lambda_0$=980 nm. Parameters are given by A=1.10, B=2.05, and C=2.00. In addition, when phase shifts $\phi 1$ and $\phi 2$ of tantalum oxide and aluminum oxide are given by $\phi 1$=0.991775 and $\phi 2$=0.923736, a reflectance of 8.0% is obtained at a wavelength of 980 nm. In this case, the film thickness of the layers of the seven-layer reflecting film are given by d3/Ad1/Ad2/Bd1/Bd2/Cd1/Cd2=50 nm/82.72 nm/97.83 nm/154.16 nm/182.32 nm/150.40 nm/177.87 nm. The total thickness ($d_{total}=\Sigma d_i$) of the film is 895.3 nm. A sum $\Sigma n_i d_i$ of products $n_i d_i$ of refractive index $n_i$ and film thickness $d_i$ of a layer denoted with i in the seven films is 1642.23 nm which is very large, i.e., about 6.70 times a ¼ wavelength (=245 nm) of the predetermined wavelength of 980 nm. For this reason, a heat-radiation characteristic on the end face is improved, and the temperature of the end face can be suppressed from increasing.

Figure 85:
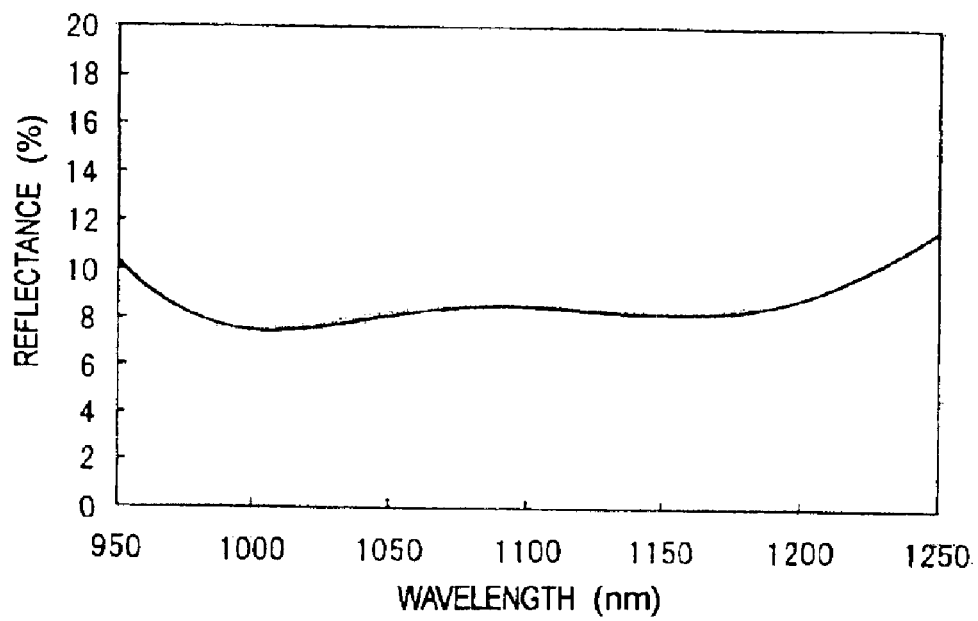
FIG. 85 is a graph of a wavelength dependence of a reflectance on a reflecting multi-layer film formed on an end face portion of a semiconductor optical device according to the seventy-fifth embodiment of the present invention.

FIG. 85 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 8% of the setting reflectance over a wide wavelength band can be obtained. More specifically, the reflectance in the range of a wavelength of 964 nm to a wavelength of 1204 nm ranges from 7.5% to 9.0%. With reference to the reflectance of 8.0% at the setting wavelength 980 nm, a continuous wavelength band in the range of −1.5% to +1.0%, i.e., 6.5% to 9.0% is 240 nm. A value obtained by dividing the wavelength band by the setting wavelength of 980 nm is about 0.245, and is larger than 0.065 in the hypothetical reflecting film. Therefore, it is understood that the seven-layer reflecting film 50 has a flat portion having a low reflectance over a wide wavelength band.

Seventy-sixth Embodiment

A semiconductor optical device having a seven-layer reflecting film including films of three types according to the seventy-sixth embodiment of the present invention will be described below with reference to FIG. 86. This semiconductor optical device is different from the semiconductor optical device according to the seventy-fifth embodiment in that a setting reflectance $R(\lambda_0)$ is 8.0% at a setting wavelength $\lambda_0$=881 nm. In addition, when phase shifts $\phi 1$ and $\phi 2$ of tantalum oxide and aluminum oxide are given by $\phi 1$=0.958992 and $\phi 2$=0.930306, a reflectance of 8.0% is obtained at a wavelength of 881 nm. In this case, the film thickness of the layers of the seven-layer reflecting film are given by d3/Ad1/Ad2/Bd1/Bd2/Cd1/Cd2=50 nm/71.91 nm/88.57 nm/134.01 nm/165.07 nm/130.74 nm/161.04 nm. The total thickness ($d_{total}=\Sigma d_i$) of the film is 801.34 nm. A sum $\Sigma n_i d_i$ of products $n_i d_i$ of refractive index $n_i$ and film thickness $d_i$ of a layer denoted with i in the seven films is 1467.89 nm which is very large, i.e., about 5.99 times a ¼ wavelength (=245 nm) of the predetermined wavelength of 980 nm. For this reason, a heat-radiation characteristic on the end face is improved, and the temperature of the end face can be suppressed from increasing.

Figure 86:
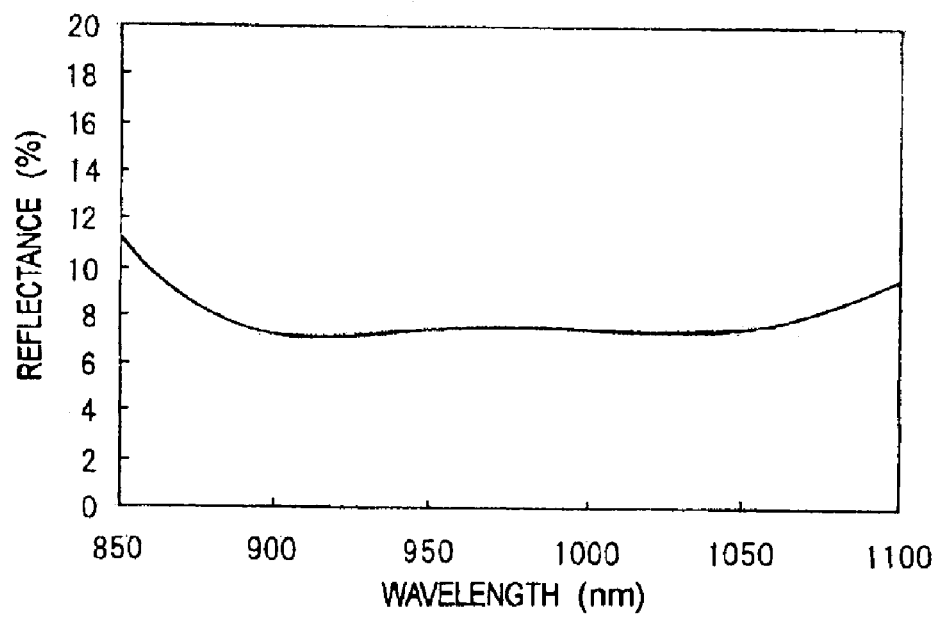
FIG. 86 is a graph of a wavelength dependence of a reflectance on a reflecting multi-layer film formed on an end face portion of a semiconductor optical device according to the seventy-sixth embodiment of the present invention.

FIG. 86 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 8% of the setting reflectance over a wide wavelength band can be obtained. More specifically, the reflectance in the range of a wavelength of 869 nm to a wavelength of 1090 nm ranges from 7.1% to 9.0%. With reference to the reflectance of 8.0% at the setting wavelength 881 nm, a continuous wavelength band in the range of −1.5% to +1.0%, i.e., 6.5% to 9.0% is 221 nm. A value obtained by dividing the wavelength band by the setting wavelength of 881 nm is about 0.251, and is larger than 0.065 in the hypothetical reflecting film. Therefore, it is understood that the seven-layer reflecting film 50 has a flat portion having a low reflectance over a wide wavelength band.

Seventy-seventh Embodiment

A semiconductor optical device having a seven-layer reflecting film including films of three types according to the seventy-seventh embodiment of the present invention will be described below with reference to FIG. 87. This semiconductor optical device is different from the semiconductor optical device according to the twenty-fifth embodiment in that a setting reflectance $R(\lambda_0)$ is 9.0% at a setting wavelength $\lambda_0$=980 nm. Parameters are given by A=1.15, B=2.10, and C=2.05. In addition, when phase shifts $\phi 1$ and $\phi 2$ of tantalum oxide and aluminum oxide are given by $\phi 1$=0.934834 and $\phi 2$=0.92769, a reflectance of 8.0% is obtained at a wavelength of 980 nm. In this case, the film thickness of the layers of the seven-layer reflecting film are given by $d_3$/$Ad_1$/$Ad_2$/$Bd_1$/$Bd_2$/$Cd_1$/$Cd_2$=50 nm/81.52 nm/102.72 nm/148.86 nm/187.57 nm/145.31 nm/183.10 nm. The total thickness ($d_{total}=\Sigma d_1$) of the film is 899.08 nm. A sum $\Sigma n_i d_i$ of products $n_i d_i$ of refractive index $n_i$ and film thickness $d_i$ of a layer denoted with i in the seven films is 1643.29 nm which is very large, i.e., about 6.71 times a ¼ wavelength (=245 nm) of the predetermined wavelength of 980 nm. For this reason, a heat-radiation characteristic on the end face is improved, and the temperature of the end face can be suppressed from increasing.

Figure 87:
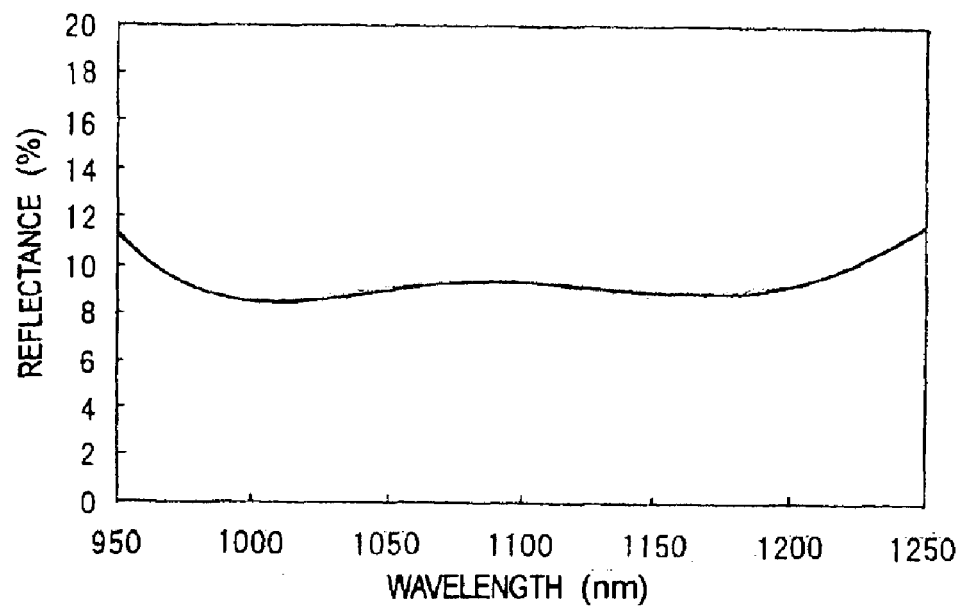
FIG. 87 is a graph of a wavelength dependence of a reflectance on a reflecting multi-layer film formed on an end face portion of a semiconductor optical device according to the seventy-seventh embodiment of the present invention.

FIG. 87 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 9% of the setting reflectance over a wide wavelength band can be obtained. More specifically, the reflectance in the range of a wavelength of 965 nm to a wavelength of 1220 nm ranges from 8.4% to 10.0%. With reference to the reflectance of 9.0% at the setting wavelength 980 nm, a continuous wavelength band in the range of −1.5% to +1.0%, i.e., 7.5% to 10.0% is 255 nm. A value obtained by dividing the wavelength band by the setting wavelength of 980 nm is about 0.260, and is larger than 0.065 in the hypothetical reflecting film. Therefore, it is understood that the seven-layer reflecting film 50 has a flat portion having a low reflectance over a wide wavelength band.

Seventy-eighth Embodiment

A semiconductor optical device having a seven-layer reflecting film including films of three types according to the seventy-eighth embodiment of the present invention will be described below with reference to FIG. 88. This semiconductor optical device is different from the semiconductor optical device according to the seventy-first embodiment in that a setting reflectance $R(\lambda_0)$ is 9.0% at a setting wavelength $\lambda_0$=874 nm. In addition, when phase shifts $\phi_1$ and $\phi_2$ of tantalum oxide and aluminum oxide are given by $\phi_1$=0.900337 and $\phi_2$=0.935222, a reflectance of 9.0% is obtained at a wavelength of 874 nm. In this case, the film thickness of the layers of the seven-layer reflecting film are given by $d_3/Ad_1/Ad_2/Bd_1/Bd_2/Cd_1/Cd_2$=50 nm/70.02 nm/92.35 nm/127.86 nm/168.64 nm/124.81 nm/164.62 nm. The total thickness ($d_{total}=\Sigma d_i$) of the film is 798.3 nm. A sum $\Sigma n_i d_i$ of products $n_i d_i$ of refractive index $n_i$ and film thickness $d_i$ of a layer denoted with i in the seven films is 1456.86 nm which is very large, i.e., about 5.95 times a ¼ wavelength (=245 nm) of the predetermined wavelength of 980 nm. For this reason, a heat-radiation characteristic on the end face is improved, and the temperature of the end face can be suppressed from increasing.

Figure 88:
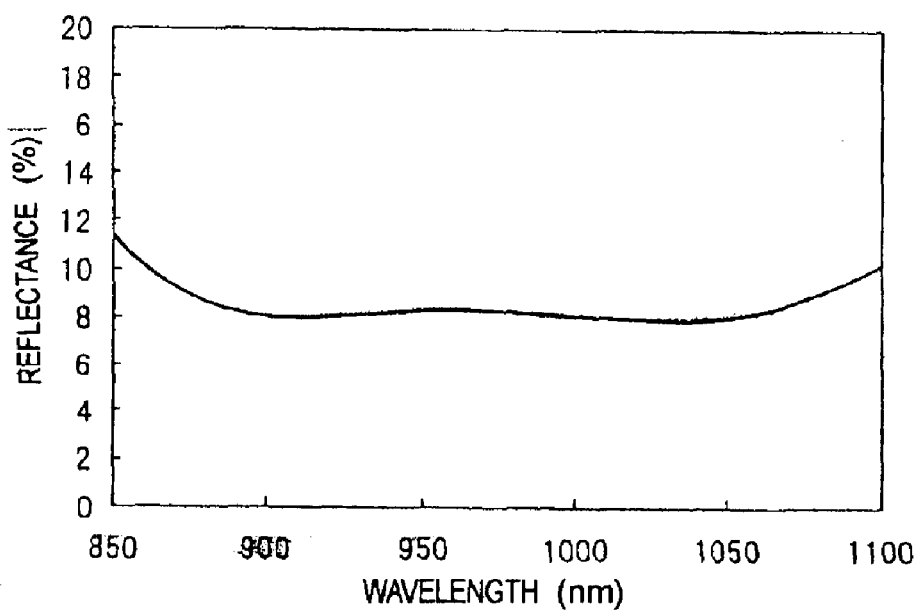
FIG. 88 is a graph of a wavelength dependence of a reflectance on a reflecting multi-layer film formed on an end face portion of a semiconductor optical device according to the seventy-eighth embodiment of the present invention.

FIG. 88 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 9% of the setting reflectance over a wide wavelength band can be obtained. More specifically, the reflectance in the range of a wavelength of 863 nm to a wavelength of 1096 nm ranges from 7.9% to 10.0%. With reference to the reflectance of 9.0% at the setting wavelength 874 nm, a continuous wavelength band in the range of −1.5% to +1.0%, i.e., 7.5% to 10.0% is 233 nm. A value obtained by dividing the wavelength band by the setting wavelength of 874 nm is about 0.267, and is larger than 0.065 in the hypothetical reflecting film. Therefore, it is understood that the seven-layer reflecting film 50 has a flat portion having a low reflectance over a wide wavelength band.

Seventy-ninth Embodiment

A semiconductor optical device having a seven-layer reflecting film including films of three types according to the seventy-ninth embodiment of the present invention will be described below with reference to FIG. 89. This semiconductor optical device is different from the semiconductor optical device according to the twenty-fifth embodiment in that a setting reflectance $R(\lambda_0)$ is 10.0% at a setting wavelength $\lambda_0$=980 nm. Parameters are given by A=1.15, B=2.10, and C=2.05. In addition, when phase shifts $\phi_1$ and $\phi_2$ of tantalum oxide and aluminum oxide are given by $\phi_1$=0.914148 and $\phi_2$=0.95535, a reflectance of 10.0% is obtained at a wavelength of 980 nm. In this case, the film thickness of the layers of the seven-layer reflecting film are given by $d_3/Ad_1/Ad_2/Bd_1/Bd_2/Cd_1/Cd_2$=50 nm/79.71 nm/105.78 nm/145.56 nm/193.16 nm/142.10 nm/188.56 nm. The total thickness ($d_{total}=\Sigma d_i$) of the film is 904.87 nm. A sum $\Sigma n_i d_i$ of products $n_i d_i$ of refractive index $n_i$ and film thickness $d_i$ of a layer denoted with i in the seven films is 1649.03 nm which is very large, i.e., about 6.73 times a ¼ wavelength (=245 nm) of the predetermined wavelength of 980 nm. For this reason, a heat-radiation characteristic on the end face is improved, and the temperature of the end face can be suppressed from increasing.

Figure 89:
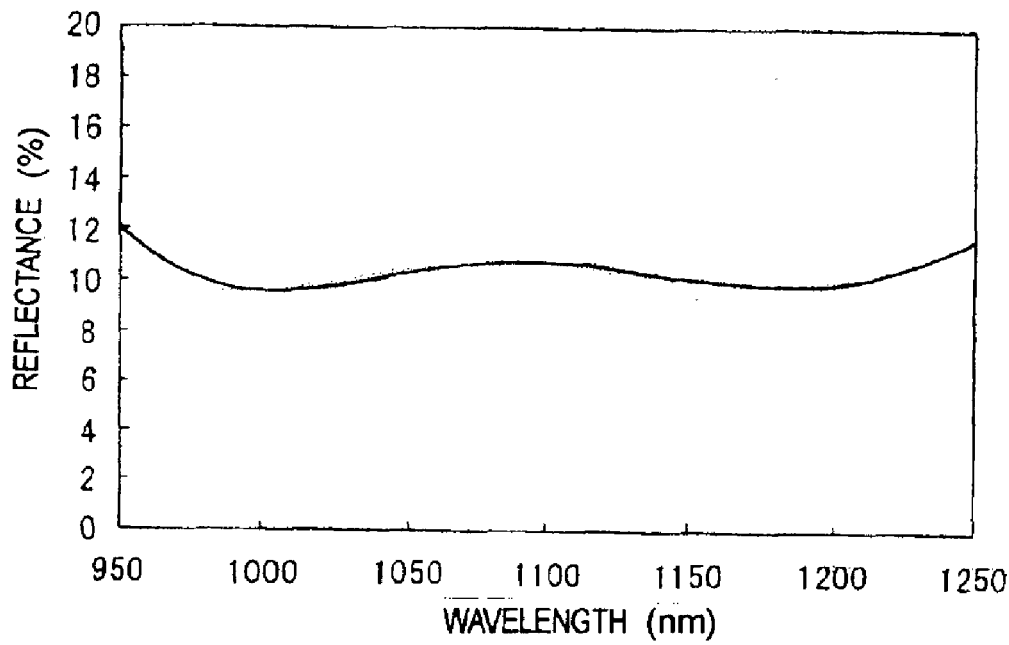
FIG. 89 is a graph of a wavelength dependence of a reflectance on a reflecting multi-layer film formed on an end face portion of a semiconductor optical device according to the seventy-ninth embodiment of the present invention.

FIG. 89 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 10% of the setting reflectance over a wide wavelength band can be obtained. More specifically, the reflectance in the range of a wavelength of 963 nm to a wavelength of 1235 nm ranges from 9.6% to 11.0%. With reference to the reflectance of 10.0% at the setting wavelength 980 nm, a continuous wavelength band in the range of −1.5% to +1.0%, i.e., 8.5% to 11.0% is 272 nm. A value obtained by dividing the wavelength band by the setting wavelength of 980 nm is about 0.278, and is larger than 0.065 in the hypothetical reflecting film. Therefore, it is understood that the seven-layer reflecting film 50 has a flat portion having a low reflectance over a wide wavelength band.

Eightieth Embodiment

A semiconductor optical device having a seven-layer reflecting film including films of three types according to the eightieth embodiment of the present invention will be described below with reference to FIG. 90. This semiconductor optical device is different from the semiconductor optical device according to the seventy-ninth embodiment in that a setting reflectance $R(\lambda_0)$ is 10.0% at a setting wavelength $\lambda_0$=868 nm. In addition, when phase shifts $\phi 1$ and $\phi 2$ of tantalum oxide and aluminum oxide are given by $\phi 1$=0.879123 and $\phi 2$=0.96166, a reflectance of 10.0% is obtained at a wavelength of 868 nm. In this case, the film thickness of the layers of the seven-layer reflecting film are given by $d_3/Ad_1/Ad_2/Bd_1/Bd_2/Cd_1/Cd_2$=50 nm/67.90 nm/94.31 nm/123.99 nm/172.21 nm/121.03 nm/168.11 nm. The total thickness ($d_{total}=\Sigma d_i$) of the film is 797.55 nm. A sum $\Sigma n_i d_i$ of products $n_i d_i$ of refractive index $n_i$ and film thickness $d_i$ of a layer denoted with i in the seven films is 1451.38 nm which is very large, i.e., about 5.92 times a ¼ wavelength (=245 nm) of the predetermined wavelength of 980 nm. For this reason, a heat-radiation characteristic on the end face is improved, and the temperature of the end face can be suppressed from increasing.

Figure 90:
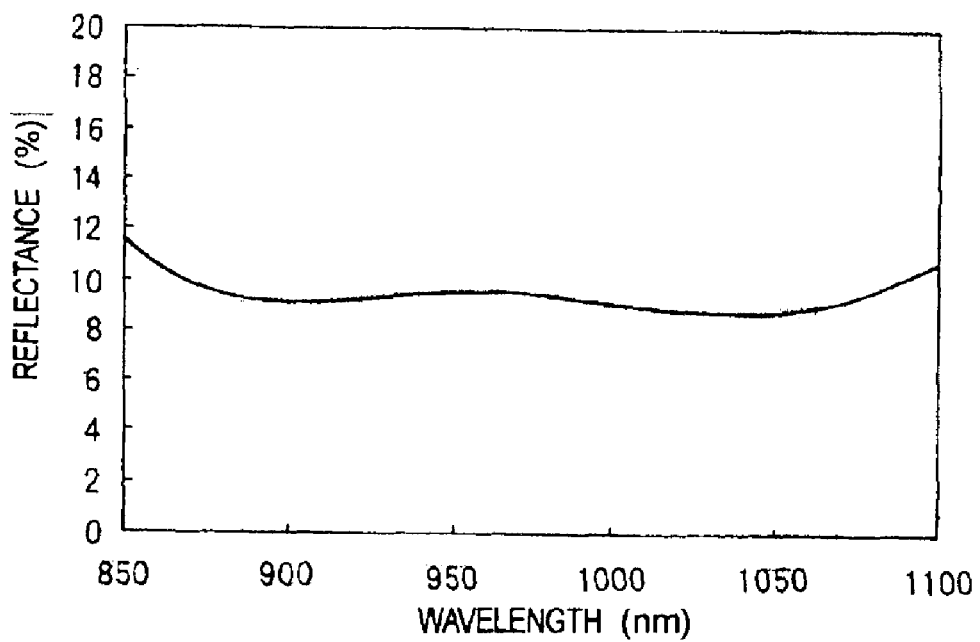
FIG. 90 is a graph of a wavelength dependence of a reflectance on a reflecting multi-layer film formed on an end face portion of a semiconductor optical device according to the eightieth embodiment of the present invention.

FIG. 90 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 10% of the setting reflectance over a wide wavelength band can be obtained. More specifically, the reflectance in the range of a wavelength of 856 nm to a wavelength of 1102 nm ranges from 8.7% to 11.0%. With reference to the reflectance of 10.0% at the setting wavelength 868 nm, a continuous wavelength band in the range of −1.5% to +1.0%, i.e., 8.5% to 11.0% is 246 nm. A value obtained by dividing the wavelength band by the setting wavelength of 868 nm is about 0.283, and is larger than 0.065 in the hypothetical reflecting film. Therefore, it is understood that the seven-layer reflecting film 50 has a flat portion having a low reflectance over a wide wavelength band.

Eighty-first Embodiment

A semiconductor optical device having a seven-layer reflecting film including films of three types according to the eighty-first embodiment of the present invention will be described below with reference to FIG. 91. This semiconductor optical device is different from the semiconductor optical device according to the twenty-fifth embodiment in that a setting reflectance $R(\lambda_0)$ is 11.0% at a setting wavelength $\lambda_0$=980 nm. Parameters are given by A=1.17, B=2.10, and C=2.05. In addition, when phase shifts $\phi 1$ and $\phi 2$ of tantalum oxide and aluminum oxide are given by $\phi 1$=0.881444 and $\phi 2$=0.983957, a reflectance of 11.0% is obtained at a wavelength of 980 nm. In this case, the film thickness of the layers of the seven-layer reflecting film are given by $d_3/Ad_1/Ad_2/Bd_1/Bd_2/Cd_1/Cd_2$=50 nm/78.20 nm/110.84 nm/140.35 nm/198.94 nm/1 37.01 nm/1 94.21 nm. The total thickness ($d_{total}=\Sigma d_i$) of the film is 909.55 nm. A sum $\Sigma n_i d_i$ of products $n_i d_i$ of refractive index $n_i$ and film thickness $d_i$ of a layer denoted with i in the seven films is 1651.45 nm which is very large, i.e., about 6.74 times a ¼ wavelength (=245 nm) of the predetermined wavelength of 980 nm. For this reason, a heat-radiation characteristic on the end face is improved, and the temperature of the end face can be suppressed from increasing.

Figure 91:
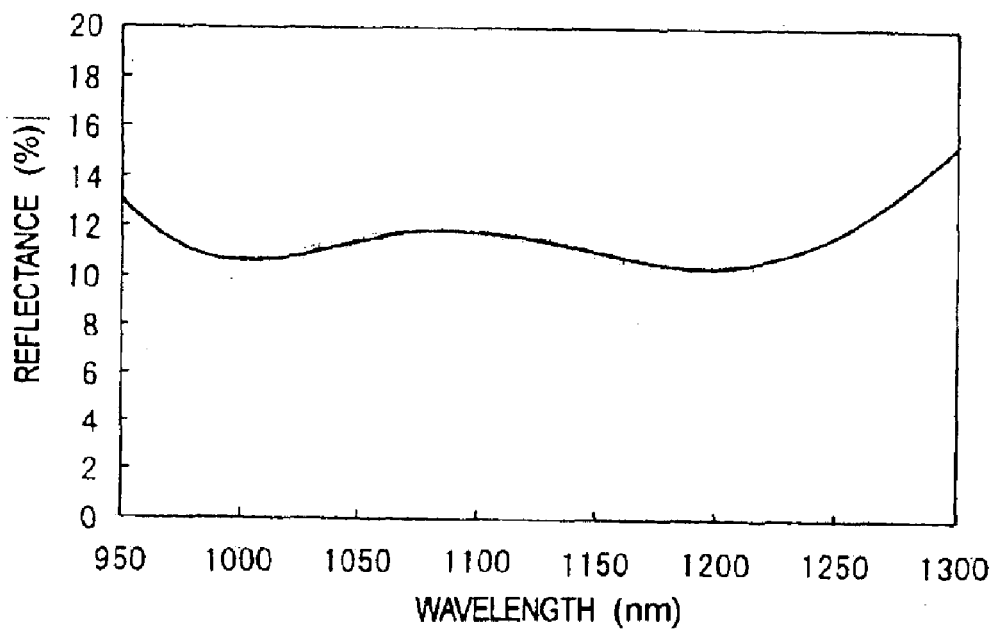
FIG. 91 is a graph of a wavelength dependence of a reflectance on a reflecting multi-layer film formed on an end face portion of a semiconductor optical device according to the eighty-first embodiment of the present invention.

FIG. 91 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 11% of the setting reflectance over a wide wavelength band can be obtained. More specifically, the reflectance in the range of a wavelength of 963 nm to a wavelength of 1254 nm ranges from 10.4% to 12.0%. With reference to the reflectance of 11.0% at the setting wavelength 980 nm, a continuous wavelength band in the range of −1.5% to +1.0%, i.e., 9.5% to 12.0% is 291 nm. A value obtained by dividing the wavelength band by the setting wavelength of 980 nm is about 0.297, and is larger than 0.065 in the hypothetical reflecting film. Therefore, it is understood that the seven-layer reflecting film 50 has a flat portion having a low reflectance over a wide wavelength band.

Eighty-second Embodiment

A semiconductor optical device having a seven-layer reflecting film including films of three types according to the eighty-second embodiment of the present invention will be described below with reference to FIG. 92. This semiconductor optical device is different from the semiconductor optical device according to the eighty-first embodiment in that a setting reflectance $R(\lambda_0)$ is 11.0% at a setting wavelength $\lambda_0$=862 nm. Parameters are given by A=1.15, B=2.10, and C=2.05. In addition, when phase shifts $\phi 1$ and $\phi 2$ of tantalum oxide and aluminum oxide are given by $\phi 1$=0.856738 and $\phi 2$=0.989623, a reflectance of 11.0% is obtained at a wavelength of 862 nm. In this case, the film thickness of the layers of the seven-layer reflecting film are given by $d_3/Ad_1/Ad_2/Bd_1/Bd_2/Cd_1/Cd_2$=50 nm/65.71 nm/96.38 nm/119.99 nm/176.00 nm/1 17.14 nm/1 71.81 nm. The total thickness ($d_{total}=\Sigma d_i$) of the film is 797.03 nm. A sum $\Sigma n_i d_i$ of products $n_i d_i$ of refractive index $n_i$ and film thickness $d_i$ of a layer denoted with i in the seven films is 1446.13 nm which is very large, i.e., about 5.90 times a ¼ wavelength (=245 nm) of the predetermined wavelength of 980 nm. For this reason, a heat-radiation characteristic on the end face is improved, and the temperature of the end face can be suppressed from increasing.

Figure 92:
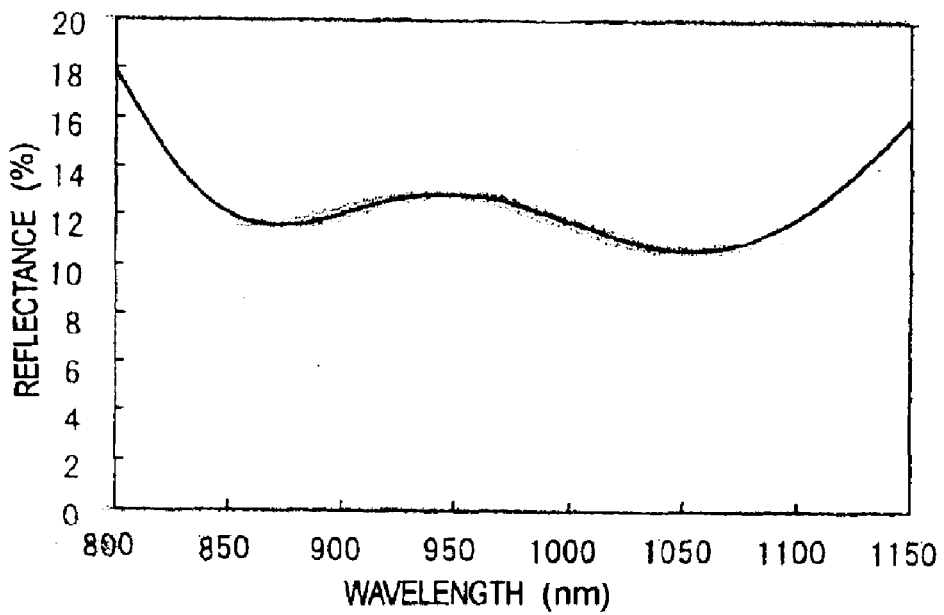
FIG. 92 is a graph of a wavelength dependence of a reflectance on a reflecting multi-layer film formed on an end face portion of a semiconductor optical device according to the eighty-second embodiment of the present invention.

FIG. 92 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 11% of the setting reflectance over a wide wavelength band can be obtained. More specifically, the reflectance in the range of a wavelength of 850 nm to a wavelength of 1110 nm ranges from 9.5% to 12.0%. With reference to the reflectance of 11.0% at the setting wavelength 862 nm, a continuous wavelength band in the range of −1.5% to +1.0%, i.e., 9.5% to 12.0% is 260 nm. A value obtained by dividing the wavelength band by the setting wavelength of 862 nm is about 0.302, and is larger than 0.065 in the hypothetical reflecting film. Therefore, it is understood that the seven-layer reflecting film 50 has a flat portion having a low reflectance over a wide wavelength band.

Eighty-third Embodiment

A semiconductor optical device having a seven-layer reflecting film including films of three types according to the eighty-third embodiment of the present invention will be described below with reference to FIG. 93. This semiconductor optical device is different from the semiconductor optical device according to the twenty-fifth embodiment in that a setting reflectance $R(\lambda_0)$ is 12.0% at a setting wavelength $\lambda_0$=980 nm. Parameters are given by A=1.22, B=2.13, and C=2.05. In addition, when phase shifts $\phi 1$ and $\phi 2$ of tantalum oxide and aluminum oxide are given by $\phi 1$=0.815005 and $\phi 2$=1.02518, a reflectance of 12.0% is obtained at a wavelength of 980 nm. In this case, the film thickness of the layers of the seven-layer reflecting film are given by $d_3/Ad_1/Ad_2/Bd_1/Bd_2/Cd_1/Cd_2$=50 nm/75.39 nm/120.42 nm/131.63 nm/210.24 nm/126.69 nm/1202.34 nm. The total thickness ($d_{total}=\Sigma d_i$) of the film is 916.71 nm. A sum $\Sigma n_i d_i$ of products $n_i d_i$ of refractive index $n_i$ and film thickness $d_i$ of a layer denoted with i in the seven films is 1653.50 nm which is very large, i.e., about 6.75 times a ¼ wavelength (=245 nm) of the predetermined wavelength of 980 nm. For this reason, a heat-radiation characteristic on the end face is improved, and the temperature of the end face can be suppressed from increasing.

Figure 93:
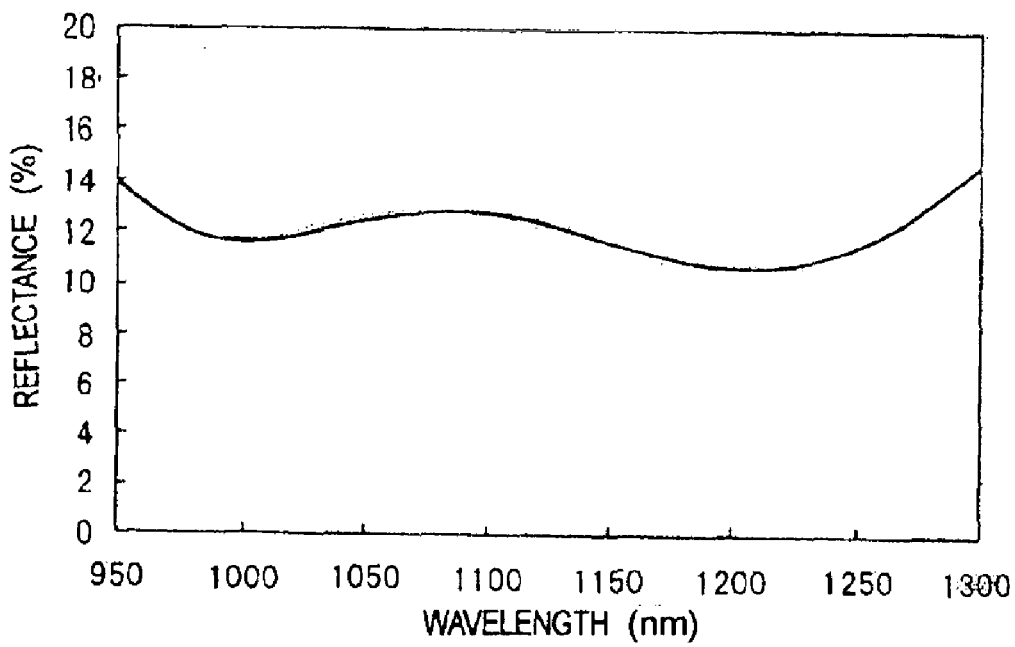
FIG. 93 is a graph of a wavelength dependence of a reflectance on a reflecting multi-layer film formed on an end face portion of a semiconductor optical device according to the eighty-third embodiment of the present invention.

FIG. 93 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 12% of the setting reflectance over a wide wavelength band can be obtained. More specifically, the reflectance in the range of a wavelength of 962 nm to a wavelength of 1275 nm ranges from 10.7% to 13.0%. With reference to the reflectance of 12.0% at the setting wavelength 980 nm, a continuous wavelength band in the range of −1.5% to +1.0%, i.e., 10.5% to 13.0% is 313 nm. A value obtained by dividing the wavelength band by the setting wavelength of 980 nm is about 0.319, and is larger than 0.065 in the hypothetical reflecting film. Therefore, it is understood that the seven-layer reflecting film 50 has a flat portion having a low reflectance over a wide wavelength band.

Eighty-fourth Embodiment

A semiconductor optical device having a seven-layer reflecting film including films of three types according to the eighty-fourth embodiment of the present invention will be described below with reference to FIG. 94. This semiconductor optical device is different from the semiconductor optical device according to the eighty-third embodiment in that a setting reflectance $R(\lambda_0)$ is 12.0% at a setting wavelength $\lambda_0$=853 nm. Parameters are given by A=1.13, B=2.10, and C=2.05. In addition, when phase shifts $\phi 1$ and $\phi 2$ of tantalum oxide and aluminum oxide are given by $\phi1=0.842465$ and $\phi2=1.02038$, a reflectance of 12.0% is obtained at a wavelength of 853 nm. In this case, the film thickness of the layers of the seven-layer reflecting film are given by $d_3/Ad_1/Ad_2/Bd_1/Bd_2/Cd_1/Cd_2=50$ nm/62.83 nm/96.63 nm/116.76 nm/179.57 nm/113.98 nm/175.30 nm. The total thickness $(d_{total}=\Sigma d_i)$ of the film is 795.07 nm. A sum $\Sigma n_i d_i$ of products $n_i d_i$ of refractive index $n_i$ and film thickness $d_i$ of a layer denoted with i in the seven films is 1438.90 nm which is very large, i.e., about 5.87 times a ¼ wavelength (=245 nm) of the predetermined wavelength of 980 nm. For this reason, a heat-radiation characteristic on the end face is improved, and the temperature of the end face can be suppressed from increasing.

Figure 94:
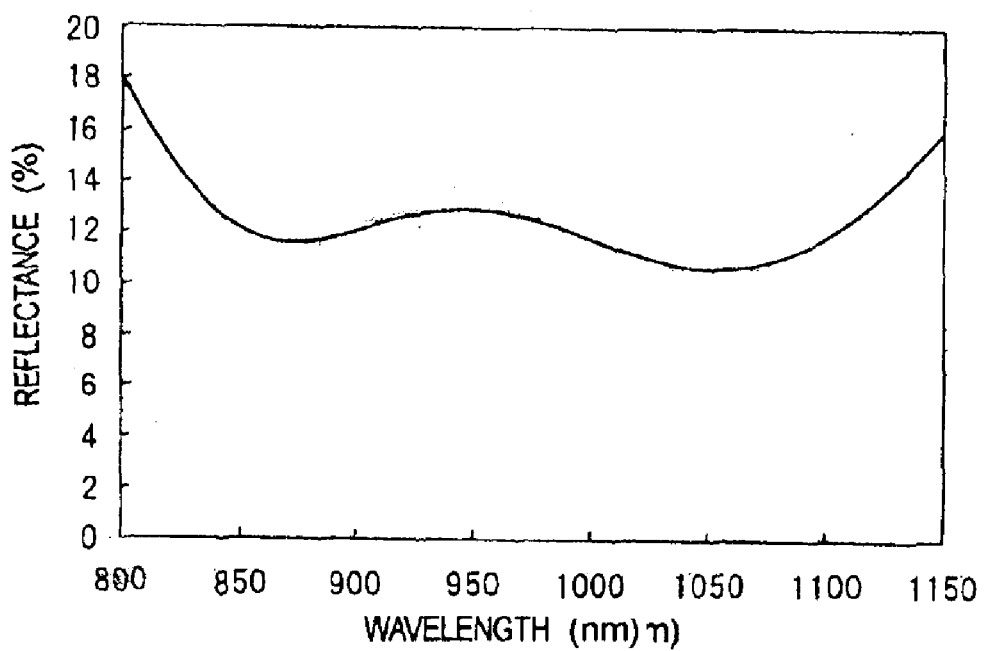
FIG. 94 is a graph of a wavelength dependence of a reflectance on a reflecting multi-layer film formed on an end face portion of a semiconductor optical device according to the eighty-fourth embodiment of the present invention.

FIG. 94 is a graph of a wavelength dependence of the reflectance of the seven-layer reflecting film 50 including the films of three types. The abscissa of the graph indicates a wavelength, and the ordinate denotes a reflectance. In the seven-layer reflecting film, a flat portion having about 12% of the setting reflectance over a wide wavelength band can be obtained. More specifically, the reflectance in the range of a wavelength of 838 nm to a wavelength of 1116 nm ranges from 10.6% to 13.0%. With reference to the reflectance of 12.0% at the setting wavelength 853 nm, a continuous wavelength band in the range of −1.5% to +1.0%, i.e., 10.5% to 13.0% is 278 nm. A value obtained by dividing the wavelength band by the setting wavelength of 853 nm is about 0.326, and is larger than 0.065 in the hypothetical reflecting film. Therefore, it is understood that the seven-layer reflecting film 50 has a flat portion having a low reflectance over a wide wavelength band.

The characteristics of the reflecting multi-layer films of the semiconductor optical device according to the seventy-first embodiment to the eighty-fourth embodiment are shown in Table 8. In Table 8, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\phi$ in which the reflectance falls within the range from −1.5 to +1.0% of $R(\lambda_0)$, and ratio of $\Delta\lambda/\lambda_0$ are shown.

TABLE 8

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation $\Sigma nidi$; Ratio of $\Sigma nidi$ to 1/4 wave-length (245 nm) of 980 nm | Band width $\Delta\lambda$ in which the reflectance falls within the range from −1.5 to 1.0 of $R(\lambda_0)$ | Ratio of $\Delta\lambda/\lambda_0$ |
|---|---|---|---|---|---|---|
| 71 | Seven films (three types) | 980 nm 6.0% | 5.4% | 1639.85 nm 6.69 times | 221 nm | 221/980 = 0.226 |
| 72 | Seven films (three types) | 889 nm 6.0% | 5.2% | 1479.24 nm 6.04 times | 204 nm | 204/889 = 0.229 |
| 73 | Seven films (three types) | 980 nm 7.0% | 6.4% | 1636.96 nm 6.68 times | 229 nm | 229/980 = 0.234 |
| 74 | Seven films (three types) | 886 nm 7.0% | 6.0% | 1471.83 nm 6.01 times | 211 nm | 211/886 = 0.238 |
| 75 | Seven films (three types) | 980 nm 8.0% | 7.5% | 1642.23 nm 6.70 times | 240 nm | 240/980 = 0.245 |
| 76 | Seven films (three types) | 881 nm 8.0% | 7.1% | 1467.89 nm 5.99 times | 221 nm | 221/881 = 0.251 |
| 77 | Seven films (three types) | 980 nm 9.0% | 8.4% | 1643.29 nm 6.71 times | 255 nm | 255/980 = 0.260 |
| 78 | Seven films (three types) | 874 nm 9.0% | 7.9% | 1456.86 nm 5.95 times | 233 nm | 233/874 = 0.267 |
| 79 | Seven films (three types) | 980 nm 10.0% | 9.6% | 1649.03 nm 6.73 times | 272 nm | 272/980 = 0.278 |
| 80 | Seven films (three types) | 868 nm 10.0% | 8.7% | 1451.38 nm 5.92 times | 246 nm | 246/868 = 0.283 |
| 81 | Seven films (three types) | 980 nm 11.0% | 10.4% | 1651.45 nm 6.74 times | 291 nm | 291/980 = 0.297 |
| 82 | Seven films (three types) | 862 nm 11.0% | 9.5% | 1446.13 nm 5.90 times | 260 nm | 260/862 = 0.320 |
| 83 | Seven films (three types) | 980 nm 12.0% | 10.7% | 1653.50 nm 6.75 times | 313 nm | 313/980 = 0.319 |
| 84 | Seven films (three types) | 853 nm 12.0% | 10.6% | 1438.90 nm 5.87 times | 278 nm | 278/853 = 0.326 |

Eighty-fifth Embodiment

A semiconductor optical device having a nine-layer reflecting film according to the eighty-fifth embodiment of the present invention will be described below with reference to FIG. 95. This semiconductor optical device is different from the semiconductor optical device according to the thirty-third embodiment in that a setting reflectance $R(\lambda_0)$ is 6.0% at a setting wavelength $\lambda_0=980$ nm. Parameters are given by O=0.10, A=2.7, B=2.1, C=2.0 and D=2.0. In addition, when phase shifts $\phi1$ and $\phi2$ of tantalum oxide and aluminum oxide are given by $\phi1=0.429458$ and $\phi2=0.889116$, a reflectance of 6.0% can be obtained at a wavelength of 980 nm. In this case, the film thickness of the layers of the nine-layer reflecting film are given by Od2/Ad1/Ad2/Bd1/Bd2/Cd1/Cd2/Dd1/Dd2=8.56 nm/87.92 nm/231.13 nm/68.38 nm/179.77 nm/65.13 nm/171.21 nm/65.13 nm/171.21 nm. The total thickness $(d_{total}=\Sigma d_i)$ of the film is 1048.44 nm. A sum $\Sigma n_i d_i$ of products $n_i d_i$ of refractive index $n_i$ and film thickness $d_i$ of a layer denoted with i in the nine films is 1823.70 nm which is very large, i.e., about 7.44 times a ¼ wavelength (=245 nm) of the predetermined wavelength of 980 nm. For this reason, a heat-radiation characteristic on the end face is improved, and the temperature of the end face can be suppressed from increasing.

Figure 95:
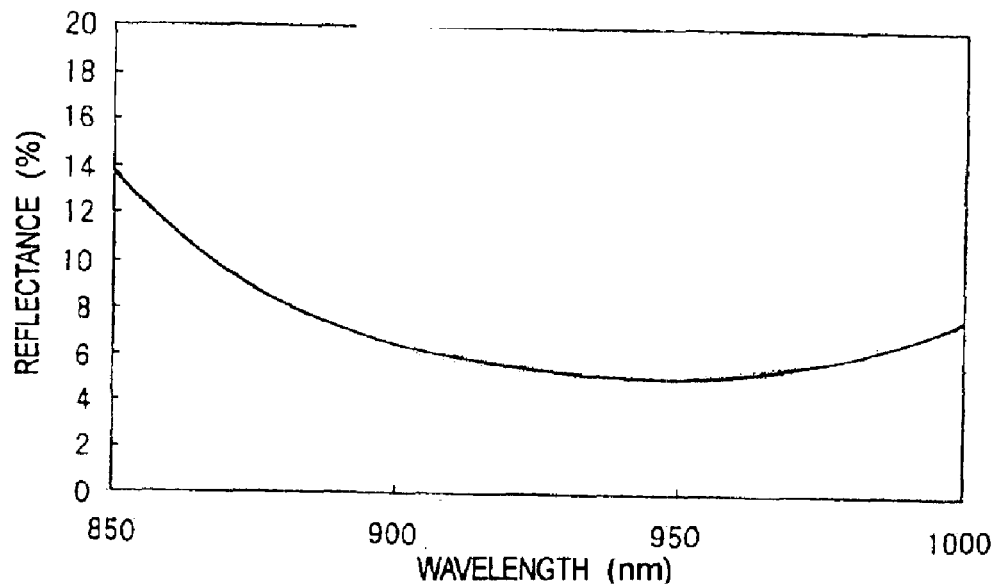
FIG. 95 is a graph of a wavelength dependence of a reflectance on a reflecting multi-layer film formed on an end face portion of a semiconductor optical device according to the eighty-fifth embodiment of the present invention.

FIG. 95 is a graph of a wavelength dependence of the reflectance of the nine-layer reflecting film 60. The abscissa of the graph indicates a wavelength, and the ordinate denotes a reflectance. In the nine-layer reflecting film, a flat portion having about 6% of the setting reflectance over a wide wavelength band can be obtained. More specifically, the reflectance in the range of a wavelength of 893 nm to a wavelength of 993 nm ranges from 5.1% to 7.0%. With reference to the reflectance of 6.0% at the setting wavelength 980 nm, a continuous wavelength band in the range of −1.5% to +1.0%, i.e., 4.5% to 7.0% is 100 nm. A value obtained by dividing the wavelength band by the setting wavelength of 980 nm is about 0.102, and is larger than 0.065 in the hypothetical reflecting film. Therefore, it is understood that the nine-layer reflecting film 60 has a flat portion having a low reflectance over a wide wavelength band.

Eighty-sixth Embodiment

A semiconductor optical device having a nine-layer reflecting film according to the eighty-sixth embodiment of the present invention will be described below with reference to FIG. 96. This semiconductor optical device is different from the semiconductor optical device according to the eighty-fifth embodiment in that a setting reflectance $R(\lambda_0)$ is 6.0% at a setting wavelength $\lambda_0$=1018 nm. In addition, when phase shifts $\phi 1$ and $\phi 2$ of tantalum oxide and aluminum oxide are given by $\phi 1$=0.429458 and $\phi 2$=0.889116, a reflectance of 6.0% can be obtained at a wavelength of 1018 nm. In this case, the film thickness of the layers of the nine-layer reflecting film are given by Od2/Ad1/Ad2/Bd1/Bd2/Cd1/Cd2/Dd1/Dd2=8.89 nm/91.33 nm/240.09 nm/71.04 nm/186.74 nm/67.65 nm/177.85 nm/67.65 nm/177.85 nm. The total thickness ($d_{total}=\Sigma d_i$) of the film is 1089.09 nm. A sum $\Sigma n_i d_i$ of products $n_i d_i$ of refractive index $n_i$ and film thickness $d_i$ of a layer denoted with i in the nine films is 1857.42 nm which is very large, i.e., about 7.73 times a ¼ wavelength (=245 nm) of the predetermined wavelength of 980 nm. For this reason, a heat-radiation characteristic on the end face is improved, and the temperature of the end face can be suppressed from increasing.

Figure 96:
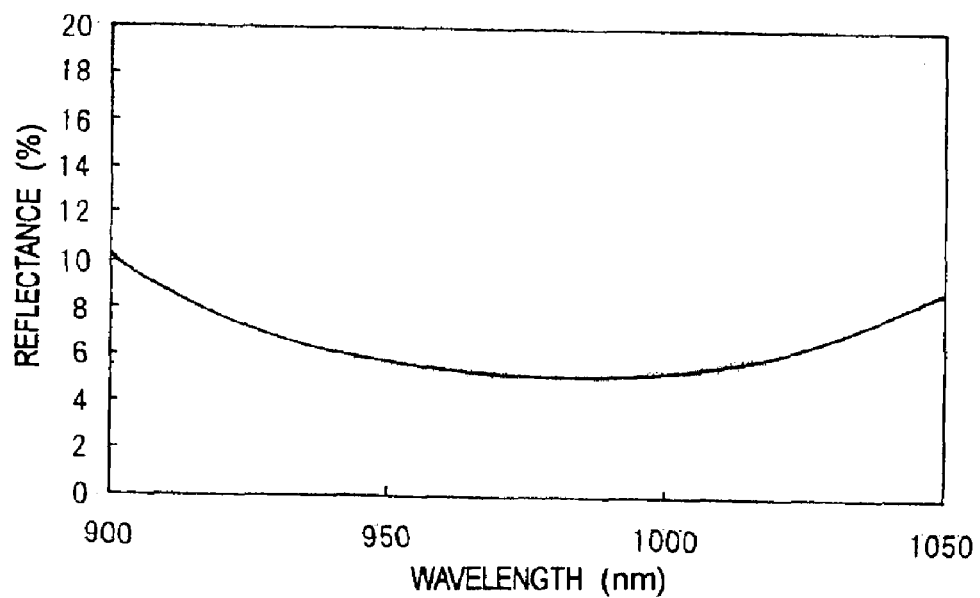
FIG. 96 is a graph of a wavelength dependence of a reflectance on a reflecting multi-layer film formed on an end face portion of a semiconductor optical device according to the eighty-sixth embodiment of the present invention.

FIG. 96 is a graph of a wavelength dependence of the reflectance of the nine-layer reflecting film 60. The abscissa of the graph indicates a wavelength, and the ordinate denotes a reflectance. In the nine-layer reflecting film, a flat portion having about 6% of the setting reflectance over a wide wavelength band can be obtained. More specifically, the reflectance in the range of a wavelength of 928 nm to a wavelength of 1031 nm ranges from 5.1% to 7.0%. With reference to the reflectance of 6.0% at the setting wavelength 1018 nm, a continuous wavelength band in the range of −1.5% to +1.0%, i.e., 4.5% to 7.0% is 103 nm. A value obtained by dividing the wavelength band by the setting wavelength of 1018 nm is about 0.101, and is larger than 0.065 in the hypothetical reflecting film. Therefore, it is understood that the nine-layer reflecting film 60 has a flat portion having a low reflectance over a wide wavelength band.

Eighty-seventh Embodiment

A semiconductor optical device having a nine-layer reflecting film according to the eighty-seventh embodiment of the present invention will be described below with reference to FIG. 97. This semiconductor optical device is different from the semiconductor optical device according to the thirty-third embodiment in that a setting reflectance $R(\lambda_0)$ is 7.0% at a setting wavelength $\lambda_0$=980 nm. Parameters are given by O=0.10, A=2.7, B=2.15, C=1.9 and D=1.9. In addition, when phase shifts $\phi 1$ and $\phi 2$ of tantalum oxide and aluminum oxide are given by $\phi 1$=0.413831 and $\phi 2$=0.91752, a reflectance of 7.0% can be obtained at a wavelength of 980 nm. In this case, the film thickness of the layers of the nine-layer reflecting film are given by Od2/Ad1/Ad2/Bd1/Bd2/Cd1/Cd2/Dd1/Dd2=8.83 nm/84.72 nm/238.51 nm/65.90 nm/185.51 nm/59.62 nm/167.84 nm/59.62 nm/167.84 nm. The total thickness ($d_{total}=\Sigma d_i$) of the film is 1038.39 nm. A sum $\Sigma n_i d_i$ of products $n_i d_i$ of refractive index $n_i$ and film thickness $d_i$ of a layer denoted with i in the nine films is 1800.12 nm which is very large, i.e., about 7.35 times a ¼ wavelength (=245 nm) of the predetermined wavelength of 980 nm. For this reason, a heat-radiation characteristic on the end face is improved, and the temperature of the end face can be suppressed from increasing.

Figure 97:
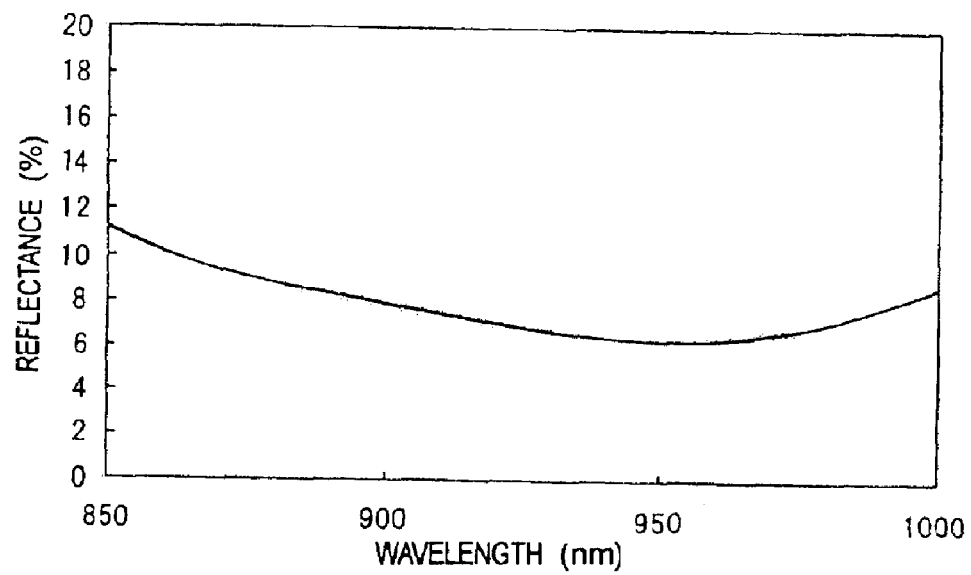
FIG. 97 is a graph of a wavelength dependence of a reflectance on a reflecting multi-layer film formed on an end face portion of a semiconductor optical device according to the eighty-seventh embodiment of the present invention.

FIG. 97 is a graph of a wavelength dependence of the reflectance of the nine-layer reflecting film 60. The abscissa of the graph indicates a wavelength, and the ordinate denotes a reflectance. In the nine-layer reflecting film, a flat portion having about 7% of the setting reflectance over a wide wavelength band can be obtained. More specifically, the reflectance in the range of a wavelength of 898 nm to a wavelength of 993 nm ranges from 6.3% to 8.0%. With reference to the reflectance of 7.0% at the setting wavelength 980 nm, a continuous wavelength band in the range of −1.5% to +1.0%, i.e., 5.5% to 8.0% is 95 nm. A value obtained by dividing the wavelength band by the setting wavelength of 980 nm is about 0.097, and is larger than 0.065 in the hypothetical reflecting film. Therefore, it is understood that the nine-layer reflecting film 60 has a flat portion having a low reflectance over a wide wavelength band.

Eighty-eighth Embodiment

A semiconductor optical device having a nine-layer reflecting film according to the eighty-eighth embodiment of the present invention will be described below with reference to FIG. 98. This semiconductor optical device is different from the semiconductor optical device according to the eighty-seventh embodiment in that a setting reflectance $R(\lambda_0)$ is 7.0% at a setting wavelength $\lambda_0$=1016 nm. In addition, when phase shifts $\phi_1$ and $\phi_2$ of tantalum oxide and aluminum oxide are given by $\phi_1$=0.413831 and $\phi_2$=0.91752, a reflectance of 7.0% can be obtained at a wavelength of 1016 nm. In this case, the film thickness of the layers of the nine-layer reflecting film are given by Od$_2$/Ad$_1$/Ad$_2$/Bd$_1$/Bd$_2$/Cd$_1$/Cd$_2$/Dd$_1$I/Dd$_2$=9.16 nm/87.83 nm/247.27 nm/68.32 nm/192.32 nm/61.81 nm/174.01 nm/61.81 nm/174.01 nm. The total thickness ($d_{total}=\Sigma d_i$) of the film is 1076.54 nm. A sum $\Sigma n_i d_i$ of products $n_i d_i$ of refractive index $n_i$ and film thickness $d_i$ of a layer denoted with i in the nine films is 1866.25 nm which is very large, i.e., about 7.62 times a ¼ wavelength (=245 nm) of the predetermined wavelength of 980 nm. For this reason, a heat-radiation characteristic on the end face is improved, and the temperature of the end face can be suppressed from increasing.

Figure 98:
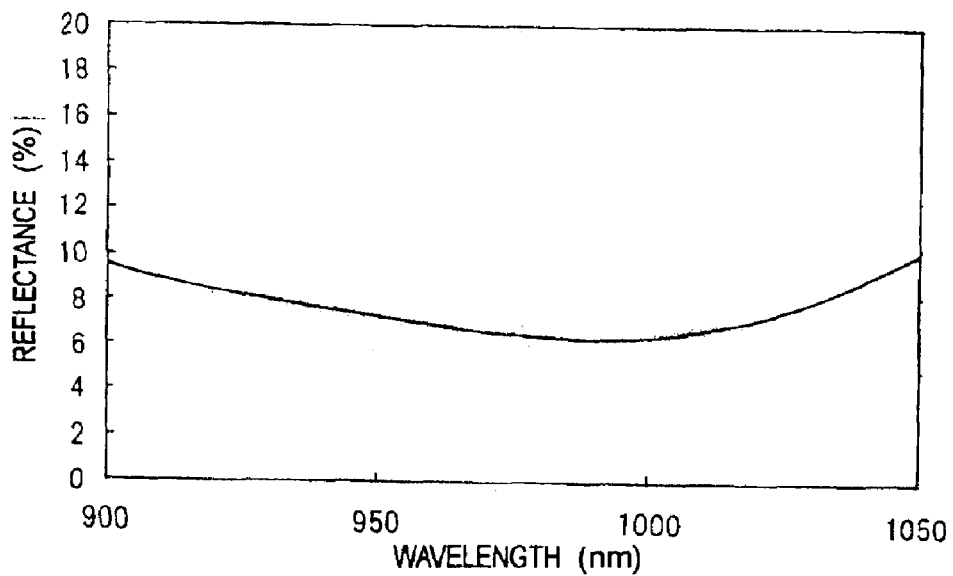
FIG. 98 is a graph of a wavelength dependence of a reflectance on a reflecting multi-layer film formed on an end face portion of a semiconductor optical device according to the eighty-eighth embodiment of the present invention.

FIG. 98 is a graph of a wavelength dependence of the reflectance of the nine-layer reflecting film 60. The abscissa of the graph indicates a wavelength, and the ordinate denotes a reflectance. In the nine-layer reflecting film, a flat portion having about 7% of the setting reflectance over a wide wavelength band can be obtained. More specifically, the reflectance in the range of a wavelength of 931 nm to a wavelength of 1029 nm ranges from 6.3% to 8.0%. With reference to the reflectance of 7.0% at the setting wavelength 1016 nm, a continuous wavelength band in the range of −1.5% to +1.0%, i.e., 5.5% to 8.0% is 98 nm. A value obtained by dividing the wavelength band by the setting wavelength of 1016 nm is about 0.096, and is larger than 0.065 in the hypothetical reflecting film. Therefore, it is understood that the nine-layer reflecting film 60 has a flat portion having a low reflectance over a wide wavelength band.

Eighty-ninth Embodiment

A semiconductor optical device having a nine-layer reflecting film according to the eighty-ninth embodiment of the present invention will be described below with reference to FIG. 99. This semiconductor optical device is different from the semiconductor optical device according to the thirty-third embodiment in that a setting reflectance $R(>\lambda_0)$ is 8.0% at a setting wavelength $\lambda_0 = 980$ nm. Parameters are given by O=0.10, A=2.70, B=2.10, C=2.05 and D=1.80. In addition, when phase shifts $\phi 1$ and $\phi 2$ of tantalum oxide and aluminum oxide are given by $\phi 1 = 0.395103$ and $\phi 2 = 0.933593$, a reflectance of 8.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2 = 8.99$ nm/80.89 nm/242.69 nm/62.91 nm/188.76 nm/61.42 nm/184.27 nm/53.93 nm/161.79 nm. The total thickness $(d_{total} = \Sigma d_i)$ of the film is 1045.65 nm. A sum $\Sigma n_i d_i$ of products $n_i d_i$ of refractive index $n_i$ and film thickness $d_i$ of a layer denoted with i in the nine films is 1807.20 nm which is very large, i.e., about 7.38 times a ¼ wavelength (=245 nm) of the predetermined wavelength of 980 nm. For this reason, a heat-radiation characteristic on the end face is improved, and the temperature of the end face can be suppressed from increasing.

Figure 99:
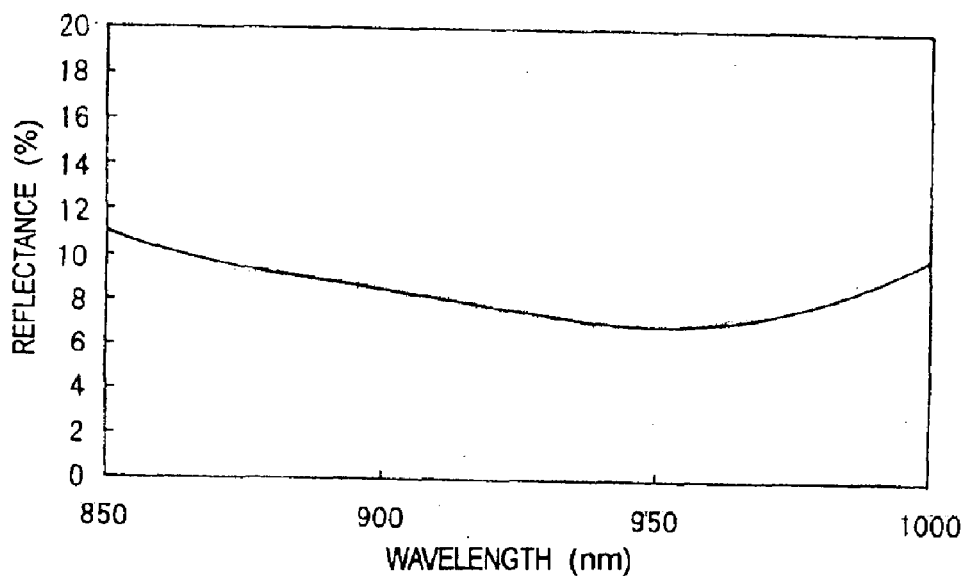
FIG. 99 is a graph of a wavelength dependence of a reflectance on a reflecting multi-layer film formed on an end face portion of a semiconductor optical device according to the eighty-ninth embodiment of the present invention.

FIG. 99 is a graph of a wavelength dependence of the reflectance of the nine-layer reflecting film 60. The abscissa of the graph indicates a wavelength, and the ordinate denotes a reflectance. In the nine-layer reflecting film, a flat portion having about 8% of the setting reflectance over a wide wavelength band can be obtained. More specifically, the reflectance in the range of a wavelength of 886 nm to a wavelength of 991 nm ranges from 7.0% to 9.0%. With reference to the reflectance of 8.0% at the setting wavelength 980 nm, a continuous wavelength band in the range of −1.5% to +1.0%, i.e., 6.5% to 9.0% is 105 nm. A value obtained by dividing the wavelength band by the setting wavelength of 980 nm is about 0.107, and is larger than 0.065 in the hypothetical reflecting film. Therefore, it is understood that the nine-layer reflecting film 60 has a flat portion having a low reflectance over a wide wavelength band.

Ninetieth Embodiment

A semiconductor optical device having a nine-layer reflecting film according to the ninetieth embodiment of the present invention will be described below with reference to FIG. 100. This semiconductor optical device is different from the semiconductor optical device according to the eighty-ninth embodiment in that a setting reflectance $R(\lambda_0)$ is 8.0% at a setting wavelength $\lambda_0 = 1023$ nm. In addition, when phase shifts $\phi 1$ and $\phi 2$ of tantalum oxide and aluminum oxide are given by $\phi 1 = 0.395103$ and $\phi 2 = 0.933593$, a reflectance of 8.0% can be obtained at a wavelength of 1023 nm. In this case, the film thickness of the layers of the nine-layer reflecting film are given by $Od_2/Ad_1/Ad_2/Bd_1/Bd_2/Cd_1/Cd_2/Dd_1/Dd_2 = 9.38$ nm/84.44 nm/253.34 nm/65.67 nm/197.04 nm/64.11 nm/192.35 nm/56.29 nm/168.89 nm. The total thickness $(d_{total} = \Sigma d_i)$ of the film is 1091.51 nm. A sum $\Sigma n_i d_i$ of products $n_i d_i$ of refractive index $n_i$ and film thickness $d_i$ of a layer denoted with i in the nine films is 1886.46 nm which is very large, i.e., about 7.70 times a ¼ wavelength (=245 nm) of the predetermined wavelength of 980 nm. For this reason, a heat-radiation characteristic on the end face is improved, and the temperature of the end face can be suppressed from increasing.

Figure 100:
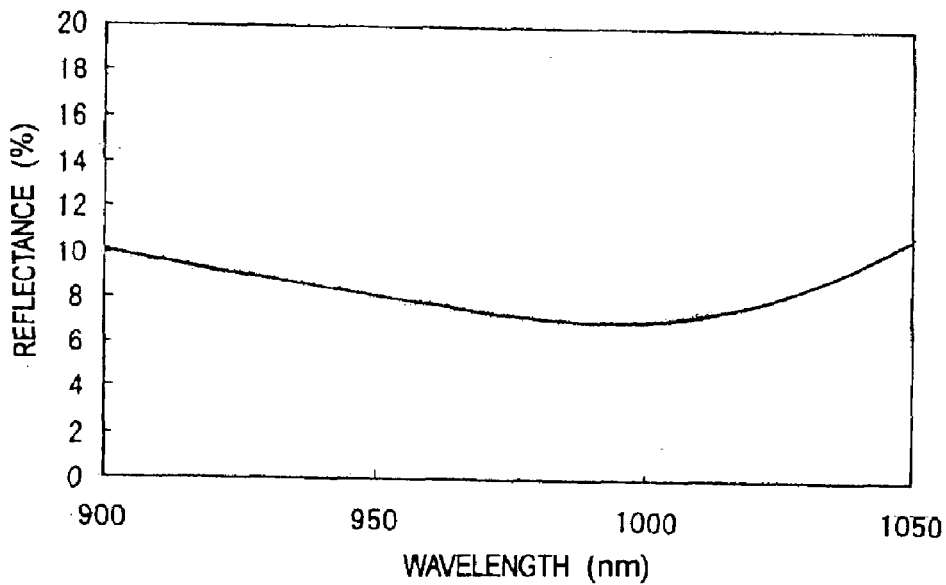
FIG. 100 is a graph of a wavelength dependence of a reflectance on a reflecting multi-layer film formed on an end face portion of a semiconductor optical device according to the ninetieth embodiment of the present invention.

FIG. 100 is a graph of a wavelength dependence of the reflectance of the nine-layer reflecting film 60. The abscissa of the graph indicates a wavelength, and the ordinate denotes a reflectance. In the nine-layer reflecting film, a flat portion having about 8% of the setting reflectance over a wide wavelength band can be obtained. More specifically, the reflectance in the range of a wavelength of 925 nm to a wavelength of 1034 nm ranges from 7.0% to 9.0%. With reference to the reflectance of 8.0% at the setting wavelength 1023 nm, a continuous wavelength band in the range of −1.5% to +1.0%, i.e., 6.5% to 9.0% is 109 nm. A value obtained by dividing the wavelength band by the setting wavelength of 1023 nm is about 0.107, and is larger than 0.065 in the hypothetical reflecting film. Therefore, it is understood that the nine-layer reflecting film 60 has a flat portion having a low reflectance over a wide wavelength band.

Ninety-first Embodiment

A semiconductor optical device having a nine-layer reflecting film according to the ninety-first embodiment of the present invention will be described below with reference to FIG. 101. This semiconductor optical device is different from the semiconductor optical device according to the thirty-third embodiment in that a setting reflectance $R(\lambda_0)$ is 9.0% at a setting wavelength $\lambda_0 = 980$ nm. Parameters are given by O=0.10, A=2.70, B=2.10, C=2.15 and D=1.75. In addition, when phase shifts $\phi 1$ and $\phi 2$ of tantalum oxide and aluminum oxide are given by $\phi 1 = 0.392646$ and $\phi 2 = 0.930741$, a reflectance of 9.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2 = 8.96$ nm/80.39 nm/241.95 nm/62.52 nm/188.16 nm/64.01 nm/192.66 nm/52.10 nm/156.82 nm. The total thickness $(d_{total} = \Sigma d_i)$ of the film is 1047.59 nm. A sum $\Sigma n_i d_i$ of products $n_i d_i$ of refractive index $n_i$ and film thickness $d_i$ of a layer denoted with i in the nine films is 1810.29 nm which is very large, i.e., about 7.39 times a ¼ wavelength (=245 nm) of the predetermined wavelength of 980 nm. For this reason, a heat-radiation characteristic on the end face is improved, and the temperature of the end face can be suppressed from increasing.

Figure 101:
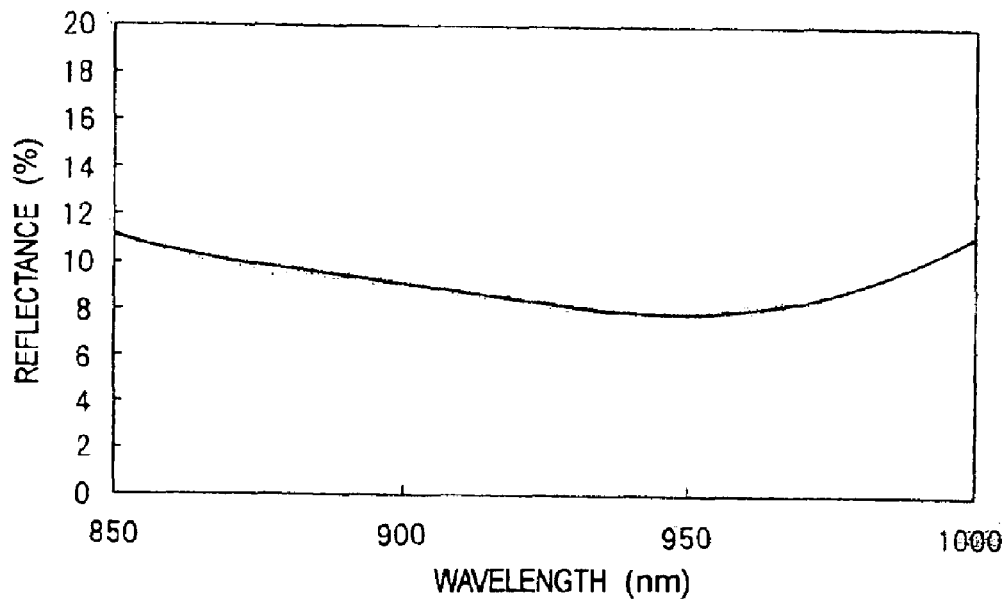
FIG. 101 is a graph of a wavelength dependence of a reflectance on a reflecting multi-layer film formed on an end face portion of a semiconductor optical device according to the ninety-first embodiment of the present invention.

FIG. 101 is a graph of a wavelength dependence of the reflectance of the nine-layer reflecting film 60. The abscissa of the graph indicates a wavelength, and the ordinate denotes a reflectance. In the nine-layer reflecting film, a flat portion having about 9% of the setting reflectance over a wide wavelength band can be obtained. More specifically, the reflectance in the range of a wavelength of 872 nm to a wavelength of 990 nm ranges from 7.8% to 10.0%. With reference to the reflectance of 9.0% at the setting wavelength 980 nm, a continuous wavelength band in the range of −1.5% to +1.0%, i.e., 7.5% to 10.0% is 118 nm. A value obtained by dividing the wavelength band by the setting wavelength of 980 nm is about 0.120, and is larger than 0.065 in the hypothetical reflecting film. Therefore, it is understood that the nine-layer reflecting film 60 has a flat portion having a low reflectance over a wide wavelength band.

Ninety-second Embodiment

A semiconductor optical device having a nine-layer reflecting film according to the ninety-second embodiment of the present invention will be described below with reference to FIG. 102. This semiconductor optical device is different from the semiconductor optical device according to the ninety-first embodiment in that a setting reflectance $R(\lambda_0)$ is 9.0% at a setting wavelength $\lambda_0=1031$ nm. In addition, when phase shifts $\phi1$ and $\phi2$ of tantalum oxide and aluminum oxide are given by $\phi1=0.392646$ and $\phi2=0.930741$, a reflectance of 9.0% can be obtained at a wavelength of 1031 nm. In this case, the film thickness of the layers of the nine-layer reflecting film are given by $Od_2/Ad_1/Ad_2/Bd_1/Bd_2/Cd_1/Cd_2/Dd_1/Dd_2=9.43$ nm/84.57 nm/254.54 nm/65.78 nm/197.98 nm/67.34 nm/202.69 nm/54.81 nm/164.98 nm. The total thickness ($d_{total}=\Sigma d_i$) of the film is 1102.12 nm. A sum $\Sigma n_i d_i$ of products $n_i d_i$ of refractive index $n_i$ and film thickness $d_i$ of a layer denoted with i in the nine films is 1904.52 nm which is very large, i.e., about 7.77 times a ¼ wavelength (=245 nm) of the predetermined wavelength of 980 nm. For this reason, a heat-radiation characteristic on the end face is improved, and the temperature of the end face can be suppressed from increasing.

Figure 102:
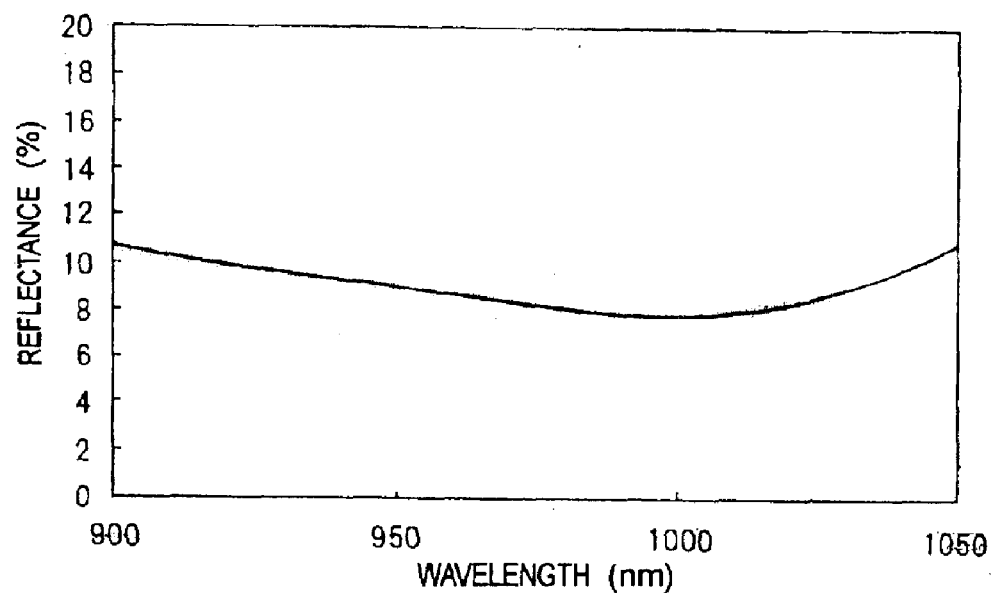
FIG. 102 is a graph of a wavelength dependence of a reflectance on a reflecting multi-layer film formed on an end face portion of a semiconductor optical device according to the ninety-second embodiment of the present invention.

FIG. 102 is a graph of a wavelength dependence of the reflectance of the nine-layer reflecting film 60. The abscissa of the graph indicates a wavelength, and the ordinate denotes a reflectance. In the nine-layer reflecting film, a flat portion having about 9% of the setting reflectance over a wide wavelength band can be obtained. More specifically, the reflectance in the range of a wavelength of 918 nm to a wavelength of 1041 nm ranges from 7.8% to 10.0%. With reference to the reflectance of 9.0% at the setting wavelength 1031 nm, a continuous wavelength band in the range of −1.5% to +1.0%, i.e., 7.5% to 10.0% is 123 nm. A value obtained by dividing the wavelength band by the setting wavelength of 1031 nm is about 0.119, and is larger than 0.065 in the hypothetical reflecting film. Therefore, it is understood that the nine-layer reflecting film 60 has a flat portion having a low reflectance over a wide wavelength band.

Ninety-third Embodiment

A semiconductor optical device having a nine-layer reflecting film according to the ninety-third embodiment of the present invention will be described below with reference to FIG. 103. This semiconductor optical device is different from the semiconductor optical device according to the thirty-third embodiment in that a setting reflectance $R(\lambda_0)$ is 10.0% at a setting wavelength $\lambda_0=980$ nm. Parameters are given by O=0.10, A=2.75, B=2.10, C=2.25 and D=1.75. In addition, when phase shifts $\phi1$ and $\phi2$ of tantalum oxide and aluminum oxide are given by $\phi1=0.394052$ and $\phi2=0.907302$, a reflectance of 10.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2=8.74$ nm/82.17 nm/240.22 nm/62.75 nm/183.44 nm/67.33 nm/196.55 nm/52.29 nm/152.87 nm. The total thickness ($d_{total}=\Sigma d_i$) of the film is 1046.36 nm. A sum $\Sigma n_i d_i$ of products $n_i d_i$ of refractive index $n_i$ and film thickness $d_i$ of a layer denoted with i in the nine films is 1810.50 nm which is very large, i.e., about 7.39 times a ¼ wavelength (=245 nm) of the predetermined wavelength of 980 nm. For this reason, a heat-radiation characteristic on the end face is improved, and the temperature of the end face can be suppressed from increasing.

Figure 103:
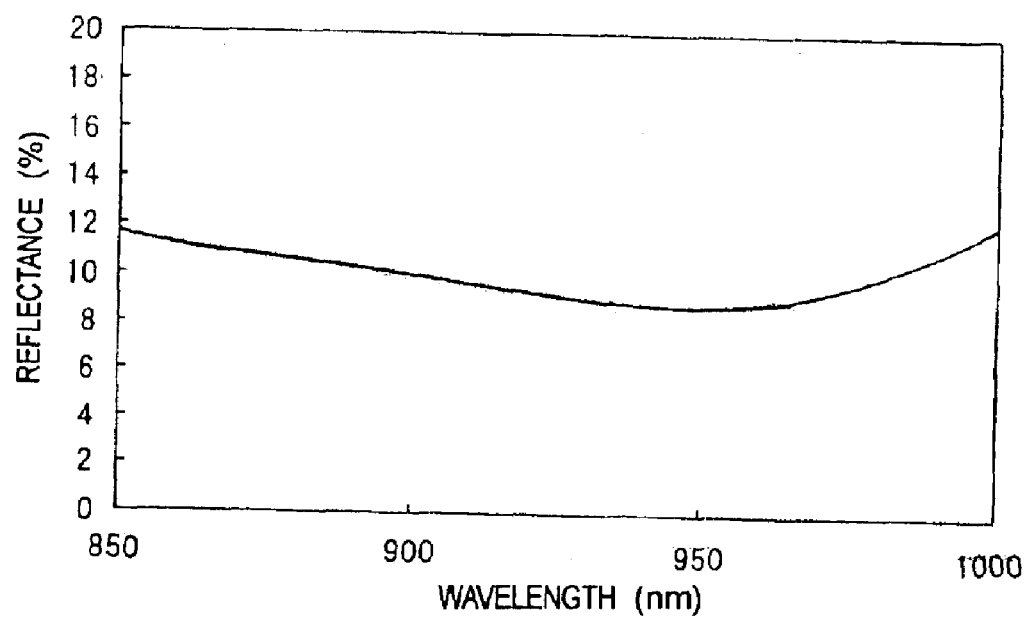
FIG. 103 is a graph of a wavelength dependence of a reflectance on a reflecting multi-layer film formed on an end face portion of a semiconductor optical device according to the ninety-third embodiment of the present invention.

FIG. 103 is a graph of a wavelength dependence of the reflectance of the nine-layer reflecting film 60. The abscissa of the graph indicates a wavelength, and the ordinate denotes a reflectance. In the nine-layer reflecting film, a flat portion having about 10% of the setting reflectance over a wide wavelength band can be obtained. More specifically, the reflectance in the range of a wavelength of 866 nm to a wavelength of 990 nm ranges from 8.7% to 11.0%. With reference to the reflectance of 10.0% at the setting wavelength 980 nm, a continuous wavelength band in the range of −1.5% to +1.0%, i.e., 8.5% to 11.0% is 124 nm. A value obtained by dividing the wavelength band by the setting wavelength of 980 nm is about 0.127, and is larger than 0.065 in the hypothetical reflecting film. Therefore, it is understood that the nine-layer reflecting film 60 has a flat portion having a low reflectance over a wide wavelength band.

Ninety-fourth Embodiment

A semiconductor optical device having a nine-layer reflecting film according to the ninety-fourth embodiment of the present invention will be described below with reference to FIG. 104. This semiconductor optical device is different from the semiconductor optical device according to the ninety-third embodiment in that a setting reflectance $R(\lambda_0)$ is 10.0% at a setting wavelength $\lambda_0=1035$ nm. In addition, when phase shifts $\phi1$ and $\phi2$ of tantalum oxide and aluminum oxide are given by $\phi1=0.394052$ and $\phi2=0.907302$, a reflectance of 10.0% can be obtained at a wavelength of 1035 nm. In this case, the film thickness of the layers of the nine-layer reflecting film are given by $Od_2/Ad_1/Ad_2/Bd_1/Bd_2/Cd_1/Cd_2/Dd_1/Dd_2=9.23$ nm/86.78 nm/253.71 nm/66.27 nm/193.74 nm/71.00 nm/207.58 nm/55.22 nm/161.45 nm. The total thickness ($d_{total}=\Sigma d_i$) of the film is 1104.98 nm. A sum $\Sigma n_i d_i$ of products $n_i d_i$ of refractive index $n_i$ and film thickness $d_i$ of a layer denoted with i in the nine films is 1912.11 nm which is very large, i.e., about 7.80 times a ¼ wavelength (=245 nm) of the predetermined wavelength of 980 nm. For this reason, a heat-radiation characteristic on the end face is improved, and the temperature of the end face can be suppressed from increasing.

Figure 104:
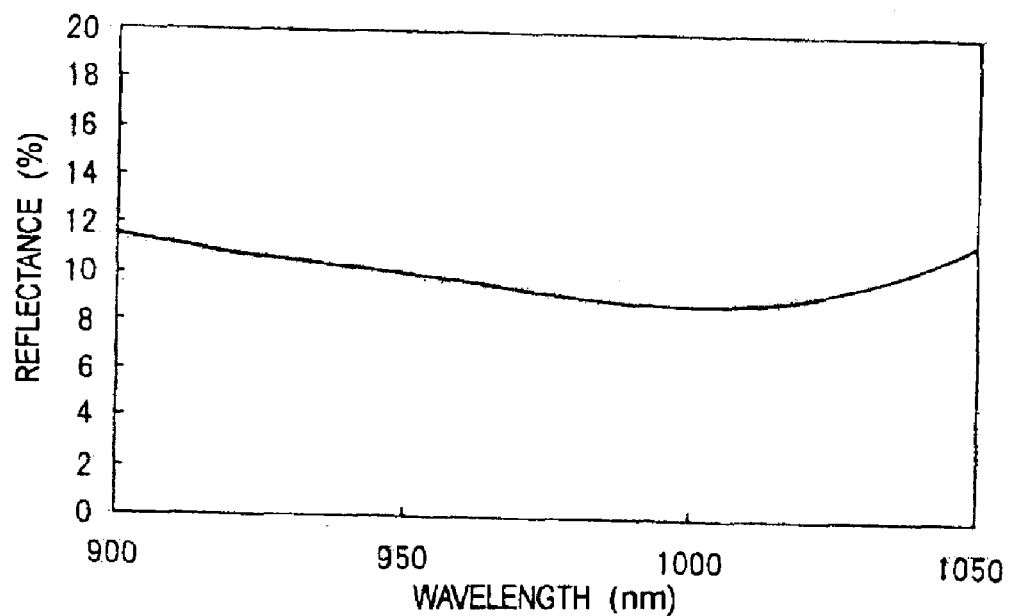
FIG. 104 is a graph of a wavelength dependence of a reflectance on a reflecting multi-layer film formed on an end face portion of a semiconductor optical device according to the ninety-fourth embodiment of the present invention.

FIG. 104 is a graph of a wavelength dependence of the reflectance of the nine-layer reflecting film 60. The abscissa of the graph indicates a wavelength, and the ordinate denotes a reflectance. In the nine-layer reflecting film, a flat portion having about 10% of the setting reflectance over a wide wavelength band can be obtained. More specifically, the reflectance in the range of a wavelength of 914 nm to a wavelength of 1045 nm ranges from 8.7% to 11.0%. With reference to the reflectance of 10.0% at the setting wavelength 1035 nm, a continuous wavelength band in the range of −1.5% to +1.0%, i.e., 8.5% to 11.0% is 131 nm. A value obtained by dividing the wavelength band by the setting wavelength of 1035 nm is about 0.127, and is larger than 0.065 in the hypothetical reflecting film. Therefore, it is understood that the nine-layer reflecting film 60 has a flat portion having a low reflectance over a wide wavelength band.

Ninety-fifth Embodiment

A semiconductor optical device having a nine-layer reflecting film according to the ninety-fifth embodiment of the present invention will be described below with reference to FIG. 105. This semiconductor optical device is different from the semiconductor optical device according to the thirty-third embodiment in that a setting reflectance $R(\lambda_0)$ is 11.0% at a setting wavelength $\lambda_0=980$ nm. Parameters are given by O=0.10, A=2.80, B=2.10, C=2.35 and D=1.75. In addition, when phase shifts $\phi1$ and $\phi2$ of tantalum oxide and aluminum oxide are given by $\phi1=0.395641$ and $\phi2=0.88414$, a reflectance of 11.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2=8.51$ nm/84.00 nm/238.35 nm/63.00 nm/178.76 nm/70.50 nm/200.04 nm/52.50 nm/148.97 nm.

The total thickness ($d_{total} = \Sigma d_i$) of the film is 1044.63 nm. A sum $\Sigma n_i d_i$ of products $n_i d_i$ of refractive index $n_i$ and film thickness $d_i$ of a layer denoted with i in the nine films is 1810.29 nm which is very large, i.e., about 7.39 times a ¼ wavelength (=245 nm) of the predetermined wavelength of 980 nm. For this reason, a heat-radiation characteristic on the end face is improved, and the temperature of the end face can be suppressed from increasing.

Figure 105:
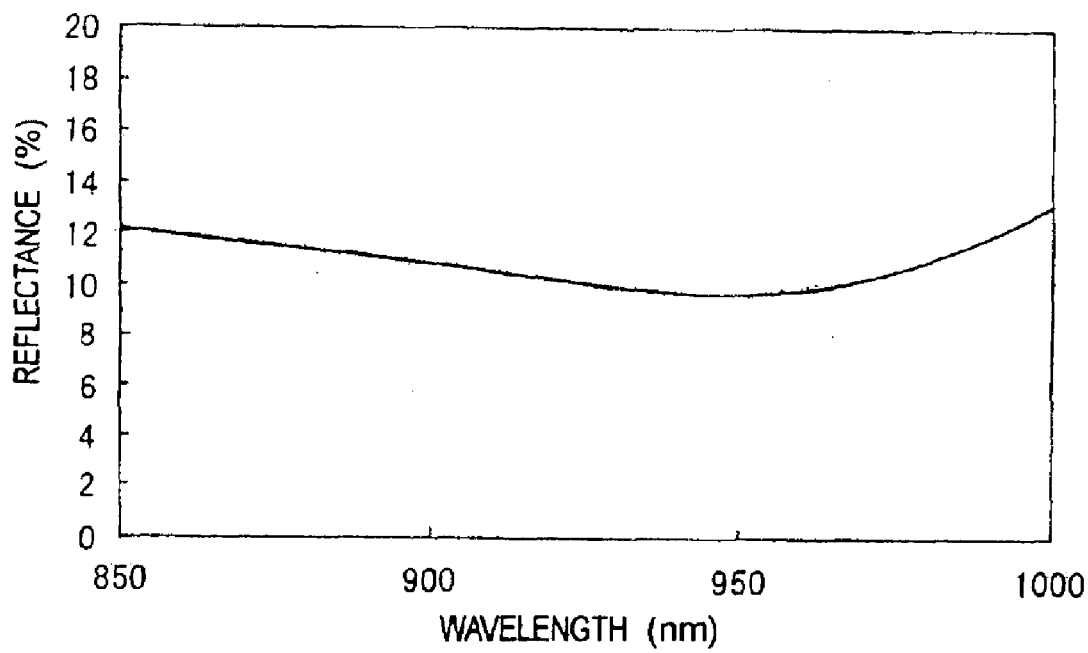
FIG. 105 is a graph of a wavelength dependence of a reflectance on a reflecting multi-layer film formed on an end face portion of a semiconductor optical device according to the ninety-fifth embodiment of the present invention.

FIG. 105 is a graph of a wavelength dependence of the reflectance of the nine-layer reflecting film 60. The abscissa of the graph indicates a wavelength, and the ordinate denotes a reflectance. In the nine-layer reflecting film, a flat portion having about 11% of the setting reflectance over a wide wavelength band can be obtained. More specifically, the reflectance in the range of a wavelength of 856 nm to a wavelength of 990 nm ranges from 9.7% to 12.0%. With reference to the reflectance of 11.0% at the setting wavelength 980 nm, a continuous wavelength band in the range of −1.5% to +1.0%, i.e., 9.5% to 12.0% is 134 nm. A value obtained by dividing the wavelength band by the setting wavelength of 980 nm is about 0.137, and is larger than 0.065 in the hypothetical reflecting film. Therefore, it is understood that the nine-layer reflecting film 60 has a flat portion having a low reflectance over a wide wavelength band.

Ninety-sixth Embodiment

A semiconductor optical device having a nine-layer reflecting film according to the nineth-sixth embodiment of the present invention will be described below with reference to FIG. 106. This semiconductor optical device is different from the semiconductor optical device according to the ninety-fifth embodiment in that a setting reflectance $R(\lambda_0)$ is 11.0% at a setting wavelength $\lambda_0=1040$ nm. In addition, when phase shifts $\phi 1$ and $\phi 2$ of tantalum oxide and aluminum oxide are given by $\phi 1 = 0.395641$ and $\phi 2 = 0.88414$, a reflectance of 11.0% can be obtained at a wavelength of 1040 nm. In this case, the film thickness of the layers of the nine-layer reflecting film are given by $Od_2/Ad_1/Ad_2/Bd_1/Bd_2/Cd_1/Cd_2/Dd_1/Dd_2=9.03$ nm/89.14 nm/252.94 nm/66.86 nm/189.71 nm/74.81 nm/212.29 nm/55.71 nm/158.09 nm. The total thickness ($d_{total} = \Sigma d_i$) of the film is 1108.58 nm. A sum $\Sigma n_i d_i$ of products $n_i d_i$ of refractive index $n_i$ and film thickness $d_i$ of a layer denoted with i in the nine films is 1921.11 nm which is very large, i.e., about 7.84 times a ¼ wavelength (=245 nm) of the predetermined wavelength of 980 nm. For this reason, a heat-radiation characteristic on the end face is improved, and the temperature of the end face can be suppressed from increasing.

Figure 106:
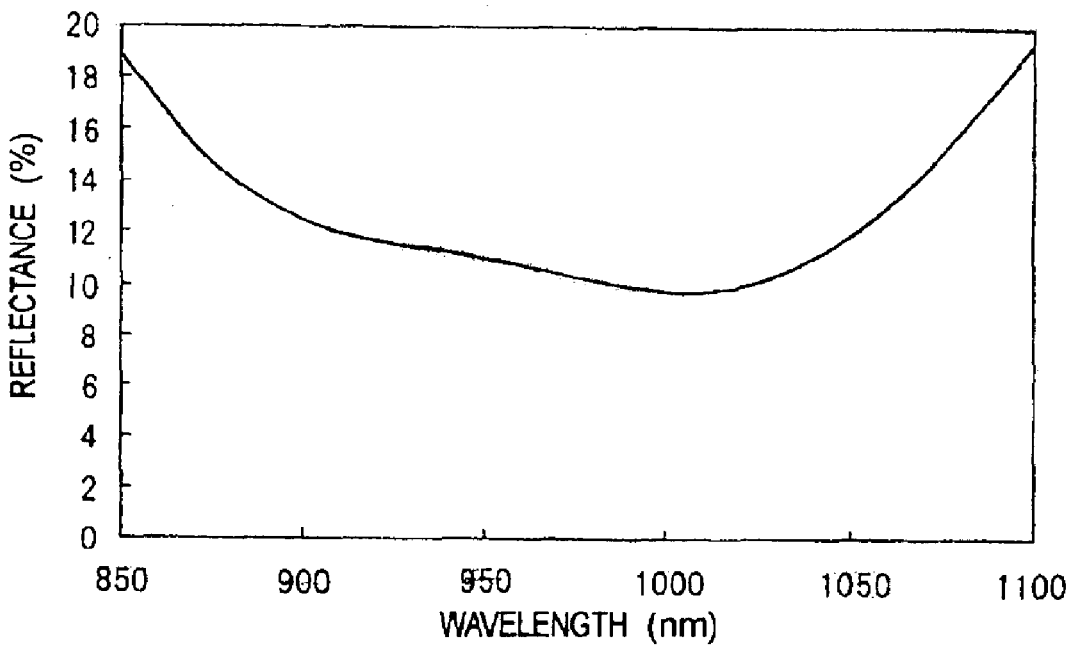
FIG. 106 is a graph of a wavelength dependence of a reflectance on a reflecting multi-layer film formed on an end face portion of a semiconductor optical device according to the ninety-sixth embodiment of the present invention.

FIG. 106 is a graph of a wavelength dependence of the reflectance of the nine-layer reflecting film 60. The abscissa of the graph indicates a wavelength, and the ordinate denotes a reflectance. In the nine-layer reflecting film, a flat portion having about 11% of the setting reflectance over a wide wavelength band can be obtained. More specifically, the reflectance in the range of a wavelength of 909 nm to a wavelength of 1050 nm ranges from 9.7% to 12.0%. With reference to the reflectance of 11.0% at the setting wavelength 1040 nm, a continuous wavelength band in the range of −1.5% to +1.0%, i.e., 9.5% to 12.0% is 141 nm. A value obtained by dividing the wavelength band by the setting wavelength of 1040 nm is about 0.136, and is larger than 0.065 in the hypothetical reflecting film. Therefore, it is understood that the nine-layer reflecting film 60 has a flat portion having a low reflectance over a wide wavelength band.

Ninety-seventh Embodiment

A semiconductor optical device having a nine-layer reflecting film according to the ninety-seventh embodiment of the present invention will be described below with reference to FIG. 107. This semiconductor optical device is different from the semiconductor optical device according to the thirty-third embodiment in that a setting reflectance $R(\lambda_0)$ is 12.0% at a setting wavelength $\lambda_0=980$ nm. Parameters are given by O=0.10, A=2.85, B=2.10, C=2.42 and D=1.75. In addition, when phase shifts $\phi 1$ and $\phi 2$ of tantalum oxide and aluminum oxide are given by $\phi 1 = 0.39697$ and $\phi 2 = 0.864124$, a reflectance of 12.0% can be obtained at a wavelength of 980 nm. In this case, the film thickness of the layers of the nine-layer reflecting film are given by $Od_2/Ad_1/Ad_2/Bd_1/Bd_2/Cd_1/Cd_2/Dd_1/Dd_2=8.32$ nm/85.79 nm/237.11 nm/63.21 nm/174.71 nm/72.84 nm/201.34 nm/52.68 nm/145.60 nm. The total thickness ($d_{total} = \Sigma d_i$) of the film is 1041.60 nm. A sum $\Sigma n_i d_i$ of products $n_i d_i$ of refractive index $n_i$ and film thickness $d_i$ of a layer denoted with i in the nine films is 1807.36 nm which is very large, i.e., about 7.38 times a ¼ wavelength (=245 nm) of the predetermined wavelength of 980 nm. For this reason, a heat-radiation characteristic on the end face is improved, and the temperature of the end face can be suppressed from increasing.

Figure 107:
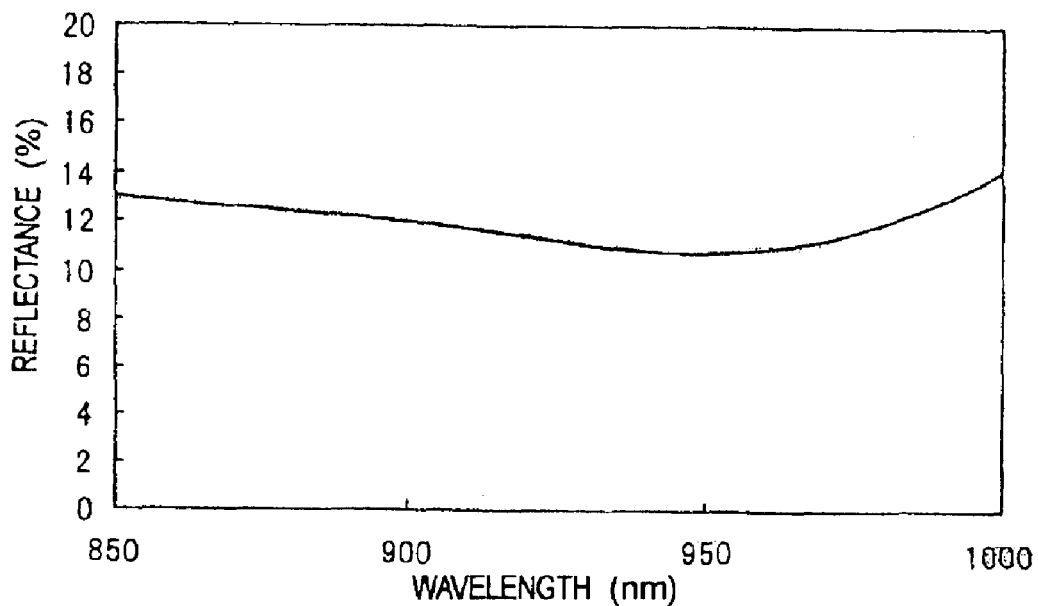
FIG. 107 is a graph of a wavelength dependence of a reflectance on a reflecting multi-layer film formed on an end face portion of a semiconductor optical device according to the ninety-seventh embodiment of the present invention.

FIG. 107 is a graph of a wavelength dependence of the reflectance of the nine-layer reflecting film 60. The abscissa of the graph indicates a wavelength, and the ordinate denotes a reflectance. In the nine-layer reflecting film, a flat portion having about 12% of the setting reflectance over a wide wavelength band can be obtained. More specifically, the reflectance in the range of a wavelength of 852 nm to a wavelength of 990 nm ranges from 10.8% to 13.0%. With reference to the reflectance of 12.0% at the setting wavelength 980 nm, a continuous wavelength band in the range of −1.5% to +1.0%, i.e., 10.5% to 13.0% is 138 nm. A value obtained by dividing the wavelength band by the setting wavelength of 980 nm is about 0.141, and is larger than 0.065 in the hypothetical reflecting film. Therefore, it is understood that the nine-layer reflecting film 60 has a flat portion having a low reflectance over a wide wavelength band.

Ninety-eighth Embodiment

A semiconductor optical device having a nine-layer reflecting film according to the ninety-eighth embodiment of the present invention will be described below with reference to FIG. 108. This semiconductor optical device is different from the semiconductor optical device according to the ninety-seventh embodiment in that a setting reflectance $R(\lambda_0)$ is 12.0% at a setting wavelength $\lambda_0=1043$ nm. In addition, when phase shifts $\phi 1$ and $\phi 2$ of tantalum oxide and aluminum oxide are given by $\phi 1 = 0.39697$ and $\phi 2 = 0.864124$, a reflectance of 12.0% can be obtained at a wavelength of 1043 nm. In this case, the film thickness of the layers of the nine-layer reflecting film are given by $Od_2/Ad_1/Ad_2/Bd_1/Bd_2/Cd_1/Cd_2/Dd_1/Dd_2=8.85$ nm/91.30 nm/252.35 nm/67.27 nm/185.95 nm/77.53 nm/214.28 nm/56.06 nm/154.95 nm. The total thickness ($d_{total} = \Sigma d_i$) of the film is 1108.54 nm. A sum $\Sigma n_i d_i$ of products $n_i d_i$ of refractive index $n_i$ and film thickness $d_i$ of a layer denoted with i in the nine films is 1923.51 nm which is very large, i.e., about 7.85 times a ¼ wavelength (=245 nm) of the predetermined wavelength of 980 nm. For this reason, a heat-radiation characteristic on the end face is improved, and the temperature of the end face can be suppressed from increasing.

Figure 108:
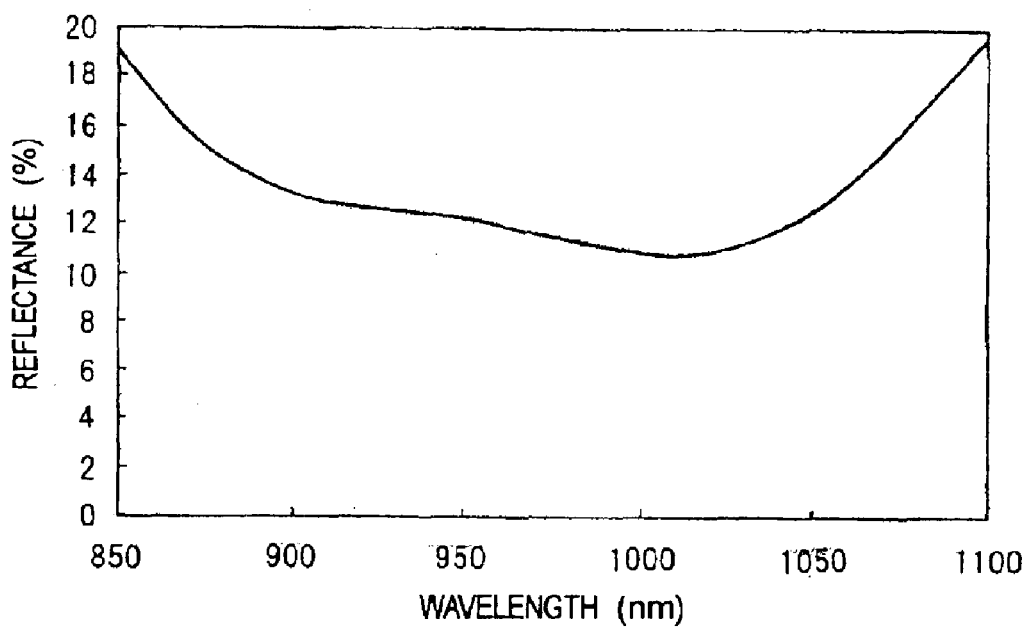
FIG. 108 is a graph of a wavelength dependence of a reflectance on a reflecting multi-layer film formed on an end face portion of a semiconductor optical device according to the ninety-eighth embodiment of the present invention.

FIG. 108 is a graph of a wavelength dependence of the reflectance of the nine-layer reflecting film 60. The abscissa of the graph indicates a wavelength, and the ordinate denotes a reflectance. In the nine-layer reflecting film, a flat portion having about 12% of the setting reflectance over a wide wavelength band can be obtained. More specifically, the reflectance in the range of a wavelength of 907 nm to a wavelength of 1053 nm ranges from 10.8% to 13.0%. With reference to the reflectance of 12.0% at the setting wavelength 1043 nm, a continuous wavelength band in the range of −1.5% to +1.0%, i.e., 10.5% to 13.0% is 146 nm. A value obtained by dividing the wavelength band by the setting wavelength of 1043 nm is about 0.140, and is larger than 0.065 in the hypothetical reflecting film. Therefore, it is understood that the nine-layer reflecting film 60 has a flat portion having a low reflectance over a wide wavelength band.

The characteristics of the reflecting multi-layer films of the semiconductor optical device according to the eighty-fifth embodiment to the ninety-eighth embodiment are shown in Table 9. In Table 9, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (245 nm) of a predetermined wavelength 980 nm, band bands $\Delta\lambda$ in which the reflectance falls within the range from −1.5 to +1.0% of $R(\lambda_0)$, and ratio of $\Delta\lambda/\pi_0$ are shown.

the eight-layer reflecting film 70. More specifically, the semiconductor optical device is different from the semiconductor optical device according to the first embodiment in that first-layer film being in contact with a waveguide layer 10 and second-layer film are respectively aluminum oxide layer and silicon oxide layer, and each film has a refractive index smaller than a square root of an effective refractive index $n_c$ of the waveguide layer. It is noted that tantalum oxide films and silicon oxide films are alternately stacked from the third-layer film to the eight-layer film.

A condition for setting the reflectance of the eight-layer reflecting film 70 to be equal to the reflectance of the hypothetical film at a predetermined wavelength will be considered. A case in which the film of the third type is used as the first-layer film being in contact with the waveguide layer 10 is considered here. A phase shift φ3 of the third film is expressed by the following equation (20).

$$\phi_3 = \frac{2\pi}{\lambda} n_3 d_3 \tag{20}$$

Therefore, the amplitude reflectance of the eight-layer reflecting film 70 is expressed by the following equation

TABLE 9

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation of $\Sigma nidi$; Ratio of $\Sigma nidi$ to 1/4 wave-length (245 nm) of 980 nm | Band width $\Delta\lambda$ in which the reflectance falls within the range from −1.5 to 1.0 of $R(\lambda_0)$ | Ratio of $\Delta\lambda/\lambda_0$ |
|---|---|---|---|---|---|---|
| 85 | nine films | 980 nm 6.0% | 5.1% | 1823.70 nm 7.44 times | 100 nm | 100/980 = 0.102 |
| 86 | nine films | 1018 nm 6.0% | 5.1% | 1857.42 nm 7.73 times | 103 nm | 103/1018 = 0.101 |
| 87 | nine films | 980 nm 7.0% | 6.3% | 1800.12 nm 7.35 times | 95 nm | 95/980 = 0.097 |
| 88 | nine films | 1016 nm 7.0% | 6.3% | 1866.25 nm 7.62 times | 98 nm | 98/1016 = 0.096 |
| 89 | nine films | 980 nm 8.0% | 7.0% | 1807.20 nm 7.38 times | 105 nm | 105/980 = 0.107 |
| 90 | nine films | 1023 nm 8.0% | 7.0% | 1886.46 nm 7.70 times | 109 nm | 109/1023 = 0.107 |
| 91 | nine films | 980 nm 9.0% | 7.8% | 1810.29 nm 7.39 times | 118 nm | 118/980 = 0.120 |
| 92 | nine films | 1031 nm 9.0% | 7.8% | 1904.52 nm 7.77 times | 123 nm | 123/1031 = 0.119 |
| 93 | nine films | 980 nm 10.0% | 8.7% | 1810.50 nm 7.39 times | 124 nm | 124/980 = 0.127 |
| 94 | nine films | 1035 nm 10.0% | 8.7% | 1912.11 nm 7.80 times | 131 nm | 131/1035 = 0.127 |
| 95 | nine films | 980 nm 11.0% | 9.7% | 1810.29 nm 7.39 times | 134 nm | 134/980 = 0.137 |
| 96 | nine films | 1040 nm 11.0% | 9.7% | 1921.11 nm 7.84 times | 141 nm | 141/1040 = 0.136 |
| 97 | nine films | 980 nm 12.0% | 10.8% | 1807.36 nm 7.38 times | 138 nm | 138/980 = 0.141 |
| 98 | nine films | 1043 nm 12.0% | 10.8% | 1923.51 nm 7.85 times | 146 nm | 146/1043 = 0.140 |

Ninety-ninth Embodiment

Figure 109:
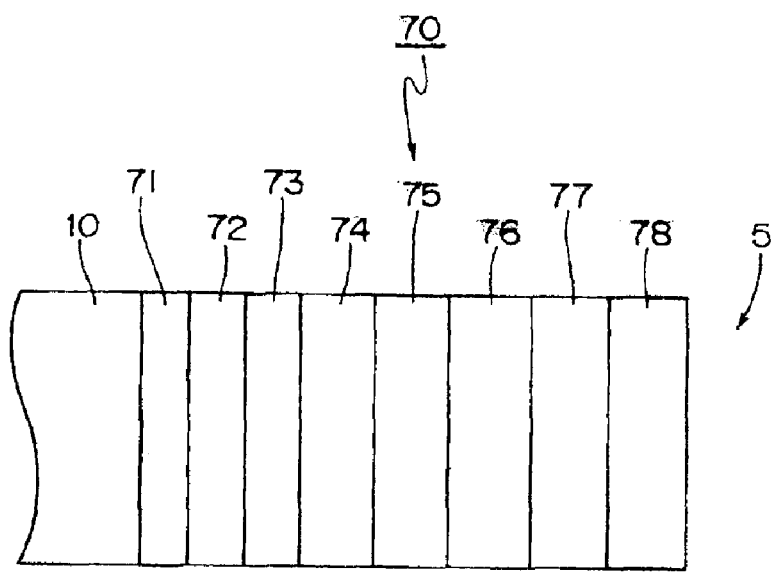
FIG. 109 is a schematic sectional view of the structure of an end face portion of a semiconductor optical device according to the ninety-ninth embodiment of the present invention.

A semiconductor optical device having a eight-layer reflecting film according to the ninety-ninth embodiment of the present invention will be described below with reference to FIGS. 109 and 122. FIG. 109 is a schematic sectional view of a configuration obtained when a eight-layer reflecting film 70 is formed in place of a single-layer reflecting film as a reflecting film on an end face portion of the semiconductor optical device. This semiconductor optical device is different from the semiconductor optical device according to the first embodiment in that the reflecting multi-layer film is

(21) like the amplitude reflectance of the seven-layers reflecting film.

$$r = \frac{(m_{11} + m_{12})n_c - (m_{21} + m_{22})}{(m_{11} + m_{12})n_c + (m_{21} + m_{22})} \tag{21}$$

where $m_{ij}$ (i and j are 1 or 2) is expressed by the following equation (22):

$$\begin{pmatrix} m_{11} & m_{12} \\ m_{21} & m_{22} \end{pmatrix} = \qquad (22)$$

$$\begin{pmatrix} \cos\phi_3 & -\dfrac{i}{n_3}\sin\phi_3 \\ -in_3\sin A\phi_3 & \cos A\phi_1 \end{pmatrix} \begin{pmatrix} \cos A\phi_2 & -\dfrac{i}{n_2}\sin A\phi_2 \\ -in_2\sin A\phi_2 & \cos A\phi_2 \end{pmatrix} \times$$

$$\begin{pmatrix} \cos B\phi_1 & -\dfrac{i}{n_1}\sin B\phi_1 \\ -in_1\sin B\phi_1 & \cos B\phi_1 \end{pmatrix} \begin{pmatrix} \cos B\phi_2 & -\dfrac{i}{n_2}\sin B\phi_2 \\ -in_2\sin B\phi_2 & \cos B\phi_2 \end{pmatrix} \times$$

$$\begin{pmatrix} \cos C\phi_1 & -\dfrac{i}{n_1}\sin C\phi_1 \\ -in_1\sin C\phi_1 & \cos C\phi_1 \end{pmatrix} \begin{pmatrix} \cos C\phi_2 & -\dfrac{i}{n_2}\sin C\phi_2 \\ -in_2\sin C\phi_2 & \cos C\phi_2 \end{pmatrix} \times$$

$$\begin{pmatrix} \cos D\phi_1 & -\dfrac{i}{n_1}\sin D\phi_1 \\ -in_1\sin D\phi_1 & \cos D\phi_1 \end{pmatrix} \begin{pmatrix} \cos D\phi_2 & -\dfrac{i}{n_2}\sin D\phi_2 \\ -in_2\sin D\phi_2 & \cos D\phi_2 \end{pmatrix}$$

where A, B, C and D are parameters representing contributing rates of respective two-layer films (pair) in a film thickness $Ad_2$ of a second-layer film 72, a film thickness $Bd_1$ of a third-layer film 73, a film thickness $Bd_2$ of a fourth-layer film 74, a film thickness $Cd_1$ of a fifth-layer film 75, a film thickness $Cd_2$ of a sixth-layer film 76, a film thickness $Dd_1$ of a seventh-layer film 77, and a film thickness $Dd_2$ of an eighth-layer film 78. It is noted that parameter "A" is contribution ratio for the second-layer film 72.

A case in which the eight-layer reflecting film 70 is formed on an end face portion of the semiconductor optical device will be described below. FIG. 109 is a schematic sectional view of the configuration of the eight-layer reflecting film formed on the end face portion. In this semiconductor optical device, on an end face portion of the waveguide layer 10 (equivalent refractive index $n_c=3.37$), the first-layer film 71 (refractive index $n_2=1.636$ and a film thickness $d_3=10$ nm) made of aluminum oxide, the second-layer film 72 (refractive index $n_1=1.457$ and a film thickness $Ad_2$) made of silicon oxide, the third-layer film 73 (refractive index $n_1=2.072$ and a film thickness $Bd_1$) made of tantalum oxide, the fourth-layer film 74 (refractive index $n_2=1.457$ and a film thickness $Bd_2$) made of silicon oxide, the fifth-layer film 75 (refractive index $n_1=2.072$ and a film thickness $Cd_1$) made of tantalum oxide, the sixth-layer film 76 (refractive index $n_2=1.457$ and a film thickness $Cd_2$) made of silicon oxide, the seventh-layer film 77 (refractive index $n_1=2.072$ and a film thickness $Dd_1$) made of tantalum oxide, the eighth-layer film 78 (refractive index $n_2=1.457$ and a film thickness $Dd_2$) made of silicon oxide, are stacked. In addition, the eight-layer reflecting film 70 is in contact with a free space 5 such as the air.

The reflecting characteristic of the eight-layer reflecting film 70 on the end face portion of the semiconductor optical device will be described below. A setting reflectance $R(\lambda_0)$ is set to be 4.0% at a predetermined wavelength $\lambda_0=808$ nm. When parameters are given by A=0.32, B=1.96, C=1.85, and D=2.00, and when phase shifts $\phi_1$ and $\phi_2$ of tantalum oxide and silicon oxide are given by $100_1=0.356684$ and $\phi2=1.26875$, a reflectance of 4.0% is obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2=10$ nm/35.83 nm/43.39 nm/219.49 nm/40.95 nm/207.17 nm/44.27 nm/223.96 nm. The total thickness $(d_{total}=\Sigma d_i)$ of the film is 825.06 nm. A sum $\Sigma n_i d_i$ of products $n_i d_i$ of refractive index $n_i$ and film thickness $d_i$ of a layer denoted with i in the eight films is 2108.54 nm which is very large, i.e., about 10.44 times a ¼ wavelength (=202 nm) at a predetermined wavelength of 808 nm. For this reason, a heat-radiation characteristic on the end face is improved, and the temperature of the end face can be suppressed from increasing.

Figure 110:
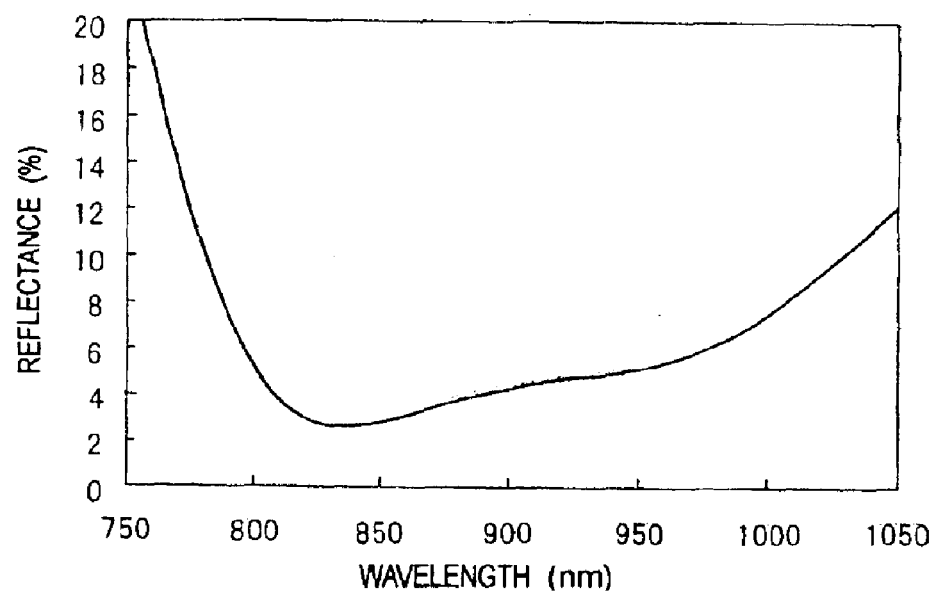
FIG. 110 is a graph of a wavelength dependence of a reflectance on a reflecting multi-layer film formed on an end face portion of a semiconductor optical device according to the ninety-ninth embodiment of the present invention.

FIG. 110 is a graph of a wavelength dependence of the reflectance of the eight-layer reflecting film 70. The abscissa of the graph indicates a wavelength, and the ordinate denotes a reflectance. In the eight-layer reflecting film, a flat portion having about 4% of the setting reflectance over a wide wavelength band can be obtained. More specifically, the reflectance in the range of a wavelength of 802 nm to a wavelength of 941 nm ranges from 2.6% to 5.0%. With reference to the reflectance of 4.0% at the predetermined wavelength 808 nm, a continuous wavelength band in the range of −1.5% to +1.0%, i.e., 2.5% to 5.0% is 139 nm. A value obtained by dividing the wavelength band by the predetermined wavelength of 808 nm is about 0.172, and is larger than 0.065 in the hypothetical reflecting film. Therefore, it is understood that the eight-layer reflecting film 70 has a flat portion having a low reflectance over a wide wavelength band.

Hundredth Embodiment

A semiconductor optical device having a eight-layer reflecting film according to the hunderedth embodiment of the present invention will be described below with reference to FIG. 111. This semiconductor optical device is different from the semiconductor optical device according to the ninety-ninth embodiment in that a setting reflectance $R(\lambda_0)$ is 4.0% at a setting wavelength $\lambda_0=744$ nm. In addition, when phase shifts $\phi_1$ and $\phi_2$ of tantalum oxide and silicon oxide are given by $\phi_1=0.361744$ and $\phi_2=1.26093$, a reflectance of 4.0% can be obtained at a wavelength of 744 nm. In this case, the film thickness of the layers of the eight-layer reflecting film are given by $d_3/Ad_2/Bd_1/Bd_2/Cd_1/Cd_2/Dd_1/Dd_2=10$ nm/32.79 nm/40.31 nm/199.83 nm/38.25 nm/189.58 nm/41.35 nm/204.95 nm. The total thickness $(d_{total}=\Sigma d_i)$ of the film is 757.06 nm. A sum $\Sigma n_i d_i$ of products $n_i d_i$ of refractive index $n_i$ and film thickness $d_i$ of a layer denoted with i in the eight films is 1949.67 nm which is very large, i.e., about 9.65 times a ¼ wavelength (=202 nm) of the predetermined wavelength of 808 nm. For this reason, a heat-radiation characteristic on the end face is improved, and the temperature of the end face can be suppressed from increasing.

Figure 111:
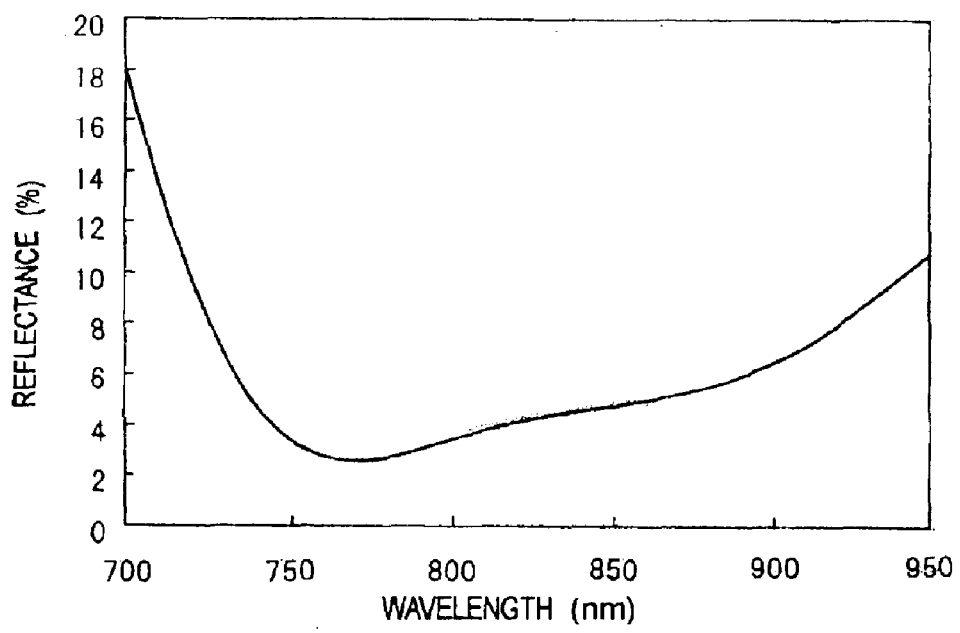
FIG. 111 is a graph of a wavelength dependence of a reflectance on a reflecting multi-layer film formed on an end face portion of a semiconductor optical device according to the 100th embodiment of the present invention.

FIG. 111 is a graph of a wavelength dependence of the reflectance of the eight-layer reflecting film 70. The abscissa of the graph indicates a wavelength, and the ordinate denotes a reflectance. In the eight-layer reflecting film, a flat portion having about 4% of the setting reflectance over a wide wavelength band can be obtained. More specifically, the reflectance in the range of a wavelength of 738 nm to a wavelength of 869 nm ranges from 2.5% to 5.0%. With reference to the reflectance of 4.0% at the setting wavelength 744 nm, a continuous wavelength band in the range of −1.5% to +1.0%, i.e., 2.5% to 5.0% is 131 nm. A value obtained by dividing the wavelength band by the setting wavelength of 744 nm is about 0.176, and is larger than 0.065 in the hypothetical reflecting film. Therefore, it is understood that the eight-layer reflecting film 70 has a flat portion having a low reflectance over a wide wavelength band.

Hundredth-first Embodiment

A semiconductor optical device having a eight-layer reflecting film according to the hundredth-first embodiment of the present invention will be described below with reference to FIG. 112. This semiconductor optical device is different from the semiconductor optical device according to the ninety-ninth embodiment in that a setting reflectance $R(\lambda_0)$ is 8.0% at a setting wavelength $\lambda_0=808$ nm. Parameters are given by A=0.20, B=2.00, C=2.00 and D=2.00. In addition, when phase shifts $\phi_1$ and $\phi_2$ of tantalum oxide and silicon oxide are given by $\phi_1=0.374385$ and $\phi_2=1.26121$, a reflectance of 8.0% can be obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2=10$ nm/22.26 nm/46.47 nm/222.63 nm/46.47 nm/222.63 nm/46.47 nm/222.63 nm. The total thickness $(d_{total}=\Sigma d_i)$ of the film is 839.56 nm. A sum $\Sigma n_i d_i$ of products $n_i d_i$ of refractive index $n_i$ and film thickness $d_i$ of a layer denoted with i in the eight films is 2177.34 nm which is very large, i.e., about 10.78 times a ¼ wavelength (=202 nm) of the predetermined wavelength of 808 nm. For this reason, a heat-radiation characteristic on the end face is improved, and the temperature of the end face can be suppressed from increasing.

Figure 112:
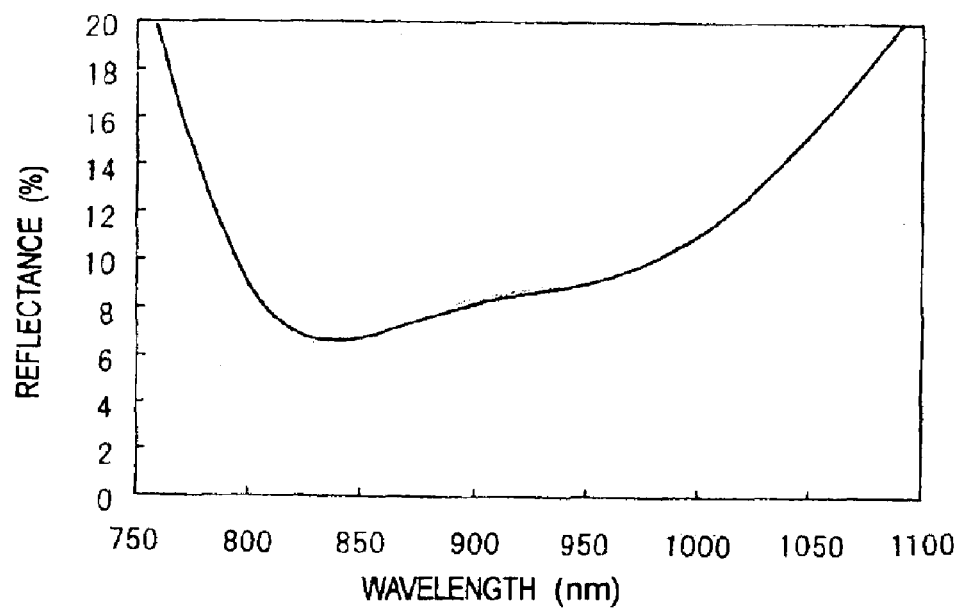
FIG. 112 is a graph of a wavelength dependence of a reflectance on a reflecting multi-layer film formed on an end face portion of a semiconductor optical device according to the 101st embodiment of the present invention.

FIG. 112 is a graph of a wavelength dependence of the reflectance of the eight-layer reflecting film 70. The abscissa of the graph indicates a wavelength, and the ordinate denotes a reflectance. In the eight-layer reflecting film, a flat portion having about 8% of the setting reflectance over a wide wavelength band can be obtained. More specifically, the reflectance in the range of a wavelength of 801 nm to a wavelength of 946 nm ranges from 6.6% to 9.0%. With reference to the reflectance of 8.0% at the predetermined wavelength 808 nm, a continuous wavelength band in the range of −1.5% to +1.0%, i.e., 6.5% to 9.0% is 145 nm. A value obtained by dividing the wavelength band by the predetermined wavelength of 808 nm is about 0.179, and is larger than 0.065 in the hypothetical reflecting film. Therefore, it is understood that the eight-layer reflecting film 70 has a flat portion having a low reflectance over a wide wavelength band.

Hundredth-second Embodiment

A semiconductor optical device having a eight-layer reflecting film according to the hunderedth-second embodiment of the present invention will be described below with reference to FIG. 113. This semiconductor optical device is different from the semiconductor optical device according to the hundredth-first embodiment in that a setting reflectance $R(\lambda_0)$ is 8.0% at a setting wavelength $\lambda_0=753$ nm. Parameter is given by A=0.19. In addition, when phase shifts $\phi_1$ and $\phi_2$ of tantalum oxide and silicon oxide are given by $\phi_1=0.370822$ and $\phi_2=1.26896$, a reflectance of 8.0% can be obtained at a wavelength of 753 nm. In this case, the film thickness of the layers of the eight-layer reflecting film are given by $d_3/Ad_2/Bd_1/Bd_2/Cd_1/Cd_2/Dd_1/Dd_2=10$ nm/19.83 nm/42.90 nm/208.75 nm/42.90 nm/208.75 nm/42.90 nm/208.75 nm. The total thickness $(d_{total}=\Sigma d_i)$ of the film is 784.78 nm. A sum $\Sigma n_i d_i$ of products $n_i d_i$ of refractive index $n_i$ and film thickness $d_i$ of a layer denoted with i in the eight films is 2024.36 nm which is very large, i.e., about 10.02 times a ¼ wavelength (=202 nm) of the predetermined wavelength of 808 nm. For this reason, a heat-radiation characteristic on the end face is improved, and the temperature of the end face can be suppressed from increasing.

Figure 113:
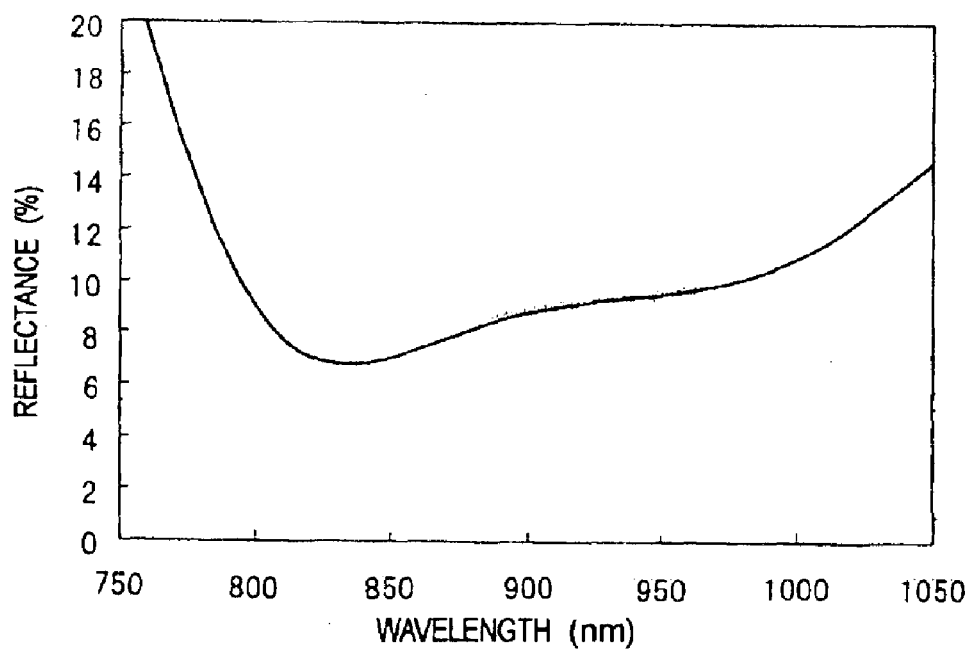
FIG. 113 is a graph of a wavelength dependence of a reflectance on a reflecting multi-layer film formed on an end face portion of a semiconductor optical device according to the 102nd embodiment of the present invention.

FIG. 113 is a graph of a wavelength dependence of the reflectance of the eight-layer reflecting film 70. The abscissa of the graph indicates a wavelength, and the ordinate denotes a reflectance. In the eight-layer reflecting film, a flat portion having about 8% of the setting reflectance over a wide wavelength band can be obtained. More specifically, the reflectance in the range of a wavelength of 746 nm to a wavelength of 870 nm ranges from 6.7% to 9.0%. With reference to the reflectance of 8.0% at the setting wavelength 753 nm, a continuous wavelength band in the range of −1.5% to +1.0%, i.e., 6.5% to 9.0% is 124 nm. A value obtained by dividing the wavelength band by the setting wavelength of 753 nm is about 0.165, and is larger than 0.065 in the hypothetical reflecting film. Therefore, it is understood that the eight-layer reflecting film 70 has a flat portion having a low reflectance over a wide wavelength band.

Hundredth-third Embodiment

A semiconductor optical device having a eight-layer reflecting film according to the hundredth-third embodiment of the present invention will be described below with reference to FIG. 114. This semiconductor optical device is different from the semiconductor optical device according to the ninety-ninth embodiment in that a setting reflectance $R(\lambda_0)$ is 12.0% at a predetermined wavelength $\lambda_0=808$ nm. Parameters are given by A=0.14, B=1.95, C=1.80 and D=2.00. In addition, when phase shifts $\phi_1$ and $\phi_2$ of tantalum oxide and silicon oxide are given by $\phi_1=0.403695$ and $\phi_2=1.34024$, a reflectance of 12.0% can be obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2=10$ nm/16.56 nm/48.86 nm/230.67 nm/45.10 nm/212.93 nm/50.11 nm/236.58 nm. The total thickness $(d_{total}=\Sigma d_i)$ of the film is 850.81 nm. A sum $\Sigma n_i d_i$ of products $n_i d_i$ of refractive index $n_i$ and film thickness $d_i$ of a layer denoted with i in the eight films is 2264.47 nm which is very large, i.e., about 11.21 times a ¼ wavelength (=202 nm) of the predetermined wavelength of 808 nm. For this reason, a heat-radiation characteristic on the end face is improved, and the temperature of the end face can be suppressed from increasing.

Figure 114:
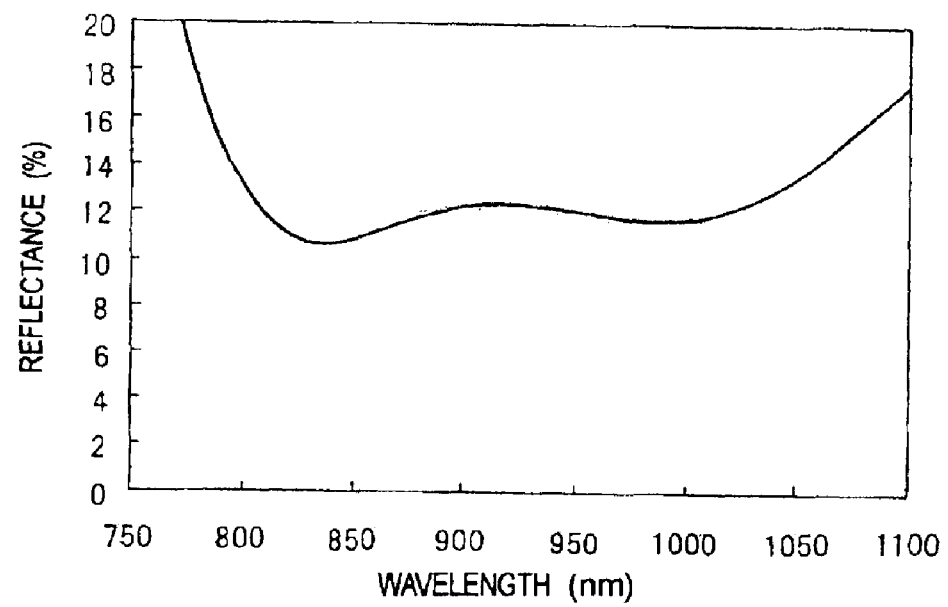
FIG. 114 is a graph of a wavelength dependence of a reflectance on a reflecting multi-layer film formed on an end face portion of a semiconductor optical device according to the 103rd embodiment of the present invention.

FIG. 114 is a graph of a wavelength dependence of the reflectance of the eight-layer reflecting film 70. The abscissa of the graph indicates a wavelength, and the ordinate denotes a reflectance. In the eight-layer reflecting film, a flat portion having about 12% of the setting reflectance over a wide wavelength band can be obtained. More specifically, the reflectance in the range of a wavelength of 801 nm to a wavelength of 1037 nm ranges from 10.7% to 13.0%. With reference to the reflectance of 12.0% at the predetermined wavelength 808 nm, a continuous wavelength band in the range of −1.5% to +1.0%, i.e., 10.5% to 13.0% is 236 nm. A value obtained by dividing the wavelength band by the predetermined wavelength of 808 nm is about 0.292, and is larger than 0.065 in the hypothetical reflecting film. Therefore, it is understood that the eight-layer reflecting film 70 has a flat portion having a low reflectance over a wide wavelength band.

Hundredth-fourth Embodiment

A semiconductor optical device having a eight-layer reflecting film according to the hunderedth-fourth embodiment of the present invention will be described below with reference to FIG. 115. This semiconductor optical device is different from the semiconductor optical device according to the hundredth-third embodiment in that a setting reflectance $R(\lambda_0)$ is 12.0% at a setting wavelength $\lambda_0=706$ nm. Parameter is given by B=1.93. In addition, when phase shifts $\phi_1$ and $\phi_2$ of tantalum oxide and silicon oxide are given by $\phi_1=0.412469$ and $\phi2=1.3303$, a reflectance of 12.0% can be obtained at a wavelength of 706 nm. In this case, the film thickness of the layers of the eight-layer reflecting film are given by $d_3/Ad_2/Bd_1/Bd_2/Cd_1/Cd_2/Dd_1/Dd_2=10$ nm/14.43 nm/43.90 nm/198.96 nm/40.56 nm/185.56 nm/45.06 nm/206.18 nm. The total thickness $(d_{total}=\Sigma d_i)$ of the film is 744.24 nm. A sum $\Sigma n_i d_i$ of products $n_i d_i$ of refractive index $n_i$ and film thickness $d_i$ of a layer denoted with i in the eight films is 2005.83 nm which is very large, i.e., about 9.93 times a ¼ wavelength (=202 nm) of the predetermined wavelength of 808 nm. For this reason, a heat-radiation characteristic on the end face is improved, and the temperature of the end face can be suppressed from increasing.

Figure 115:
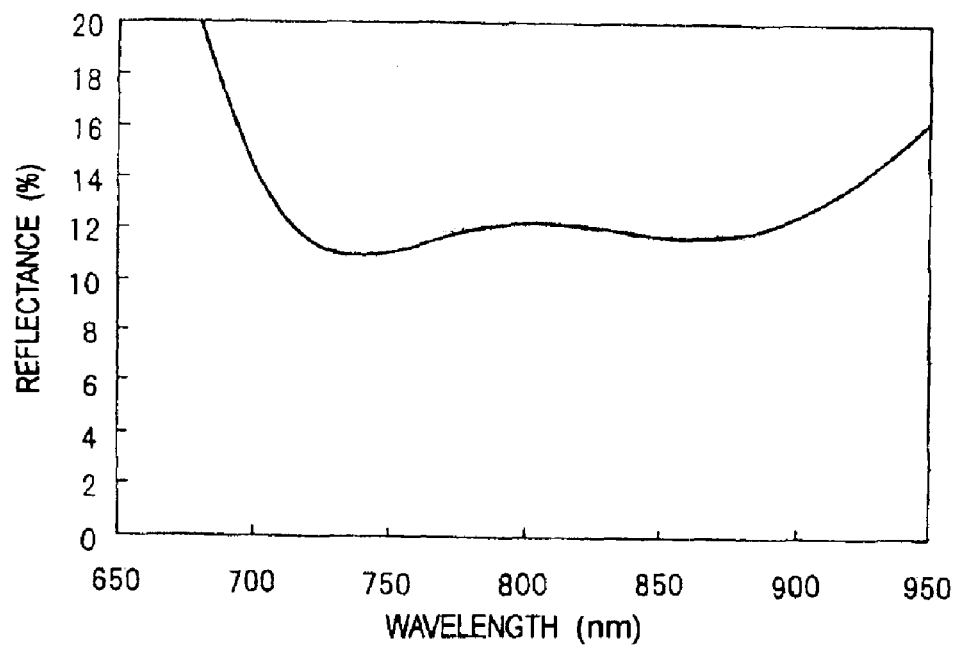
FIG. 115 is a graph of a wavelength dependence of a reflectance on a reflecting multi-layer film formed on an end face portion of a semiconductor optical device according to the 104th embodiment of the present invention.

FIG. 115 is a graph of a wavelength dependence of the reflectance of the eight-layer reflecting film 70. The abscissa of the graph indicates a wavelength, and the ordinate denotes a reflectance. In the eight-layer reflecting film, a flat portion having about 12% of the setting reflectance over a wide wavelength band can be obtained. More specifically, the reflectance in the range of a wavelength of 707 nm to a wavelength of 908 nm ranges from 10.9% to 13.0%. With reference to the reflectance of 12.0% at the setting wavelength 706 nm, a continuous wavelength band in the range of −1.5% to +1.0%, i.e., 10.5% to 13.0% is 201 nm. A value obtained by dividing the wavelength band by the setting wavelength of 706 nm is about 0.285, and is larger than 0.065 in the hypothetical reflecting film. Therefore, it is understood that the eight-layer reflecting film 70 has a flat portion having a low reflectance over a wide wavelength band.

Hundredth-fifth Embodiment

Figure 116:
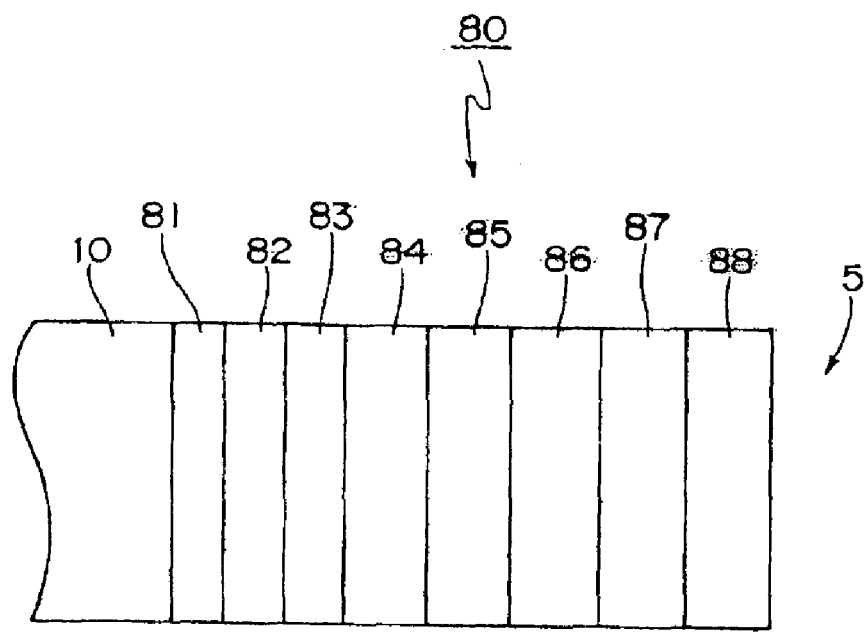
FIG. 116 is a schematic sectional view of the structure of an end face portion of a semiconductor optical device according to the 105th embodiment of the present invention.

A semiconductor optical device having a eight-layer reflecting film according to the hundredth-fifth embodiment of the present invention will be described below with reference to FIGS. 116 and 117. FIG. 116 is a schematic sectional view of a configuration obtained when a eight-layer reflecting film 80 is formed in place of a single-layer reflecting film as a reflecting film on an end face portion of the semiconductor optical device. This semiconductor optical device is different from the semiconductor optical device according to the ninety-ninth embodiment in that first-layer film being in contact with a waveguide layer 10 is silicon oxide layer and second-layer film, fourth-layer film, sixth-layer film, and eighth-layer film are aluminum oxide layers.

A case in which the eight-layer reflecting film 80 is formed on an end face portion of the semiconductor optical device will be described below. FIG. 116 is a schematic sectional view of the configuration of the eight-layer reflecting film formed on the end face portion. In this semiconductor optical device, on an end face portion of the waveguide layer 10 (equivalent refractive index $n_c$=3.37), the first-layer film 81 (refractive index $n_2$=1.457 and a film thickness $d_3$=5 nm) made of silicon oxide, the second-layer film 82 (refractive index $n_c$=1.636 and a film thickness $Ad_2$) made of aluminum oxide, the third-layer film 83 (refractive index $n_1$=2.072 and a film thickness $Bd_1$) made of tantalum oxide, the fourth-layer film 84 (refractive index $n_2$=1.636 and a film thickness $Bd_2$) made of aluminum oxide, the fifth-layer film 85 (refractive index $n_1$=2.072 and a film thickness $Cd_1$) made of tantalum oxide, the sixth-layer film 86 (refractive index $n_2$=1.636 and a film thickness $Cd_2$) made of aluminum oxide, the seventh-layer film 87 (refractive index $n_1$=2.072 and a film thickness $Dd_1$) made of tantalum oxide, the eighth-layer film 88 (refractive index $n_2$=1.636 and a film thickness $Dd_2$) made of aluminum oxide, are stacked. In addition, the eight-layer reflecting film 80 is in contact with a free space 5 such as the air.

The reflecting characteristic of the eight-layer reflecting film 80 on the end face portion of the semiconductor optical device will be described below. A setting reflectance $R(\lambda_0)$ is set to be 4.0% at a predetermined wavelength $\lambda_0$=808 nm. When parameters are given by A=0.22, B=2.00, C=2.16, and D=2.00, and when phase shifts $\phi_1$ and $\phi_2$ of tantalum oxide and aluminum oxide are given by $\phi_1$=0.44218 and $\phi_2$=1.18776, a reflectance of 4.0% is obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2$=5 nm/20.54 nm/54.89 nm/186.73 nm/59.28 nm/201.67 nm/54.89 nm/186.73 nm. The total thickness ($d_{total}=\Sigma d_i$) of the film is 769.73 nm. A sum $\Sigma n_i d_i$ of products $n_i d_i$ of refractive index $n_i$ and film thickness $d_i$ of a layer denoted with i in the eight films is 2355.68 nm which is very large, i.e., about 11.66 times a ¼ wavelength (=202 nm) of the predetermined wavelength of 808 nm. For this reason, a heat-radiation characteristic on the end face is improved, and the temperature of the end face can be suppressed from increasing.

Figure 117:
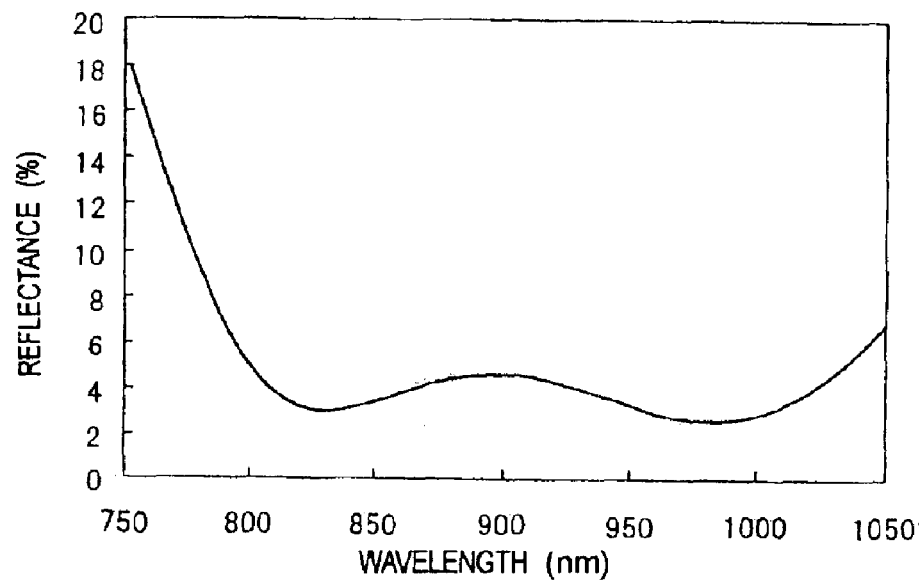
FIG. 117 is a graph of a wavelength dependence of a reflectance on a reflecting multi-layer film formed on an end face portion of a semiconductor optical device according to the 105th embodiment of the present invention.

FIG. 117 is a graph of a wavelength dependence of the reflectance of the eight-layer reflecting film 80. The abscissa of the graph indicates a wavelength, and the ordinate denotes a reflectance. In the eight-layer reflecting film, a flat portion having about 4% of the setting reflectance over a wide wavelength band can be obtained. More specifically, the reflectance in the range of a wavelength of 800 nm to a wavelength of 1032 nm ranges from 2.7% to 5.0%. With reference to the reflectance of 4.0% at the predetermined wavelength 808 nm, a continuous wavelength band in the range of −1.5% to +1.0%, i.e., 2.5% to 5.0% is 232 nm. A value obtained by dividing the wavelength band by the predetermined wavelength of 808 nm is about 0.287, and is larger than 0.065 in the hypothetical reflecting film. Therefore, it is understood that the eight-layer reflecting film 80 has a flat portion having a low reflectance over a wide wavelength band.

Hundredth-sixth Embodiment

A semiconductor optical device having a eight-layer reflecting film according to the hunderedth-sixth embodiment of the present invention will be described below with reference to FIG. 118. This semiconductor optical device is different from the semiconductor optical device according to the hundredth-fifth embodiment in that a setting reflectance $R(\lambda_0)$ is 4.0% at a setting wavelength $\lambda_0$=716 nm. Parameter are given by A=0.17, B=1.93, C=2.24. In addition, when phase shifts $\phi_1$ and $\phi_2$ of tantalum oxide and aluminum oxide are given by $\phi_1$=0.455795 and $\phi 2$=1.15938, a reflectance of 4.0% can be obtained at a wavelength of 716 nm. In this case, the film thickness of the layers of the eight-layer reflecting film are given by $d_3/Ad_2/Bd_1/Bd_2/Cd_1/Cd_2/Dd_1/Dd_2$=5 nm/13.73 nm/50.89 nm/163.94 nm/56.15 nm/180.89 nm/50.01 nm/161.11 nm. The total thickness ($d_{total}=\Sigma d_i$) of the film is 681.72 nm. A sum $\Sigma n_i d_i$ of products $n_i d_i$ of refractive index $n_i$ and film thickness $d_i$ of a layer denoted with i in the eight films is 2115.46 nm which is very large, i.e., about 10.47 times a ¼ wavelength (=202 nm) of the predetermined wavelength of 808 nm. For this reason, a heat-radiation characteristic on the end face is improved, and the temperature of the end face can be suppressed from increasing.

Figure 118:
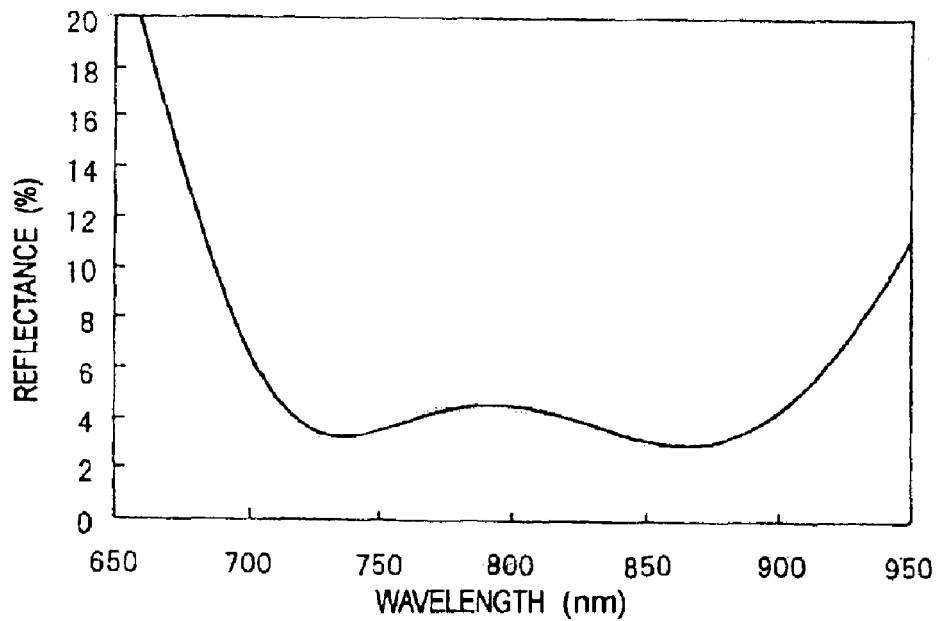
FIG. 118 is a graph of a wavelength dependence of a reflectance on a reflecting multi-layer film formed on an end face portion of a semiconductor optical device according to the 106th embodiment of the present invention.

FIG. 118 is a graph of a wavelength dependence of the reflectance of the eight-layer reflecting film 80. The abscissa of the graph indicates a wavelength, and the ordinate denotes a reflectance. In the eight-layer reflecting film, a flat portion having about 4% of the setting reflectance over a wide wavelength band can be obtained. More specifically, the reflectance in the range of a wavelength of 709 nm to a wavelength of 906 nm ranges from 3.0% to 5.0%. With reference to the reflectance of 4.0% at the setting wavelength 716 nm, a continuous wavelength band in the range of −1.5% to +1.0%, i.e., 2.5% to 5.0% is 197 nm. A value obtained by dividing the wavelength band by the setting wavelength of 716 nm is about 0.275, and is larger than 0.065 in the hypothetical reflecting film. Therefore, it is understood that the eight-layer reflecting film 80 has a flat portion having a low reflectance over a wide wavelength band.

Hundredth-seventh Embodiment

A semiconductor optical device having a eight-layer reflecting film according to the hundredth-seventh embodiment of the present invention will be described below with reference to FIG. 119. This semiconductor optical device is different from the semiconductor optical device according to the hundredth-fifth embodiment in that a setting reflectance $R(\lambda_0)$ is 8.0% at a predetermined wavelength $\lambda_0$=808 nm. Parameters are given by A=0.20, B=2.00, C=2.60 and D=2.00. In addition, when phase shifts $\phi_1$ and $\phi_2$ of tantalum oxide and aluminum oxide are given by (i=0.703895 and $\phi2$=0.563728, a reflectance of 8.0% can be obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2$=5 nm/8.86 nm/87.37 nm/88.62 nm/113.59 nm/115.21 nm/87.37 nm/88.62 nm. The total thickness ($d_{total}$=$\Sigma d_i$) of the film is 594.64 nm. A sum $\Sigma n_i d_i$ of products $n_i d_i$ of refractive index $n_i$ and film thickness $d_i$ of a layer denoted with i in the eight films is 2726.92 nm which is very large, i.e., about 13.50 times a ¼ wavelength (=202 nm) of the predetermined wavelength of 808 nm. For this reason, a heat-radiation characteristic on the end face is improved, and the temperature of the end face can be suppressed from increasing.

Figure 119:
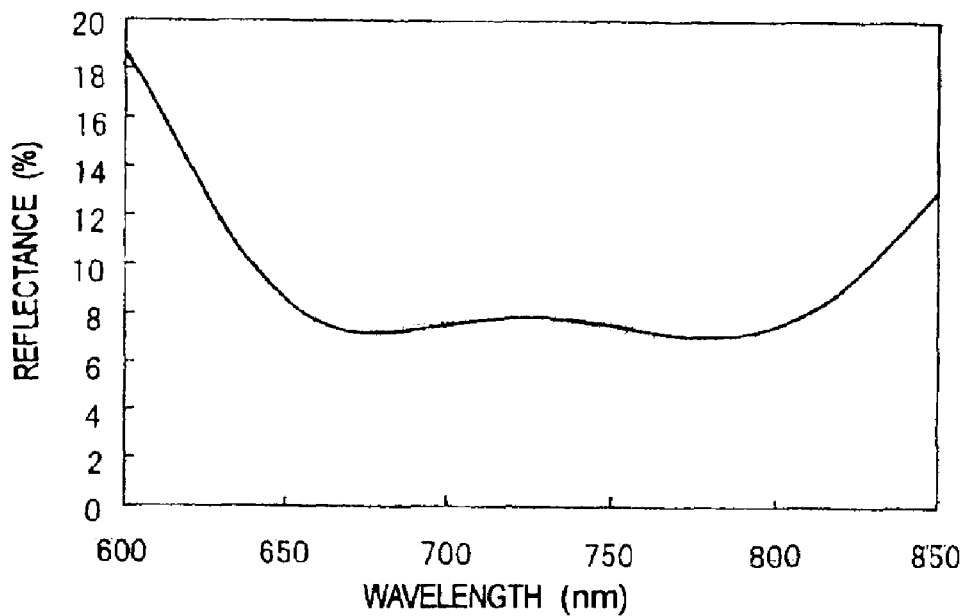

FIG. 119 is a graph of a wavelength dependence of the reflectance of the eight-layer reflecting film 80. The abscissa of the graph indicates a wavelength, and the ordinate denotes a reflectance. In the eight-layer reflecting film, a flat portion having about 8% of the setting reflectance over a wide wavelength band can be obtained. More specifically, the reflectance in the range of a wavelength of 647 nm to a wavelength of 819 nm ranges from 7.1% to 9.0%. With reference to the reflectance of 8.0% at the predetermined wavelength 808 nm, a continuous wavelength band in the range of −1.5% to +1.0%, i.e., 6.5% to 9.0% is 172 nm. A value obtained by dividing the wavelength band by the predetermined wavelength of 808 nm is about 0.213, and is larger than 0.065 in the hypothetical reflecting film. Therefore, it is understood that the eight-layer reflecting film 80 has a flat portion having a low reflectance over a wide wavelength band.

Hundredth-eight Embodiment

A semiconductor optical device having a eight-layer reflecting film according to the hunderedth-eighth embodiment of the present invention will be described below with reference to FIG. 120. This semiconductor optical device is different from the semiconductor optical device according to the hundredth-seventh embodiment in that a setting reflectance $R(\lambda_0)$ is 8.0% at a setting wavelength $\lambda_0$=891 nm. In addition, when phase shifts $\phi_1$ and $\phi_2$ of tantalum oxide and aluminum oxide are given by $\phi_1$=0.707082 and $\phi_2$=0.56214, a reflectance of 8.0% can be obtained at a wavelength of 891 nm. In this case, the film thickness of the layers of the eight-layer reflecting film are given by $d_3/Ad_2/Bd_1/Bd_2/Cd_1/Cd_2/Dd_1/Dd_2$=5 nm/9.75 nm/96.79 nm/97.45 nm/125.82 nm/126.69 nm/96.79 nm/97.45 nm. The total thickness ($d_{total}$=$\Sigma d_i$) of the film is 655.74 nm. A sum $\Sigma n_i d_i$ of products $n_i d_i$ of refractive index $n_i$ and film thickness $d_i$ of a layer denoted with i in the eight films is 3016.09 nm which is very large, i.e., about 14.93 times a ¼ wavelength (=202 nm) of the predetermined wavelength of 808 nm. For this reason, a heat-radiation characteristic on the end face is improved, and the temperature of the end face can be suppressed from increasing.

Figure 120:
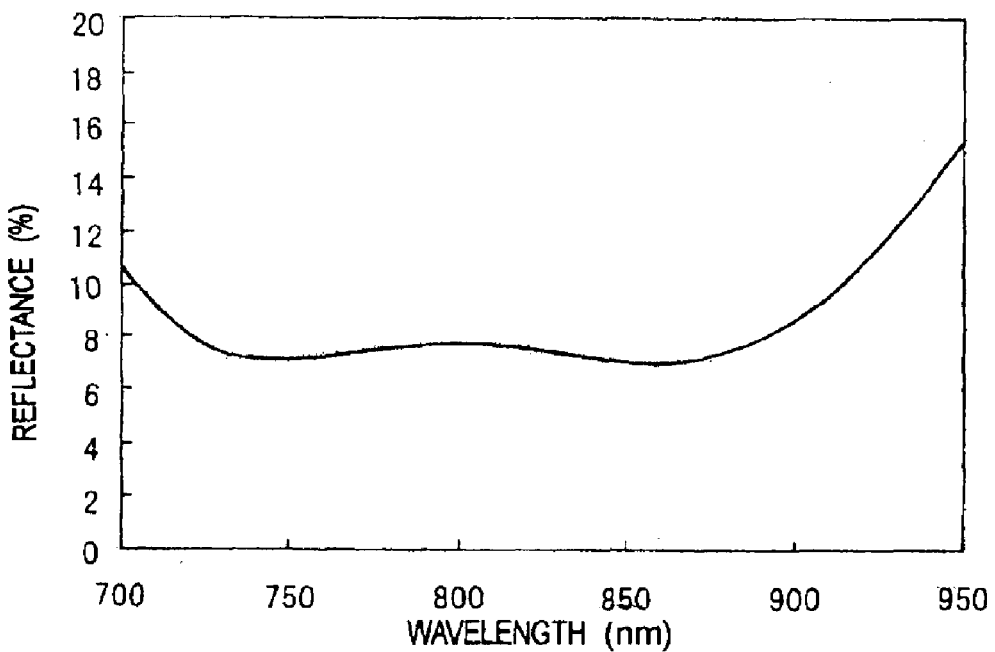

FIG. 120 is a graph of a wavelength dependence of the reflectance of the eight-layer reflecting film 80. The abscissa of the graph indicates a wavelength, and the ordinate denotes a reflectance. In the eight-layer reflecting film, a flat portion having about 8% of the setting reflectance over a wide wavelength band can be obtained. More specifically, the reflectance in the range of a wavelength of 712 nm to a wavelength of 903 nm ranges from 7.0% to 9.0%. With reference to the reflectance of 8.0% at the setting wavelength 891 nm, a continuous wavelength band in the range of −1.5% to +1.0%, i.e., 6.5% to 9.0% is 191 nm. A value obtained by dividing the wavelength band by the setting wavelength of 891 nm is about 0.214, and is larger than 0.065 in the hypothetical reflecting film. Therefore, it is understood that the eight-layer reflecting film 80 has a flat portion having a low reflectance over a wide wavelength band.

Hundredth-ninth Embodiment

A semiconductor optical device having a eight-layer reflecting film according to the hundredth-ninth embodiment of the present invention will be described below with reference to FIG. 121. This semiconductor optical device is different from the semiconductor optical device according to the hundredth-fifth embodiment in that a setting reflectance $R(\lambda_0)$ is 12.0% at a predetermined wavelength $\lambda_0$=808 nm. Parameters are given by A=0.10, B=2.53, C 2.75 and D=2.00. In addition, when phase shifts $\phi1$ and $\phi2$ of tantalum oxide and aluminum oxide are given by (i=0.549712 and $\phi2$=0.58774, a reflectance of 12.0% can be obtained at a wavelength of 808 nm. In this case, the film thickness of the layers of the eight-layer reflecting film are given by $d_3/Ad_2/Bd_1/Bd_2/Cd_1/Cd_2/Dd_1/Dd_2$=5 nm/4.62 nm/86.32 nm/1 16.88 nm/93.82 nm/127.05 nm/68.24 nm/92.40 nm. The total thickness ($d_{total}$=$\Sigma d_i$) of the film is 594.33 nm. A sum $\Sigma n_i d_i$ of products $n_i d_i$ of refractive index $n_i$ and film thickness $d_i$ of a layer denoted with i in the eight films is 2352.26 nm which is very large, i.e., about 11.64 times a ¼ wavelength (=202 nm) of the predetermined wavelength of 808 nm. For this reason, a heat-radiation characteristic on the end face is improved, and the temperature of the end face can be suppressed from increasing.

FIG. 121 is a graph of a wavelength dependence of the reflectance of the eight-layer reflecting film 80. The abscissa of the graph indicates a wavelength, and the ordinate denotes a reflectance. In the eight-layer reflecting film, a flat portion having about 12% of the setting reflectance over a wide wavelength band can be obtained. More specifically, the reflectance in the range of a wavelength of 617 nm to a wavelength of 821 nm ranges from 10.6% to 13.0%. With reference to the reflectance of 12.0% at the predetermined wavelength 808 nm, a continuous wavelength band in the range of −1.5% to +1.0%, i.e., 10.5% to 13.0% is 204 nm. A value obtained by dividing the wavelength band by the predetermined wavelength of 808 nm is about 0.252, and is larger than 0.065 in the hypothetical reflecting film. Therefore, it is understood that the eight-layer reflecting film 80 has a flat portion having a low reflectance over a wide wavelength band.

Hundredth-tenth Embodiment

A semiconductor optical device having a eight-layer reflecting film according to the hunderedth-tenth embodiment of the present invention will be described below with reference to FIG. 122. This semiconductor optical device is different from the semiconductor optical device according to the hundredth-ninth embodiment in that a setting reflectance $R(\lambda_0)$ is 12.0% at a setting wavelength $\lambda_0$=909 nm. Parameter is given by B=2.57. In addition, when phase shifts $\phi_1$ and $\phi_2$ of tantalum oxide and aluminum oxide are given by $\phi_1$=0.53932 and $\phi_2$=0.592482, a reflectance of 12.0% can be obtained at a wavelength of 909 nm. In this case, the film thickness of the layers of the eight-layer reflecting film are given by $d_3/Ad_2/Bd_1/Bd_2/Cd_1/Cd_2/Dd_1/Dd_2$=5 nm/5.24 nm/96.78 nm/134.65 nm/103.56 nm/144.08 nm/75.31 nm/104.79 nm. The total thickness ($d_{total}=\Sigma d_i$) of the film is 669.41 nm. A sum $\Sigma n_i d_i$ of products $n_i d_i$ of refractive index The characteristics of the reflecting multi-layer films of the semiconductor optical device according to the ninety-ninth embodiment to the hunderedth-tenth embodiment are shown in Table 10. In Table 10, as the characteristics of the reflecting multi-layer film, the configurations of the reflecting multi-layer film, setting wavelength $\lambda_0$ and setting reflectance $R(\lambda_0)$, minimal reflectance, summation $\Sigma n_i d_i$, ratio of $\Sigma n_i d_i$ to ¼ wavelength (202 nm) of a predetermined wavelength 808 nm, band bands $\Delta\lambda$ in which the reflectance falls within the range from −1.5 to +1.0% of $R(\lambda_0)$, and ratio of $\Delta\lambda/\lambda_0$ are shown.

TABLE 10

Characteristic of Reflecting Multi-layer Film

| Embodiment No. | Configuration of reflecting multi-layer film | Setting wavelength $\lambda_0$; Setting reflectance $R(\lambda_0)$ | Minimal reflectance | Summation of $\Sigma nidi$; Ratio of $\Sigma nidi$ to 1/4 wave-length (202 nm) of 808 nm | Band width $\Delta\lambda$ in which the reflectance falls within the range from −1.5 to 1.0 of $R(\lambda_0)$ | Ratio of $\Delta\lambda/\lambda_0$ |
|---|---|---|---|---|---|---|
| 99 | eight films | 808 nm 4.0% | 2.6% | 2108.54 nm 10.44 times | 139 nm | 139/808 = 0.172 |
| 100 | eight films | 744 nm 4.0% | 2.5% | 1949.67 nm 9.65 times | 131 nm | 131/744 = 0.101 |
| 101 | eight films | 808 nm 8.0% | 6.6% | 2177.34 nm 10.78 times | 145 nm | 145/808 = 0.179 |
| 102 | eight films | 753 nm 8.0% | 6.7% | 2024.36 nm 10.02 times | 124 nm | 124/753 = 0.165 |
| 103 | eight films | 808 nm 12.0% | 10.7% | 2264.47 nm 11.21 times | 236 nm | 236/808 = 0.292 |
| 104 | eight films | 706 nm 12.0% | 10.9% | 2005.83 nm 9.93 times | 201 nm | 201/706 = 0.285 |
| 105 | eight films | 808 nm 4.0% | 2.7% | 2355.68 nm 11.66 times | 232 nm | 232/808 = 0.287 |
| 106 | eight films | 716 nm 4.0% | 3.0% | 2115.46 nm 10.47 times | 197 nm | 197/716 = 0.275 |
| 107 | eight films | 808 nm 8.0% | 7.1% | 2726.92 nm 13.50 times | 172 nm | 172/808 = 0.213 |
| 108 | eight films | 891 nm 8.0% | 7.0% | 3016.09 nm 14.93 times | 191 nm | 191/891 = 0.214 |
| 109 | eight films | 808 nm 12.0% | 10.6% | 2352.26 nm 11.64 times | 204 nm | 204/808 = 0.252 |
| 110 | eight films | 909 nm 12.0% | 10.5% | 2618.82 nm 12.96 times | 230 nm | 230/909 = 0.253 |

$n_i$ and film thickness $d_i$ of a layer denoted with i in the eight films is 2618.82 nm which is very large, i.e., about 12.96 times a ¼ wavelength (=202 nm) of the predetermined wavelength of 808 nm. For this reason, a heat-radiation characteristic on the end face is improved, and the temperature of the end face can be suppressed from increasing.

FIG. 122 is a graph of a wavelength dependence of the reflectance of the eight-layer reflecting film 80. The abscissa of the graph indicates a wavelength, and the ordinate denotes a reflectance. In the eight-layer reflecting film, a flat portion having about 12% of the setting reflectance over a wide wavelength band can be obtained. More specifically, the reflectance in the range of a wavelength of 693 nm to a wavelength of 923 nm ranges from 10.5% to 13.0%. With reference to the reflectance of 12.0% at the setting wavelength 909 nm, a continuous wavelength band in the range of −1.5% to +1.0%, i.e., 10.5% to 13.0% is 230 nm. A value obtained by dividing the wavelength band by the setting wavelength of 909 nm is about 0.253, and is larger than 0.065 in the hypothetical reflecting film. Therefore, it is understood that the eight-layer reflecting film 80 has a flat portion having a low reflectance over a wide wavelength band.

In the embodiments which describe the present invention, the seven-layers reflecting film, the six-layers reflecting film, the nine-layers reflecting film, and eight-layer reflecting film have been described as examples. The present invention is not limited to these embodiments. Other reflecting multi-layer films may be used as the reflecting multi-layer films described in the embodiments. The case in which the materials of three types are used has been described. However, even in a case in which materials of four or more types are used, when a phase condition is given in advance, films can be handled in the same manner as described above. It is noted that an aluminum nitride film having a thickness 50 nm, an aluminum oxide film having a thickness 10 nm, and a silicon oxide film having a thickness 5 nm are described as a third-type film. The third-type film and the thickness are not limited to the above examples. The parameters such as O, A, B, C, and D representing contribution of a two-layer film including a pair of films made of aluminum oxide and tantalum oxide are not limited to the values described in the above embodiments. In addition, the case in which a semiconductor laser device is used as a semiconductor optical device has been exemplified. However, the present invention is applied to not only the semiconductor laser device but also an optical device such as a semiconductor optical amplifier, a super luminescent, a diode, an optical modulator, or an optical switch. In addition, a wavelength is not limited to about 980 nm and 808 nm, and a wavelength in a visible region, a far infrared region, and an infrared region can also be applied. Furthermore, although a reflectance of about 2% to 12% has been described as a reflectance, the present invention can be applied to any other reflectance range.

According to the semiconductor optical device according to the present invention, a sum $\Sigma n_i d_i$ of products $n_i d_i$ of refractive index $n_i$ and film thickness $d_i$ of layers of a reflecting multi-layer film is larger than a ¼ wavelength of, e.g., a predetermined wavelength of 980 nm of light guided through a waveguide layer. In addition, $\Sigma n_i d_i$ of the reflecting multi-layer film is almost larger than a ⅝ wavelength of the guided light, and the thickness is very large. For this reason, a heat-radiation characteristic on the end face is improved, and the temperature of the end face can be suppressed from increasing. A value $\Delta\lambda/\lambda$ obtained such that a continuous wavelength band $\Delta\lambda$ in the range of a minimal value of a reflectance serving as a function of a wavelength to the minimal value +2.0% is divided by the wavelength $\lambda$ is 0.062 or more. Therefore, although the film is very large in thickness, a wavelength band $\Delta\lambda$ of a low reflectance becomes wide.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor optical device comprising:
   a waveguide layer including two cladding layers and an active layer sandwiched between the two cladding layers; and
   a reflecting multi-layer film including a plurality of layers and disposed on at least one of a pair of opposing end faces of the waveguide layer, wherein
   a summation $\Sigma n_i d_i$ of products $n_i d_i$ of refractive indexes $n_i$ and thicknesses $d_i$ for each of i layers of the reflecting multi-layer film, and wavelength $\lambda_0$ of light guided through the waveguide layer satisfies $\Sigma n_i d_i > \lambda_0/4$, and a first wavelength bandwidth $\Delta\lambda$ is wider than a second wavelength bandwidth $\Delta\Lambda$, the first wavelength bandwidth $\Delta\lambda$ being a wavelength range including the wavelength $\lambda_0$ in which a reflectance R of the reflecting multi-layer film is not higher than +2.0% of reflectance R at the wavelength $\lambda_0$, the second wavelength bandwidth $\Delta\Lambda$ being a wavelength range including the wavelength $\lambda_0$ in which a reflectance R' of a hypothetical layer is not higher than +2.0% from reflectance R' at the wavelength $\lambda_0$ of a hypothetical layer having a thickness $5\lambda_0/(4n_f)$, a refractive index $n_f$, disposed on the at least one of opposing end faces, and satisfying $R' = ((n_c - n_f^2)/(n_c + n_f^2))^2$, where $n_c$ denotes an effective refractive index of the waveguide layer.

2. A semiconductor optical device comprising:
   a waveguide layer including two cladding layers and an active layer sandwiched between the two cladding layers; and
   a reflecting multi-layer film including a plurality of layers and disposed on at least one of a pair of opposing end faces of the waveguide layer, wherein
   a summation $\Sigma n_i d_i$ of products $n_i d_i$ of refractive indexes $n_i$ and thicknesses $d_i$ for each of i layers of the reflecting multi-layer film, and a wavelength $\lambda_0$ of light guided through the waveguide layer satisfies $\Sigma n_i d_i > \lambda_0/4$, $\Delta\lambda/\lambda_0$ is not lower than 0.062, and
   reflectance R in the bandwidth $\Delta\lambda$ ranges from −1.0% to +2.0% of reflectance R at the wavelength $\lambda_0$.

3. A semiconductor optical device comprising:
   a waveguide layer including two cladding layers and an active layer sandwiched between the two cladding layers; and
   a reflecting multi-layer film including a plurality of layers and disposed on at least one of a pair of opposing end faces of the waveguide layer, wherein
   a summation $\Sigma n_i d_i$ of products $n_i d_i$ of refractive indexes $n_i$ and thicknesses $d_i$ of each of i layers of the reflecting multi-layer film, and a wavelength $\lambda_0$ of light guided through the waveguide layer satisfies:

$\Sigma n_i d_i > \lambda_0/4$, and $\Delta\lambda/\lambda_0$ is not lower than 0.066, and
   reflectance R in the bandwidth $\Delta\lambda$ ranges from −1.5% to +1.0% of the reflectance R at the wavelength $\lambda_0$.

4. The semiconductor optical device according to claim 1, wherein the reflecting multi-layer film includes a first layer having a refractive index larger than a square root of an effective refractive index $n_c$ of the waveguide layer and a second layer having a refractive index smaller than the square root of the effective refractive index $n_c$.

5. The semiconductor optical device according to claim 4, wherein the first layer and the second layer are layered alternately.

6. The semiconductor optical device according to claim 1, wherein a first-layer of the reflecting multi-layer film, which is in contact with the waveguide layer, has a refractive index smaller than a square root of an effective refractive index $n_c$ of the waveguide layer.

7. The semiconductor optical device according to claim 1, wherein the reflecting multi-layer film includes at least three layers made of materials different from each other.

8. The semiconductor optical device according to claim 1, wherein the reflecting multi-layer film includes seven layers.

9. The semiconductor optical device according to claim 1, wherein the reflecting multi-layer film includes six layers.

10. The semiconductor optical device according to claim 1, wherein the reflecting multi-layer film includes nine layers.

11. The semiconductor optical device according to claim 1, wherein a first-layer film of the reflecting multi-layer film, in contact with the waveguide layer, has a heat conductivity higher than other layers of the reflecting multi-layer film.

12. The semiconductor optical device according to claim 1, wherein a first-layer of the reflecting multi-layer film, in contact with the waveguide layer, is aluminum nitride.

13. The semiconductor optical device according to claim 1, wherein minimum value of the reflectance of the reflecting multi-layer film is within range from 1% to 32%.

14. The semiconductor optical device according to claim 1, wherein a first-layer, which is in contact with the waveguide layer, and a second-layer of the reflecting multi-layer film have a refractive index smaller than a square root of an effective refractive index $n_c$ of the waveguide layer.

15. The semiconductor optical device according to claim 1, wherein the reflecting multi-layer film includes eight layers.

* * * * *